(12) United States Patent
Nakaya

(10) Patent No.: US 7,191,205 B2
(45) Date of Patent: Mar. 13, 2007

(54) FUNCTION BLOCK

(75) Inventor: Shogo Nakaya, Tokyo (JP)

(73) Assignee: NEC Corporation, Tokyo (JP)

( * ) Notice: Subject to any disclaimer, the term of this patent is extended or adjusted under 35 U.S.C. 154(b) by 128 days.

(21) Appl. No.: 10/968,554

(22) Filed: Oct. 18, 2004

(65) Prior Publication Data

US 2005/0055395 A1    Mar. 10, 2005

Related U.S. Application Data

(62) Division of application No. 10/177,180, filed on Jun. 24, 2002, now Pat. No. 6,836,147.

(30) Foreign Application Priority Data

Jun. 25, 2001 (JP) .............................. 2001-191770
Jun. 20, 2002 (JP) .............................. 2002-179301

(51) Int. Cl.
*G06F 7/50* (2006.01)
*H03K 19/20* (2006.01)

(52) U.S. Cl. ...................... 708/711; 708/713; 708/707; 708/708; 708/709; 708/710; 326/38; 326/39

(58) Field of Classification Search ................ 708/505, 708/670, 703, 710, 711, 725; 326/38, 39, 326/41

See application file for complete search history.

(56) References Cited

U.S. PATENT DOCUMENTS 5,808,928 A    9/1998  Miyoshi 5,818,747 A *  10/1998  Wong .......................... 708/702
6,097,212 A *  8/2000   Agrawal et al. .............. 326/41
6,157,209 A    12/2000  McGettigan
6,188,240 B1   2/2001   Nakaya

FOREIGN PATENT DOCUMENTS

| JP | 10-55265   | 2/1998  |
| JP | 10-333884  | 12/1998 |
| JP | 11-24891   | 1/1999  |
| JP | 11-122096  | 4/1999  |
| JP | 11-353152  | 12/1999 |

OTHER PUBLICATIONS

European Search Report for EP application No.: EP 02 013 978.8-2215 dated Dec. 9, 2006.

* cited by examiner

*Primary Examiner*—Vibol Tan
(74) *Attorney, Agent, or Firm*—Foley & Lardner LLP

(57) ABSTRACT

A function block allows a multiplier and a multi-input multiplexer to be realized with a small number of blocks. A logical function generator generates a logical output signal from first to fourth logical inputs thereof according to a logical function selected from a plurality of 4-input/1-output logical functions depending on configuration data. A 4-2 carry block generates a 4-2 carry output from the second to fourth logical inputs. A first signal is generated from at least the logical output, a second signal from at least the first logical input, a third signal from at least a 4-2 carry input signal, and a fourth signal from at least the 4-2 carry input signal. A multiplexer selects one of the second and third signals depending on the first signal to produce a carry output signal. An exclusive OR circuit produce an exclusive-ORed result from the logical output and the fourth signal.

149 Claims, 107 Drawing Sheets

FIG. 8
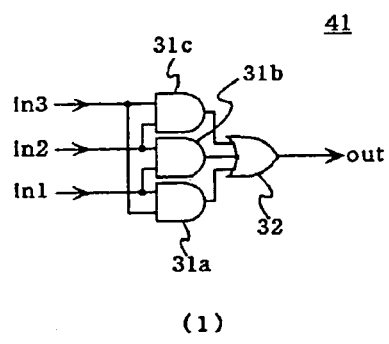
(1)
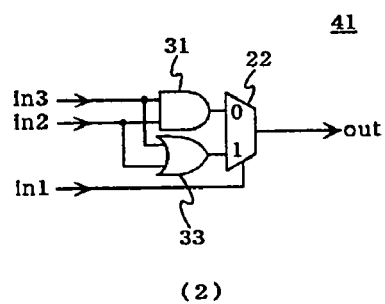
(2)
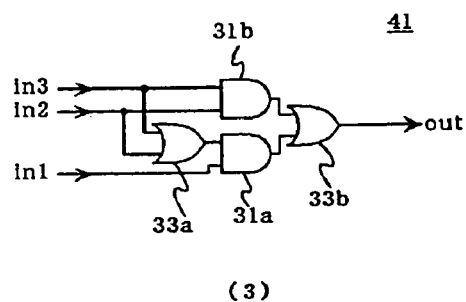
(3)
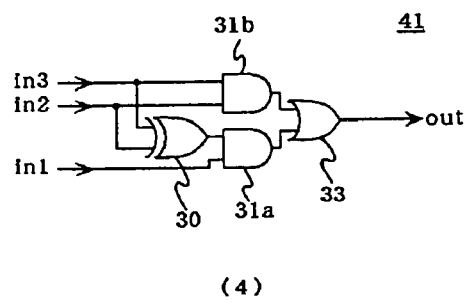
(4)
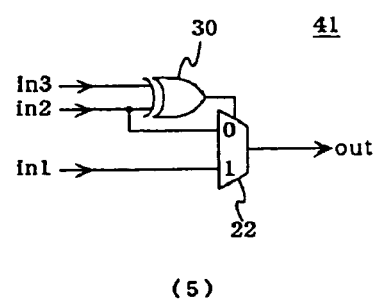
(5)
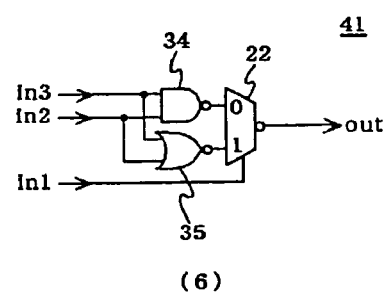
(6)
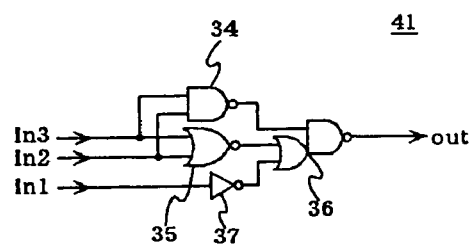
(7)

FIG. 16
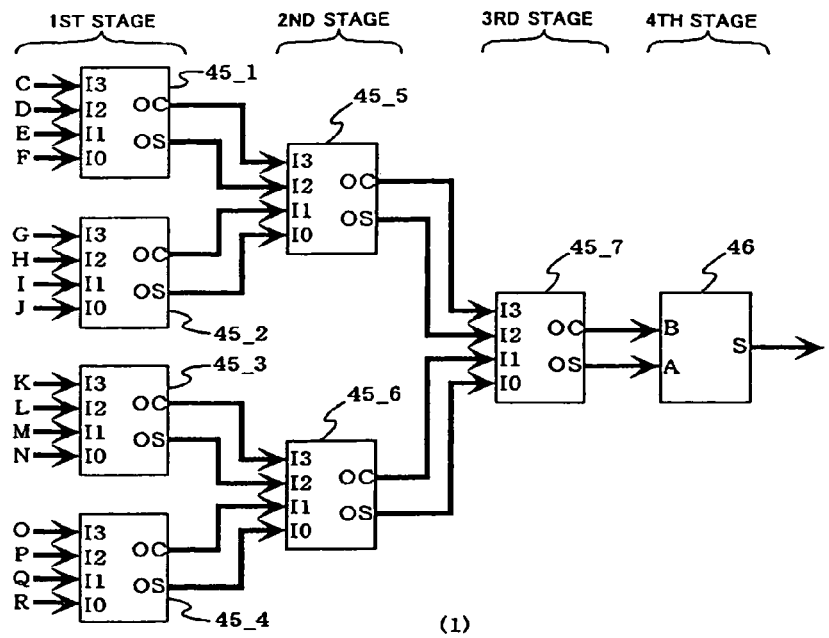
(1)
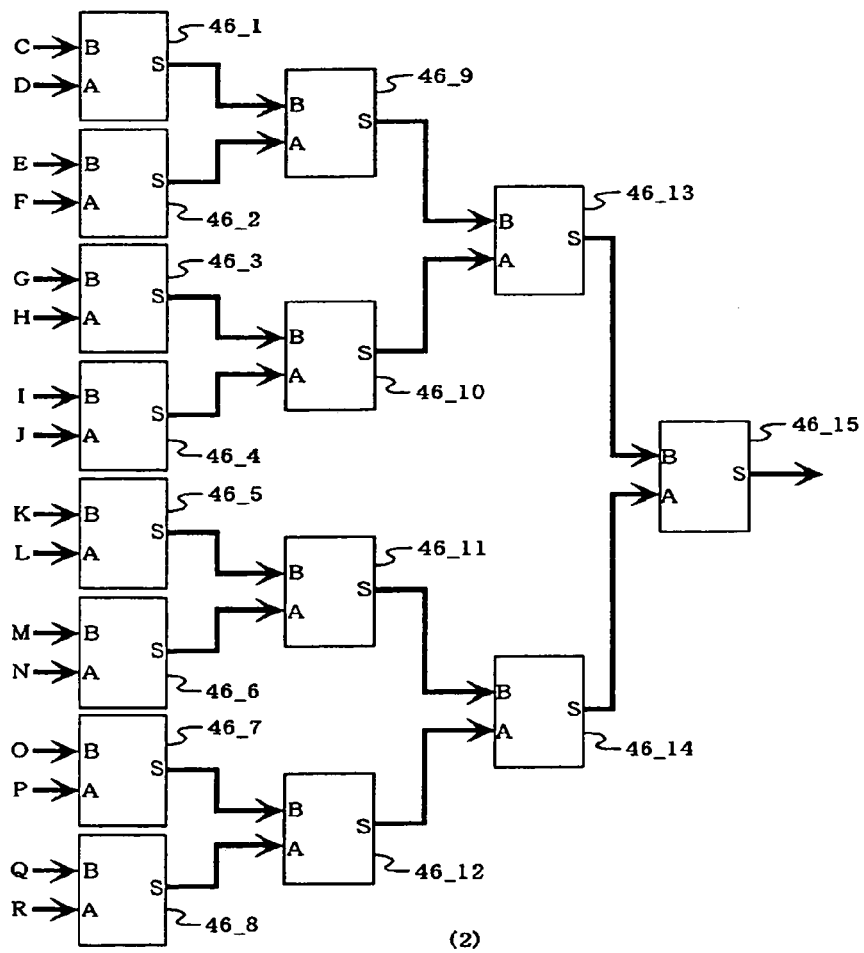
(2)

FIG. 28
| INPUT SETTINGS | | | EQUIVALENT LOGIC CIRCUIT |
|---|---|---|---|
| in0 | in1 | in2 | |
| in0 | X | 0 | in0 ———— out |
| 0 | in1 | in2 |  |
| in0 | 1 | in2 |  |
| 1 | in1 | in2 |  |
| in0 | 0 | in2 |  |
| in0 | in1 | in2 | 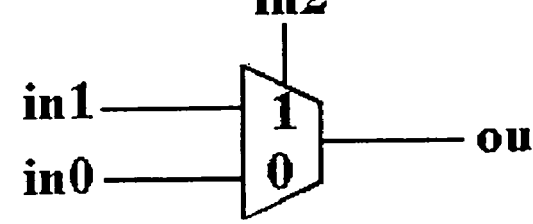 |

FIG. 31
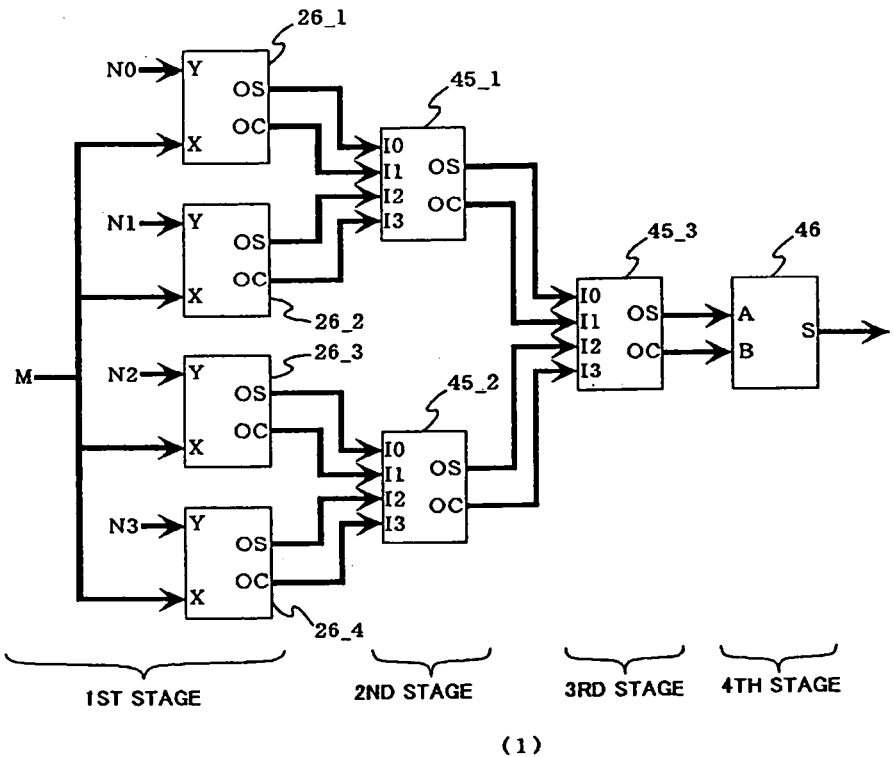
(1)
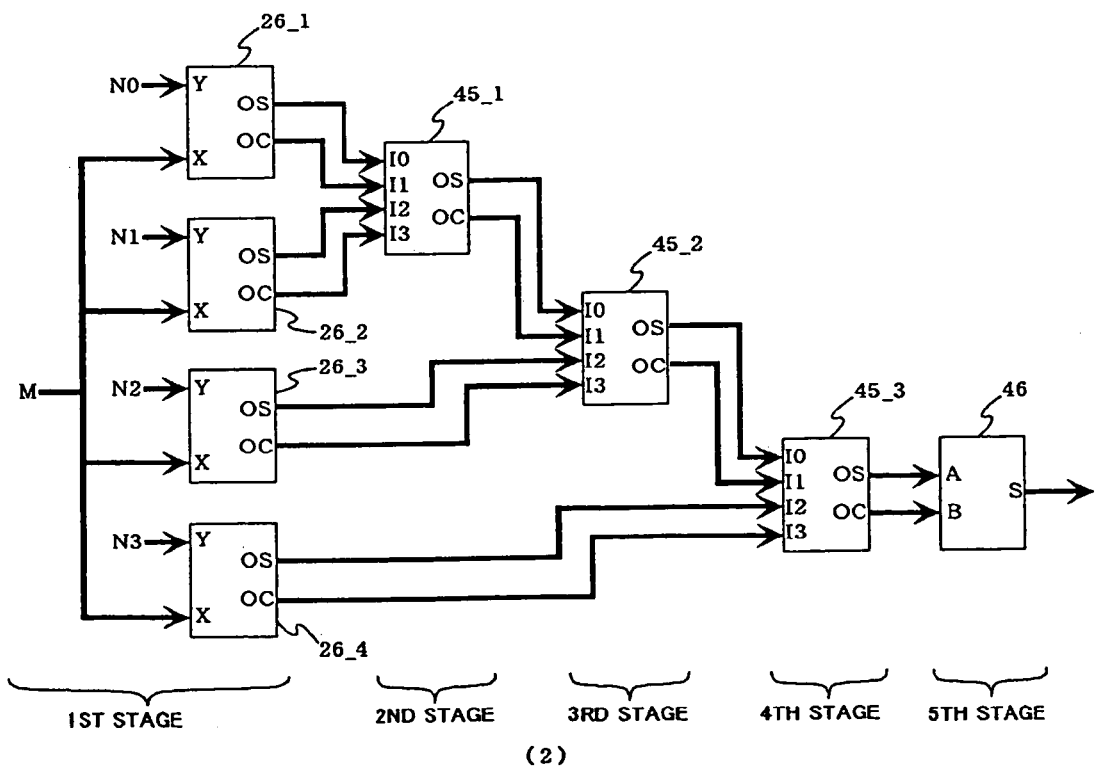
(2)

FIG. 37
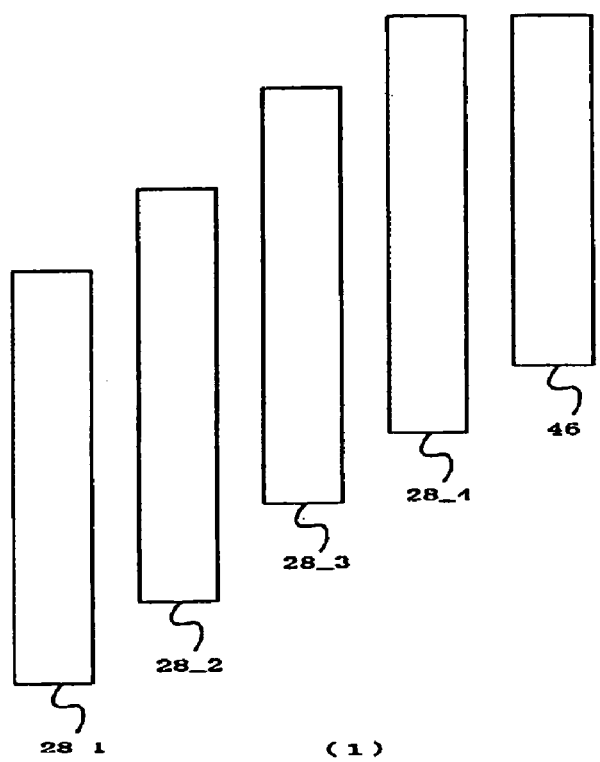
(1)
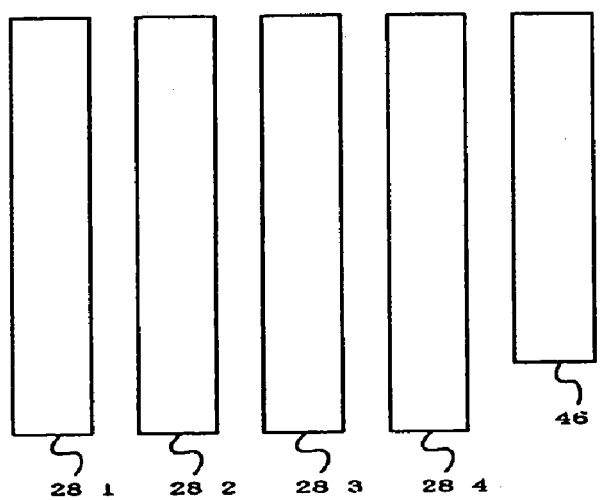
(2)

23

(1) (2)

(1)

FIG. 63
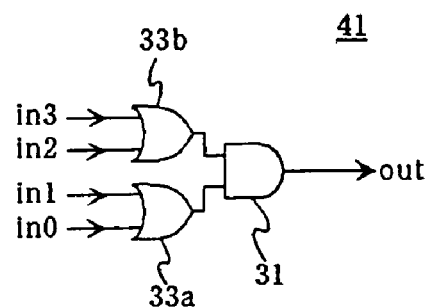
(1)
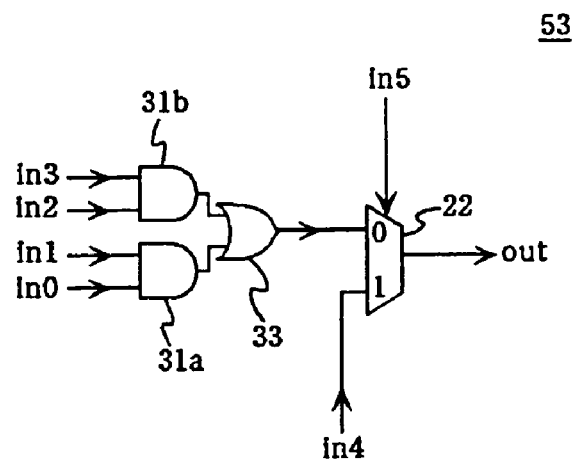
(2)

FIG. 64
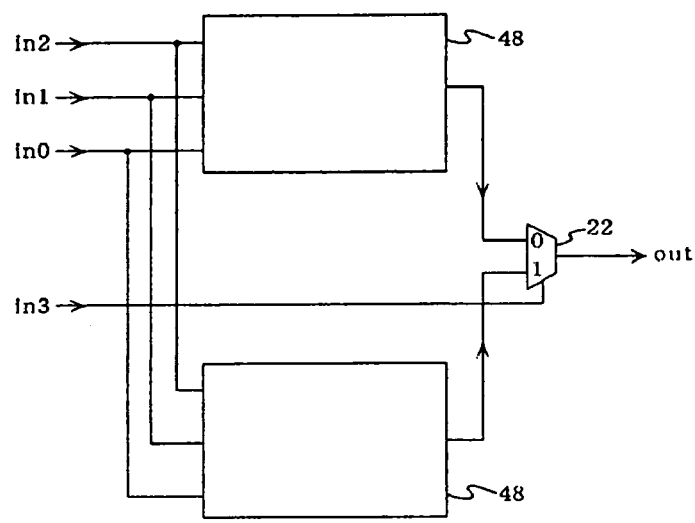
(1)
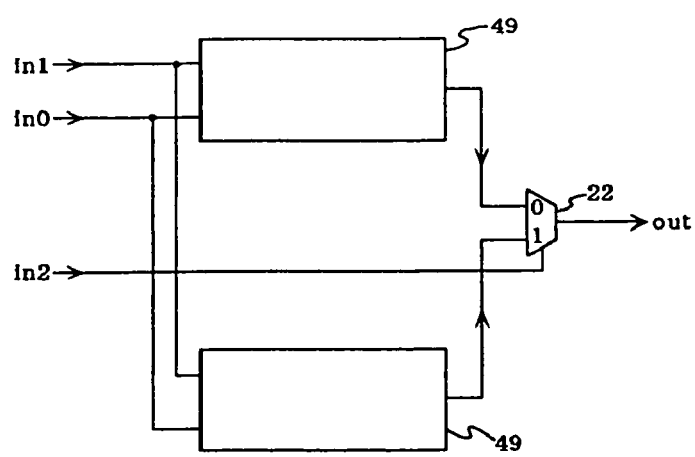
(2)

FIG. 74
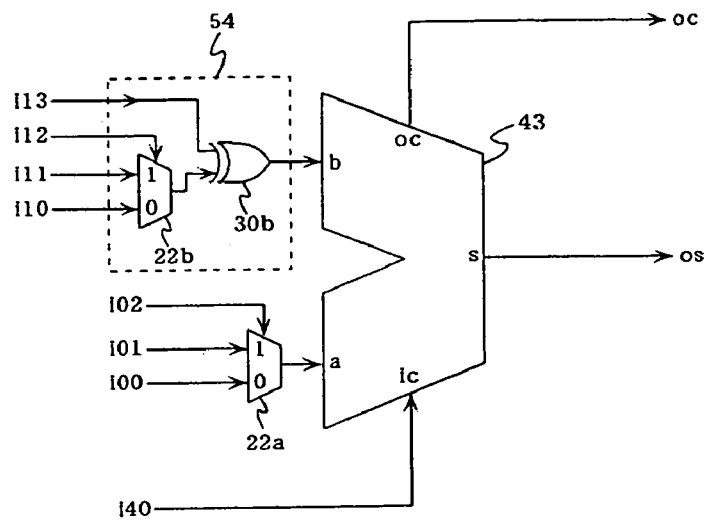
(1)
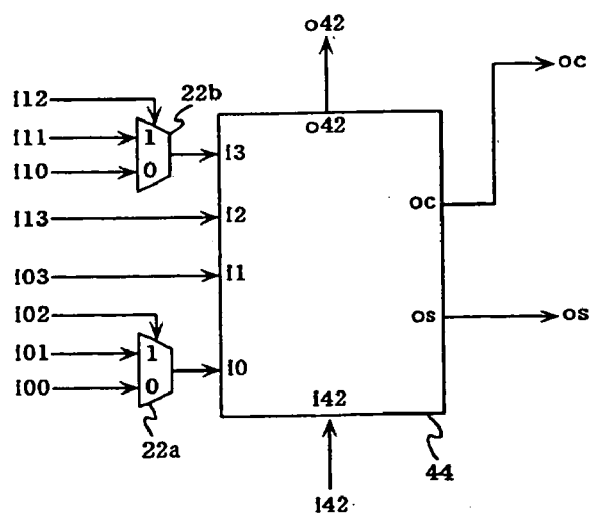
(2)

FIG. 75

| INPUT SETTINGS | | | | EQUIVALENT LOGIC CIRCUIT |
|---|---|---|---|---|
| i10 | i11 | i12 | i13 | |
| i10 | X | 0 | 0 | i10 ─────── out |
| i10 | X | 0 | 1 | i10 ──▷○── out |
| 0 | i11 | i12 | 0 | i12, i11 ──AND── out |
| 0 | i11 | i12 | 1 | i12, i11 ──NAND── out |
| 1 | i11 | i12 | 0 | i12, i11 ──NOR── out (with inverted input) |
| 1 | i11 | i12 | 1 | i12, i11 ──AND── out (with inverted input) |
| i10 | 1 | i12 | 0 | i12, i10 ──OR── out |
| i10 | 1 | i12 | 1 | i12, i10 ──NOR── out |
| i10 | 0 | i12 | 0 | i12, i10 ──NAND── out (with inverted input) |
| i10 | 0 | i12 | 1 | i12, i10 ──NOR── out (with inverted input) |
| i10 | X | 0 | i13 | i13, i10 ──OR── out |
| 1 | 0 | i12 | i13 | i13, i12 ──NOR── out |
| i10 | i11 | i12 | 0 | MUX: i11(1), i10(0), sel=i12 → out |
| i10 | i11 | i12 | 1 | MUX: i11(1), i10(0), sel=i12 → out (inverted) |

4

42

57

FUNCTION BLOCK

CROSS-REFERENCE TO RELATED PATENT APPLICATIONS

This application is a division of application Ser. No. 10/177,180, filed Jun. 24, 2002, now a U.S. Pat. No. 6,836,147, and based on Japanese Patent Application No. 2001-191770, filed Jun. 25, 2001, and Japanese Patent Application No. 2002-179301, filed Jun. 20, 2002, by Shogo Nakaya. This application claims only subject matter disclosed in the parent application and therefore presents no new matter.

BACKGROUND OF THE INVENTION

1. Field of the Invention

The present invention relates to a reconfigurable device in which various functions can be implemented by a user, and in particular to a function block which is a logic function constituting unit. More specifically, the present invention relates to a function block suitable for implementing a multiplier and a multiplexer. In this specification, a circuit bearing a main portion of a logic function in a programmable function cell is referred to as a function block.

2. Description of the Related Art

Recently, reconfigurable devices such as a PLD (programmable logic device), FPGA (field programmable gate array) and the like in which various functions can be set by a user have been rapidly developed. With increase of degree of integration and speed, such a reconfigurable device is expected to be used not only for emulation during the designing of ASIC (application-specific integrated circuit) or substitution of a simple peripheral circuit but also for a reconfigurable computer whose hardware structure can be changed depending on an application.

However, a multiplier that is frequently used in computing cannot be effectively realized by a conventional PLD or FPGA, which is one of the causes disturbing practical use of a reconfigurable computer. Furthermore, the conventional PLD and FPGA cannot effectively realize a multi-input multiplexer (MUX). Owing to this, it has been impossible to obtain a compact barrel shifter, for example, used for floating-point addition/subtraction.

FIG. 103 shows a typical example of an ordinary multiplier. This multiplier multiplies $X = x_7 x_6 x_5 x_4 x_3 x_2 x_1 x_0$ by $Y = y_3 y_2 y_1 y_0$ to produce $Z = z_{11} z_{10} z_9 z_8 z_7 z_6 z_5 z_4 z_3 z_2 z_1 z_0$ that is the product of X and Y, where each of $x_i$, $y_i$ or $z_i$ represents (i+1)-th bit of binary data X, Y and Z, and is 0 or 1 (i=0, 1, 2, . . . ). For example, the notation of $x_7 x_6 x_5 x_4 x_3 x_2 x_1 x_0$ represents a bit arrangement of binary data X. As is clear from FIG. 103, this multiplier is constructed by systematically arranging a multiplier unit 76 in an array. In the multiplier unit 76, an output of an AND circuit 31 is connected to one argument input b of a 1-bit full adder 43. In the 1-bit full adder 43 of FIG. 103, the other argument input is denoted by a, a carry input by ic, a carry output by oc, and an addition output by s. The multiplier as shown in FIG. 103 is the most basic array-type multiplier having a simple and systematic configuration, which is suitable for implementation in the FPGA.

FIG. 104 shows an example of a conventional function block 4 for FPGA (for example, see U.S. Pat. Nos. 5,349, 250, 5,481,206, and 5,546,018). Here, only those parts related to the description are shown. In the figure, a logic function generator 40 is a circuit capable of realizing various logic functions in accordance with contents of a built-in configuration memory.

FIG. 105 shows an example of the logic function generator 40. This has sixteen 1-bit memory cells 13 as a configuration memory and the outputs of respective ones of the memory cells are inputted to a 16-input multiplexer (MUX) 20. In accordance with values of four control inputs in0, in1, in2 and in3, the 16-input MUX 20 selects one of the 16 inputs to output it as denoted by out. This logic function generator 40 has a logic function which is determined in accordance with contents stored in the configuration memory 13 and can realize an arbitrary 4-input 1-output logic function having four inputs in0, in1, in2 and in3 and one output. In general, a logic function generator having 2k-bit memory cells and capable of realizing all the k-input 1-output logic functions is referred to as a Look-Up Table (hereinafter, abbreviated as LUT). FIG. 105 shows an example of 4-input LUT. Examples of other configurations of the LUT are disclosed in, for example, U.S. Pat. Re. 34,363 and U.S. Pat. No. 4,706,216.

The function block 4 of FIG. 104 uses the logic function generator 40 to which a 2-input MUX 22 as a ripple carry circuit and a 2-input exclusive OR circuit (XOR) 30 required for constituting an adder are added.

With regard to the 2-input MUX, see FIG. 7. In FIG. 7, the 2-input MUX 22 has an input to which input in0 is connected (input-0) and another input to which input in1 is connected (input-1). When a control input in2 is logical 0, a signal in0 fed to the input-0 is outputted as denoted by out, and when the control input in2 is logical 1, a signal in1 fed to the input-1 is outputted. Hereinafter, when MUX is briefly written as "MUX" omitting the number of inputs, it represents two inputs (exclusive of a control input).

The multiplier of FIG. 103 may be configured using the function block 4 of FIG. 104 to implement the function as shown in FIG. 106 in the logic function generator 40 of FIG. 104. In this case, the function block 4 of FIG. 104 functions as the multiplier unit 76 of FIG. 103. Here, an input in0, an output os, a ripple carry input irc, and a ripple carry output orc of FIG. 104 correspond to the argument input a, the adder output s, the carry input ic, and the carry output oc of the 1-bit full adder 43, respectively. Moreover, the AND 31 in the circuit of FIG. 106 implemented in the logic function generator 40 of FIG. 104 corresponds to the AND 31 in the multiplier unit 76 of FIG. 103.

As has been described above, the multiplier unit 76 of FIG. 103 can be constructed of one function block 4 of FIG. 104. However, when a multiplier is constructed by this method, multiplication of m-bit data and n-bit data requires m×n function blocks, occupying a great area. Furthermore, in the case of a multiplier of n bits, a signal should be transferred through n stages of function blocks 4 (besides a carry propagation delay) and accordingly, a signal propagation delay is also increased.

In addition to the function block shown in FIG. 104, several methods have been devised for realizing by a single function block a multiplier unit in which an AND gate is attached to one argument input of a 1-bit full adder (for example, see Japanese Patent Application Laid-open Publication Nos. 11-24891, 11-122096, and 11-353152, and U.S. Pat. No. 5,570,039). These conventional techniques also have the aforementioned problem.

In order to solve the aforementioned problem, U.S. Pat. No. 5,754,459 discloses a method for implementing a multiplier using the modified Booth algorithm and the Wallace Tree into a PLD. However, this multiplier has disadvantages that its circuit configuration is complicated, a plenty of wiring resources is needed, and the area reduction effect is small.

Furthermore, the conventional FPGA has a problem that multi-input (3-input or more in this specification) MUX cannot be effectively realized. As shown in FIG. 104, in the function block 4 having one 4-input logic function generator 40, only one 2-input MUX which is the simplest can be implemented. This is because a 2-input MUX can be realized by three input terminals including a control input while a 3-input MUX requires 5 input terminals and a 4-input MUX requires 6 input terminals. Thus, the 4-input logic function generator cannot provide a sufficient number of inputs.

From this reason, for example, for realizing a 4-input MUX having a high usability by the conventional FPGA, as shown in FIG. 107, it is necessary to use two function blocks 4a and 4b and a MUX 22. (FIG. 107 shows only a portion of the function block related to the present explanation). Here, the logic function generator 40 of each function block has a 2-input MUX (for example, as shown in FIG. 7) implemented therein. In this case, in FIG. 107, two pairs of inputs i0 and i1 of the function blocks 4a and 4b correspond to the four inputs of the 4-input MUX, respectively. The respective inputs i2 and i4 correspond to first and second control inputs of the 4-input MUX. An output om corresponds to the output of the 4-input MUX.

Thus, in order to realize a 4-input MUX by using the conventional FPGA, it is necessary to use two function blocks, resulting in an increase in occupied area. Japanese Patent Laid-open Publication No. 11-24891, Japanese Patent Laid-open Publication Nos. 11-122096 and 11-353152 disclose a completely different type of function block not using the 4-input LUT. However, even with this function block, it is impossible to realize a 4-input MUX in one block.

The floating-point addition/subtraction is performed by using a barrel shifter, which is composed of a large number of MUX'es. When implementing it in the FPGA, such a scheme that a single function block corresponds to one 2-input MUX is inefficient, resulting in increased area. It is desired to realize a 4-input MUX with one function block, thereby greatly improving the efficiency.

A first problem is that when a multiplier is configured by using a conventional function block, the multiplier area and signal propagation delay are increased. When a multiplier unit consisting of a 1-bit full adder and an AND gate is made by one function block, it is necessary to use great many function blocks to complete the entire multiplier.

A second problem is that when constructing a multi-input multiplexer using a conventional function block, the area is increased. Since only one 2-input MUX can be implemented in one function block, plural function blocks should be used to constitute a multi-input MUX.

SUMMARY OF THE INVENTION

It is therefore an object of the present invention to provide a function block capable of realizing a compact and high-speed multiplier.

Another object of the present invention is to provide a function block capable of realizing a compact multi-input multiplexer.

According to the present invention, a 4-2 carry block is added to a known function block so as to be used as a 4-2 adder. Furthermore, a preposition logic circuit is added so that an AND-attached 4-2 adder can be realized in one function block. Moreover, an XOR (exclusive OR) and an MUX (multiplexer) are combined with each other so as to constitute a function block, which can also be used as an AND-attached 4-2 adder. Furthermore, by using a MUX as a preposition logic circuit, a multi-input MUX (for example, 4-input MUX) can be realized in one function block.

According to a first aspect of the present invention, a function block includes: a logical function generator having four logical input terminals and one logical output terminal, for generating a logical output signal from first, second, third, and fourth logical input signals thereof according to a logical function selected from a plurality of 4-input/1-output logical functions depending on configuration data; a 4-2 carry block for generating a 4-2 carry output signal from the second, third, and fourth logical input signals; a first signal generator for generating a first signal from at least the logical output signal; a second signal generator for generating a second signal from at least the first logical input signal; a third signal generator for generating a third signal from at least a 4-2 carry input signal; a fourth signal generator for generating a fourth signal from at least the 4-2 carry input signal; a selector for selecting one of the second and third signals depending on the first signal to produce a carry output signal; and an exclusive OR circuit for performing an exclusive OR function on the logical output signal and the fourth signal to produce an output of the function block.

Several embodiments of the first-aspect function block are shown in the accompanying drawings, for example, FIGS. 6, 40–42, 45–51, 59 and 61.

Taking FIG. 6 as an example, the respective first, second, third, and fourth logical inputs correspond to inputs in0, in1, in2, and in3 of a logical function generator 40 and the logical output corresponds to an output out of the logical function generator 40.

The first signal generator corresponds to a wire connecting the output out as the first signal to the control input of a MUX 22c that corresponds to the selector. Alternatively, taking FIGS. 40 and 42 as other examples, the first signal generator corresponds to a MUX 22d and/or AND 31d for selecting a signal from the output out, other signal i50, and/or a fixed value to output it as the first signal to the control input of the MUX 22c.

The second signal generator, as shown in FIG. 6, corresponds to a wire connecting the input in0 as the second signal to the input-0 of the MUX 22c. Alternatively, taking FIG. 42 as another example, the second signal generator corresponds to a MUX 22m for selecting a signal from the inputs in0 and in3 of the logical function generator 40 to output it as the second signal to the input-0 of the MUX 22c.

The third signal generator, as shown in FIG. 6, corresponds to a wire connecting the 4-2 carry input signal i42 as the third signal to the input-1 of the MUX 22c. Alternatively, taking FIG. 41 as another example, the third signal generator corresponds to a MUX 22g for selecting a signal from the 4-2 carry input signal i42 and the input in3 and a wire connecting the selected signal as the third signal to the input-1 of the MUX 22c. Further, taking FIG. 48 as another example, the third signal generator corresponds to a MUX 22h for selecting a signal from the 4-2 carry input signal i42 and the ripple carry signal irc and a wire connecting the selected signal as the third signal to the input-1 of the MUX 22c.

The fourth signal generator, as shown in FIG. 6, corresponds to a wire connecting the 4-2 carry input signal i42 as the fourth signal to one input of an XOR 30 that corresponds to the above exclusive OR circuit. In other words, according to the example as shown in FIG. 6, the third and fourth signal generators both use the 4-2 carry input signal i42 as the third and fourth signal, respectively. Alternatively, taking FIG. 41 as another example, the fourth signal generator corresponds to a MUX 22g for selecting a signal from the 4-2 carry input signal i42 and the input in3 and a wire connecting the selected signal as the fourth signal to the one input of the XOR 30. Further, taking FIG. 47 as another example, the fourth signal generator corresponds to a MUX 22h for selecting a signal from the 4-2 carry input signal i42 and the ripple carry signal irc to output the selected signal as the fourth signal to the input-1 of the MUX 22c. Furthermore, taking FIG. 59 as another example, the fourth signal generator corresponds to a MUX 22h for selecting a signal from the 4-2 carry input signal i42 and the input in3 and an AND 31k for selecting one of the selected signal and a fixed value to output it as the fourth signal to the one input of the XOR 30.

According to a second aspect of the present invention, a function block includes: a first exclusive OR circuit for performing an exclusive OR function on a first input signal and a second input signal; a second exclusive OR circuit for performing an exclusive OR function on a third input signal and a fourth input signal; a 4-2 carry block for generating a 4-2 carry output signal from at least, one of the first and second input signals and one of the third and fourth input signals; a third exclusive OR circuit for performing an exclusive OR function on output signals of the first exclusive OR circuit and the second exclusive OR circuit; a first signal generator for generating a first signal from at least an output signal of the third exclusive OR circuit; a second signal generator for generating a second signal from at least one of the first and second input signals; a third signal generator for generating a third signal from a first multiple-signal group including a 4-2 carry input signal and at least one logical input signal; a fourth signal generator for generating a fourth signal from a second multiple-signal group including the 4-2 carry input signal and at least one logical input signal; a selector for selecting one of the second and third signals to produce a carry output signal depending on the first signal; and a fourth exclusive OR circuit for performing an exclusive OR function on the fourth signal and the output signal of the third exclusive OR circuit.

Several embodiments of the second-aspect function block are shown in the accompanying drawings, for example, FIGS. 73, 77–81, and 84–86.

Taking FIG. 73 as an example, the first exclusive OR circuit corresponds to XOR 30a, the second exclusive OR circuit corresponds to XOR 30b, the 4-2 carry block corresponds to a MUX 22j, the third exclusive OR circuit corresponds to XOR 30c, and the fourth exclusive OR circuit corresponds to XOR 30d.

The first signal generator is basically similar to that of the first-aspect function block. For example, in FIG. 73, the first signal generator corresponds to a wire connecting the output of XOR 30c as the first signal to the control input of a MUX 22c that corresponds to the selector.

The second signal generator is basically similar to that of the first-aspect function block. For example, in FIG. 73, the second signal generator corresponds to a wire connecting one input of XOR 30a as the second signal to the input-0 of the MUX 22c.

The third signal generator is basically similar to that of the first-aspect function block. For example, in FIG. 73, the third signal generator corresponds to a MUX 22h for selecting a signal from a first multiple-signal group including the 4-2 carry input signal i42 and another logical input signal i40 and a wire connecting the selected signal as the third signal to the input-1 of the MUX 22c.

The fourth signal generator is basically similar to that of the first-aspect function block. For example, in FIG. 73, the fourth signal generator corresponds to a MUX 22h for selecting a signal from a second multiple-signal group including the 4-2 carry input signal i42 and another logical input signal i40 and a wire connecting the selected signal as the fourth signal to one input of the XOR 30d. In other words, according to the example as shown in FIG. 73, the third and fourth signal generators select the third and fourth signal from the same multiple-signal group, respectively.

BRIEF DESCRIPTION OF THE DRAWINGS

FIG. 8(1) is a circuit diagram showing a first example of a 4-2 carry block 41; FIG. 8(2) is a circuit diagram showing a second example of the 4-2 carry block 41; FIG. 8(3) is a circuit diagram showing a third example of the 4-2 carry block 41; FIG. 8(4) is a circuit diagram showing a fourth example of the 4-2 carry block 41; FIG. 8(5) is a circuit diagram showing a fifth example of the 4-2 carry block 41; FIG. 8(6) is a circuit diagram showing a sixth example of the 4-2 carry block 41; and FIG. 8(7) is a circuit diagram showing a seventh example of the 4-2 carry block 41.

FIG. 16(1) is a block diagram showing an example of complete-tree type multi-bit multi-argument adder using a 4-2 adder; and FIG. 16(2) is a block diagram showing an example of complete-tree type multi-bit multi-argument adder using a full adder.

FIG. 17(2) is a block diagram showing an example of completely cascaded type multi-bit multi-argument adder using the full adder.

FIG. 28 is a table showing various logic functions of an MUX.

FIG. 31(1) is a block diagram showing an example of a complete-tree type multiplier using a multi-bit 4AND4-2 adder 26; and FIG. 31 (2) is a block diagram showing an example using a completely cascaded type multi-bit multi-argument 4-2 adder.

FIG. 37(1) shows a shift arrangement of a completely cascaded type multiplier using a multi-bit 2AND4-2 adder; and FIG. 37(2) shows a horizontal arrangement of the completely cascaded type multiplier using the multi-bit 2AND4-2 adder.

FIG. 60(2) shows a configuration example of the XOR.

FIG. 62(2) is a circuit diagram showing a first example of a carry block.

FIG. 63(1) is a circuit diagram showing a second example of the 4-2 carry block; FIG. 63(2) is a circuit diagram showing a second example of the carry block.

FIG. 64(1) is a circuit diagram showing a 4-input LUT composed of two 3-input LUT's; FIG. 64(2) is a circuit diagram showing a 3-input LUT composed of two 2-input LUT's.

FIG. 74(1) shows an equivalent circuit of the function block of FIG. 73 in a full adder mode; and FIG. 74(2) shows an equivalent circuit of the function block of FIG. 73 in a 4-2 adder mode.

FIG. 75 is a table showing logic functions of an MUX-XOR 54.

DESCRIPTION OF THE PREFERRED EMBODIMENTS

Hereafter, the preferred embodiments of the present invention will be described in detail with reference to the accompanying drawings.

1. First Embodiment 1.0) Programmable Function Cell

Figure 1:
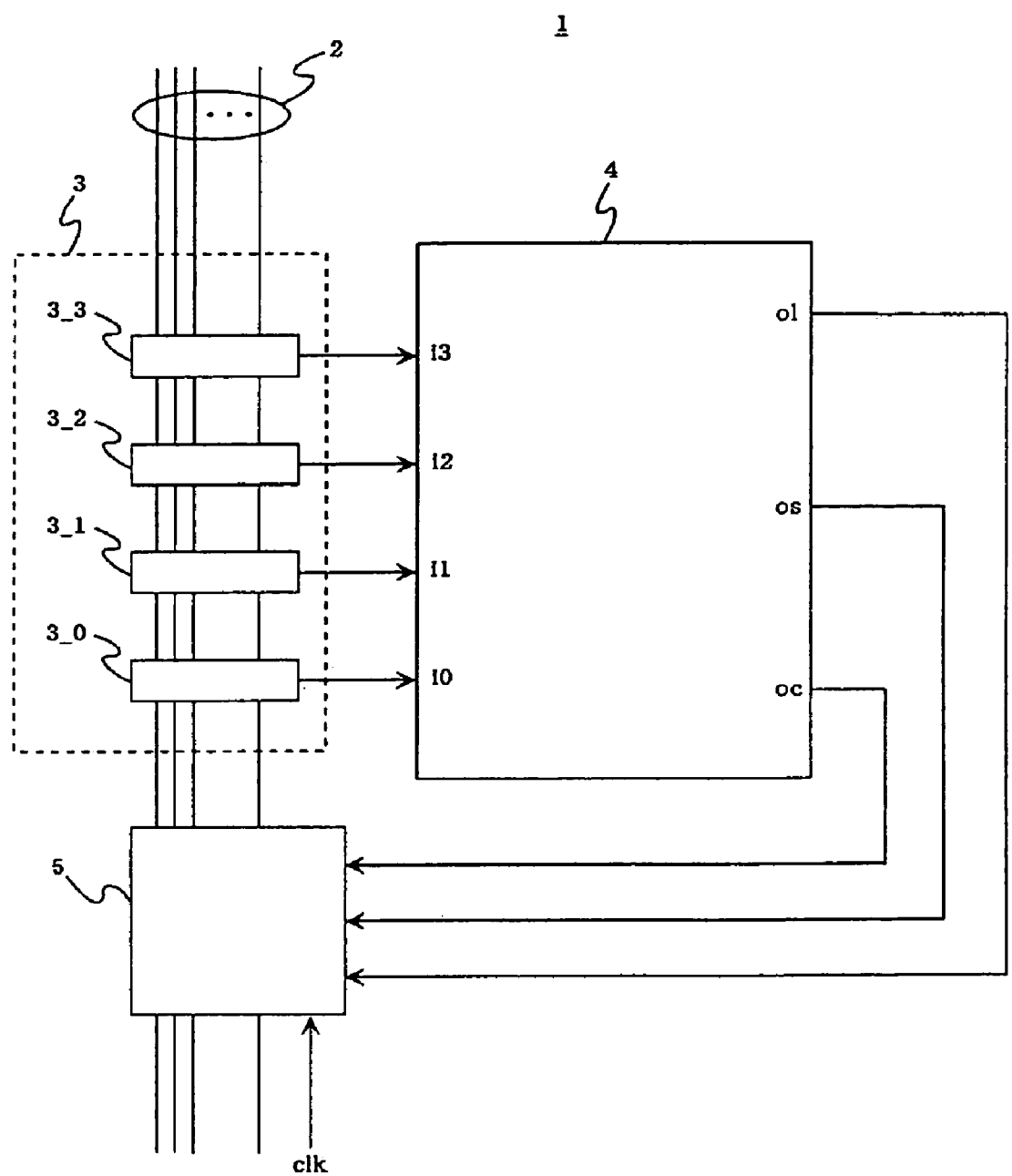
FIG. 1 is a schematic block diagram showing a programmable function cell using a function block according to the present invention.

FIG. 1 is a schematic block diagram showing the configuration of a programmable function cell using a function block according to the present invention. This programmable function cell 1 is provided with an input block 3, a function block 4, and an output block 5.

The programmable function cells 1 are arranged in a two-dimensional array on a reconfigurable device, and they are interconnected by an interconnection wire group 2.

The input block 3 is composed of a plurality of input selection units (here, four input selection units 3_0, 3_1, 3_2, and 3_3). Each of the input selection units selects a signal on one wire from the interconnection wire group 2 and outputs the selected signal to the function block 4. Outputs of the input selection units 3_0, 3_1, 3_2 and 3_3 are connected to inputs i0, i1, i2 and i3 of the input block 4, respectively. The output block 5 is supplied with outputs ol, os and oc of the function block 4 and a clock signal clk as inputs and outputs a signal selected from ol, os and oc to a wire selected from the interconnection wire group 2 directly or after temporarily storing in a register. When the programmable function cell is not used, the output block 5 may not output any signal to the interconnection wire group. Selection of a wire or a signal in the input block 3 and in the output block 5 is determined by configuration data set by a user.

1.1) Input Selection Unit

Figure 2:
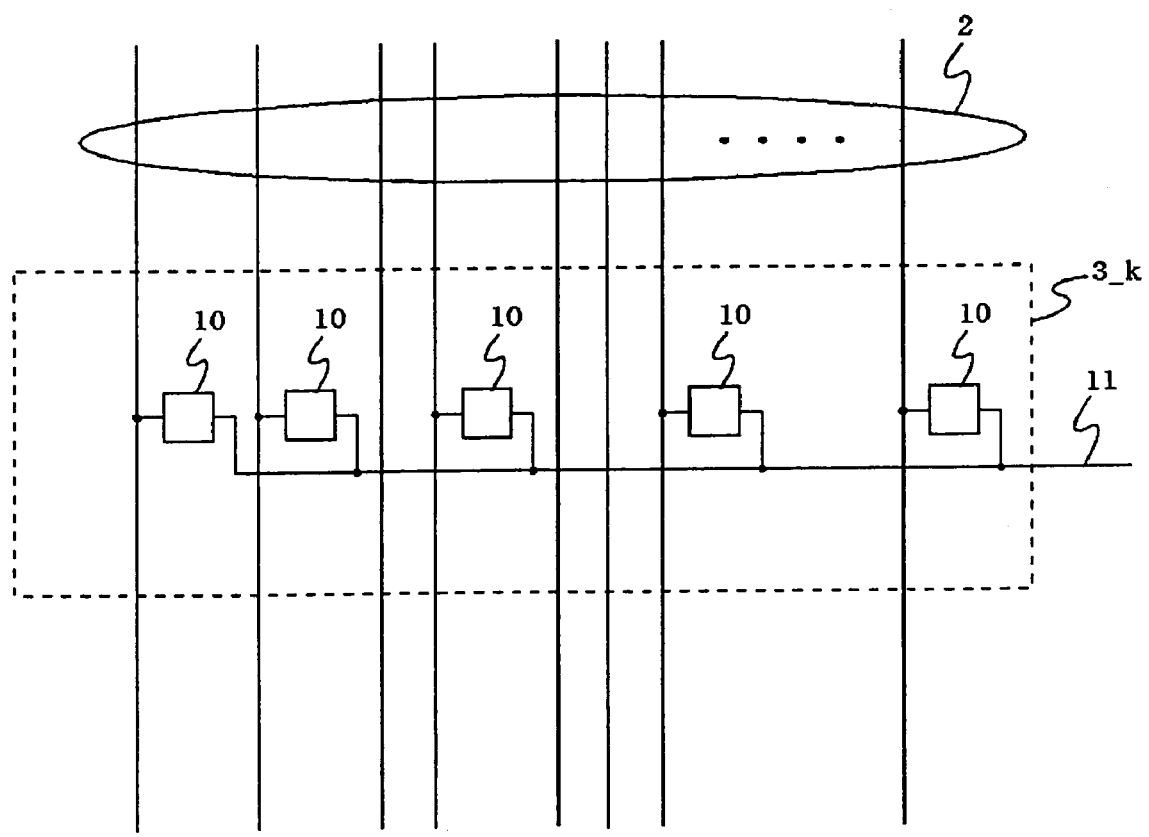
FIG. 2 is a block diagram showing a first example of an input selection unit used in the programmable function cell in FIG. 1.

FIG. 2 is a block diagram showing a first example of the input selection unit used in the programmable function cell of FIG. 1. The input selection unit 3_k (k is an integer) is composed of one output line 11 and a plurality of programmable switches 10. Each of the programmable switches 10 connects the output line 11 with a corresponding wire of the interconnection wire group 2. The output line 11 is not necessarily connected to all of the wires of the interconnection wire group 2 passing through the input selection unit 3_k by the programmable switches 10. Moreover, connection with which wire in the interconnection wire group 2 may differ in each of the input selection units. Each of the programmable switches 10 is a circuit having two terminals selectively connected and disconnected depending on configuration data.

Figure 3:
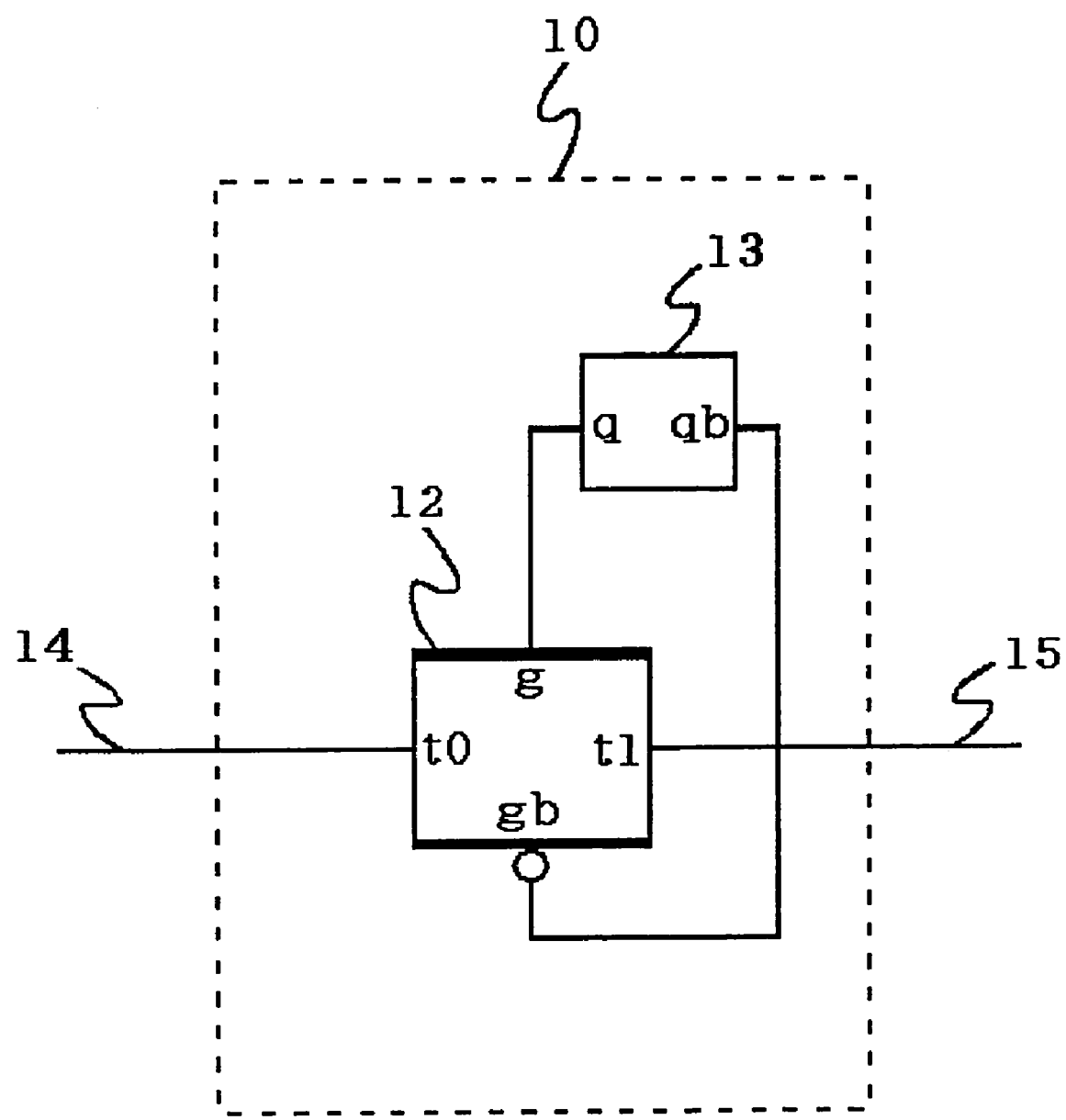
FIG. 3 is a block diagram showing a programmable switch 10 shown in FIG. 2.

FIG. 3 is a block diagram showing an example of the programmable switch 10 of FIG. 2. Each of the programmable switches includes a 1-bit configuration memory 13 and a transmission gate 12. An output q and inverted output qb of the configuration memory are connected to a gate input g and an inverted gate input gb of the transmission gate 12, respectively. An I/O terminal t0 and t1 of the transmission gate 12 are connected to terminals 14 and 15 of the programmable switch 10, respectively. The terminals 14 and 15 of the programmable switch 10 are connected to each other when a logical value of 1 is held in the configuration memory 13 and not connected when the logical value of 0 is held in the configuration memory 13.

Figure 4:
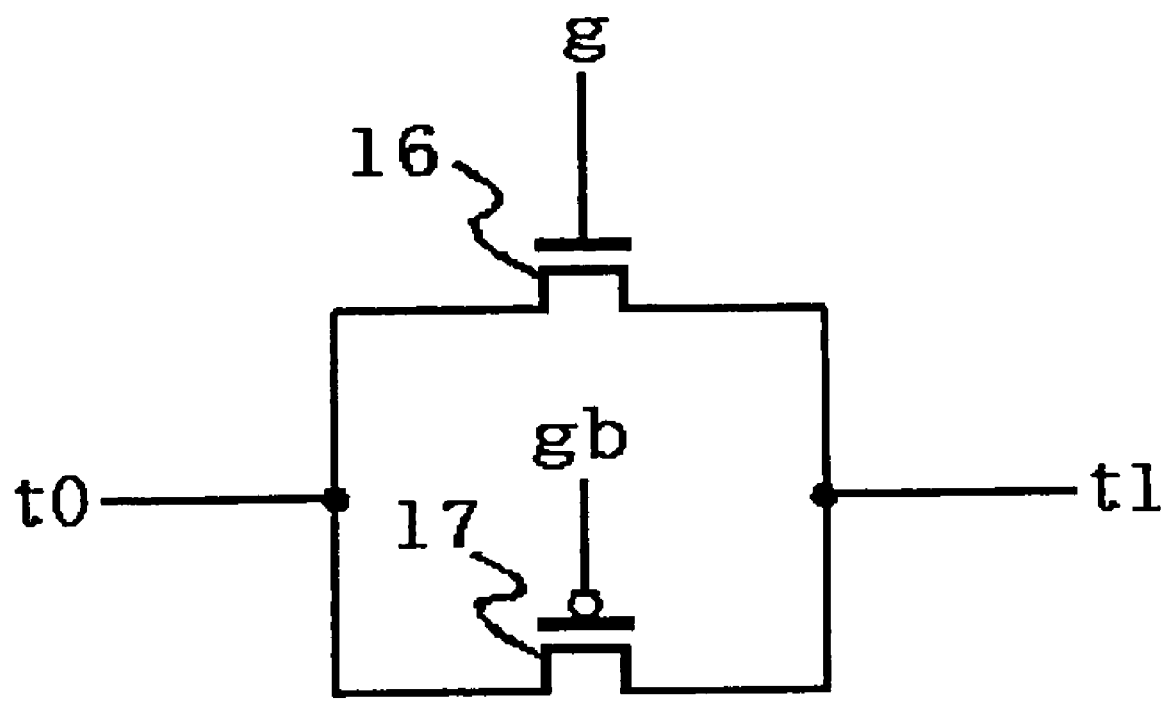
FIG. 4 is a circuit diagram showing an example of a transmission gate 12 shown in FIG. 3.

FIG. 4 is a circuit diagram showing an example of the transmission gate of FIG. 3. As is well-known, the transmission gate 12 uses a first I/O terminal t0 obtained by connecting drain terminals of an NMOS (n-channel metal-oxide-semiconductor) transistor 16 and a PMOS (p-channel MOS) transistor 17 and a second I/O terminal t1 obtained by connecting source terminals of the NMOS and the PMOS.

Other than this, the programmable switch 10 can be constructed by various ways. For example, see Japanese Patent Application Laid-open No. 11-353152.

Figure 5:
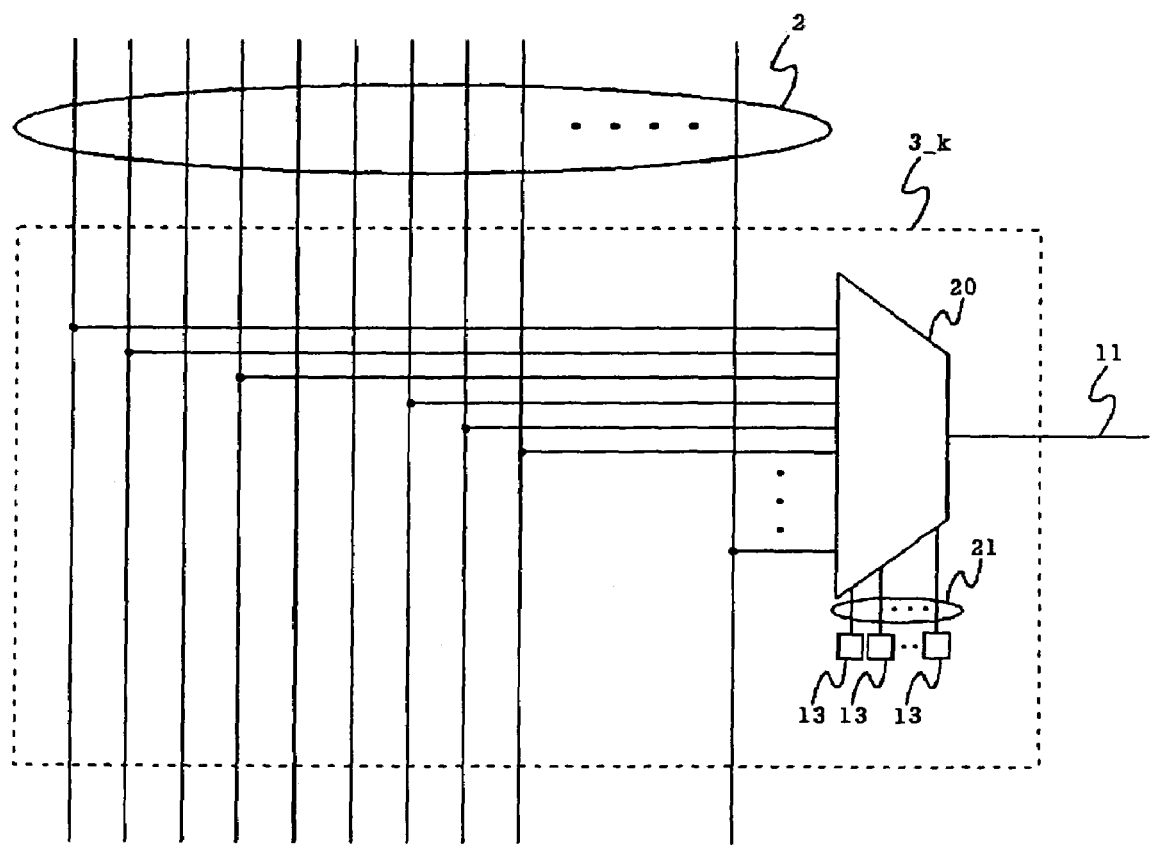
FIG. 5 is a block diagram showing a second example of the input selection unit used in the programmable function cell in FIG. 1.

FIG. 5 is a block diagram showing a second example of the input selection unit used in the programmable function cell of FIG. 1. This input selection unit 3_k connects one or more wires of the interconnection wire group 2 to inputs of a multiplexer 20 and connects the configuration memory 13 to control inputs 21 of the multiplexer 20. Depending on data stored in the configuration memory, one of the input signals of the multiplexer 20 is selected and outputted to an output line 11.

Similarly to the case of the aforementioned first example, all the wires of the interconnection wire group passing through the input selection unit 3_k are not necessarily connected to the multiplexer 20. Moreover, the connection between the interconnection wire group 2 and the multiplexer 20 may be different in each of the input selection units.

1.2) Function Block (First Embodiment)

Figure 6:
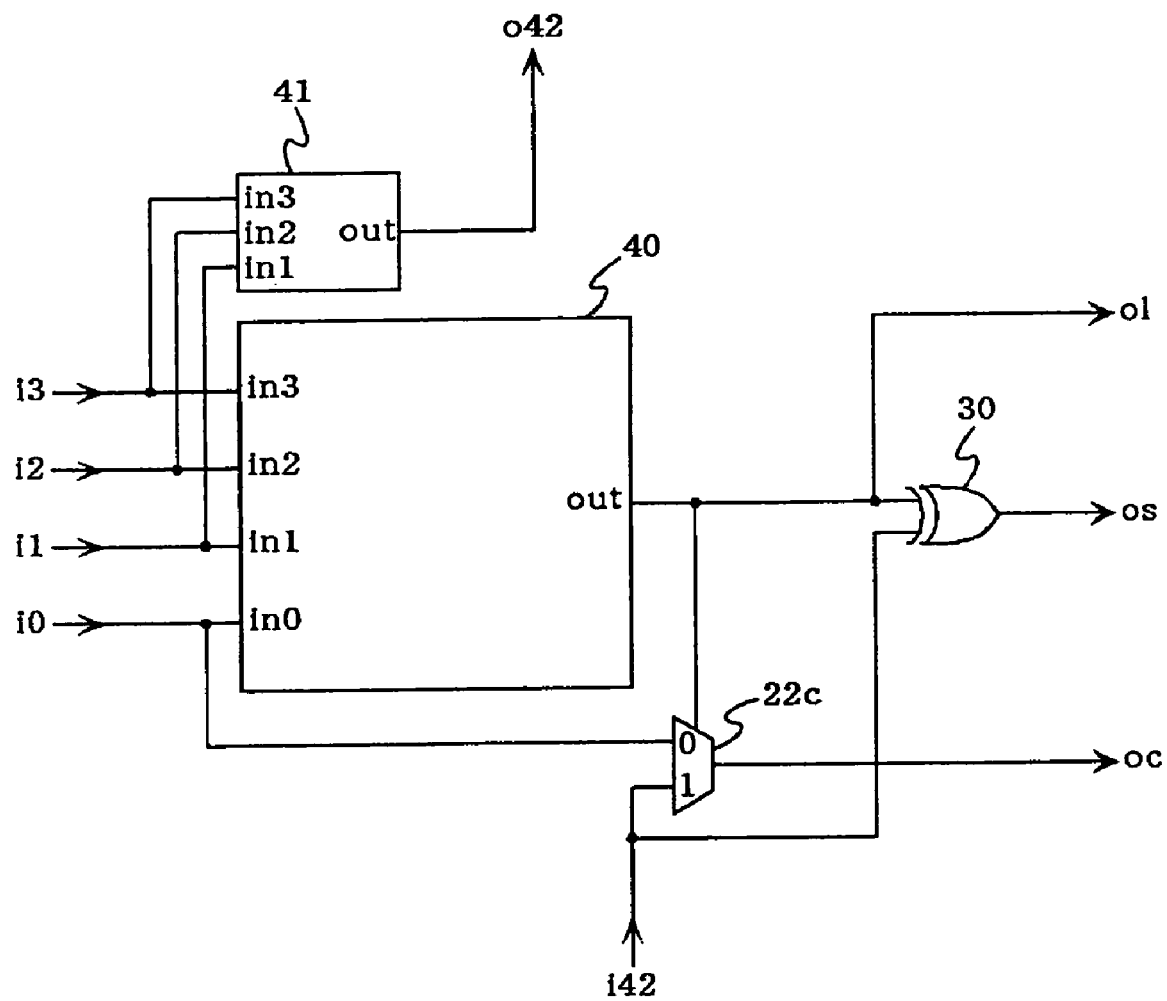
FIG. 6 is a block diagram showing configuration of a function block according to a first embodiment of the present invention.

FIG. 6 is a block diagram showing the configuration of a function block according to a first embodiment of the present invention.

The function block 4 according to the present embodiment is provided with a logic function generator 40, a 4-2 carry block 41, a 2-input MUX 22c, and an exclusive-OR circuit (XOR) 30. Inputs i1, i2, and i3 of the function block 4 are respectively connected to inputs in1, in2 and in3 of the logic function generator 40 and to inputs in1, in2 and in3 of the 4-2 carry block 41. An input i0 of the function block 4 is connected to input in0 of the logic function generator 40 and to an input-0 of the MUX 22c. An output out of the logic function generator 40 is connected to a control input of the MUX 22c and to a first input of the XOR 30. In addition, the output out of the logic function generator 40 also becomes a logic output o1 of the function block 4.

Figure 7:
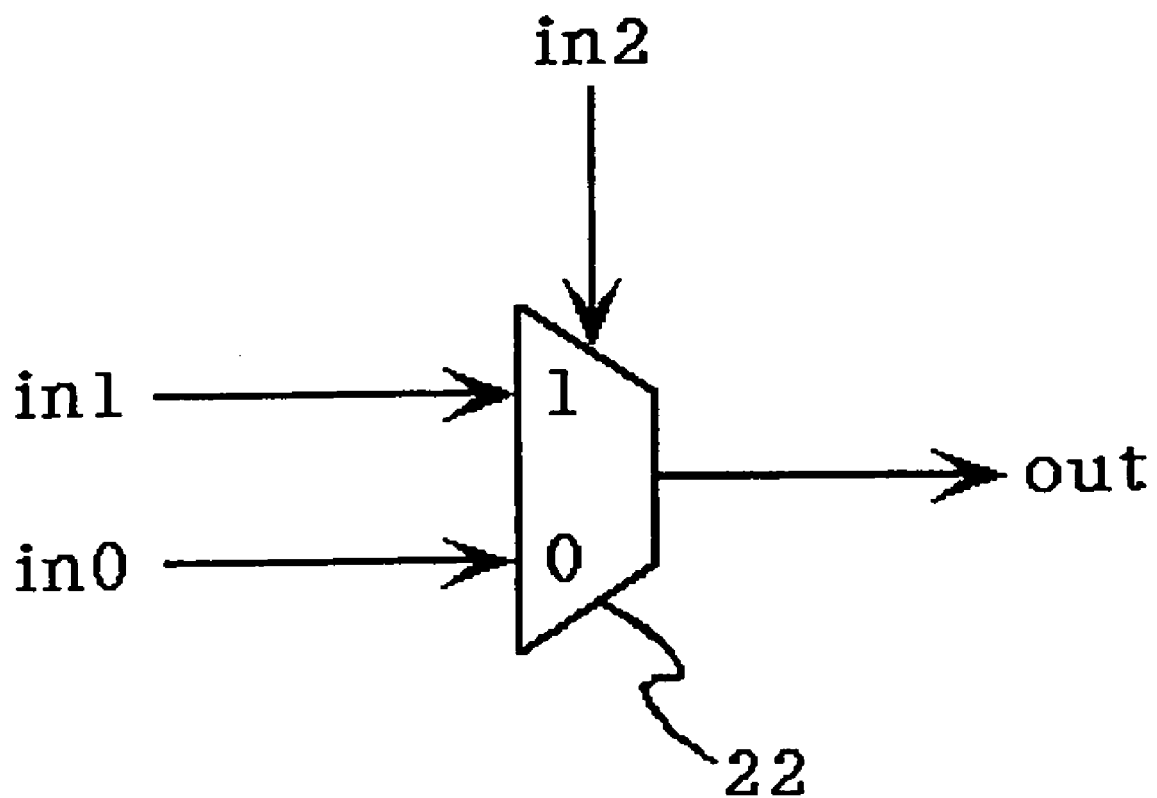
FIG. 7 is a circuit diagram for explaining a 2-input MUX.

A 4-2 carry input i42 of the function block 4 is connected to an input-1 of the MUX 22c and to a second input of the XOR 30. An output of the 4-2 carry block 41, an output of the XOR 30, and an output of the MUX 22c are a 4-2 carry output o42, an addition output os, and a carry output oc of the function block 4, respectively. Since the MUX 22c has been explained above, its explanation is omitted here (see FIG. 7).

Figure 105:
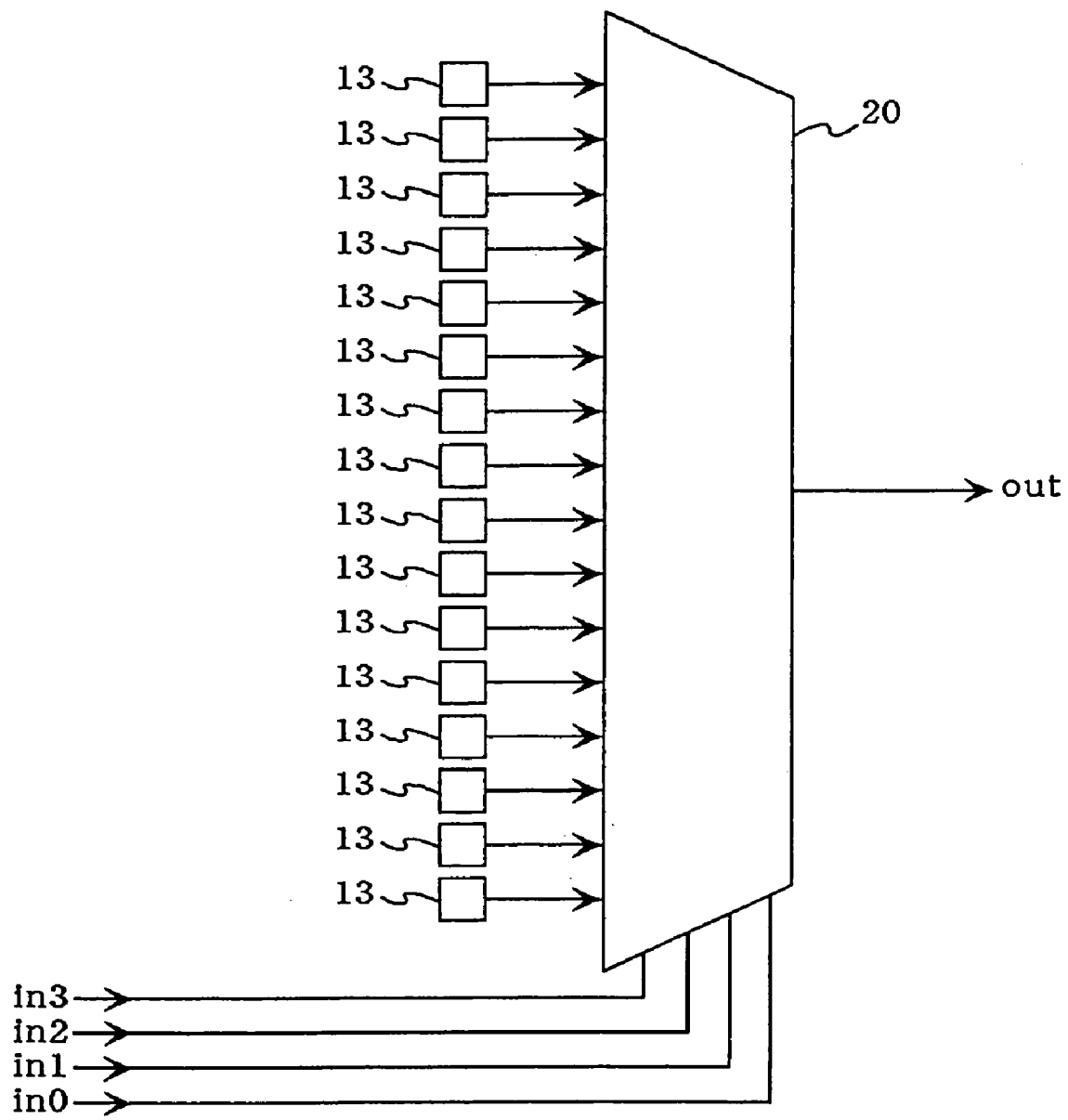
FIG. 105 is a circuit diagram showing an example of a logic function generator.
Figure 106:
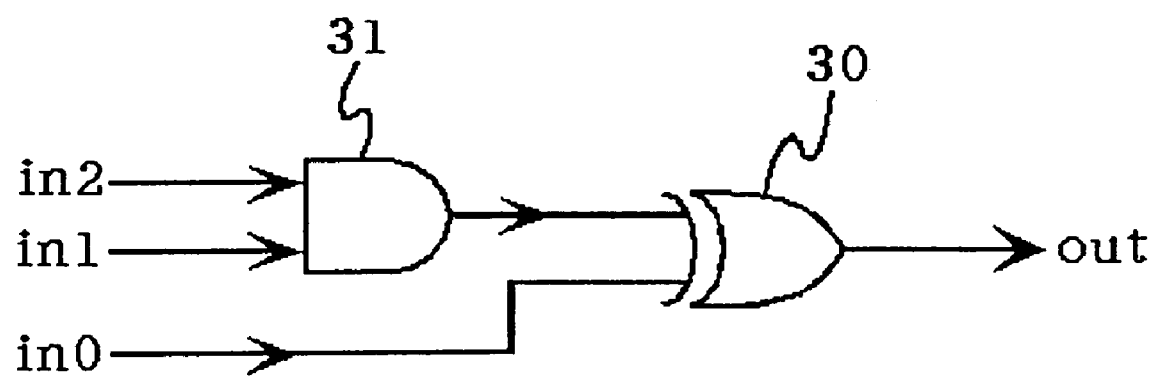
FIG. 106 is a diagram showing a circuit to be implemented in the logic function generator for constituting a multiplier.

The logic function generator 40 is a circuit that can implement various logic functions depending on data stored in a built-in configuration memory (not shown). Typically, a 4-input LUT as shown in FIG. 105 is implemented.

The 4-2 carry block 41 is a circuit that makes a carry signal that is generated when adding the inputs in1, in2 and in3. Hereinafter, several examples of the 4-2 carry block 41 will be described with reference to FIG. 8.

FIG. 8(1) is a circuit diagram showing a first example of the 4-2 carry block 41. The AND 31a uses inputs in3 and in1 to perform an AND function thereon and outputs its result to an OR circuit (OR) 32. Similarly, the AND 31b uses in1 and in2 to output its ANDed result to the OR 32, and the AND 31c uses in2 and in3 to output its ANDed result to the OR 32. The OR 32 performs an OR function on these three inputs to output the 4-2 carry signal o42. As can be seen from this configuration, the 4-2 carry block 41 is symmetric with respect to inputs in1, in2 and in3 (that is, the output does not change even if the inputs are replaced by each other).

FIG. 8(2) is a circuit diagram showing a second example of the 4-2 carry block 41. An output of the AND 31 using in2 and in3 as inputs is connected to a input-0 of a MUX 22; an output of an OR 33 using in2 and in3 as inputs is connected to an input-1 of the MUX 22; an input in1 is used as a control input of the MUX 22; and an output of the MUX 22 serves as out.

FIG. 8(3) is a circuit diagram showing a third example of the 4-2 carry block 41. An output of an AND 31b using in2 and in3 as inputs is connected to a first input of an OR 33b; an output of an OR 33a using in2 and in3 as inputs is connected to a first input of an AND 31a; the input in1 serves as a second input of the AND 31a; an output of the AND 31a is connected to a second input of the OR 33b; and an output of the OR 33b serves as out.

FIG. 8(4) is a circuit diagram showing a fourth example of the 4-2 carry block 41. In this fourth example, the OR 33a in the third example is replaced by the XOR 30.

FIG. 8(5) is a circuit diagram showing a fifth example of the 4-2 carry block 41. An output of the XOR 30 using in2 and in3 as inputs serves as a control input of the MUX 22; in2 (or in 3) is connected to the input-0 of the MUX 22; in1 serves as the input-1 of the MUX 22; and an output of the MUX 22 serves as out.

FIG. 8(6) is a circuit diagram showing a sixth example of the 4-2 carry block 41. An output of a NAND 34 using in2 and in3 as inputs is connected to the input-0 of the MUX 22; an output of an NOR 35 using in2 and in3 as inputs is connected to the input-1 of the MUX 22; the input in1 serves as a control input of the MUX 22; and an inverted output of the MUX 22 serves as out. In this example, the output of each logic gate 31, 33 and 22 in the second example is inverted. In general, with regard to a logic gate, as compared to an AND and an OR, an NAND and an NOR whose outputs are inverted can be made easily and the delay is smaller. Accordingly, the sixth example is superior to the second example with respect to the area and the delay.

FIG. 8(7) is a circuit diagram showing a seventh example of the 4-2 carry block 41. An output of the NAND 34 using in2 and in3 as inputs is connected to a first input of an OAI (OR-AND-INVERT) 36; an output of the NOR 35 using in2 and in3 as inputs is connected to a second input of the OAI 36; an output of an inverter 37 using in1 as the input is connected to a third input of the OAI 36; and an output of the OAI 36 serves as out. Here, the OAI 36 is a logic gate outputting an NAND-ed result of the first input and an OR-ed result of the second and the third input. This can also be formed by combining separated OR and NAND but sometimes it is better to form it as an indivisible logic gate from the viewpoint of occupied area and propagation delay. In the seventh example, outputs of the respective logic gates of the third example are inverted.

In addition to the examples of FIG. 8, various modifications are possible which can easily be devised by those skilled in the art such as logic inversion. Moreover, it is possible to use a 3-input logic function generator (such as a 3-input LUT) where various logic circuits can be implemented as the 4-2 carry block 41. In this case, there is an advantage that it can be used for generating a 4-2 carry output o42 or for other purposes as will be detailed later, depending on the configuration.

1.3) Output Block

Figure 9:
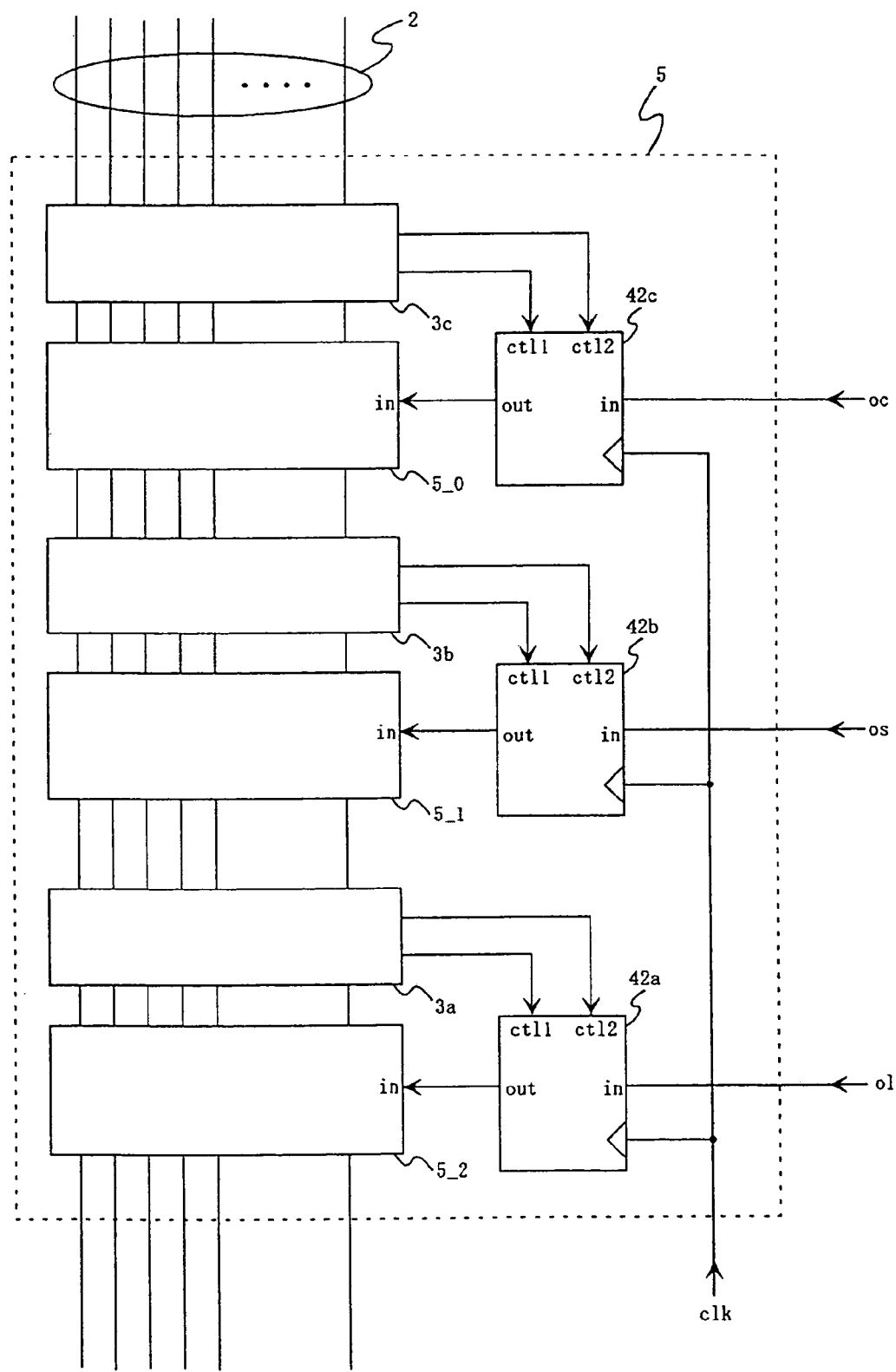
FIG. 9 is a block diagram showing a first example of an output block in FIG. 1.

FIG. 9 is a block diagram showing a first example of the output block in FIG. 1. The respective signals oc, os and ol are fed to inputs of register blocks 42c, 42b and 42a, respectively, which are supplied with a clock signal clk. Each of the register blocks 42a, 42b and 42c outputs its input signal directly or after temporarily holding in a register controlled by the clock signal clk, in accordance with the configuration data.

The outputs of the register blocks 42a, 42b and 42c are connected to inputs of output selection units 5_2, 5_1 and 5_0, respectively. The respective output selection units 5_0, 5_1 and 5_2, in accordance with the configuration data, output the input signals in to one or more wires of the interconnection wire group 2 or do not output to any of them. The register blocks 42c, 42b and 42a have some control inputs (in FIG. 9, two control inputs ctl1 and ctl2) which are connected to input blocks 3c, 3b and 3a, respectively. Connection between an input block and the interconnection wire group 2 may differ in each of the input blocks 3c, 3b and 3a.

Figure 10:
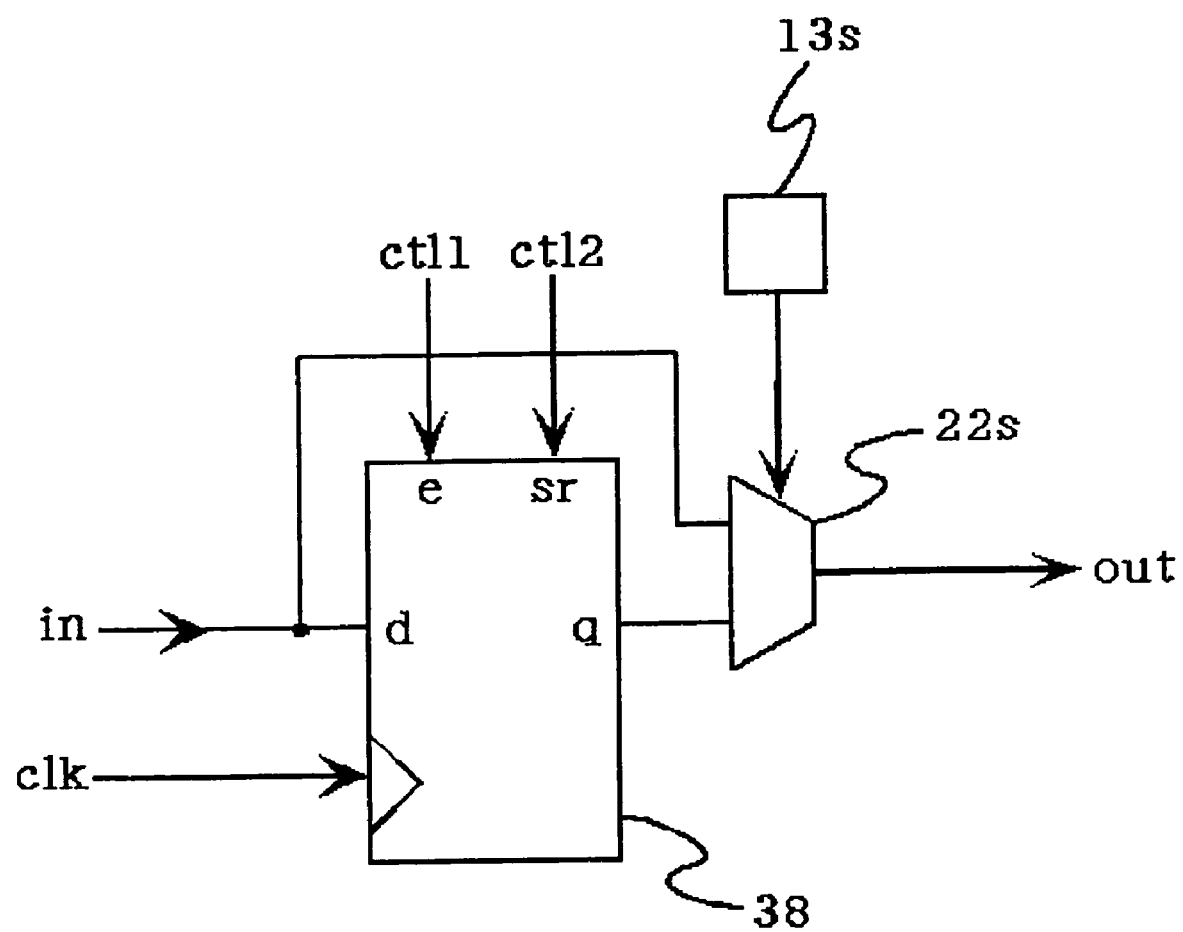
FIG. 10 is a block diagram showing an example of a register block in FIG. 9.

FIG. 10 is a block diagram showing an example of the register block in FIG. 9. An input in of the register block 42 is connected to a data input d of a D-flip-flop (FF) 38 and to one of the inputs of the MUX 22s; a data output q of the D-FF 38 is connected to the other of the inputs of the MUX 22s; and an output of the MUX 22s serves as an output out of the register block 42.

The D-FF 38 is supplied with the clock signal clk and several control signals. Here, the two control inputs of the register block 42 are ctl1 and ctl2. There are various types of control input of the D-FF. For example, a clock enable e and a set/reset sr can be used with a high usability. The control input of the MUX 22s is connected with an output of the configuration memory 13s and, in accordance with the content of the configuration memory 13s, the input in is output to out directly or after being registered in the D-FF in synchronization with the clock signal clk.

In this disclosure, if the two inputs are connected to the MUX regardless of which is connected to input-0 (or input-1), symbols 0 and 1 of the MUX are in some cases omitted as in the MUX 22s of FIG. 10.

Figure 11:
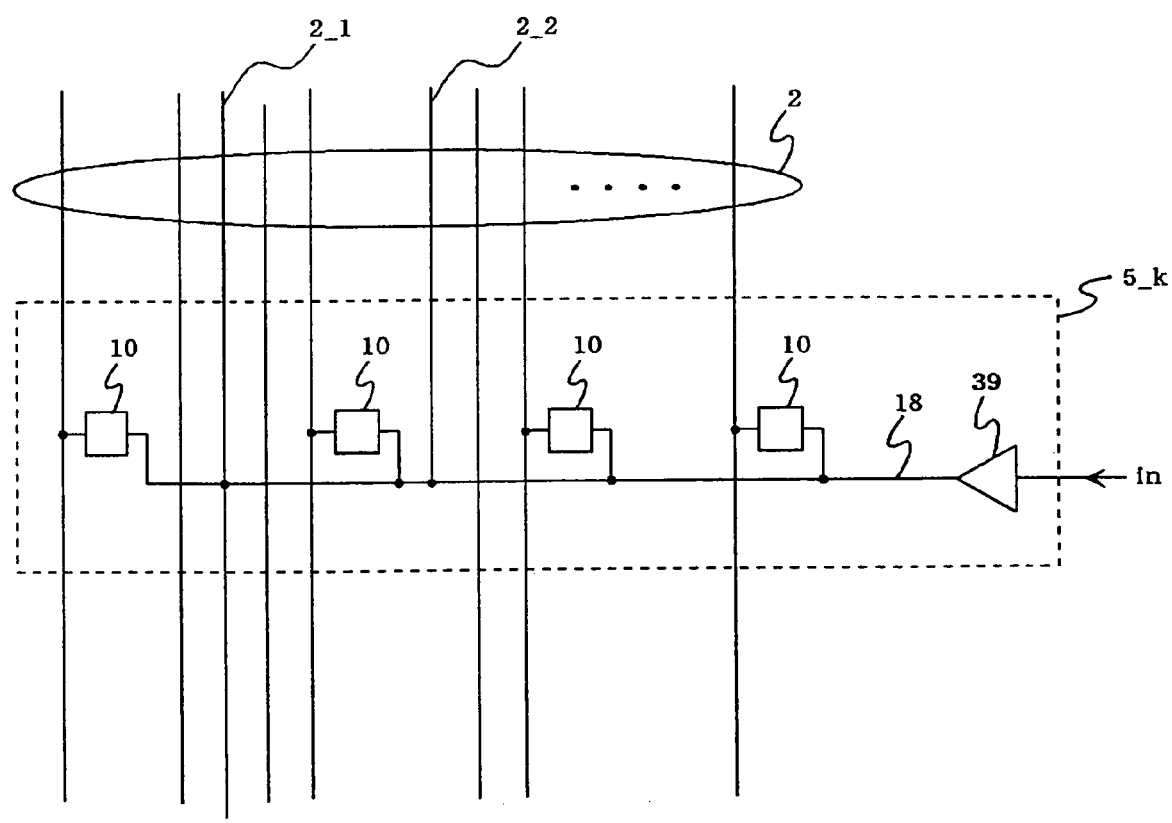
FIG. 11 is a block diagram showing a first example of an output selection unit in FIG. 9.

FIG. 11 is a block diagram showing a first example of an output selection unit in FIG. 9. An input signal of the output selection unit $5_{13}$ k (k=0, 1, . . . ) is input to a buffer 39, whose output 18 is connected to one terminals of the respective programmable switches 10. The other terminal of each of the programmable switches 10 is connected to a different wire of the interconnection wire group 2. The output 18 of the buffer 39 is not necessarily connected to all the wires of the interconnection wire group 2 passing through the output selection unit 5_k via the programmable switches 10. Moreover, as shown by reference numerals 2_1 and 2_2 in FIG. 11, some wires of the interconnection wire group 2 may be connected directly to the output 18 of the buffer 39. The interconnection wire group 2 may be connected to the output selection unit 5_k (k=0, 1, . . . ) in different ways.

Figure 12:
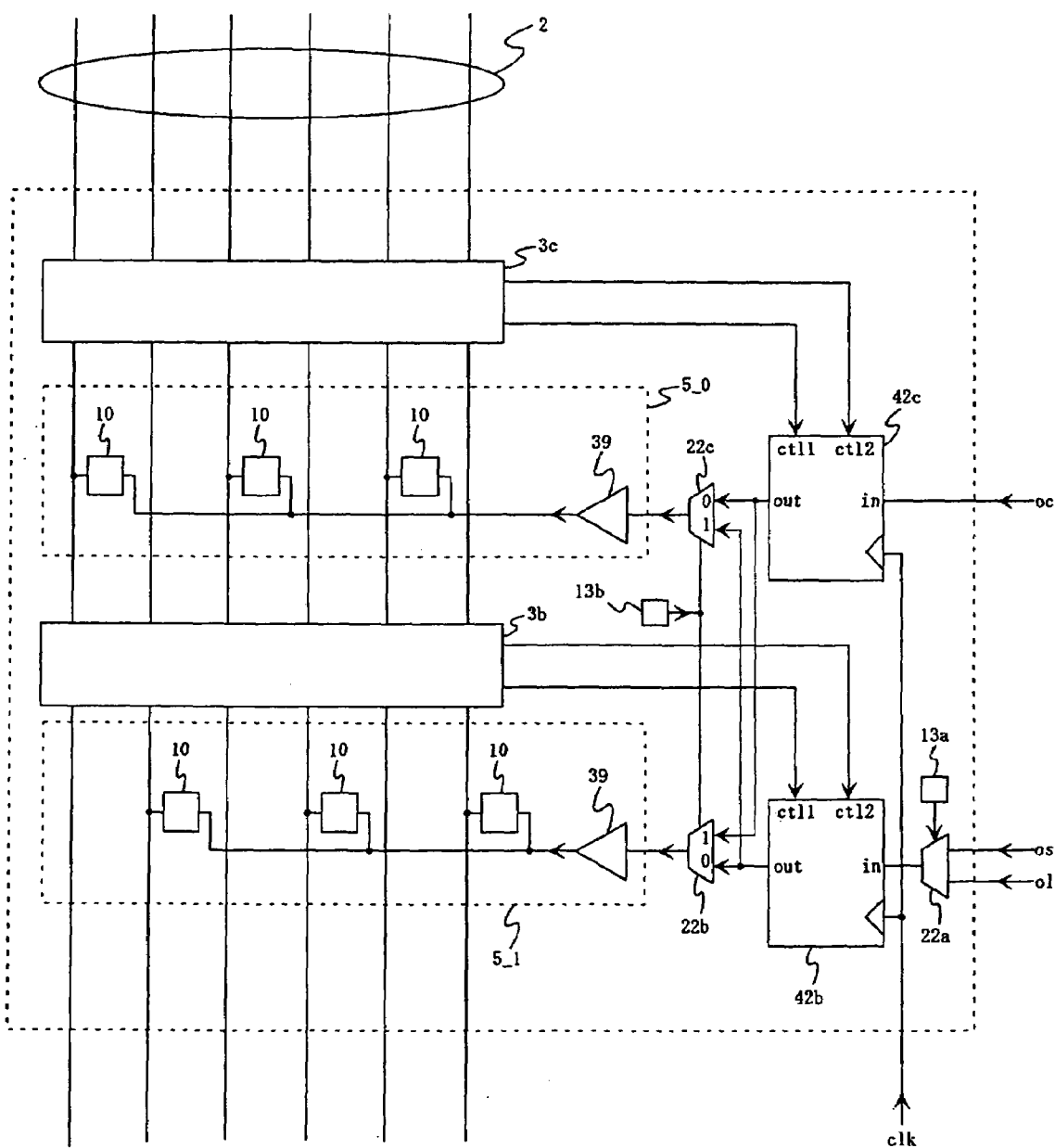
FIG. 12 is a block diagram showing a second example of the output selection unit in FIG. 9.

FIG. 12 is a block diagram showing a second example of the output selection unit in FIG. 9. An MUX 22a selects one from input signals os and ol depending on data stored in the configuration memory 13a and outputs the selected one to the input of the register block 42b. The signal oc is input to the input of the register block 42c. Moreover, the control inputs (ctl1, ctl2) of the register blocks 42b and 42c are connected to the outputs of the input blocks 3b and 3c, respectively. An output of the register block 42c is connected to the input-0 of the MUX 22c and to the input-1 of the MUX 22b; an output out of the register block 42b is connected to the input-1 of the MUX 22c and to the input-0 of the MUX 22b; and control inputs of the MUX 22c and MUX 22b are both connected to the output of the configuration memory 13b, respectively. When a logical value of 0 is held in the configuration memory 13b, outputs of the register blocks 42b and 42c are respectively connected to the output selection units 5_1 and 5_0. When a logical value of 1 is held in the configuration memory 13b, outputs of the register blocks 42b and 42c are respectively connected to the output selection units 5_0 and 5_1.

The output selection units 5_0 and 5_1 are respectively connected to even-numbered wires and odd-numbered wires of the interconnection wire group 2 (six wires are shown in FIG. 12) via the programmable switches 10.

As compared to the first example (FIG. 9), in the second example of the output block 5 (FIG. 12), the numbers of input blocks 3, the output selection units 5_k (k is an integer), and the register blocks 42 are reduced, which advantageously reduces the occupied area. This is realized by the MUX 22a selecting only one of the signals os and ol.

In the function block 4 shown in FIG. 6, there is scarcely a case that the three outputs os, ol and oc are simultaneously used. Accordingly, there is no need of providing each of the three outputs individually with the input block 3, the output selection unit 5_k (k is an integer) and the register block 42. Thus, as in the second example of the output block 5 (FIG. 12), it is more effective that firstly input signals are reduced to two and then the input selection unit, the output selection unit and the register block are provided for these signals.

Moreover, in the second example of the output block 5 (FIG. 12), by using the MUX 22c and MUX 22b, it is possible to exchange the outputs of the register blocks 42b and 42c to be given to the output selection units 5_0 and 5_1 in accordance with the content of the configuration memory 13b. The respective output selection units are connected to only half of wires of the interconnection wire group 2. However, the register block can output to any of the output selection units in accordance with the content of the configuration memory 13b and, therefore, can output to all the wires of the interconnection wire group 2.

In this manner, while assuring routability, the number of the programmable switches 10 in the output selection unit can be reduced by half, thereby decreasing the occupied area.

In the example of FIG. 12, the MUX 22c and 22b exchanging signals are arranged at the output side of the register blocks 42b and 42c. However, the same effect can be obtained when they are arranged at the input side so as to exchange input signals of two register blocks. Moreover, it may be allowable in FIG. 12 that the signals os and oc are replaced with each other and the MUX 22a selects one signal from oc and ol.

However, such an arrangement in FIG. 12 that signals ol and oc are replaced with each other and one signal is selected from oc and os, or one signal is selected from signals ol, oc and os so that only one register block and one output selection unit are used cannot achieve the object of the present invention. Because, as will be described later, in order to achieve the object of the present invention oc and os should be simultaneously output to the interconnection wire group.

1.4) Operation

Next, an operation and effect of the programmable function cell having the aforementioned configuration will be described. The programmable function cell has a logic operation mode and a 4-2 adder operation mode.

1.4.1) Logic Mode

The first operation mode is similar to the programmable function cell in the conventional PLD and FPGA; that is, the cell is used as a component of various circuits that are implemented on a reconfigurable device by setting various logic functions. This operation mode is called a logic mode.

In the logic mode, in the programmable function cell 1 of FIG. 1, the output block 5 is configured so that the logic output ol of the function block 4 is output to the interconnection wire group 2. Since the logic output ol is an output itself of the logic function generator 40 of the function block 4 (FIG. 6), the programmable function cell 1 in the logic mode can be used as an arbitrary logic circuit that can be realized by the logic function generator 40.

1.4.2) 4-2 Adder Mode

The second operation mode is to use the programmable function cell 1 of FIG. 1 as a 4-2 adder. This operation mode is called a 4-2 adder mode. In the 4-2 adder mode, a 4-input XOR is implemented in the logic function generator 40 of the function block 4 (see FIG. 6).

Figure 13:
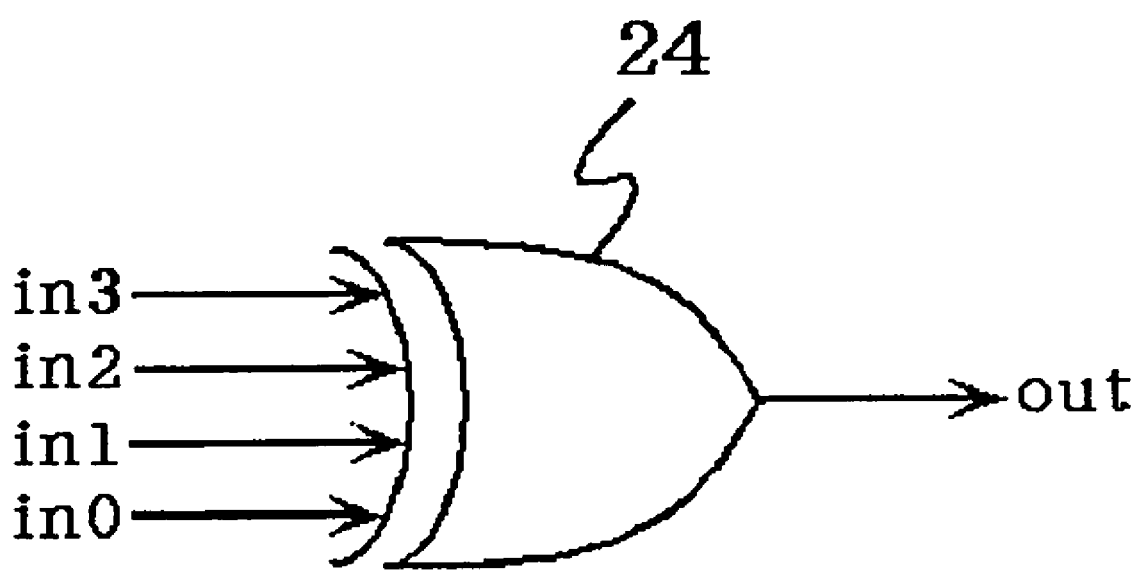
FIG. 13 shows a 4-input XOR 24 to be implemented in a logic function generator 40 of a function block 4 in a 4-2 adder mode.

FIG. 13 shows a 4-input XOR 24 implemented in the logic function generator 40 of the function block 4. In FIG. 13, four inputs in0, in1, in2 and in3 and one output out of the 4-input XOR 24 correspond to the respective inputs and output of the same reference symbols in the logic function generator 40 as shown in FIG. 6.

Figure 14:
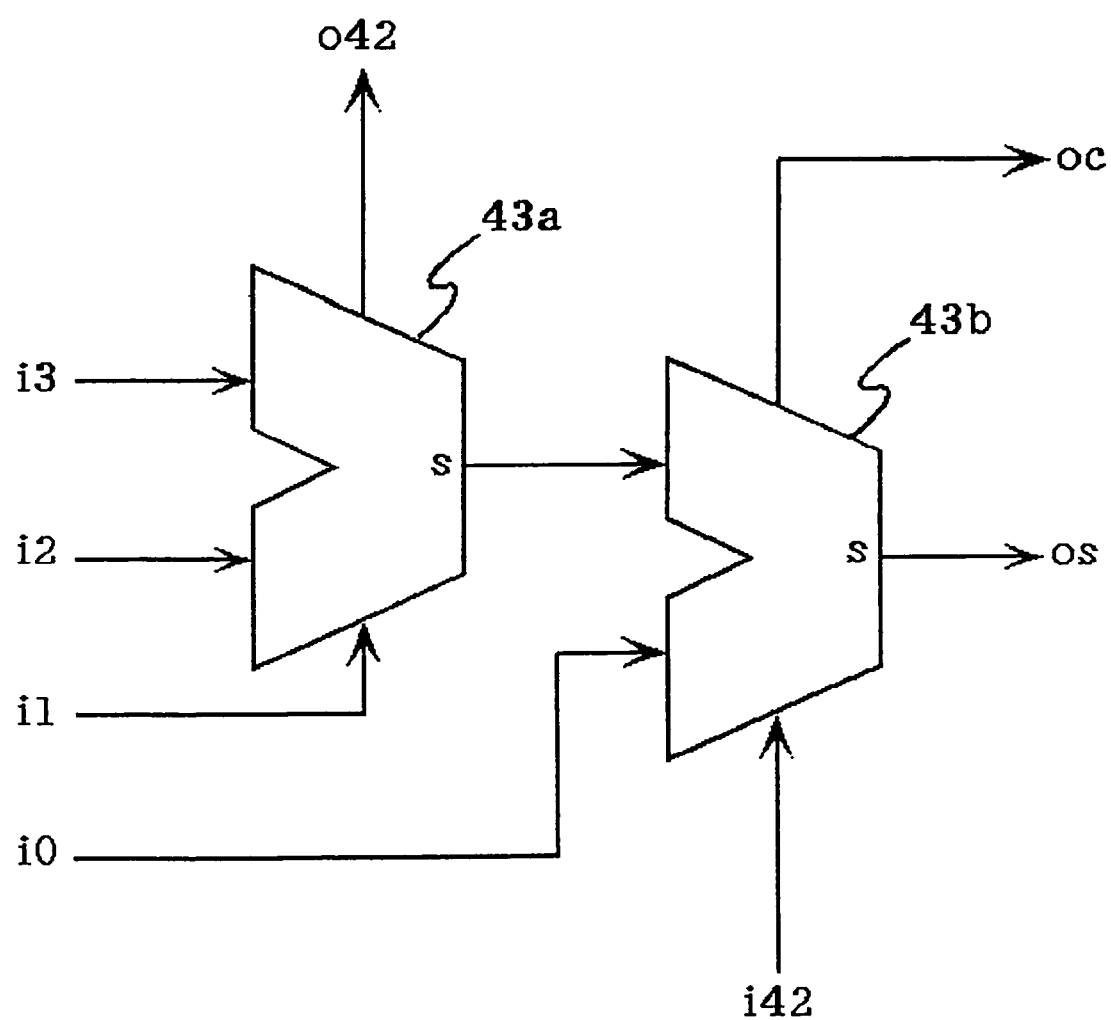
FIG. 14 shows a circuit equivalent to the 4-2 adder.

Thus, the function block 4 having the logic function generator 40 where the 4-input XOR 24 is implemented has a function identical to that of a 4-2 adder as shown in FIG. 14.

(Equivalent Circuit of 4-2 Adder)

FIG. 14 is a diagram showing an equivalent circuit of the 4-2 adder. Inputs i0, i1, i2, i3 and i4 and outputs o42, os and oc of the 4-2 adder correspond respectively to the inputs and outputs denoted by the same reference symbols in the function block 4 of FIG. 6. Since the 4-2 adder 44 has an addition output os and a carry output oc, the output block 5 of the programmable function cell 1 should output the outputs os and oc of the function block 4 simultaneously to different wires of the interconnection wire group 2, respectively.

In FIG. 14, argument inputs i1, i2 and i3 of the 4-2 adder 44 are input to the carry input ic and argument inputs a and b of the 1-bit full adder 43a, respectively; while the 4-2 carry input i42 and the argument input i0 of the 4-2 adder 44 and the addition output s of the 1-bit full adder 43a are input to the carry input ic and the argument inputs a and b of the 1-bit full adder 43b, respectively. The carry output of the 1-bit full adder 43a and the addition output s and the carry output oc of the 1-bit full adder 43b serve as a 4-2 carry output o42, an addition output os, and a carry output oc of the 4-2 full adder 44, respectively.

In the 4-2 adder mode, the function block 4 of FIG. 6 has an I/O relation (truth table) equivalent to the circuit of FIG. 14 but the function block 4 of FIG. 6 cannot be dissolved into two 1-bit full adders as in the circuit of FIG. 14.

(Use and Advantage of 4-2 Adder)

Figure 15:
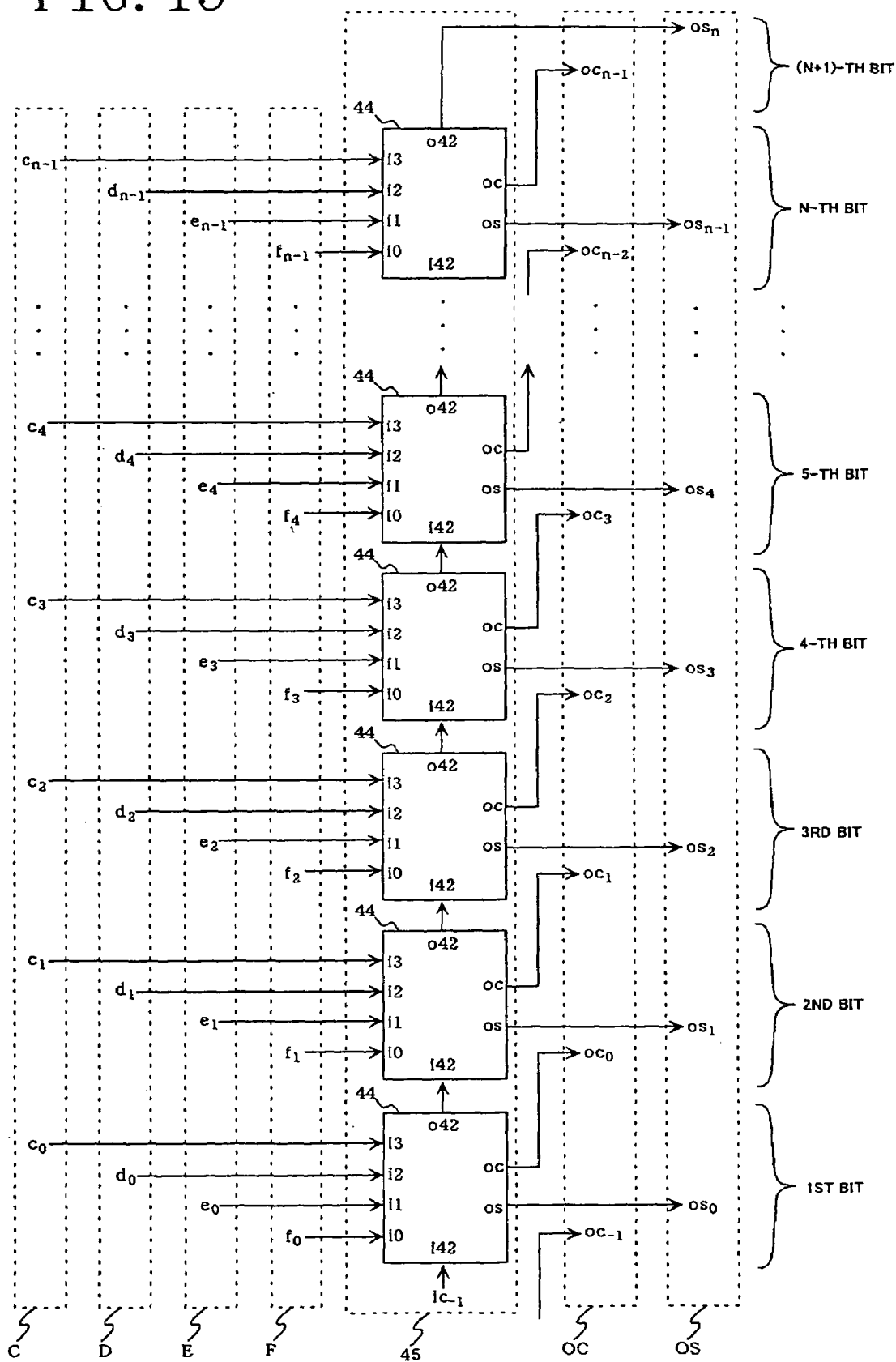
FIG. 15 is a circuit diagram of a multi-bit adder in which pluralities of 4-2 adders are arranged.

FIG. 15 is a circuit diagram showing a multi-bit 4-2 adder circuit in which plural 4-2 adders are arranged. As shown in this figure, in general, plural 4-2 adders are connected to form a multi-bit 4-2 adder circuit 45, in which the 4-2 adders 44 are arranged in one row and a 4-2 carry output o42 and a 4-2 carry input i42 are connected to each other between adjacent 4-2 adders. This circuit is designed to perform carry-save addition of multi-bit data.

In FIG. 15, in general, an n-bit 4-2 adder circuit 45 creates a (n+1)-bit addition output OS and a (n+1)-bit carry output OC from four n-bit argument inputs C, D, E and F. Here, the respective k-th (k=1, 2, ... n) bits of C, D, E and F, each denoted by $c_{k-1}$, $d_{k-1}$, $e_{k-1}$ and $f_{k-1}$, are input to argument inputs i3, i2, i1 and i0 of the k-th 4-2 adder 44 in the n-bit 4-2 adder circuit 45, respectively. In the n-bit 4-2 adder circuit 45, an addition output $os_{k-1}$ of the k-th 4-2 adder 44 serves as the k-th bit of the (n+1)-bit addition output OS; and a 4-2 carry output o42 of the n-th 4-2 adder 44 serves as the (n+1)-th bit (i.e., MSB) $os_n$ of the (n+1)-bit addition output OS. In the n-bit 4-2 adder circuit 45, a carry output $oc_{k-1}$ of the k-th 4-2 adder 44 serves as the (k+1)-th bit of the (n+1)-bit carry output OC; and the first bit (LSB) $oc_{-1}$ of the (n+1)-bit carry output OC is a signal supplied from another circuit or a fixed logical value. The carry input $ic_{-1}$ of the first 4-2 adder 44 of the n-bit 4-2 adder circuit 45 is also a signal supplied from another circuit or a fixed logical value. When adding all of the four n-bit argument inputs C, D, E and F, both of $oc_{-1}$ and $ic_{-1}$ have a logical value of 0. When a subtraction is made on one of the n-bit argument inputs, one of $oc_{-1}$ and $ic_{-1}$ has a logical value of 0 and the other has a logical value of 1. When a subtraction is made on two of the n-bit argument inputs, both of them have a logical value of 1.

Complete-tree Multi-bit Multi-argument Adder

FIG. 16(1) is a block diagram showing an example of a complete-tree-type multi-bit multi-argument adder using the 4-2 adder. Here is exemplified a multi-bit multi-argument adder that produces an addition result of 16 pieces of multi-bit data: C, D, E, F, G, H, I, J, K, L, M, N, 0, P, Q and R.

First, the multi-bit data C, D, E and F are input to multi-bit argument inputs I3, I2, I1 and I0 of the multi-bit 4-2 adder circuit 45_1, respectively (this is the same as the example shown in FIG. 15); the multi-bit data G, H, I and J are input to multi-bit argument inputs I3, I2, I1 and I0 of the multi-bit 4-2 adder circuit 45_2, respectively; the multi-bit data K, L, M and N are input to multi-bit argument inputs I3, I2, I1 and I0 of the multi-bit 4-2 adder circuit 45_3, respectively; and the multi-bit data O, P, Q and R are input to multi-bit argument inputs I3, I2, I1 and I0 of the multi-bit 4-2 adder circuit 45_4, respectively. Here, the multi-bit argument input I0 of the multi-bit 4-2 adder circuit 45_k (k is an integer) corresponds to the argument input i0 of the first to the n-th 4-2 adders constituting the multi-bit 4-2 adder circuit. It is the same with the multi-bit argument inputs I1, I2 and I3.

Next, a multi-bit addition output OS and a multi-bit carry output OC of the multi-bit 4-2 adder circuit 45_2, and a multi-bit addition output OS and a multi-bit carry output OC of the multi-bit 4-2 adder circuit 45_1 are input to the multi-bit argument inputs I0, I1, I2 and I3 of the multi-bit 4-2 adder circuit 45_5, respectively. Moreover, a multi-bit addition output OS and a multi-bit carry output OC of the multi-bit 4-2 adder circuit 45_4, and a multi-bit addition output OS and a multi-bit carry output OC of the multi-bit 4-2 adder circuit 45_3 are input to the multi-bit argument inputs I0, I1, I2 and I3 of the multi-bit 4-2 adder circuit 45_6, respectively.

Next, a multi-bit addition output OS and a multi-bit carry output OC of the multi-bit 4-2 adder circuit 45_6, and a multi-bit addition output OS and a multi-bit carry output OC of the multi-bit 4-2 adder circuit 45_5 are input to the multi-bit argument inputs I0, I1, I2 and I3 of the multi-bit 4-2 adder circuit 45_7, respectively. Lastly, a multi-bit addition output OS and a multi-bit carry output OC of the multi-bit 4-2 adder circuit 45_7 are input to the multi-bit argument inputs A and B of a multi-bit full adder circuit 46, respectively. Finally, an addition result of the multi-bit data C, D, E, F, G, H, I, J, K, L, M, N, O, P, Q and R is yielded as a multi-bit addition output S of the multi-bit full adder 46.

As is found from FIG. 16(1), the multi-bit 4-2 adder circuit 45 has a function of reducing four inputs to two outputs. By utilizing this function, by halving the number of pieces of data to be added in each stage, and the last two remaining pieces of data are added by an ordinary multi-bit full adder to yield a final addition result. This is the way of the multi-bit multi-argument adder of FIG. 16(1). Accordingly, the multi-bit full adder is certainly required at the last stage. Detailed description using the programmable function cell according to the present invention will be given later.

The respective 4-2 adders 44 constituting the aforementioned multi-bit 4-2 adder circuit 45 (see FIG. 15) can be realized with a single programmable function cell by using the function block according to the present invention shown in FIG. 6.

Figure 104:
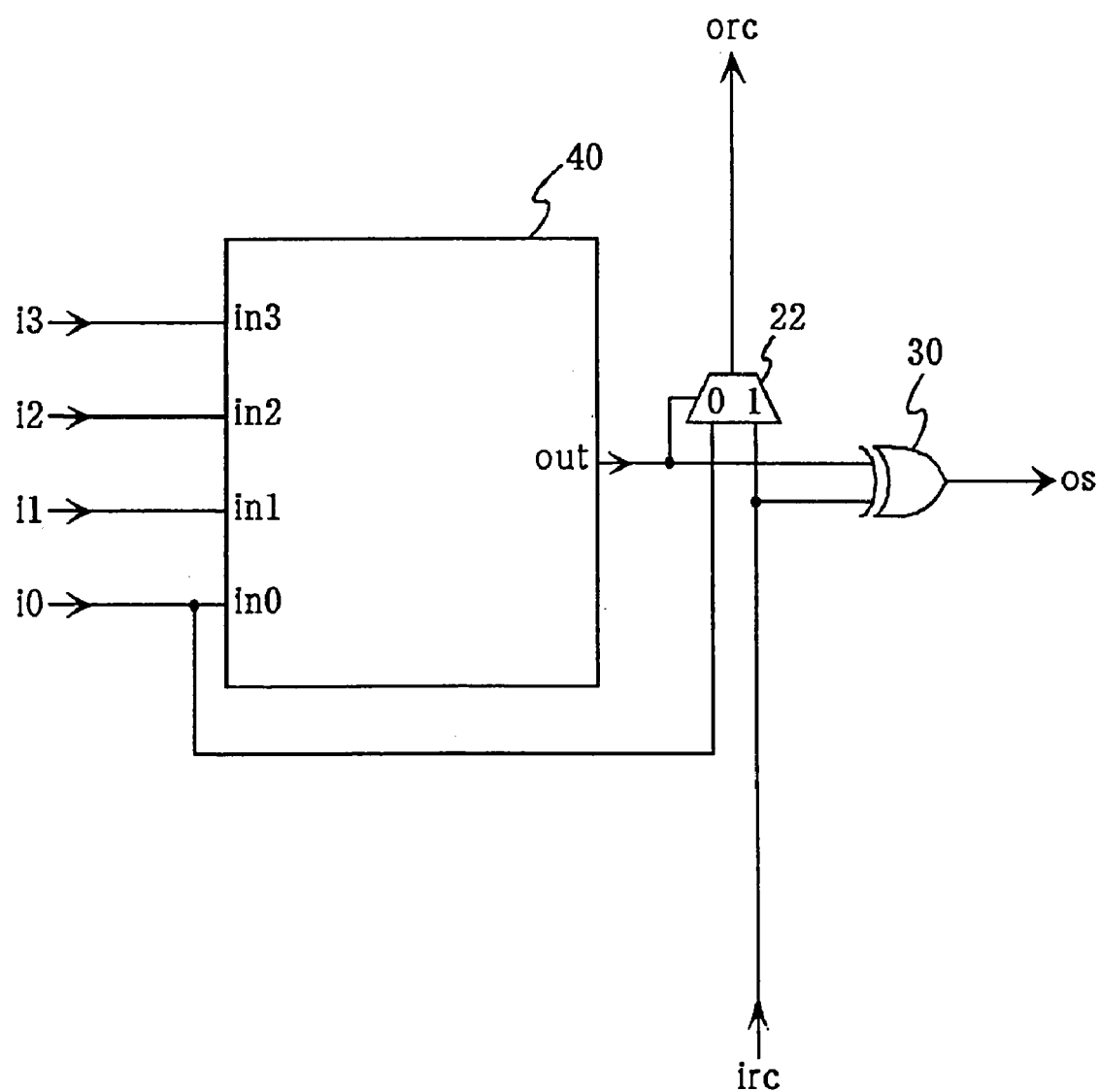
FIG. 104 is a circuit diagram showing an example of a conventional FPGA function block.

On the other hand, in the conventional function block (see FIG. 104) as well as a programmable function cell including one conventional function block, only one-bit full adder can be implemented and accordingly, as is seen from FIG. 14, in order to create the 4-2 adder 44, two programmable function cells should be connected in cascade. That is, for adding the same number of pieces of data, the conventional programmable function cell requires twice the number of cells required by the programmable function cell of the present invention (except for the multi-bit full adder of the last stage).

Now the function block of the present invention (as shown in FIG. 6) differs from the conventional function block (FIG. 104) only by one 4-2 carry block 41. As shown in FIG. 1, this is a very small area as compared to the entire programmable function cell including the input block 3 and the output block 5 occupying a large area. That is, the programmable function cell of the present invention occupies almost the same area as that of the conventional one. Moreover, both function blocks have a configuration that data propagates through the same number of stages formed with the same logic circuit. Accordingly, propagation delay of the programmable function cell of the present invention is the same as that of the conventional function cell.

From the aforementioned fact, when adding the same number of values, the programmable function cell of the present invention needs only one-half the area required for the conventional programmable function cell (aside from the multi-bit full adder of the last stage). Moreover, with regard to delay, as compared to the conventional programmable function cell in which two cells are connected in series to configure one 4-2 adder, the delay of the programmable function cell of the present invention is halved (aside from the multi-bit full adder of the last stage).

In the multi-bit multi-argument adder of FIG. 16(1), a delay from the data input until the last addition result is obtained corresponds to the four stages of computation blocks from the first to the fourth, as shown in the figure. Moreover, only eight computation blocks 45_1 to 45_7 and 46 are needed in total.

FIG. 16(1) shows a specific example of multi-bit 16-argument adder but this is only one example. In general, when adding 2k pieces of multi-bit data, the number of values is reduced to 2k−1 by the computation block of the first stage (consisting of 2k−2 multi-bit 4-2 adders), and to 2k−2 by the computation block of the second stage (consisting of 2k−3 multi-bit 4-2 adders). Thus, the number of values is reduced by half in each stage and when the number of values has become 2 through the computation block of the (k−1)-th stage (one multi-bit 4-2 adder), the two pieces of data are added by using the multi-bit full adder to yield a final result. Here, 2k−1−1 multi-bit 4-2 adders are used in total and the delay is determined by k−1 stages of the computation block (except the multi-bit full adder of the last stage). When the number of input data, 2k, is large, the area occupied by the multi-bit full adder and the delay at the last stage occupy only a small ratio as a whole. Such a complete-tree multi-bit multi-argument adder is characterized in that it has the smallest delay as compared to the other types of multi-bit multi-argument adder which will be detailed later.

The complete-tree type multi-bit multi-argument adder using the 4-2 adder has been described. In addition, there are various types of complete-tree type multi-bit multi-argument adder. Among them, the one most suitable for the conventional function block (FIG. 104) is shown in FIG. 16(2).

FIG. 16(2) is a block diagram showing an example of complete-tree type multi-bit multi-argument adder using a full adder. Here, there is exemplified a complete-tree type multi-bit multi-argument adder using multi-bit full adders 46_1 to 46_15. In the conventional function block (FIG. 104), a 1-bit full adder can be realized by one block and accordingly, as shown in FIG. 16(2), the complete-tree type multi-bit multi-argument adder using multi-bit full adders has a better efficiency. Actually, in this case, the delay is identical to that of the complete-tree type multi-bit multi-argument adder created by implementing a 4-2 adder in the programmable function cell of the present invention shown in FIG. 16(1).

However, the number of computation blocks, i.e., the occupied area of FIG. 16(1) is one-half that of FIG. 16(2) again. The complete-tree type multi-bit multi-argument adder as shown in FIG. 16(1) has an advantage that it has a highest speed but also has a disadvantage that wiring is irregular and complicated. The complexity of the wiring increases rapidly as the number of pieces of data to be added is increases, i.e., as the number of stages of the computation blocks increases. In general, in reconfigurable devices, interconnection resources are equally allocated to the respective programmable function cells arranged in a two-dimensional array. Accordingly, it is difficult to implement a circuit such as the complete-tree multi-bit multi-argument adder that uses a great number of pieces of data in which a plenty of very complicated wiring resources are consumed partially.

Completely Cascaded Tree Multi-bit Multi-argument Adder

Figure 17:
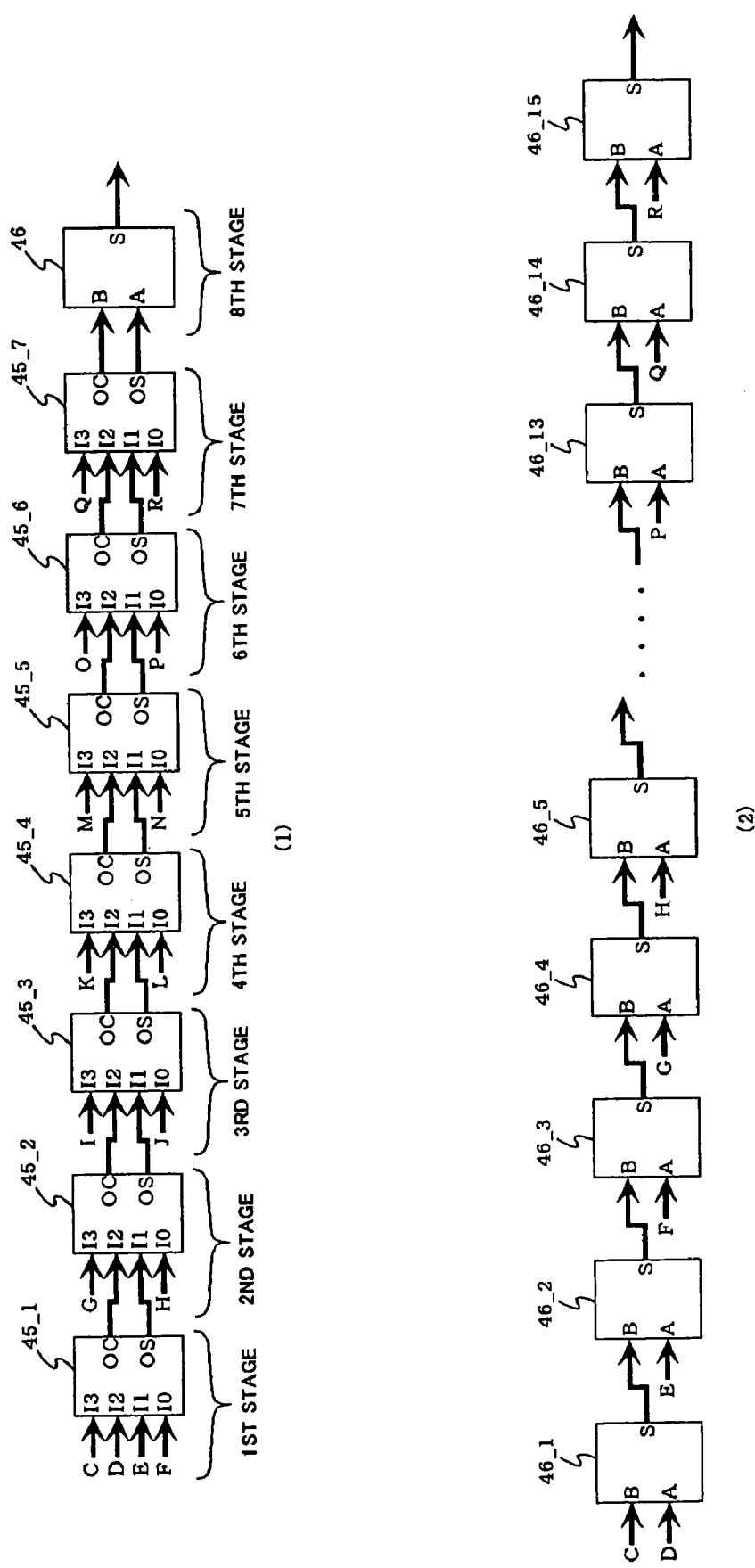
FIG. 17(1) is a block diagram showing an example of completely cascaded type multi-bit multi-argument adder using the 4-2 adder.

FIG. 17(1) is a block diagram showing an example of completely cascaded type multi-bit multi-argument adder. This has a function completely identical to that of the complete-tree type multi-bit multi-argument adder of FIG. 16(1). The multi-bit argument inputs I3, I2, I1 and I0 of the multi-bit 4-2 adder circuit 45_1 in the first stage are respectively supplied with multi-bit data C, D, E and F; and the multi-bit argument inputs I3, I0, I2 and I1 of the multi-bit 4-2 adder circuit 45_2 in the second stage are respectively supplied with multi-bit data G and H and multi-bit outputs OC and OS from the first stage. After this, likewise, it is repeated that multi-bit argument inputs of the multi-bit 4-2 adder circuit 45_k in the k-th stage are supplied with two pieces of multi-bit data and multi-bit outputs OC and OS from the (k−1)-th stage. And at the last stage, multi-bit outputs OC and OS from a preceding stage are added by the multi-bit full adder 46 and a final addition result is yielded as a multi-bit addition output S.

FIG. 17(1) shows an example when the number of the multi-bit data is 16. However, it is possible to create a completely cascaded type multi-bit multi-argument adder for an arbitrary number of pieces of data in the same way. In general, when the number of pieces of the multi-bit data is 2k, 2k−1−1 multi-bit 4-2 adders are required for the completely cascaded type multi-bit multi-argument adder. This is the same situation as the complete-tree type multi-bit multi-argument adder.

Figure 18:
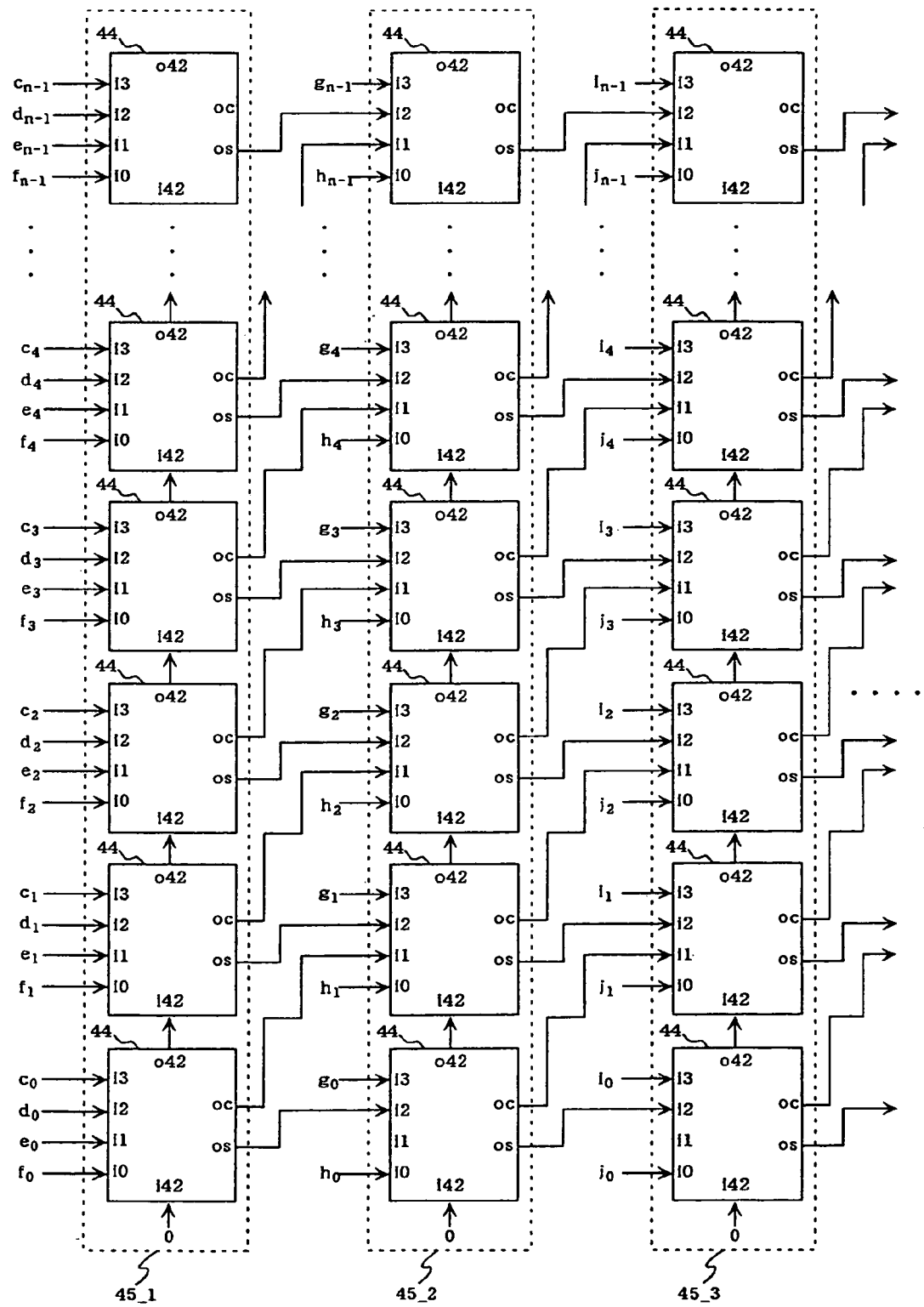
FIG. 18 is a block diagram showing a detailed configuration of first to third stages of FIG. 17(1).

FIG. 18 is a block diagram showing a detailed configuration of the first to third stages of FIG. 17(1). In the configuration of FIG. 18, it is assumed that no overflow occurs in each multi-bit 4-2 adder 45_k and further that a logical value of 0 is initially given where no data is written.

As is seen from FIG. 18, the completely cascaded type multi-bit multi-argument adder has a high regularity and its wiring is simple. This configuration is not changed even when the number of pieces of multi-bit data to be added is increased. In general, among various types of multi-bit multi-argument adders, the completely cascaded type multi-bit multi-argument adder has the advantage of the highest regularity and most simple wiring. Accordingly, such a multi-bit multi-argument adder can be implemented with the highest easiness in a reconfigurable device in which interconnection resources are allocated regularly and equally.

With regard to delay, the completely cascaded type multi-bit multi-argument adder has a delay for 2k−1−1 stages of computation blocks (multi-bit 4-2 adders), which is large as compared to a delay of the complete-tree type multi-bit multi-argument adder having computation blocks of k−1 stages (except the multi-bit full adder at the last stage). However, this makes little difference when k is small. Furthermore, the delay is calculated only by the number of stages of the computation blocks but the completely cascaded type multi-bit multi-argument adder has a merit that an interconnection delay is much smaller than that of the complete-tree type. Accordingly, when the number of pieces of data is small, the completely cascaded type almost ranks with the complete-tree type with regard to delay.

When the completely cascaded type multi-bit multi-argument adder using the 4-2 adder as shown in FIG. 17(1) is configured by using the conventional function block (FIG. 104), similarly to the case of the aforementioned complete-tree type, the area and the delay are doubled (except the multi-bit full adder of the last stage) as compared to the case using the function block of the present invention as shown in FIG. 6.

FIG. 17(2) is a block diagram showing an example of completely cascaded multi-bit multi-argument adder using the multi-bit full adder. In this case, the number of computation blocks and the number of stages of the computation blocks are doubled as compared to the case using the 4-2 adder (FIG. 17(1)). In either case, the completely cascaded multi-bit multi-argument adder, unlike the complete-tree type, the area and the delay can be halved by using the programmable function cell of the present invention.

As has been detailed above, the complete-tree type operates at higher speeds but its wiring is complicated; while the completely cascaded type has simple wiring but its delay is larger. Especially in the completely cascaded type, as the number of pieces of data to be added increases, the delay is greatly increased, as compared to the complete-tree type. In order to solve this problem, a semi-cascaded type multi-bit multi-argument adder is proposed as described hereinafter.

Semi-cascaded Multi-bit Multi-argument Adder

Figure 19:
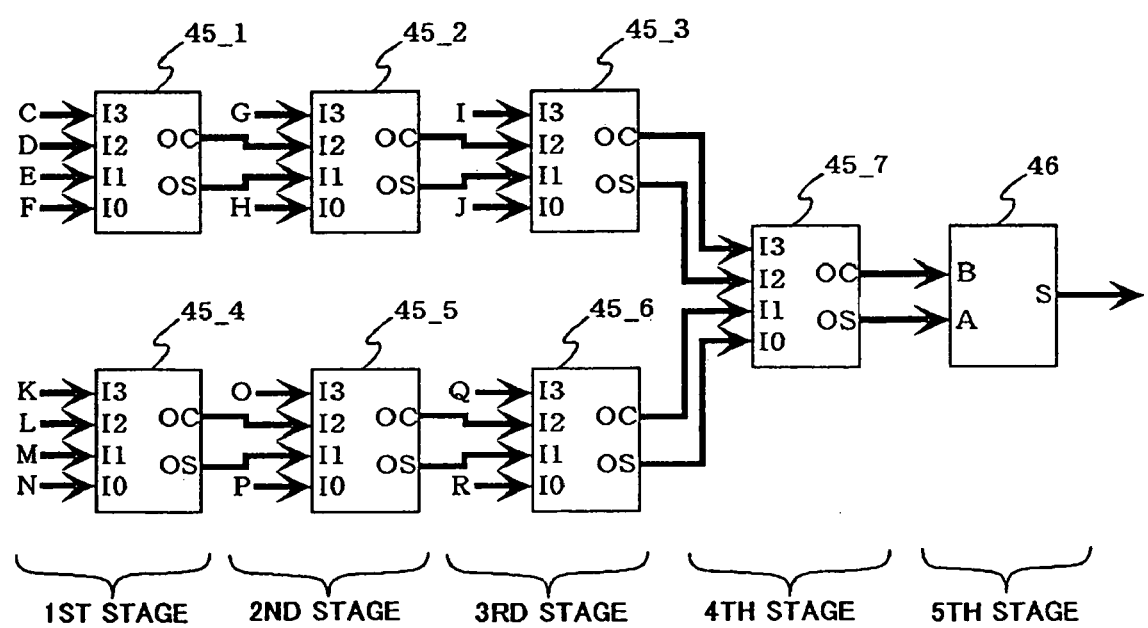
FIG. 19 is a block diagram showing an example of a semi-cascaded type multi-bit multi-argument adder.

FIG. 19 is a block diagram showing an example of a semi-cascaded multi-bit multi-argument adder. This is an example of 16-argument adder as in the case of FIG. 16(1) and FIG. 17(1). The multi-bit 4-2 adders 45_1, 45_2 and 45_3 constitute a first completely cascaded type multi-bit multi-argument adder; while the multi bit 4-2 adders 45_4, 45_5 and 45_6 constitute a second completely cascaded type multi-bit multi-argument adder. The multi-bit 4-2 adder circuit 45_7 receives four outputs in total from these adders, and the outputs of the multi-bit 4-2 adder circuit 45_7 are added by the multi-bit full adder 46 to yield the final addition result on its output S.

The number of computation blocks used in this example is identical to that of the complete-tree type and the completely cascaded type as described above. Moreover, the delay corresponds to four stages of computation blocks except the multi-bit full adder of the last stage. Therefore, the delay is about one-half that corresponding to seven stages of computation blocks in the completely cascaded type.

FIG. 19 shows an example of the case of 16 arguments. Even when the number of pieces of data to be added is different, this type of multi-bit multi-argument adder can be implemented only by changing the number of stages in the first and the second completely cascaded type multi-bit multi-argument adders. In general, when the number of pieces of data to be added is large, the delay of the semi-cascaded type multi-bit multi-argument adder is almost halved as compared to that of the completely cascaded type. The semi-cascaded type multi-bit multi-argument adder has more stages of computation blocks as compared to the complete-tree type, but has a merit that its wiring is simple and the interconnection delay is small. For this, when the number of pieces of data is not so large, the semi-cascaded type almost ranks with the complete-tree type with regard to the delay, too. The completely cascaded type multi-bit multi-argument adder is preferably used when the number of pieces of data to be added is small and the delay is almost negligible. In contrast, the semi-cascaded type multi-bit multi-argument adder is preferably used when the number of pieces of data is comparatively large and the delay becomes too large if the completely cascaded type is used. However, when the number of pieces of data becomes very large, the delay also becomes too large even in the semi-cascaded type. In this case, it is effective to use a secondary cascaded type multi-bit multi-argument adder as described below.

Secondary Cascaded Multi-bit Multi-argument Adder

Figure 20:
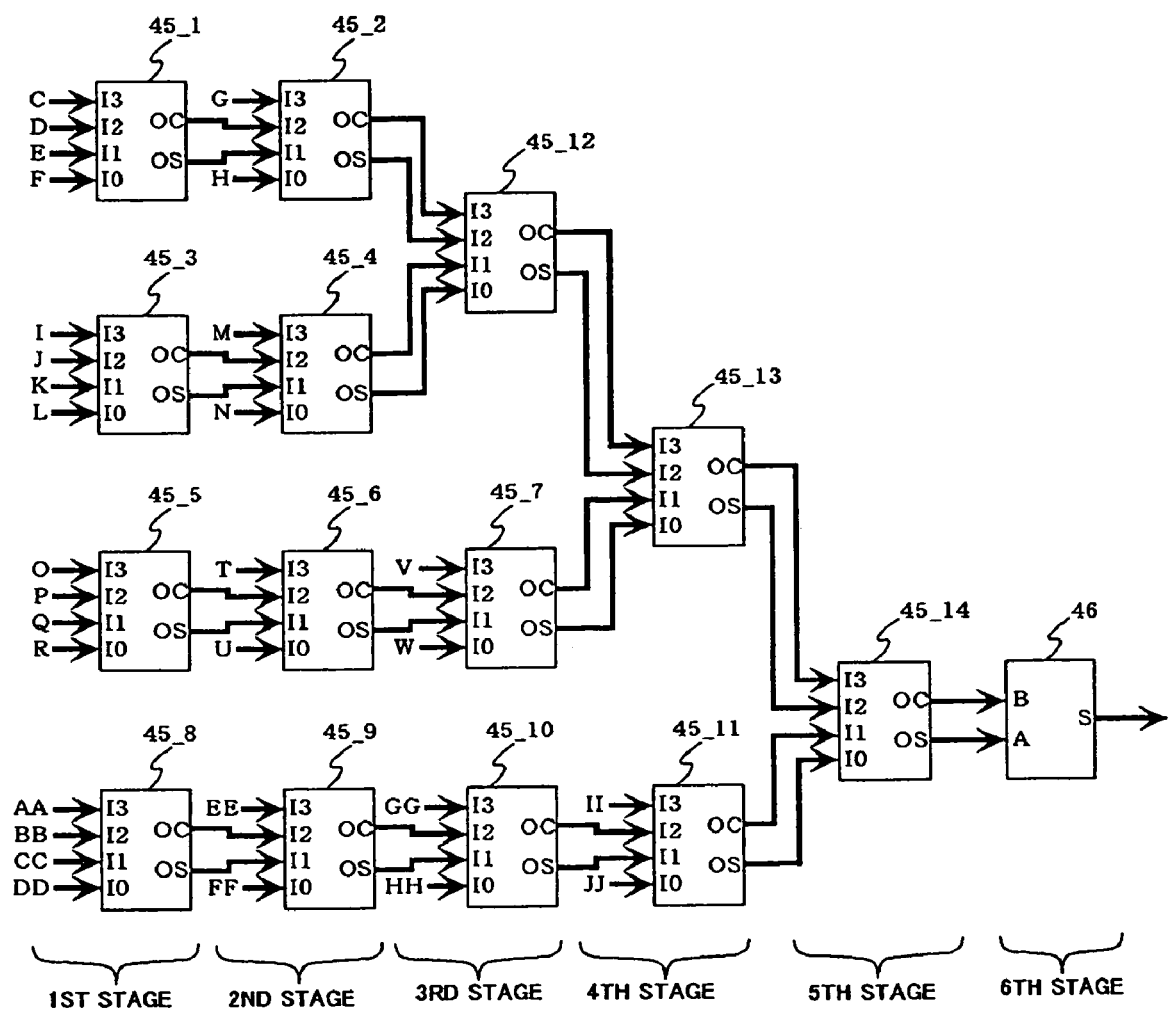
FIG. 20 is a block diagram showing an example of a secondary cascaded type multi-bit multi-argument adder.

FIG. 20 is a block diagram showing an example of secondary cascaded type multi-bit multi-argument adder. This secondary cascaded type multi-bit multi-argument adder outputs an addition result of 30 pieces of multi-bit data: C, D, E, F, G, H, I, J, K, L, M, N, O, P, Q, R, S, T, U, V, W, AA, BB, CC, DD, EE, FF, GG, HH, II, and JJ.

The multi-bit 4-2 adder circuits 45_1 and 45_2 constitute a first completely cascaded multi-bit multi-argument adder; the multi-bit 4-2 adder circuits 45_3 and 45_4 constitute a second completely cascaded multi-bit multi-argument adder; the multi-bit 4-2 adder circuits 45_5, 45_6 and 45_7 constitute a third completely cascaded multi-bit multi-argument adder; and the multi-bit 4-2 adder circuits 45_8, 45_9, 45_10 and 45_11 constitute a fourth completely cascaded multi-bit multi-argument adder. These will be called altogether a first layer of completely cascaded type multi-bit multi-argument adders.

Multi-bit 4-2 adders 45_12, 45_13 and 45_14 constitute a second layer of completely cascaded type multi-bit multi-argument adders, which is supplied with the outputs of the first layer of completely cascaded type multi-bit multi-argument adders as data pieces to be added. The semi-cascaded type multi-bit multi-argument adder as shown in FIG. 19 may be considered as the simplest example of the secondary cascaded multi-bit multi-argument adder in which the second layer consists of a single multi-bit 4-2 adder circuit 45_7. From such a point of view, the example shown in FIG. 17 is a primary cascaded type multi-bit multi-argument adder because it has only the first layer.

As the number of pieces of addend/augend data is increased in the semi-cascaded type multi-bit multi-argument adder, the number of stages in the first layer of completely cascaded type multi-bit multi-argument adders is proportionately increased, thereby increasing the delay. The entire delay increase can be suppressed as follows. Instead of increasing the number of stages in the first layer, a plenty of completely cascaded type multi-bit multi-argument adders having a small number of stages are prepared as shown in FIG. 20 and their outputs are connected to the argument inputs of the completely cascaded type multi-bit multi-argument adders in the second layer.

In FIG. 20, the number of stages in the first layer of completely cascaded type multi-bit multi-argument adders is set to become larger as its connection destination becomes nearer to the output stage (45_14) of the completely cascaded type multi-bit multi-argument adder in the second layer. Such an arrangement is employed so as to provide the approximately same delay in all signal paths from initial data inputs to the output stage (45_14). The outputs of the first and the second completely cascaded type multi-bit multi-argument adders in the first layer should go through two stages of multi-bit 4-2 adder circuits 45_12 and 45_13 before reaching the output stage (45_14). Also, the output of the third completely cascaded type multi-bit multi-argument adder in the first layer should go through one stage of the multi-bit 4-2 adder circuit 45_13 before reaching the output stage (45_14). On the other hand, the output of the fourth completely cascaded type multi-bit multi-argument adder is directly connected to the output stage (45_14). If all the completely cascaded type multi-bit multi-argument adders in the first layer have the same number of stages, then a signal path going through a multi-bit 4-2 adder farther from the output stage of the second layer has a greater delay, which determines the entire delay. To cope with this, the completely cascaded type multi-bit multi-argument adders of the first layer connected to the multi-bit 4-2 adders farther from the output stage of the second layer has a smaller number of stages, so as to eliminate a signal path having a greater delay than the others.

Description has been given on the secondary cascaded type multi-bit multi-argument adder. It is also possible to increase the number of layers to provide a higher-order cascaded type multi-bit multi-argument adder.

Higher-order Cascaded Multi-bit Multi-argument Adder

Figure 21:
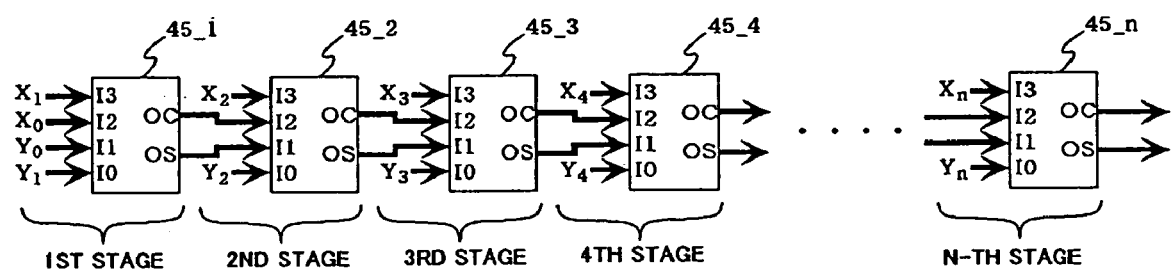
FIG. 21 is a block diagram showing an example of a high-order cascaded type multi-bit multi-argument adder.

FIG. 21 is a block diagram showing an example of a higher-order cascaded multi-bit multi-argument adder. In general, a K-order cascaded type multi-bit multi-argument adder has K layers, each of which includes at least one completely cascaded type multi-bit multi-argument adder as shown in FIG. 21. In the first layer, inputs Xi and Yi (i=0, 1, 2, . . . , n) of the completely cascaded type multi-bit multi-argument adder of FIG. 21 are multi-bit data to be added, and in the k-th (k is 2 or more) layer, Xi and Yi are outputs of the completely cascaded type multi-bit multi-argument adder of the (k−1)-th layer. The K-th layer has one completely cascaded type multi-bit multi-argument adder 1 and its output is added by a multi-bit full adder to yield a final result.

In FIG. 21, the number n of stages may differ from layer to layer or within a layer, depending on the completely cascaded multi-bit multi-argument adder. It is most preferable to determine the number of stages so that all the signal paths have the same delay. In general, a primary cascaded multi-bit multi-argument adder is preferably used when the number of pieces of addend/augend data is small. A higher order cascaded type multi-bit multi-argument adder becomes more preferable as the number of pieces of addend/augend data increases. Thus, it is possible to obtain a multi-bit multi-argument adder having simple wiring and the almost same speed as that of the complete-tree type. Since the cascaded type multi-bit multi-argument adder has a high regularity and simple wiring, it is suitable for a reconfigurable device. In the programmable function cell of the present invention, it is possible to provide a multi-bit multi-argument adder with a half area as compared to the conventional programmable function cell. It is also possible to reduce the delay (by half at the maximum compared to the conventional one).

Multiplier

There is a large demand for a compact high-speed multi-bit multi-argument adder as a main block of a multiplier. In general, multiplication consists of two parts: generation of partial products and addition of the partial products. For the addition of the partial products, the multi-bit multi-argument adder is used. On the other hand, for partial product generation, a method using the modified Booth algorithm is often used.

Figure 22:
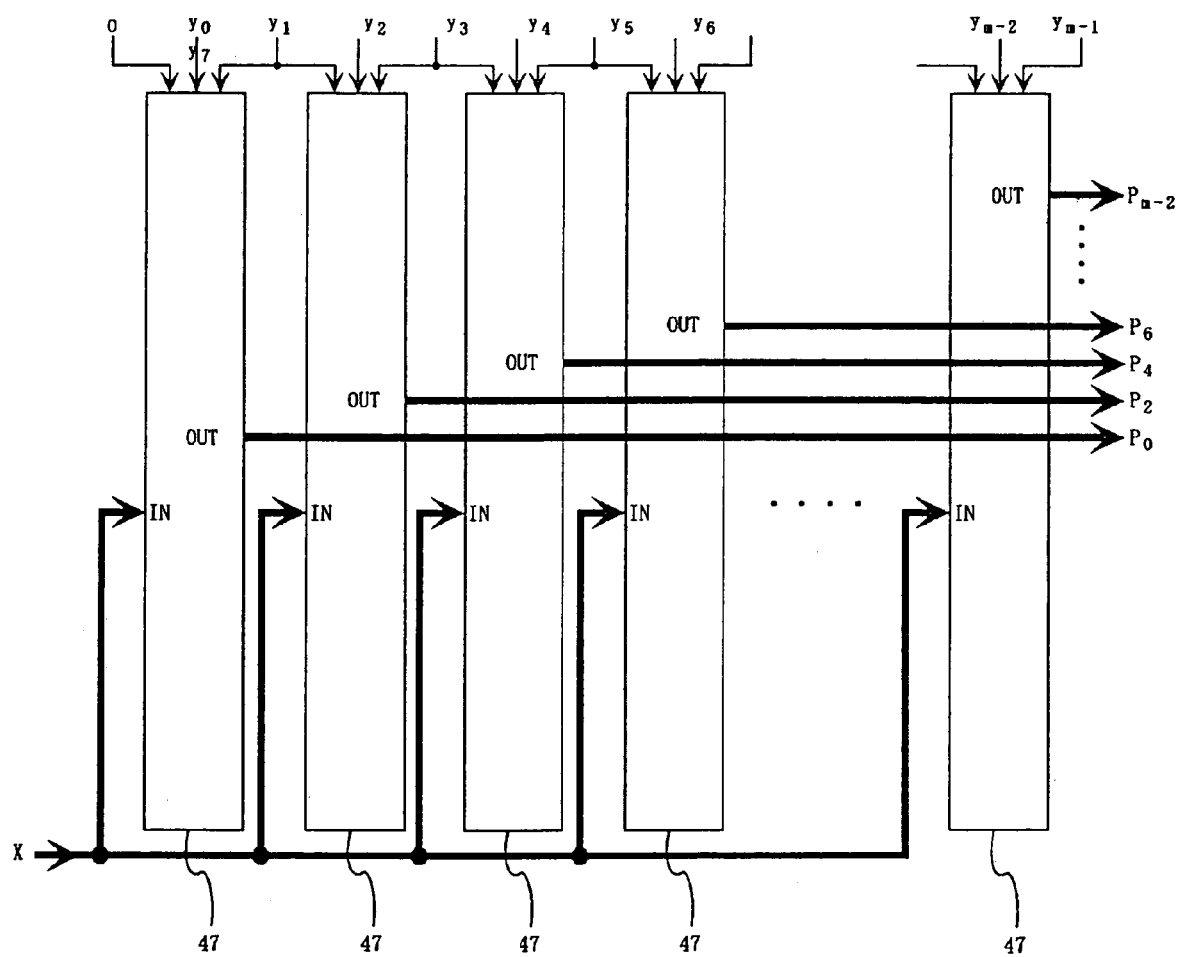
FIG. 22 is a block diagram showing a partial product generator using a modified Booth algorithm (hereinafter, referred to as a modified Booth partial product generator).

FIG. 22 is a block diagram showing a partial product generator using the modified Booth algorithm (hereinafter, referred to as a modified Booth partial product generator). A modified Booth partial product generator produces a partial product by multiplying a multiplicand X by a multiplier Y. In FIG. 22, each of m/2 partial product generation units 47 is supplied with X and a corresponding one of $y_{2k-1}$, $y_{2k}$ and $y_{2k+1}$ and outputs a partial product $P_{2k}$ (k=0, 1, 2, . . . , m/2−1). Here, Y is assumed to be m-bit data: $y_{m-1}y_{m-2} \ldots y_3y_2y_1y_0$. In an ordinary method using AND gates, the partial product consists of m pieces of multi-bit data, but in the modified Booth algorithm the number of pieces of the multi-bit data is reduced to m/2, that is, by half.

In a current custom design LSI, what is used most is a multiplier using the modified Booth partial product generator in combination with the complete-tree type multi-bit multi-argument 4-2 adder as shown in FIG. 16(1) (hereinafter, a multi-bit multi-argument adder using the 4-2 adder will be particularly referred to as a "multi-bit multi-argument 4-2 adder"). However, this is not the best way in a reconfigurable device. Its reason will be described below.

Figure 103:
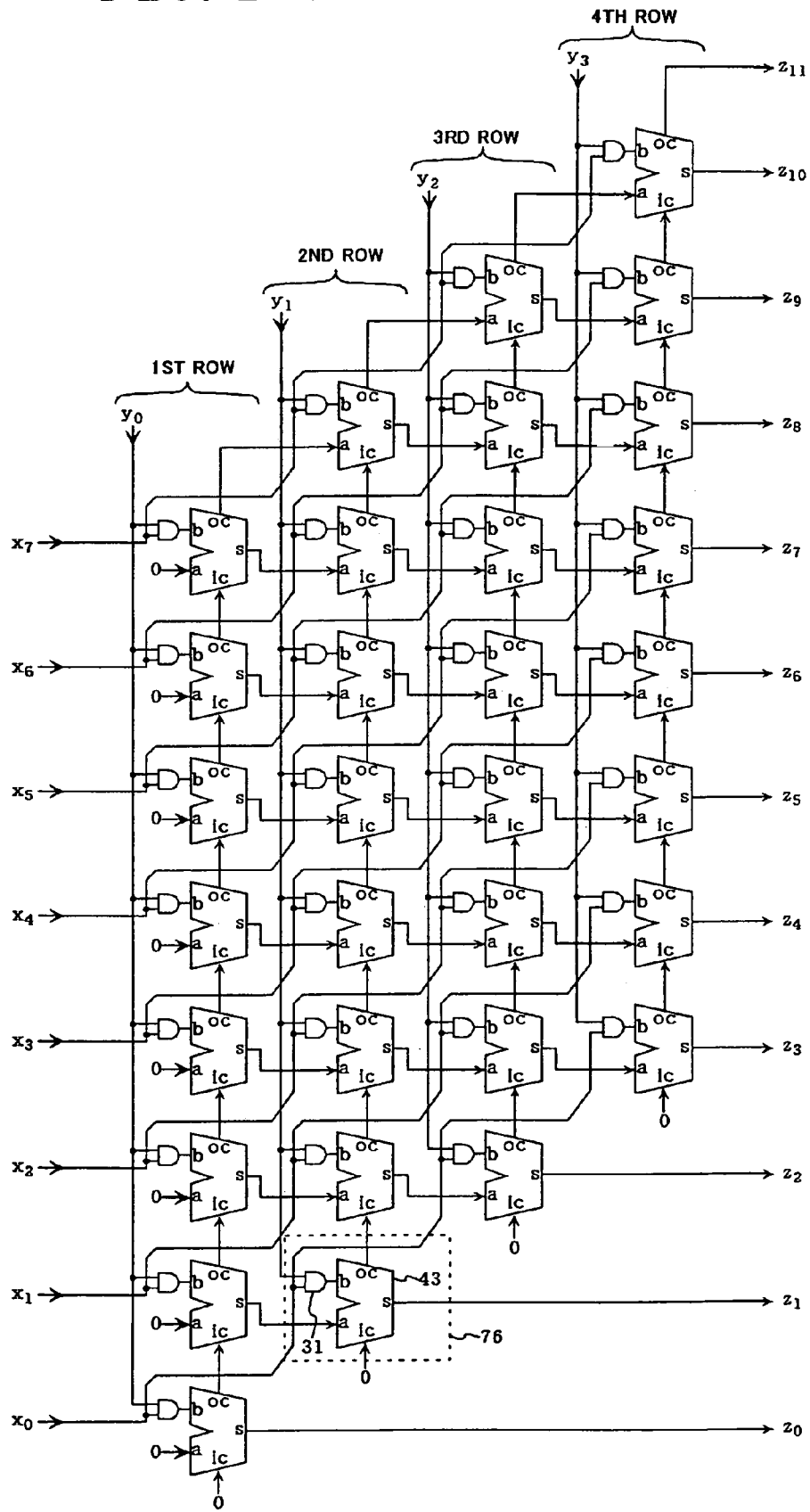
FIG. 103 is a circuit diagram showing a typical example of an ordinary multiplier.

A multiplier that is used most in the conventional FPGA is the one using a multi-bit full adder as shown in FIG. 103. Here, a partial product is generated by an AND gate attached to one input of each full adder. In this method, when Y is assumed to be m-bit data, m multi-bit full adder circuits, i.e., m rows of programmable function cells are used. Here, FIG. 103 shows the simplest completely cascaded type. However, when multi-bit full adders are combined by other method, the required number of programmable function cells is almost identical to that of the simplest type shown in FIG. 103.

On the other hand, in the case of a multiplier using the modified Booth partial product generator and the multi-bit multi-argument 4-2 adder, the required number of computation blocks is about 3m/4. And the partial product generation unit 47 can be implemented in one row of the programmable function cells according to the present invention. Thus, the multiplier using the modified Booth partial product generator and the multi-bit multi-argument 4-2 adder implemented in the programmable function cell of the present invention occupies about three quarters (¾) the area required for the conventional FPGA multiplier. The area surely becomes smaller but with slight difference. And the former multiplier has more complicated configuration than the latter and requires more wiring resource. Accordingly, there may be little merit if the area reduction is small.

Thus, the method optimal for the custom design LSI is not always optimal for the reconfigurable device. In the custom design LSI, a circuit can be formed with a free shape and arrangement and it is possible to optimally fabricate an arbitrary circuit. On the other hand, in the case of the reconfigurable device, a programmable function cell is used as a configuration unit, in which each circuit should be implemented. Furthermore, the reconfigurable device is under strong restriction with regard to the wiring resource as compared to the custom design LSI. From these differences, as in the aforementioned example, the method optimal for the custom design LSI is not always optimal for the reconfigurable device.

Next, a more compact multiplier suitable for a reconfigurable device and a function block used therefore will be described in detail hereafter.

2. Second Embodiment 2.1) Function Block

Figure 23:
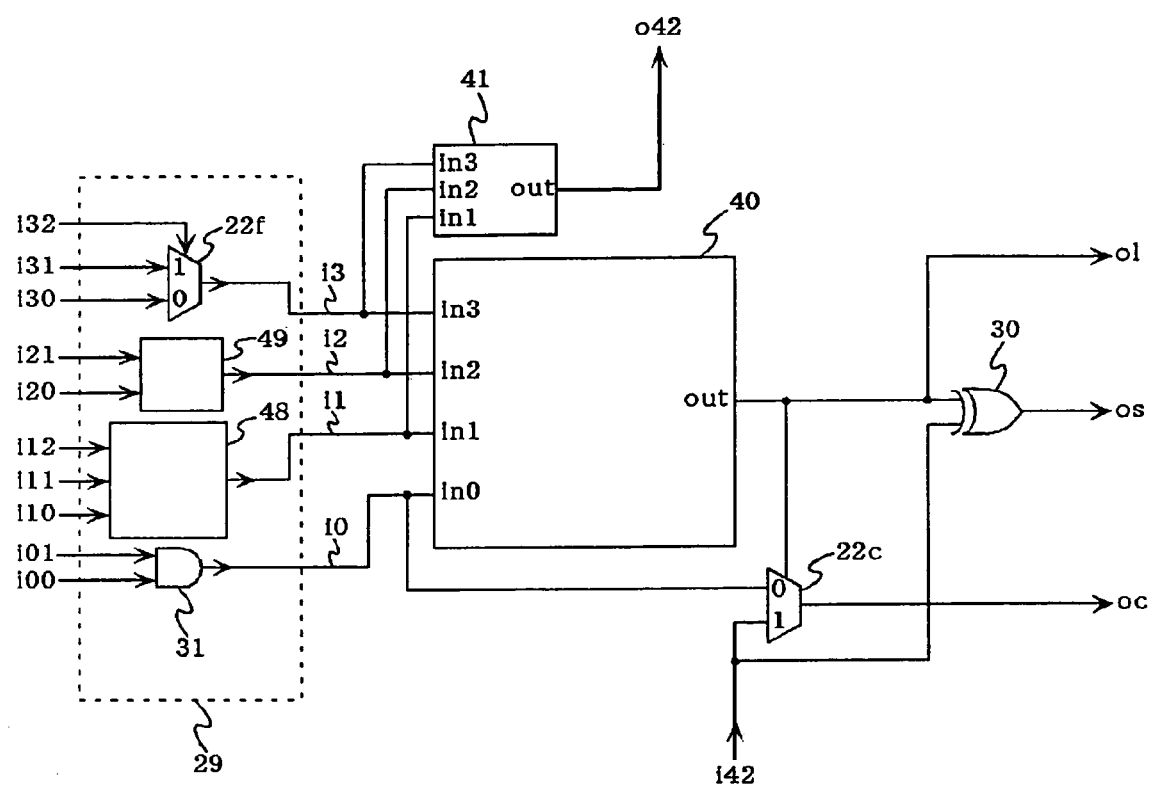
FIG. 23 is a circuit diagram showing a function block according to a second embodiment of the present invention.

FIG. 23 is a circuit diagram showing a function block according to a second embodiment of the present invention. The second embodiment differs from the first embodiment shown in FIG. 6 in that a preposition logic circuit 29 is connected to the inputs i0, i1, i2 and i3.

In FIG. 23, four types of preposition logic circuit are shown as an example: an AND 31, a 3-input LUT 48, a 2-input LUT 49 and an MUX 22*f*. However, the preposition logic circuit is not limited to these. In general, a preposition logic circuit is a circuit in which various logic functions can be set in accordance with configuration, and has a smaller variety, a smaller size and a higher speed than the logic function generator 40.

Inputs i00, i01, i11, i12, i20, i21, i30, i31 and i32 of the function block shown in FIG. 23 are connected to the input selection units, respectively, as shown in FIG. 1. FIG. 1 shows an example of four input selection units. In general, in the input block 3 of the programmable function cell 1, there are as many input selection units 3_k (k is an integer) as the inputs of the function block 4, and the respective inputs of the function block 4 are connected with the outputs of the input selection units. In the preposition logic circuit 29 of FIG. 23, each of the input selection units connected to the inputs i10, i11 and i12 of the 3-input LUT 48 and to the inputs i20 and i21 of the 2-input LUT 49 selects one signal from the interconnection wire group 2 to output it as in the examples shown in FIG. 2 and FIG. 5. As has been described above, a k-input LUT can realize an arbitrary k-input 1-output logic function in accordance with configuration data stored in a configuration memory incorporated therein.

On the other hand, in the preposition logic circuit 29 of FIG. 23, the inputs i00 and i01 of the AND 31 and the inputs i30, i31 and i32 of the MUX 22*f* are connected to the other type of input selection unit. This type of input selection unit is an input selection unit with a fixed value, which is capable of selecting one from signals on the interconnection wire group and the fixed logical values of 0 and 1.

2.2) Input Selection Unit with Fixed Value

Figure 24:
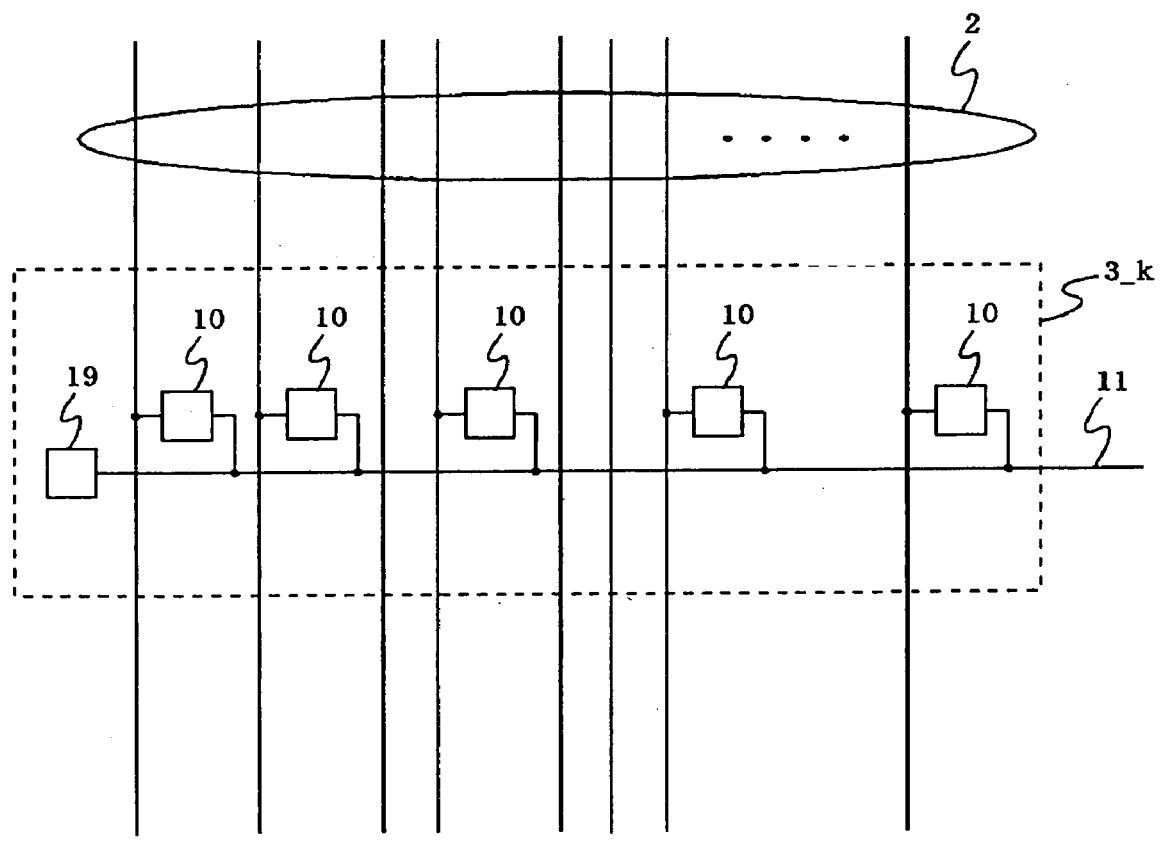
FIG. 24 is a circuit diagram showing a first example of an input selection unit having a fixed value.

FIG. 24 is a circuit diagram showing a first example of the input selection unit having a fixed value. This is different from the input selection unit of FIG. 2 in that an output of a fixed logical value supply switch 19 is connected to the output line 11.

Figure 25:
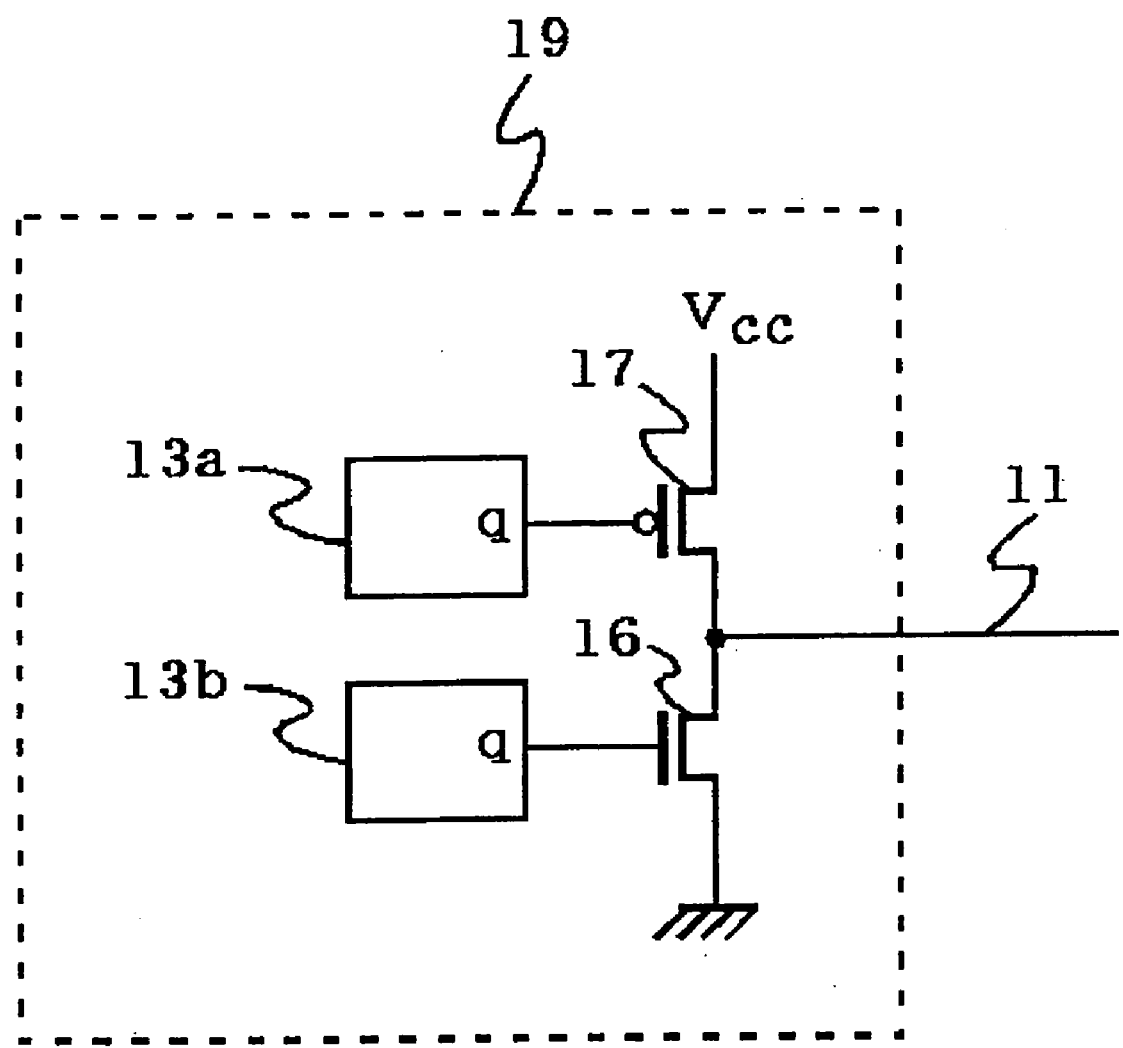
FIG. 25 is a circuit diagram showing an example of a fixed logical value supply switch.

FIG. 25 is a circuit diagram showing an example of the fixed logical value supply switch. In the fixed logical value supply switch 19, a source terminal of an NMOS transistor 16 is connected to the ground, and a source terminal of a PMOS transistor 17 is connected to a power voltage Vcc. Furthermore, drain terminals of both transistors 16 and 17 are connected in common to the output line 11.

Moreover, an output q of a configuration memory 13*a* is connected to the gate terminal of the PMOS transistor 17, and an output q of the other configuration memory 13*b* is connected to the gate terminal of the NMOS transistor 16, respectively. When the respective configuration memories 13*a* and 13*b* store logical values of 1 and 0, the fixed logical value supply switch 19 has its output at a high impedance state. When both of the configuration memories store a logical value of 0, the fixed logical value supply switch 19 outputs a logical value of 1. When both of the configuration memories store a logical value of 1, the fixed logical value supply switch 19 outputs a logical value of 0.

Figure 26:
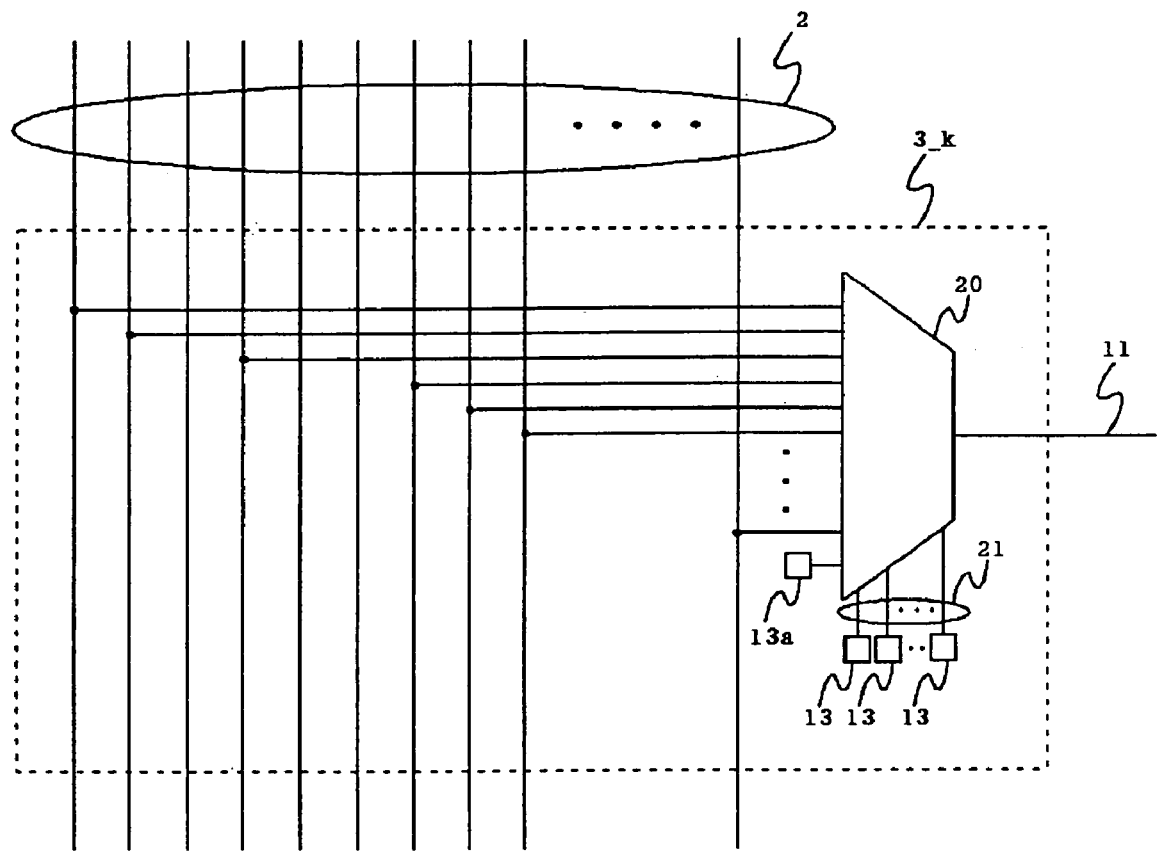
FIG. 26 is a circuit diagram showing a second example of the input selection unit having a fixed value.

FIG. 26 is a circuit diagram showing a second example of the input selection unit having a fixed value. This is different from the input selection unit 3_k of FIG. 5 in that one of the inputs of the multiplexer 20 is connected with the output of the fixed logical value supply memory 13*a*. When the control memory 13 of the multiplexer 20 is set to select the output of the fixed logical value supply memory 13*a*, a logical value stored in the fixed logical value supply memory 13*a* is supplied as a fixed logical value to the output line 11.

Figure 27:
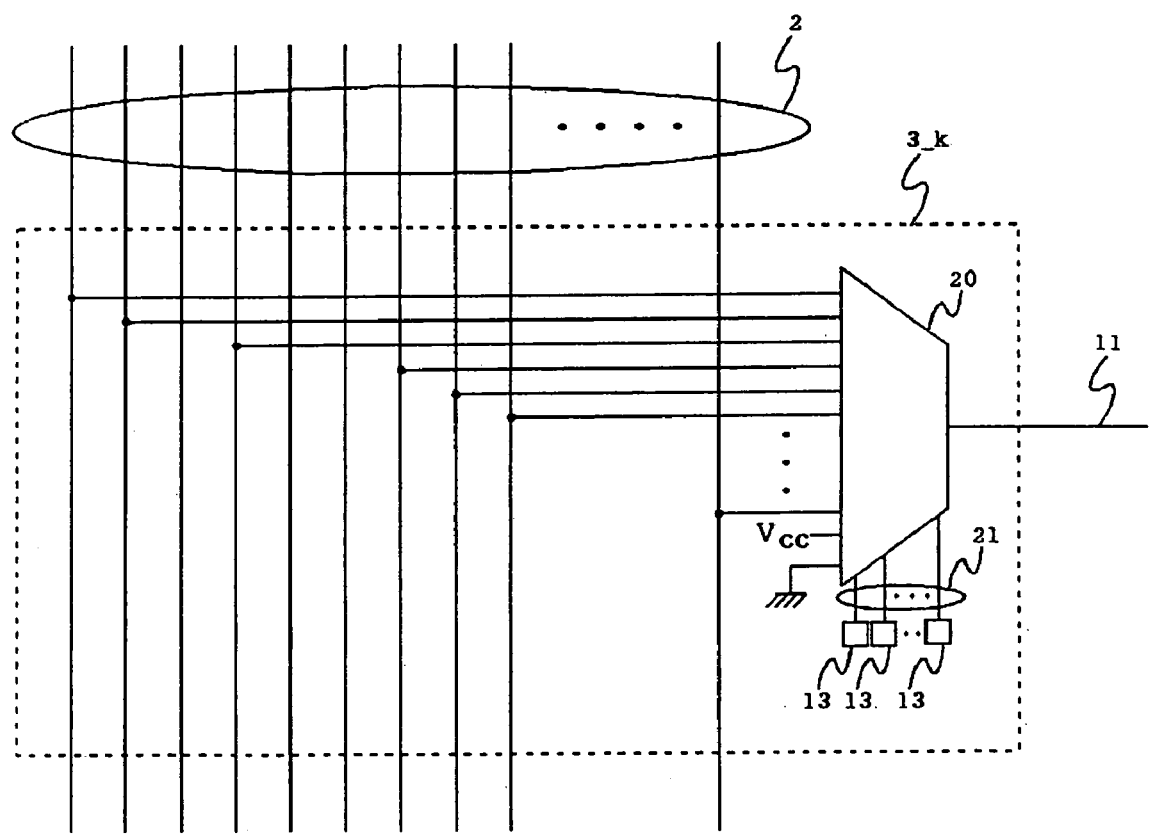
FIG. 27 is a circuit diagram showing a third example of the input selection unit having a fixed value.

FIG. 27 is a circuit diagram showing a third example of the input selection unit having a fixed value. This is different from the input selection unit 3_k of FIG. 5 in that one of the inputs of the multiplexer 20 is connected to a power voltage Vcc and the other input is connected to the ground, respectively. In accordance with the setting of the control memory 13, the power voltage Vcc (logical value of 1) and the ground (logical value of 0) can be selectively supplied as a fixed logical value to the output line 11.

In this specification, the power voltage, the ground, the output of the configuration memory, and a signal uniquely determined by them are called a fixed logical value or a fixed value, and the other signals are called dynamic signals.

By connecting the aforementioned input selection unit having a fixed logical value, it becomes possible to use one logic circuit as various logic circuits. One of the simplest examples is the AND 31 in the preposition logic circuit 29 of FIG. 23. When the inputs i00 and i01 are both used as signal inputs, i.e., when the input selection units with a fixed value connected to them are set so as to output one of the signals on the interconnection wire group 2, the AND 31 functions as a circuit outputting an AND-ed result of the two signals.

On the other hand, when the input selection unit with a fixed value connected to the input i00 is set so as to output a fixed logical value of 1 and the input selection unit with a fixed value connected to the input i01 is set so as to output one of the signals on the interconnection wire group 2, the AND 31 functions as a circuit outputting the input i01 as it is.

The AND is allowed to implement only these two functions therein, but more functions can be implemented in the MUX 22*f* in the preposition logic circuit 29 of FIG. 23.

2.3) Logic Functions of MUX

FIG. 28 is a table showing various logic functions of a MUX. Here, equivalent circuits of the MUX when its inputs are set in various ways are shown. Here, the input and output symbols in0, in1, in2 and out correspond to those of FIG. 7. In the input setting column of FIG. 28, 0 and 1 are fixed logical values supplied to the input, X means that the function does not depend on the input, and the others mean that the input is used as a signal input. As can be seen from this, the MUX can be used as various logic circuits including frequently used AND and OR.

FIG. 23 shows an example having four different logic circuits in the preposition logic circuit 29, but these may be partially or entirely identical circuits. Especially, the MUX is excellent as the preposition logic circuit because it has a large variety with a small area and small delay and it can be converted to a multi-input MUX as will be detailed later. For this, a function block having only MUX as the preposition logic circuit is an embodiment with high usability.

Moreover, the preposition logic circuit is not necessarily attached to all of the inputs i0 to i3. For example, as will be detailed later, a function block in which the preposition logic circuit is attached to only two of the inputs i0 to i3 is also another embodiment with high usability.

2.4) 4AND4-2 Adder

Figure 29:
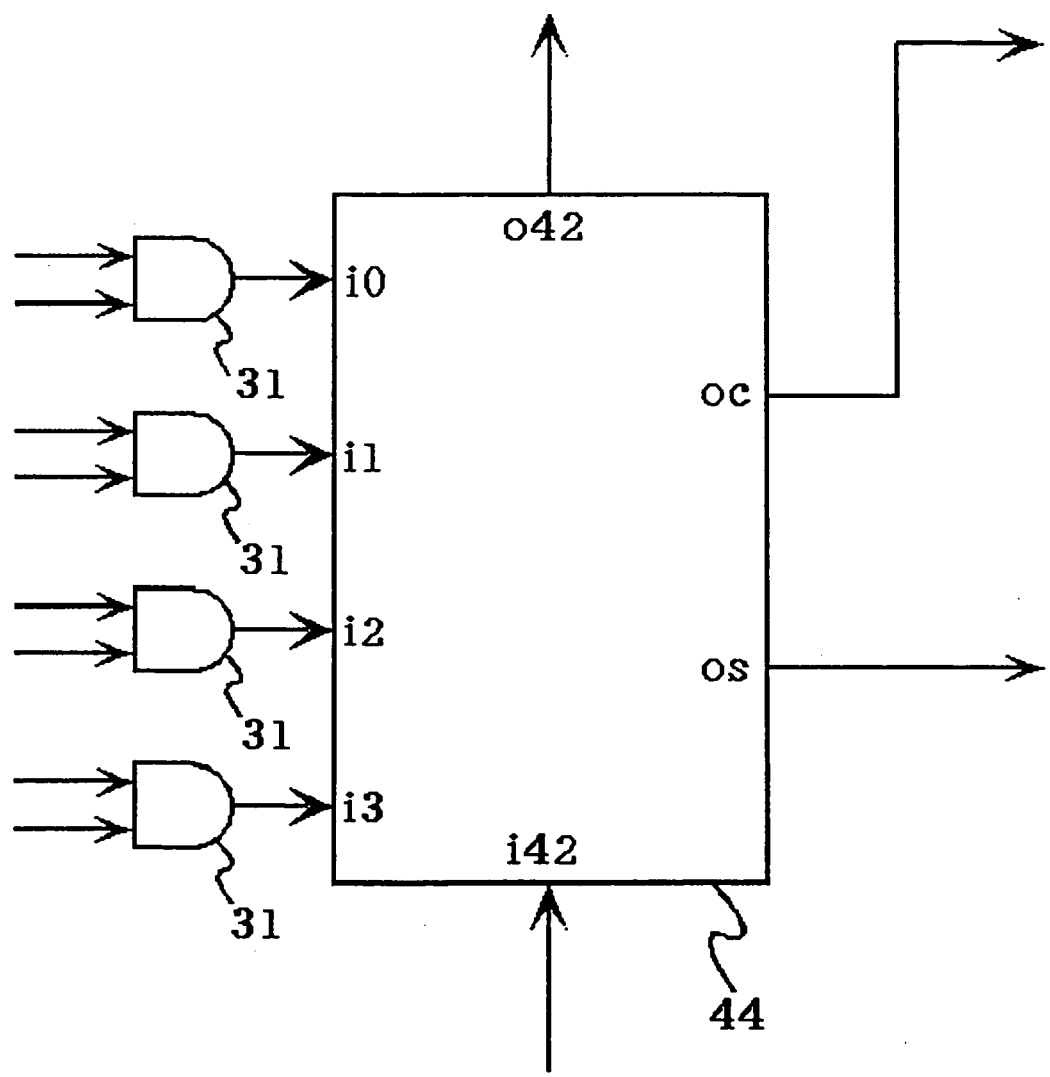
FIG. 29 is a circuit diagram showing a 4AND4-2 adder using all the circuits of the preposition logic circuit 29 of FIG. 23 as ANDs.

FIG. 29 is a circuit diagram showing a 4AND4-2 adder in which all circuits of the preposition logic circuit 29 are AND gates. The function block 4 can be used as a circuit 25 in which the inputs i0 to i3 of the 4-2 adder 44 as shown in FIG. 29 are connected with the outputs of the AND 31 (hereinafter, this will be referred to as a 4AND4-2 adder). By using this, it is possible to make a multiplier very compact.

Multiplier

Figure 30:
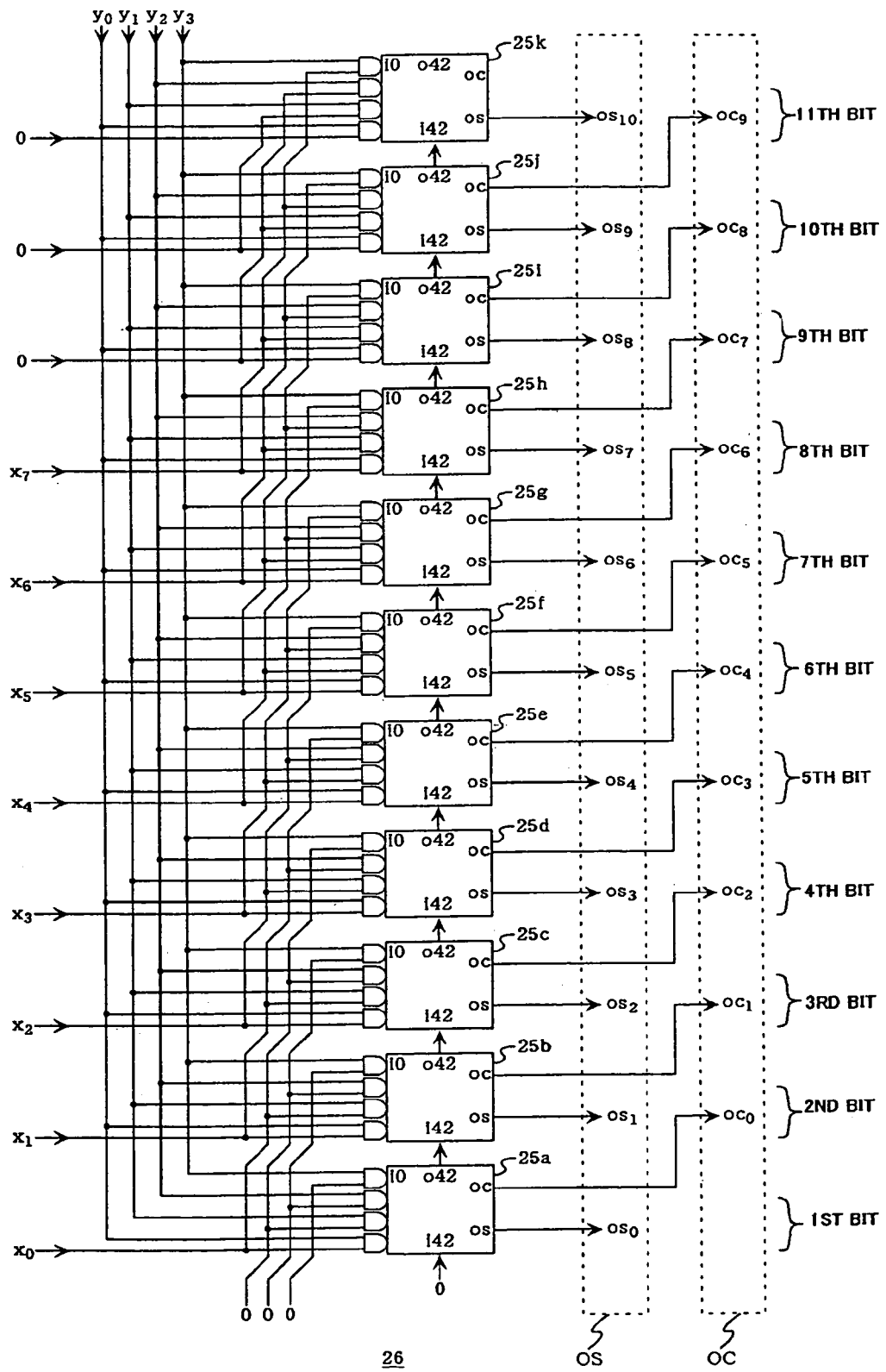
FIG. 30 is a circuit diagram showing a computation block required for a multiplier using the 4AND4-2 adder of FIG. 29.

FIG. 30 is a circuit diagram showing a computation block required for a multiplier using the 4AND4-2 adder of FIG. 29. In the computation block 26 of FIG. 30 (hereinafter, referred to as a "multi-bit 4AND4-2 adder), each of the 4AND4-2 adders 25*a* to 25*k* is represented by a 4-2 adder having ANDs connected to respective ones of the inputs thereof.

As is seen from FIG. 23, the function block 4 is not symmetric with respect to the inputs i0 to i3 (i.e., not invariable when inputs are replaced). More specifically, the input i0 is not symmetric with the other inputs i1 to i3. To cope with this, as shown in FIG. 30, a position of the i0 is indicated to show which AND of the 4AND4-2 adder is connected to the input i0. In the function block, inputs i1 to i3 are symmetric and their symbols are not indicated for simplicity in the 4AND4-2 adder.

Moreover, a 4-2 carry output o42 and a carry output oc of the 4AND4-2 adder 25*k* at the most significant bit (eleventh bit in FIG. 30) are both 0 and their output lines are omitted. For simplicity, FIG. 30 shows an example of a multiplicand input X as 8-bit data: $x_7 x_6 x_5 x_4 x_3 x_2 x_1 x_0$. However, in general, this may be of an arbitrary bit width. Moreover, $y_0$, $y_1$, $y_2$ and $y_3$ are multiplier inputs, which are listed in order of increasing bit significance.

Complete-tree Multiplier

FIG. 31(1) is a block diagram showing an example of a complete-tree type multiplier using the multi-bit 4AND4-2 adder 26. Here, M is a multiplicand, and N0, N1, N2 and N3 are respectively first to fourth bits, fifth to eighth bits, ninth to twelfth bits, and thirteenth to sixteenth bits of a multiplier. The multi-bit 4AND4-2 adders 26_1 to 26_4 of the first stage perform generation of partial products using the AND and addition of the partial products by the 4-2 adder in one computation block. The outputs from the first stage are added by the complete-tree type multi-bit multi-argument 4-2 adder (second to fourth stages in FIG. 31(1)) to yield a final multiplication result.

FIG. 31(1) shows an example in the case where a multiplier has sixteen bits. In general, in the case of an m-bit multiplier, a multiplier device is composed of m/4 multi-bit 4AND4-2 adders 26_1 to 26_(m/4), m/4-1 multi-bit 4-2 adders 45_1 to 45_(m/4-1), and the multi-bit full adder 46. Accordingly, the multiplier device can be composed of m/2 computation blocks in total. On the other hand, as has been described above, when a multiplier device is composed by using the modified Booth partial product generator and the multi-bit multi-argument 4-2 adder, it is necessary to use 3m/4 computation blocks.

Thus, it is possible to realize a multiplier device with a reduced number of programmable function cells by using the function block according to the second embodiment of the present invention to constitute the multiplier device with the multi-bit 4AND4-2 adder and the multi-bit multi-argument 4-2 adder.

FIG. 31(1) is an example using the complete-tree type multi-bit multi-argument 4-2 adder. It is also possible to constitute a multiplier using the multi-bit 4AND4-2 adder by using the other type of multi-bit multi-argument 4-2 adder.

FIG. 31(2) is a block diagram showing an example using the completely cascaded type multi-bit multi-argument 4-2 adder. In this example, outputs of the multi-bit 4AND4-2 adders 26_1 to 26_4 are input as to-be-added data of the completely cascaded multi-bit multi-argument 4-2 adder composed of computation blocks 45_1, 45_2, 45_3 and 46. In general, a multiplier can be configured by adding the output of the multi-bit 4AND4-2 adder by using an arbitrary type of multi-bit multi-argument 4-2 adder. For any of the types, the number of programmable function cells is the same.

In the function block 4 of FIG. 23, the number of preposition logic circuits is increased as compared to that of FIG. 6. The area occupied by the preposition logic circuit 29 itself is small considering the entire programmable function cell and therefore an area increase due to the preposition logic circuit does not cause so significant problem. However, addition of a preposition logic circuit 29 significantly increases the number of inputs of the function block 4, which in turn significantly increases the number of input selection units to be connected. This affects the entire area, which cannot be ignored because the input selection unit (having a fixed value) is a fairly large part. Moreover, as is seen from FIG. 30, the multi-bit 4AND4-2 adder 26 requires not a few interconnection wires.

As is seen from FIG. 31, among the computation blocks constituting the multiplier, the multi-bit 4AND4-2 adder occupies only half and the rest of the computation blocks do not require any preposition logic circuit or a plenty of wires. Such a circuit having little unevenness can easily be implemented in the reconfigurable device. Next, explanation will be given on a multiplier improving this point and a function block suitable for implementing it.

2.5) Modified Example of Second Embodiment (1)

Figure 32:
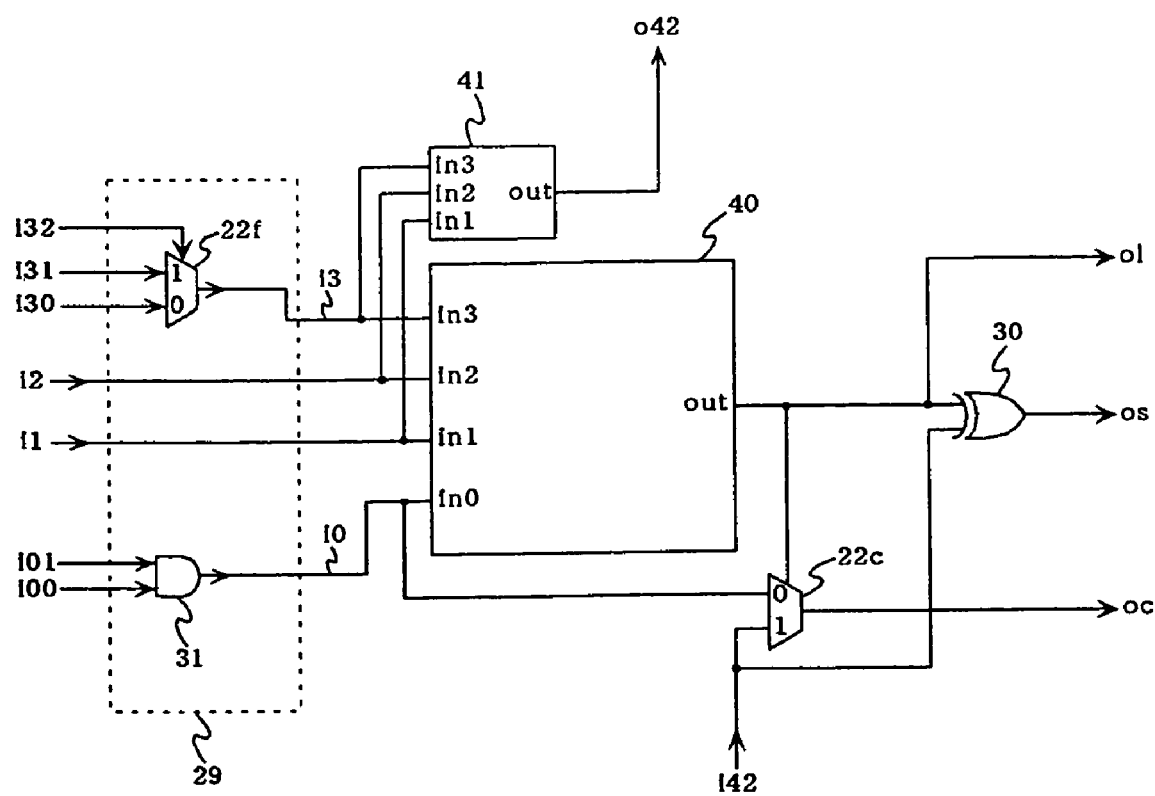
FIG. 32 is a circuit diagram showing a modified example of the function block according to the second embodiment of the present invention.

FIG. 32 is a circuit diagram showing a modified example of the function block according to the second embodiment of the present invention. This is the same as the function block as shown in FIG. 23 except for that the preposition logic circuits connected to the inputs i1 and i2 are removed. This suppresses the increase of the number of inputs in the function block as well as suppresses area increase of the programmable function cell by the increase of the input selection units (having a fixed value). In FIG. 32, the AND 31 and the MUX 22$f$ are used as the preposition logic circuits, but as has been described above, the preposition logic circuit is not limited to these. However, it is necessary that the preposition logic circuit can be used as an AND. Moreover, it is preferable that the input i0 and one of the inputs i1 to i3 are connected with a preposition logic circuit, respectively.

2AND4-2 Adder

Figure 33:
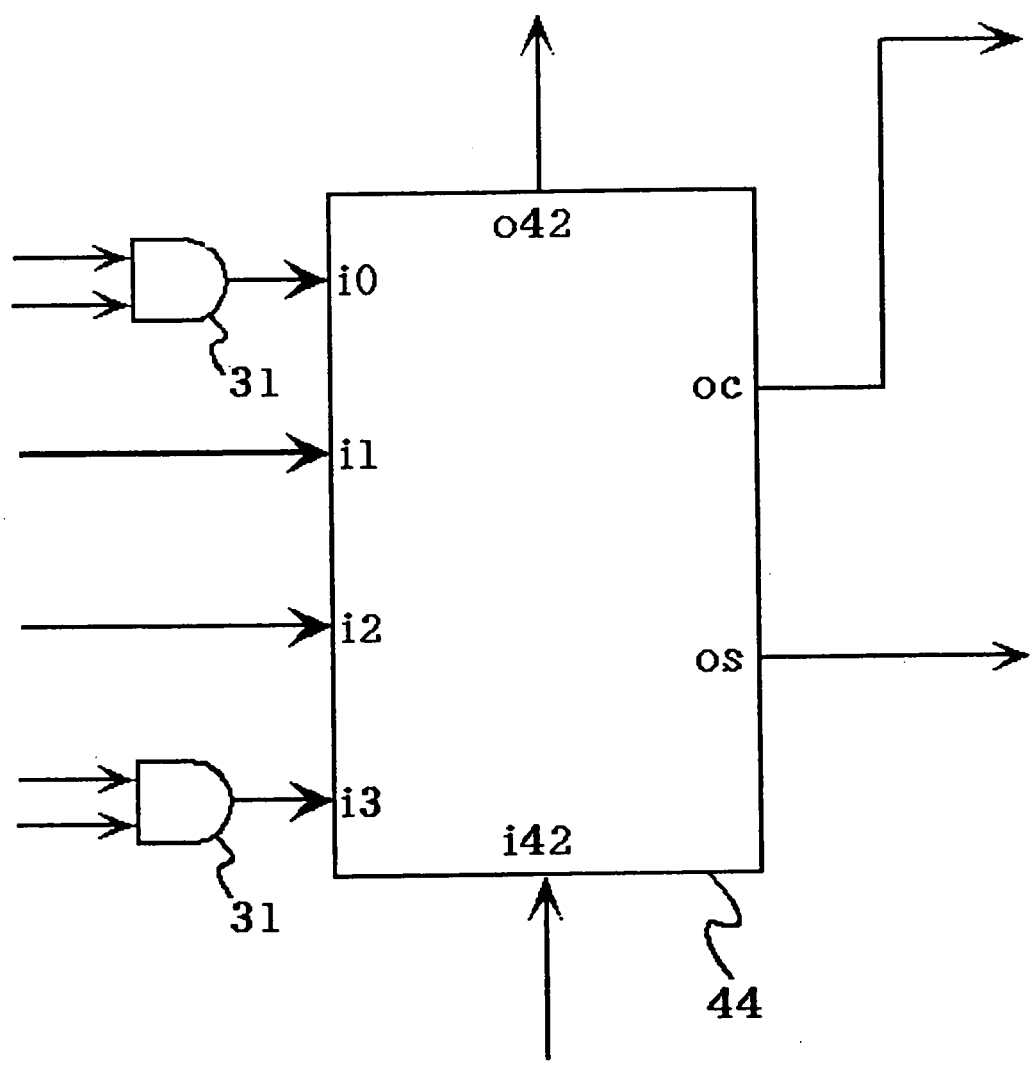
FIG. 33 is a circuit diagram showing a circuit when two circuits in the preposition logic circuit 29 of FIG. 32 are used as ANDs.

FIG. 33 is a circuit diagram showing a circuit in which two circuits in the preposition logic circuit 29 of FIG. 32 are used as AND. The function block 4 can be used as a circuit 27 in which the outputs of the ANDs 31 are connected to inputs i0 and i3 of the 4-2 adder 44 as shown in FIG. 33 (hereinafter, this circuit will be referred to as a "2AND4-2 adder").

Multiplier

Figure 34:
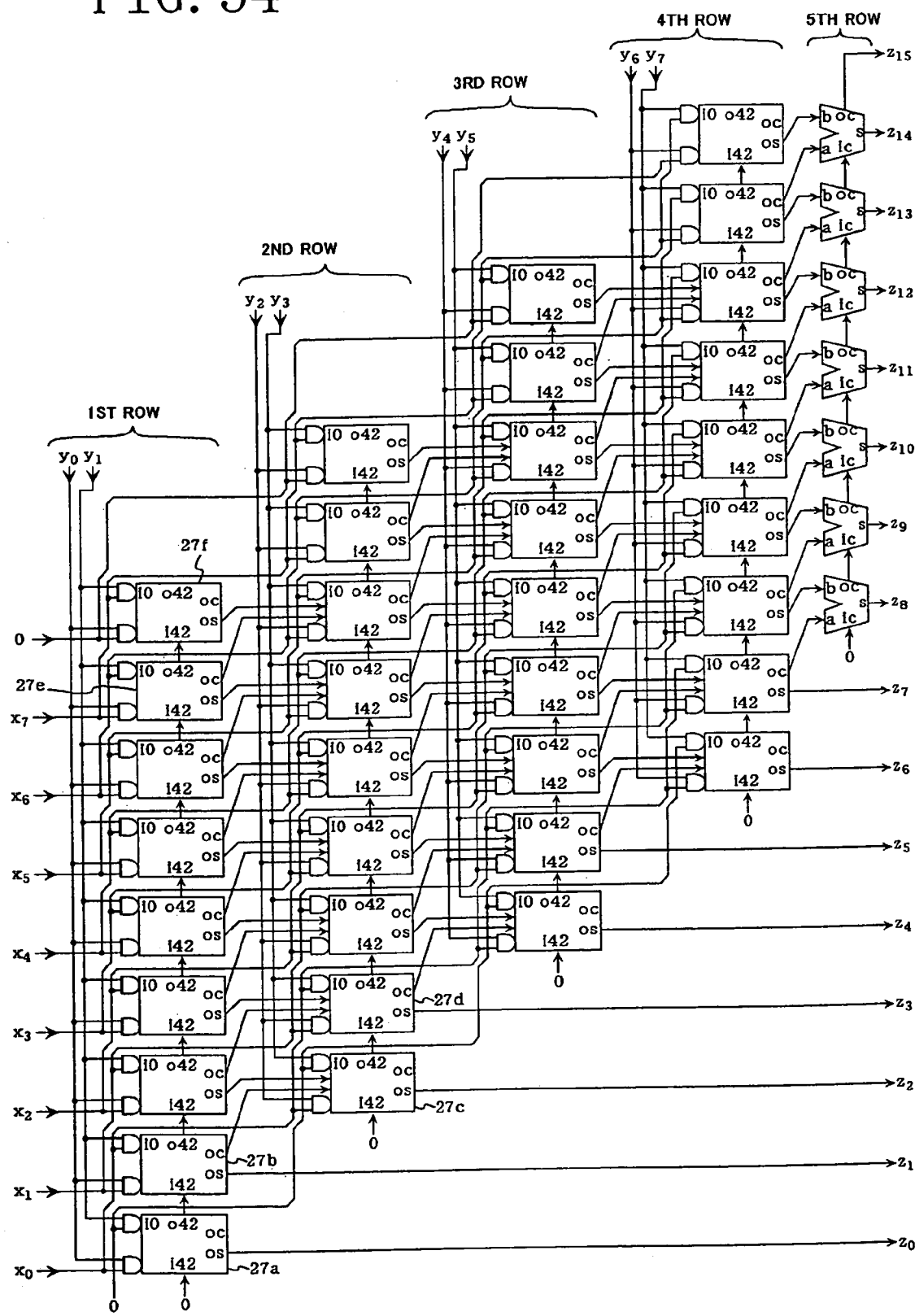
FIG. 34 is a circuit diagram showing an example of multiplier composed by using a 2AND4-2 adder shown in FIG. 33.

FIG. 34 is a circuit diagram showing an example of multiplier composed of the 2AND4-2 adders of FIG. 33. This is an example for generating a product $Z=z_{15}z_{14}z_{13}z_{12}z_{11}z_{10}z_9z_8z_7z_6z_5z_4z_3z_2z_1z_0$ of a multiplicand $X=x_7x_6x_5x_4x_3x_2x_1x_0$ and a multiplier $Y=y_7y_6y_5y_4y_3y_2y_1y_0$. Similarly to the 4AND4-2 adder 25 of FIG. 30, only the position of the input i0 is indicated in the symbol of the 2AND4-2 adder 27. Moreover, in FIG. 34, input lines are omitted for the 2AND4-2 adders 27$a$, 27$b$, 27$e$ and the like in which inputs i2 and i3 are supplied with a fixed logical value of 0; and output lines are also omitted for the 2AND4-2 adders 27$a$, 27$c$, 27$f$ and the like in which the carry output oc and the 4-2 carry output o42 always output a fixed logical value of 0.

In FIG. 34, each row is called a "multi-bit 2AND4-2 adder" except the fifth row (multi-bit full adder). As compared to the multi-bit 4AND4-2 adder 26 of FIG. 30, the multi-bit 2AND4-2 adder requires a less amount of wiring. Moreover, each 2AND4-2 adder 27 can be implemented to a smaller programmable function cell using the function block of FIG. 32. Unlike the multiplier of FIG. 31, in the multiplier of FIG. 34, all the rows except the last row (fifth row) are composed of the same computation blocks (multi-bit 2AND4-2 adders), thereby providing a high uniformity. With these features, the multiplier of FIG. 34 is extremely suitable for a reconfigurable device.

With regard to multiplication using the same multiplier, a multiplier device composed of the multi-bit 2AND4-2 adders connected in cascade requires only half of the number of rows as compared to a multiplier composed of the multi-bit full adders of FIG. 103 connected in cascade. That is, as compared to the multiplier of the type of FIG. 103 implemented in the conventional FPGA, the multiplier of the type of FIG. 34 implemented in a reconfigurable device using the function block (FIG. 32) of the present invention has an area and a delay reduced by almost half.

FIG. 34 shows a completely cascaded type multiplier using the multi-bit 2AND4-2 adders. It is also possible to form another type of multiplier using the multi-bit 2AND4-2 adders. In general, it is possible to form a multiplier by inputting as to-be-added data an output of a circuit composed of a plurality of stages of the multi-bit 2AND4-2 adders connected in cascade, to an arbitrary multi-bit multi-argument adder such as the complete-tree type (FIG. 16(1)), the completely cascaded type (FIG. 17(1)), the semi-cascaded type (FIG. 19), and the secondary cascaded type (FIG. 20).

Moreover, in the circuit composed of a plurality of stages of the multi-bit 2AND4-2 adders connected in cascade, the first stage and the second stage can be replaced with one 4AND4-2 adder, thereby reducing the number of computation blocks by one stage.

Figure 35:
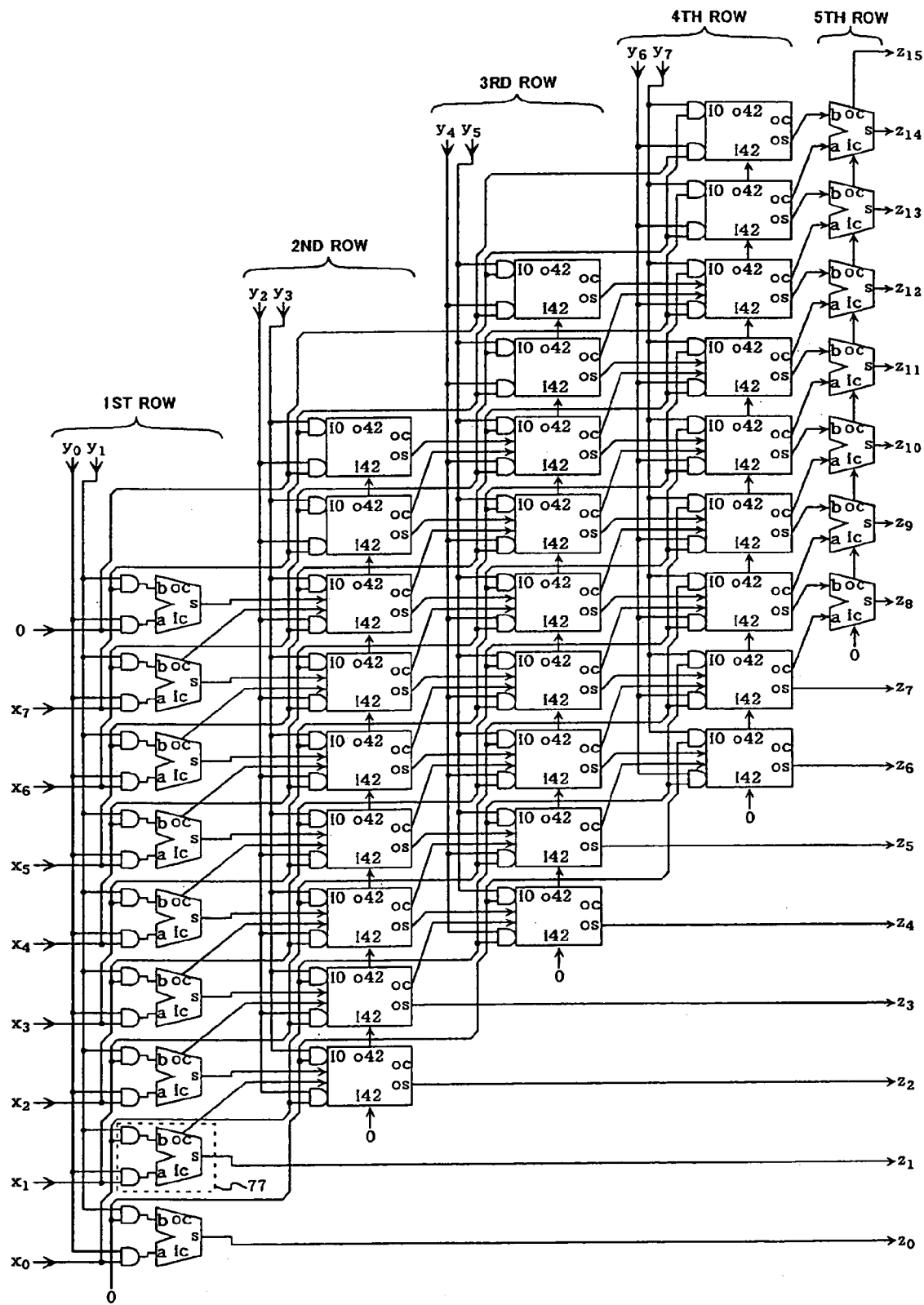
FIG. 35 is a circuit diagram of a multiplier equivalent to FIG. 34 having a different configuration.

In the completely cascaded type multiplier (FIG. 34) using the multi-bit 2AND4-2 adder, it is possible to replace the first row as shown in FIG. 35 with a circuit composed of full adders 77 in each of which two AND's are attached to the argument inputs a and b. Furthermore, the multiplier of FIG. 35 can be modified as shown in FIG. 36.

Figure 36:
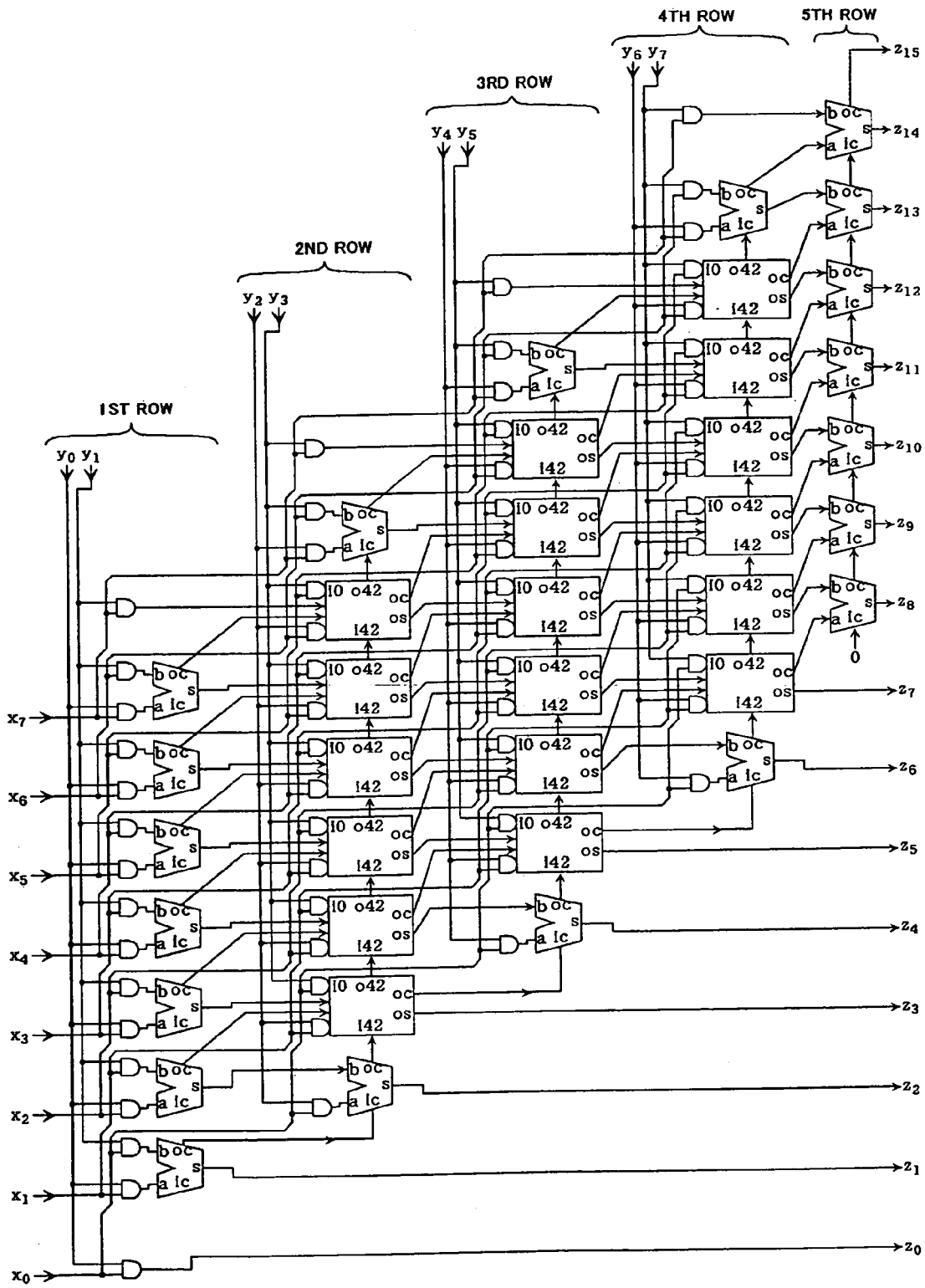
FIG. 36 is a circuit diagram of a multiplier equivalent to FIG. 35 having a different configuration.

These circuits shown in FIG. 34, FIG. 35 and FIG. 36 are equivalent. However, the circuit shown in FIG. 34 is composed of all the same calculators (2AND4-2 adders) except for the last row, while the circuits shown in FIG. 35 and FIG. 36 include different types of calculators, resulting in lack in uniformity.

In FIG. 34, the multi-bit 2AND2-4 adders are arranged such that their positions are shifted upwardly while going rightward on the sheet. That is, the computation blocks are arranged as shown in FIG. 37(1) (28_k represents a multi-bit 2AND4-2 adder of the k-th row, and 46 represents the multi-bit full adder of the last row). This is effective when using all the bits of the multiplication result; but in the case of multiplication of a mantissa of the floating-point notation in which only most significant half of the multiplication result is used, some wasted area is occupied.

When only most significant half is required, as shown in FIG. 37(2), the multi-bit 2AND4-2 adders are horizontally arranged, which can reduce the substantial multiplier area and eliminate the unnecessary space. This works most effectively in the completely cascaded multiplier of the 2AND4-2 adders. If the multi-bit 2AND4-2 adders are connected in other way, then a computation block having a large bit width is required and therefore the arrangement of FIG. 37(2) cannot reduce the multiplier area so much.

4-Input MUX

Next, explanation will be given on the other effect of the function block equipped with a preposition logic circuit as shown in FIG. 23.

Figure 38:
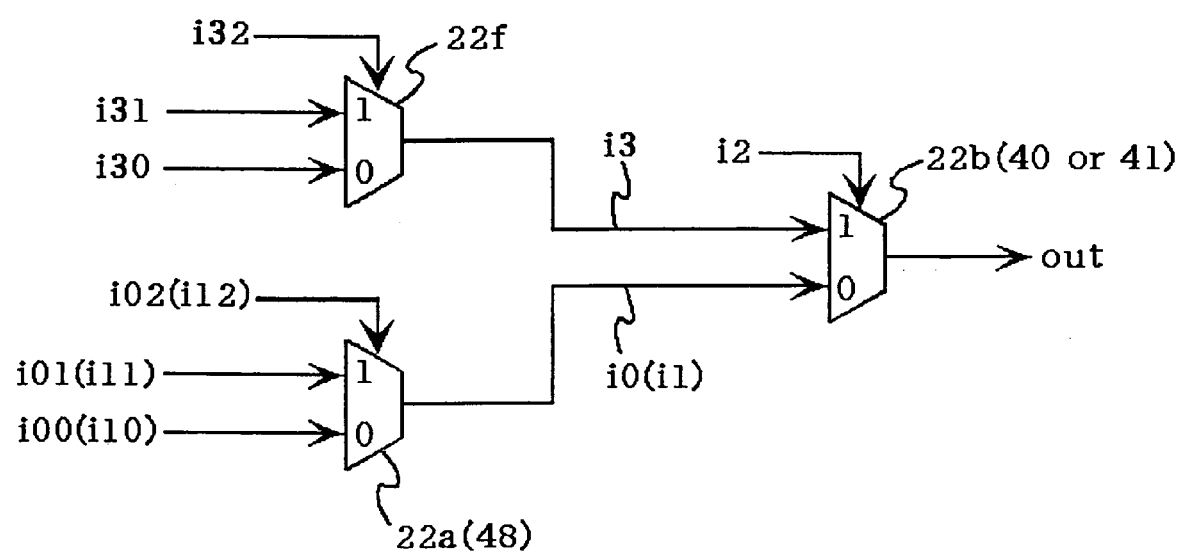
FIG. 38 is a circuit diagram showing an example of a 4-input MUX composed in accordance with the function block having a preposition logic circuit as shown in FIG. 23.

FIG. 38 is a circuit diagram showing an example of 4-input MUX based on the function block with the preposition logic circuit as shown in FIG. 23. The function block 4 of FIG. 23 can be used as a 4-input MUX, which will be described hereafter. In the preposition logic circuit 29 of FIG. 23, the AND 31 is replaced by a 2-input MUX 22a; and configuration is made so that one input of the i20 and i21 of the 2-input LUT 49 is output directly to i2, or the 2-input LUT 49 is removed. And a 2-input MUX using in3 and in0 as data inputs and in2 as a control input is implemented in the logic function generator 40. Here, reference numeral 22b corresponds to the MUX implemented in the logic function generator 40 and its output out is a logic output o1 of FIG. 23 output from the function block 4.

Moreover, instead of replacing the AND 31 of FIG. 23 by a 2-input MUX, a 2-input MUX can be implemented in the 3-input LUT 48 to obtain the same effect. Here, as shown within round brackets 0 of FIG. 38, the MUX 22a corresponds to the 3-input LUT 48, i00 corresponds to i10, i01 corresponds to i11, i02 corresponds to i12, and i0 corresponds to i1, respectively.

Figure 107:
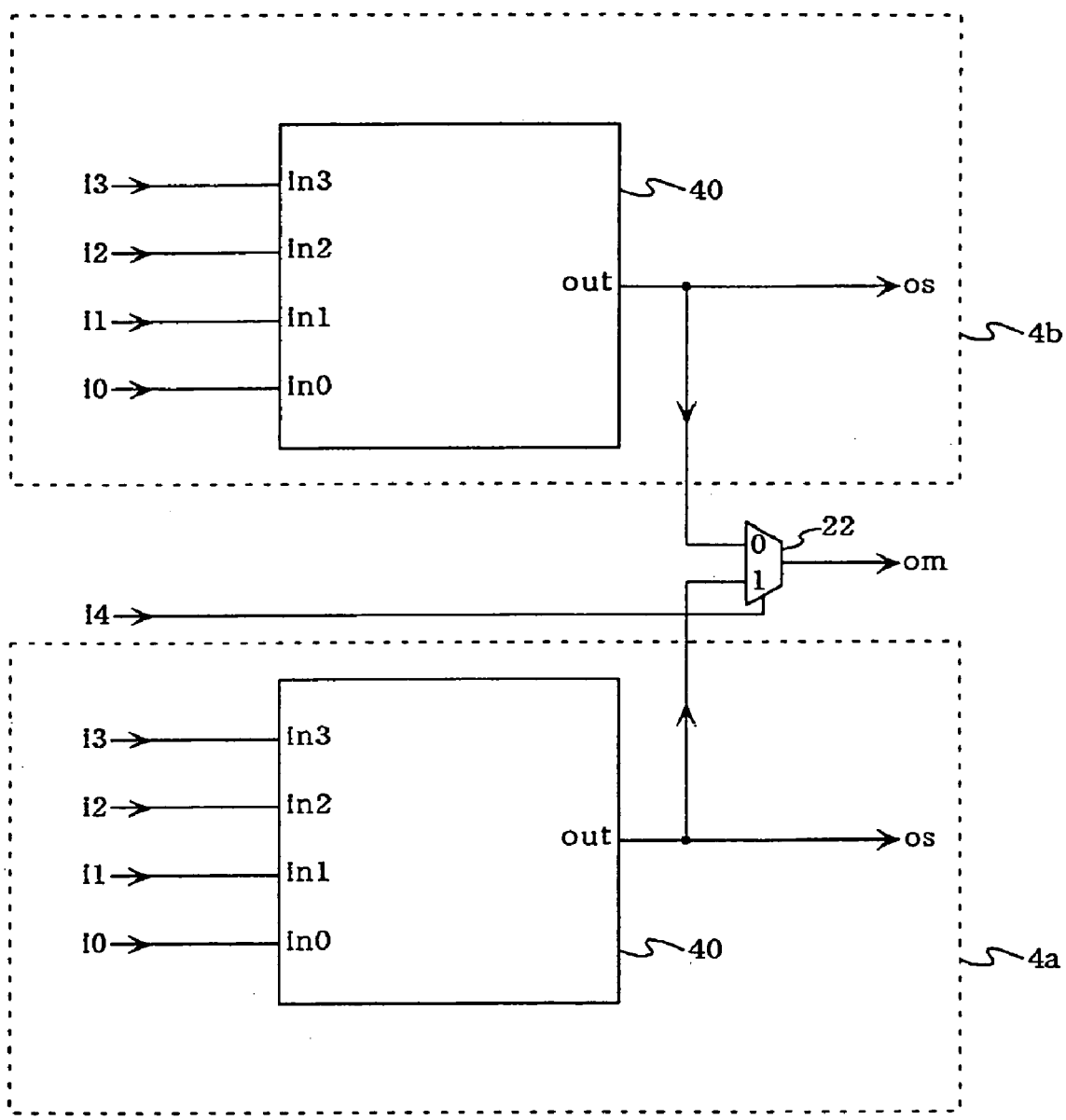
FIG. 107 is a circuit diagram showing a configuration example of a 4-input MUX using a conventional function block.

As shown in FIG. 107, in order to implement a 4-input MUX in the conventional FPGA, at least two function blocks are required. In contrast, one function block according to the present invention can realize a 4-input MUX and the area is almost halved as compared to the conventional one.

Figure 39:
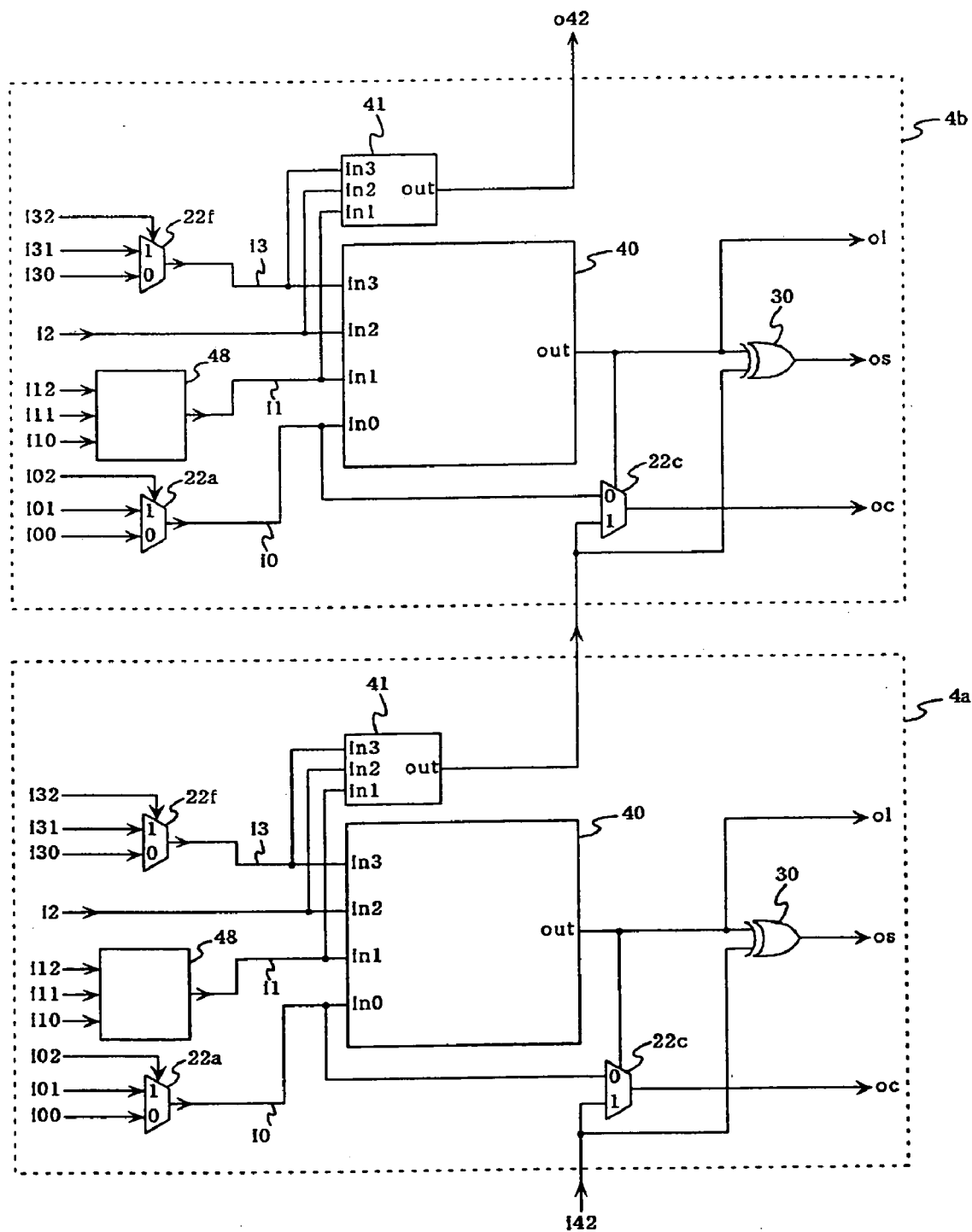
FIG. 39 is a circuit diagram for explaining a construction method of a 4-input MUX striding over two function blocks.

The function block of FIG. 23 can also be used as a 4-input MUX in other way. A 3-input LUT is used as the 4-2 carry block 41, which has a 2-input MUX having in3 and in1 as data inputs and in2 as a control input implemented therein. And a 2-input MUX is also implemented in the 3-input LUT 48. Thus, it is possible to realize a 4-input MUX as shown in FIG. 38. Here, as shown within round brackets ( ) of FIG. 38, the MUX 22b corresponds to the 4-2 carry block 41, and the MUX 22a corresponds to the 3-input LUT 48. However, since the output o42 of the 4-2 carry block 41 is connected to the adjacent function block as shown in FIG. 39, the output out of FIG. 38 should be taken out of the adjacent function block. Referring to FIG. 39, detailed explanation will be given.

FIG. 39 is a circuit diagram for explaining a configuration method of the 4-input MUX striding over two function blocks. In FIG. 39, a 4-2 carry output o42 of a function block 4a is connected to a 4-2 carry input i42 of the adjacent function block 4b, i.e., input-1 of the MUX 22c. Accordingly by configuring the logic function generator 40 to output a fixed logical value of 1 and by taking out the input-1 of the MUX 22c as the carry output oc from the function block, it is possible to use an output of the 4-input MUX of this method.

Alternatively, by configuring the logic function generator 40 to output a fixed logical value of 0, it is possible to take out an output of the 4-input MUX of this method as an addition output os via the XOR 30. In this configuration, one 4-input MUX strides over the two function blocks 4a and 4b. However, the programmable function blocks 4a and 4b can further be used as a part of other 4-input MUX and accordingly, one 4-input MUX can be formed substantially per one programmable function block.

Next, explanation will be given on still another configuration of the 4-input MUX. In FIG. 39, the MUX 22f of the function block 4a and the MUX 22a and 22c of the function block 4b are used as a 2-input MUX constituting the 4-input MUX. For this, the 4-2 carry block 41 of the function block 4a is set so that a signal of the input in3 is transmitted directly to the output out, and the logic function generator 40 of the function block 4b is set so that a signal of the input in2 is transmitted directly to the output out. Here, the MUX 22a of the function block 4b and the MUX 22f of the function block 4a function as two 2-input MUX'es of the input stage of the 4-input MUX, an input i2 of the function block 4b becomes a control signal of the MUX 22c, and the MUX 22c functions as a 2-input MUX of an output stage of the 4-input MUX.

When the 4-2 carry block 41 is a 3-input LUT, it is easy to configure so as to output one input directly. However, even when the 4-2 carry block 41 is a circuit dedicated for generating a carry signal as shown in FIG. 8, such a function can be realized. This is because in general, in a carry signal generation circuit, when two of the three inputs are set to logical values 0 and 1 respectively, the remaining one input is output as it is. Accordingly, in the respective function blocks of FIG. 39, by implementing an inverter reversing the i12 when output in the 3-input LUT 48 and by inputting the same signal as i2 to the i12, the 4-2 carry block 41 outputs the signal of input in3 as it is. In this configuration, one 4-input MUX also strides over the two function blocks 4a and 4b. However, the programmable function blocks 4a and 4b can further be used as a part of the other 4-input MUX. Accordingly, substantially one 4-input MUX can be formed per one programmable function block.

And now, when using the input i2 of the function block as the control input of the MUX 22c, the control signal should go through the logic function generator 40, thereby increasing the delay. This problem can be overcome by using a function block as shown in FIG. 40.

2.6) Modified Example of the Second Embodiment (2)

Figure 40:
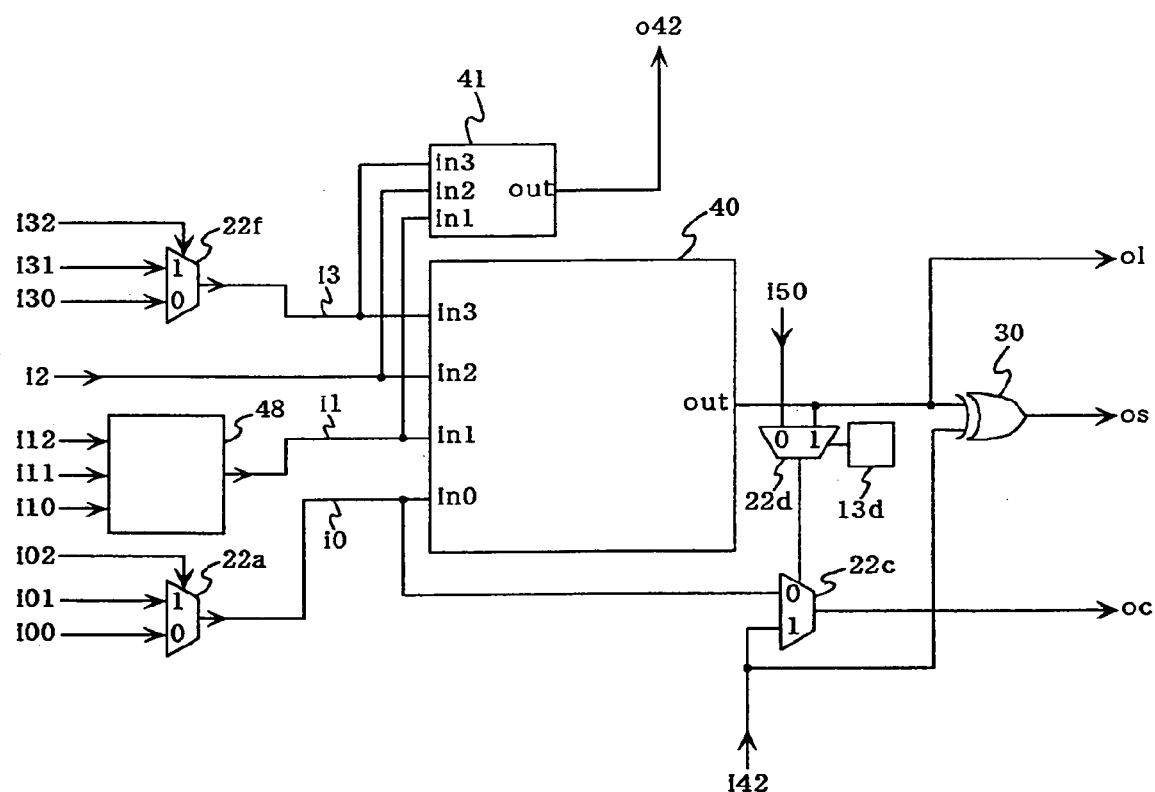
FIG. 40 is a circuit diagram showing a modified example of the function block according to the second embodiment of the present invention.

FIG. 40 is a circuit diagram showing another modified example of the function block according to the second embodiment of the present invention. In the function block of the present invention as described above (for example, 4a and 4b of FIG. 39), instead of directly connecting the logic function generator 40 with the control input of the MUX 22c, they are connected via an MUX 22d as shown in FIG. 40.

The MUX 22d is controlled by a configuration memory 13d. When the configuration memory 13d stores a logical value of 1, the MUX 22c is controlled by an output of the logic function generator 40. When the configuration memory stores a logical value of 0, the MUX 22c is controlled by a control input i50. The latter control can be performed faster and is suitable for configuring the 4-input MUX of high performance. Moreover, when controlling the MUX 22c with the i50, by inputting a fixed logical value of 0 as the i50, it is possible to output the input i00 or i01 of the function block 4 via the input-0 of the MUX 22c to the carry output oc. Thus, it is possible to output the input of the function block 4 at a high speed by bypassing the logic function generator 40. Such a signal bypass is used when using only the D-FF in the output block 5 of the programmable function cell as shown in FIG. 1 and when improving the routability.

The same can be performed in the function block (4a or 4b) of FIG. 39 by configuring the logic function generator 40 so as to output a fixed logical value of 0. However, in this case, the logic function generator 40 cannot be used as another logic circuit. On the other hand, in the function block 4 of FIG. 40, by supplying the control input of the MUX 22c via the i50, the logic function generator 40 can be used for another purpose. When the aforementioned bypass is used, the input i0 is occupied for the bypass but the other inputs i1, i2 and i3 can be used as inputs of the logic function generator 40. That is, one function block 4 can simultaneously realize a signal bypass and a 3-input logic circuit. An output of the 3-input logic circuit here is taken out from a logic output ol of FIG. 40.

3. Third Embodiment
3.1) Function Block

Figure 41:
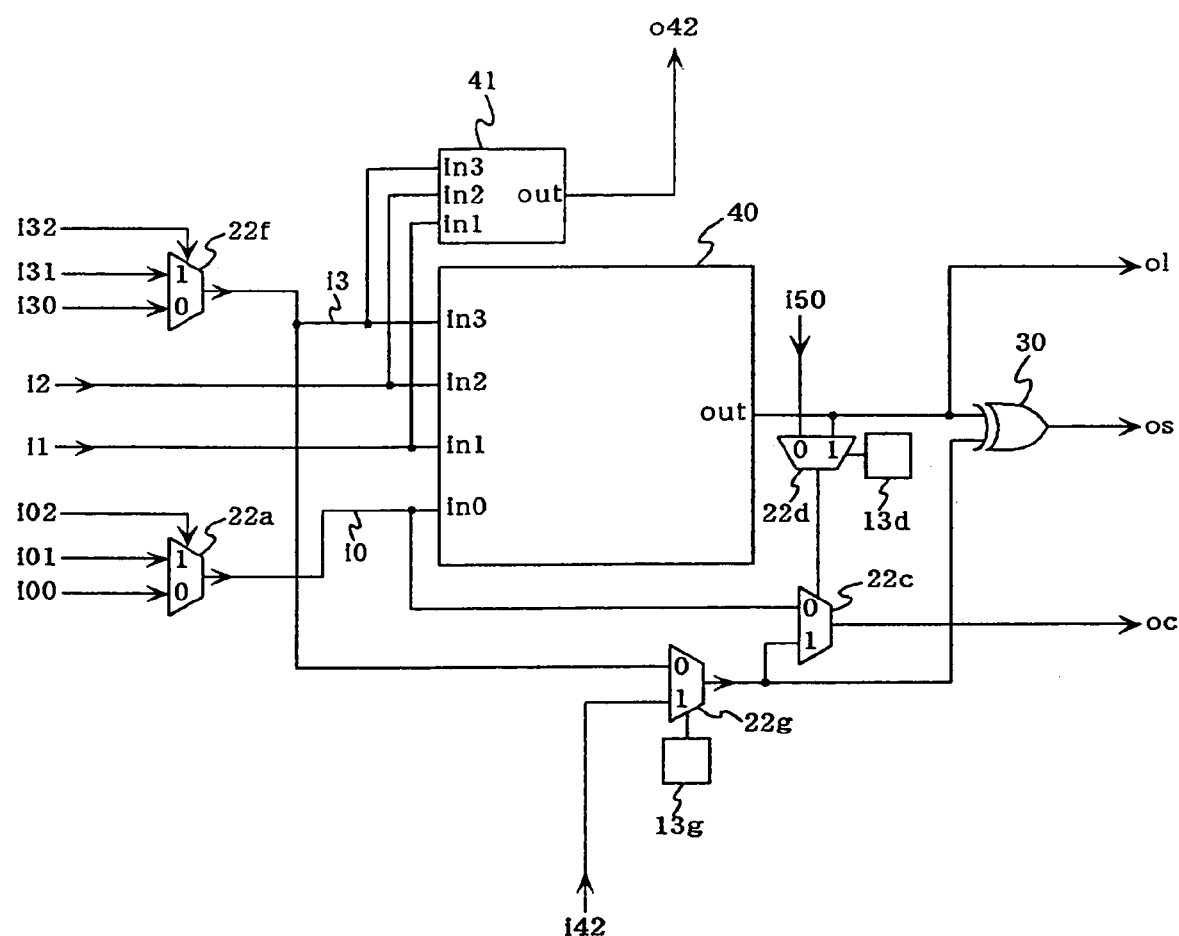
FIG. 41 is a circuit diagram showing a third embodiment of the function block according to the present invention.

FIG. 41 is a circuit diagram showing a function block according to a third embodiment of the present invention. This is different from the function block 4 of FIG. 40 in that the output of the MUX 22f and the 4-2 carry input i42 are connected to an input-0 and input-1 of an MUX 22g respectively, and an output of the MUX 22g is connected to an input-1 of the MUX 22c and to one of the inputs of the XOR. FIG. 41 shows an example in which the 3-input LUT 48 of FIG. 40 is removed but this is not an essential point. For example, a preposition logic circuit may be attached to the i1 and i2 of FIG. 41.

The function block 4 according to the present embodiment has the same function as the function block 4 of FIG. 32 (except that the AND 31 of FIG. 32 is replaced with the MUX 22a) when the configuration memory 13d and the configuration memory 13g controlling the MUX 22g both store a logical value of 1. On the other hand, when the configuration memories 13d and 13g both store a logical value of 0, a 4-input MUX is formed by the MUX 22a, 22f and 22c of FIG. 41. This 4-input MUX, unlike the aforementioned ones, contains neither 4-2 carry block 41 nor the logic function generator 40 on the signal route and therefore operates at high speeds.

Furthermore, the function block 4 according to the present embodiment can also be used as a 1-bit full adder by using the MUX 22c as a ripple carry circuit. For this, logical values 1 and 0 are stored in the configuration memories 13d and 13g, respectively, and an XOR having inputs in1 (or in2) and in0 is implemented in the logic function generator 40. Here, the in1 (or in2) and in0 of FIG. 41 correspond to the argument inputs of the 1-bit full adder; the addition output os corresponds to an addition output of the 1-bit full adder; the carry output oc corresponds to a ripple carry output; and an output of the MUX 22f (i.e., input i30 or i31) corresponds to a ripple carry input. The ripple carry signal is transferred from the carry output oc via the interconnection wire group to an input i30 (or i31) of an adjacent function block.

3.2) Modified Example of Third Embodiment

Figure 42:
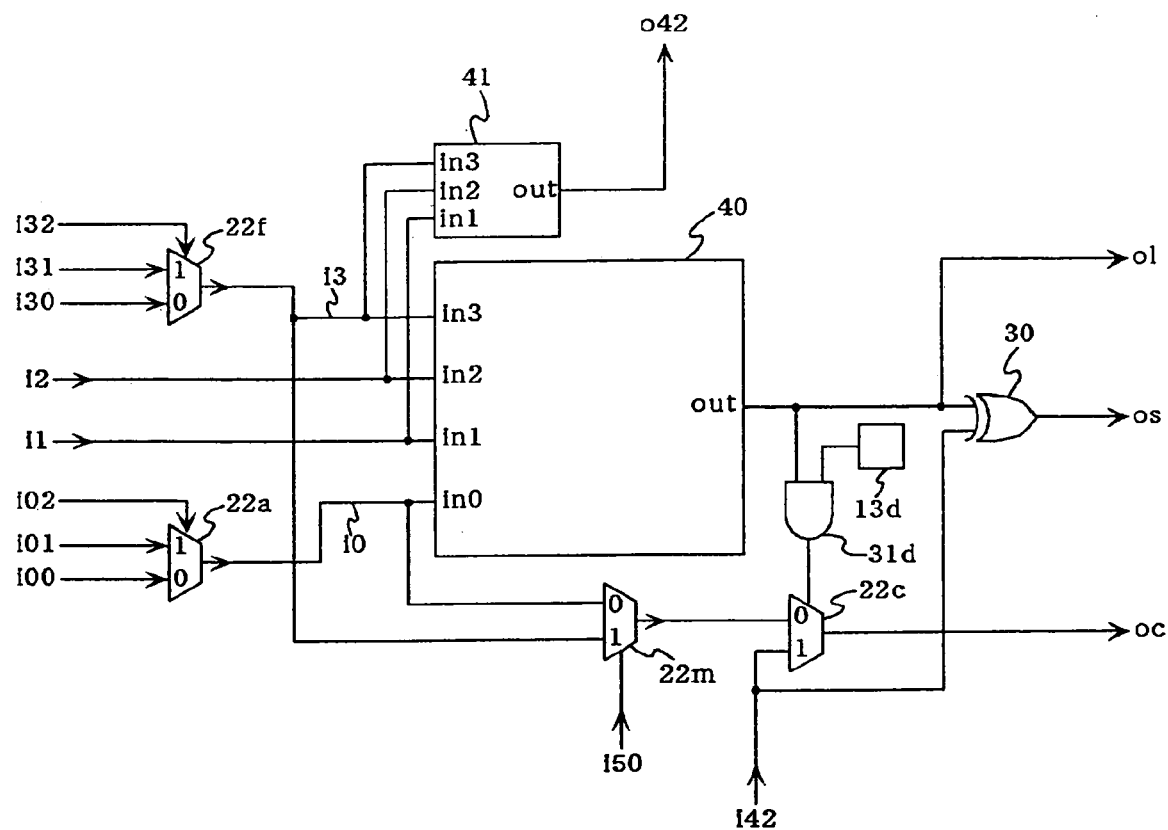
FIG. 42 is a circuit diagram showing a modified example of the third embodiment of the function block according to the present invention.

FIG. 42 is a circuit diagram showing a modified example of the function block according to the third embodiment of the present invention. Here, the outputs of the MUX 22a and 22f are connected to an input-0 and input-1 of an MUX 22m, respectively, and an input of the MUX 22m is supplied with the control signal i50. These three 2-input MUX'es constitute a 4-input MUX.

The input-0 and input-1 of the MUX 22c are connected with an output and a 4-2 carry input 42 of the MUX 22m, respectively, and an output of the AND 31d supplied with an output of the logic function generator 40 and an output of the configuration memory 13d is connected to a control input of the MUX 22c. When the configuration memory 13d stores a logical value of 0, the function block 4 of FIG. 42 can be used as a 4-input MUX.

On the other hand, when the control input i50 is supplied with a fixed logical value of 0 and the configuration memory 13d stores a logical value of 1, the same function as the function block 4 of FIG. 32 (except that the AND 31 of FIG. 32 is replaced by the MUX 22a) is obtained.

In FIG. 42, since the control signal i50 is directly input to the output stage MUX 22m of the 4-input MUX, control can be performed at a high speed as compared to FIG. 41 in which the control signal is input via the MUX 22d. Moreover, in FIG. 41, the 4-2 carry input i42 is output via the MUX 22g and 22c to the carry output oc while in FIG. 42 the 4-2 carry input i42 is output via only one MUX 22c, thereby obtaining a merit of delay reduction.

In FIG. 42, the AND 31 is used for controlling the MUX 22c but it is not limited to this. For example, when an NAND is used instead of the AND 31d, the same function can be obtained by exchanging the input-0 and input-1 of the MUX 22c. Moreover, use of the AND 31d and the configuration memory 13d for controlling the MUX 22c is not limited to FIG. 42 but can also be realized in the other function blocks of the present invention. For example, in case this is applied to the function block 4 of FIG. 6, when the configuration memory 13d stores a logical value of 0, it is possible to simultaneously implement a route for outputting a signal from the input i0 via the MUX 22c (i.e., bypassing the logic function generator 40) to oc and the logic function to make i1, i2 and i3 inputs and ol an output.

Explanation has been given on the embodiment of the present invention in which a 4-input MUX can be implemented in one (or substantially one) function block. Next, explanation will be given on a barrel shifter in which the merit is brought into good play.

3.3) Barrel Shifter

A barrel shifter is a circuit in which a shift amount of multi-bit data can dynamically be changed in accordance with a control signal and is mainly used in a floating point addition/subtraction.

Figure 43:
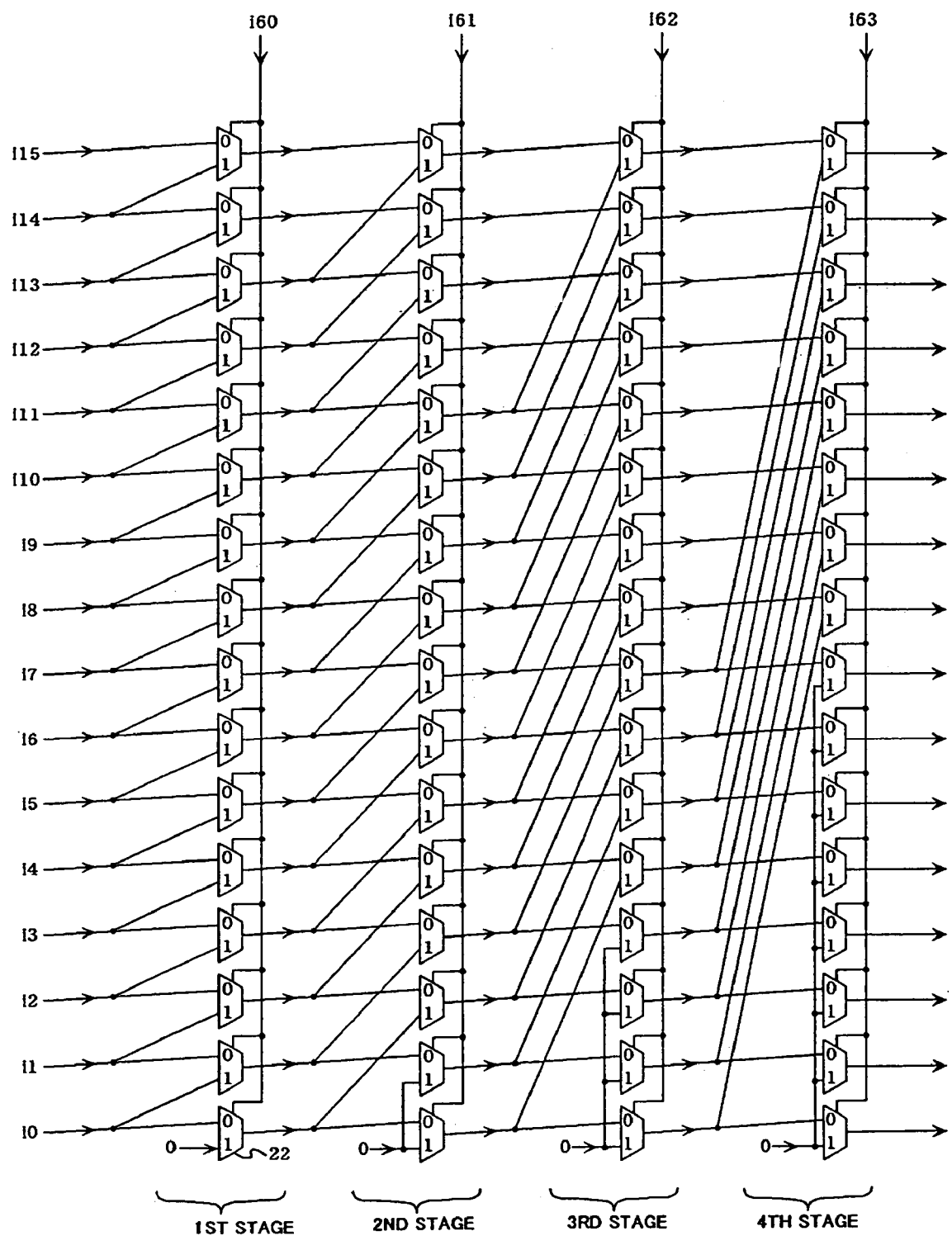
FIG. 43 is a circuit diagram showing an ordinary barrel shifter composed of a 2-input MUX.

FIG. 43 is a circuit diagram showing an ordinary barrel shifter composed of 2-input MUXs. In FIG. 43, 16-bit input data i0 to i15 go through blocks of first to fourth stages composed of 2-input MUXs to be output. The first stage outputs the input data as it is or after shifting it by one bit in accordance with a control input i60. The second stage outputs input data from the first stage as it is or after shifting it by two bits in accordance with a control input i61. The third stage outputs input data from the second stage as it is or after shifting it by four bits in accordance with a control input i62. The fourth stage outputs input data from the third stage as it is or after shifting it by eight bits in accordance with a control input i63.

As a whole, the barrel shifter of FIG. 43 can perform any shifting of 0 bit to 15 bits in accordance with the control input. If this is implemented in the conventional FPGA, one 2-input MUX corresponds to one function block and accordingly a plenty of programmable function cells are needed and the delay is also increased.

Figure 44:
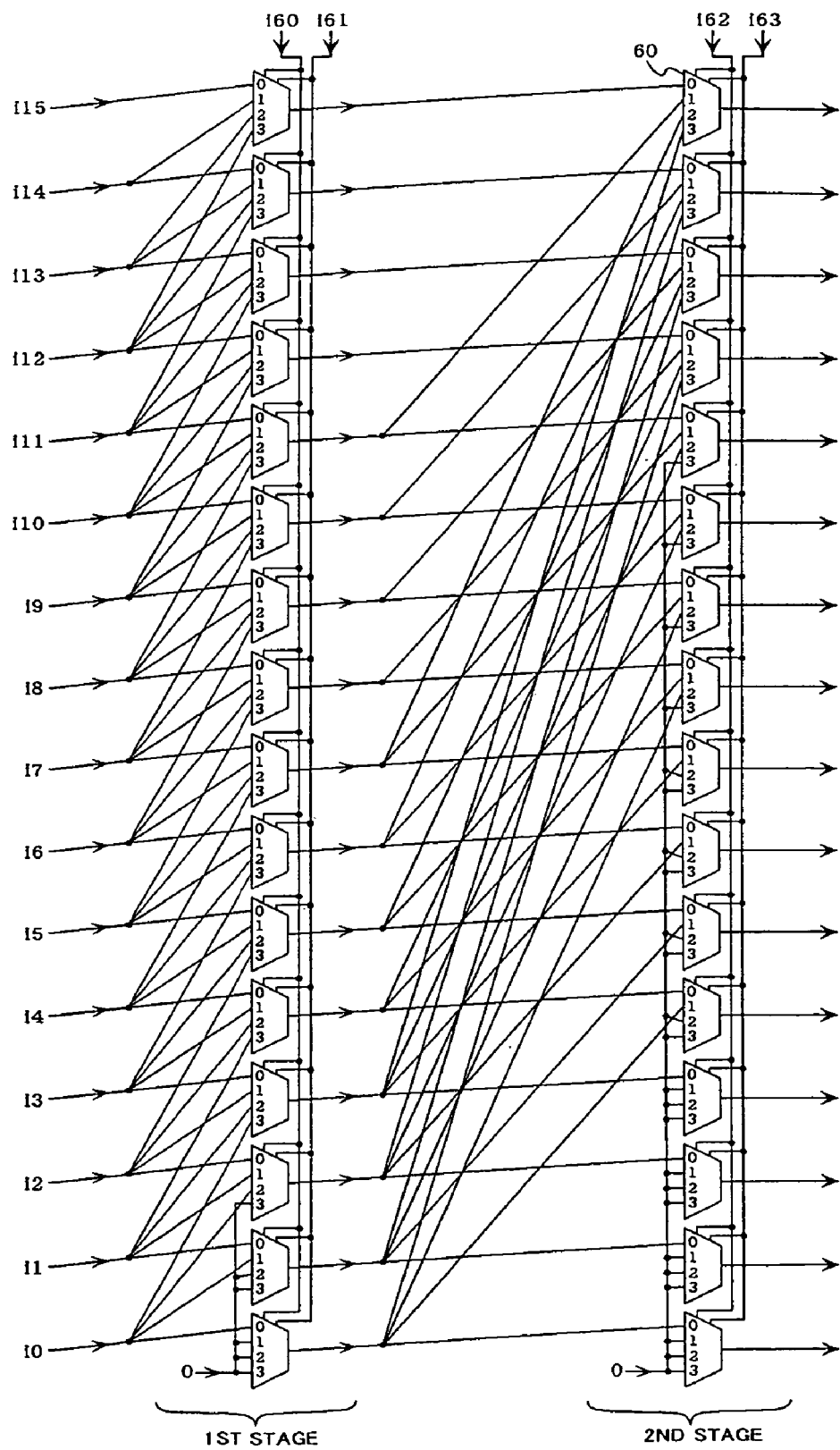
FIG. 44 is a circuit diagram showing an example of a barrel shifter composed of a 4-input MUX according to the present invention.

FIG. 44 is a circuit diagram showing an example of barrel shifter composed of the 4-input MUXs according to the present invention. Here, numbers 0, 1, 2 and 3 in the symbol of each MUX 60 mean that, when the respective control inputs i62 and i63 are 0 and 0, an input at 0 is selected to output it; when the respective control inputs i62 and i63 are 1 and 0, an input at 1 is selected to output; when the respective control inputs i62 and i63 are 0 and 1, an input at 2 is selected to output; and when the respective control inputs i62 and i63 are 1 and 1, an input at 3 is selected to output.

In FIG. 44, the first stage performs data shifting by 0, 1, 2 or 3 bits in accordance with the control inputs i60 and i61. The second stage performs data shifting by 0, 4, 8 or 12 bits in accordance with the control bits i62 and i63. As a whole, the barrel shifter of FIG. 44 can perform any shift of 0 bit to 15 bits in accordance with the control input.

If this is implemented in the conventional FPGA, as shown in FIG. 107, two function blocks are used for one 4-input MUX and accordingly, the number of programmable function cells identical to that of a barrel shifter using 2-input MUX are consumed.

In contrast, when using the function block according to the present invention, it is possible to form a 4-input MUX with one function block. Accordingly, it is possible to implement a barrel shifter having the same function using one half of the conventional area. Moreover, as compared to the barrel shifter using the 2-input MUX in FIG. 43, the barrel shifter using the 4-input MUX in FIG. 44 has a half number of stages and therefore the delay is also halved.

4. Fourth Embodiment 4.1) Function Block

Figure 45:
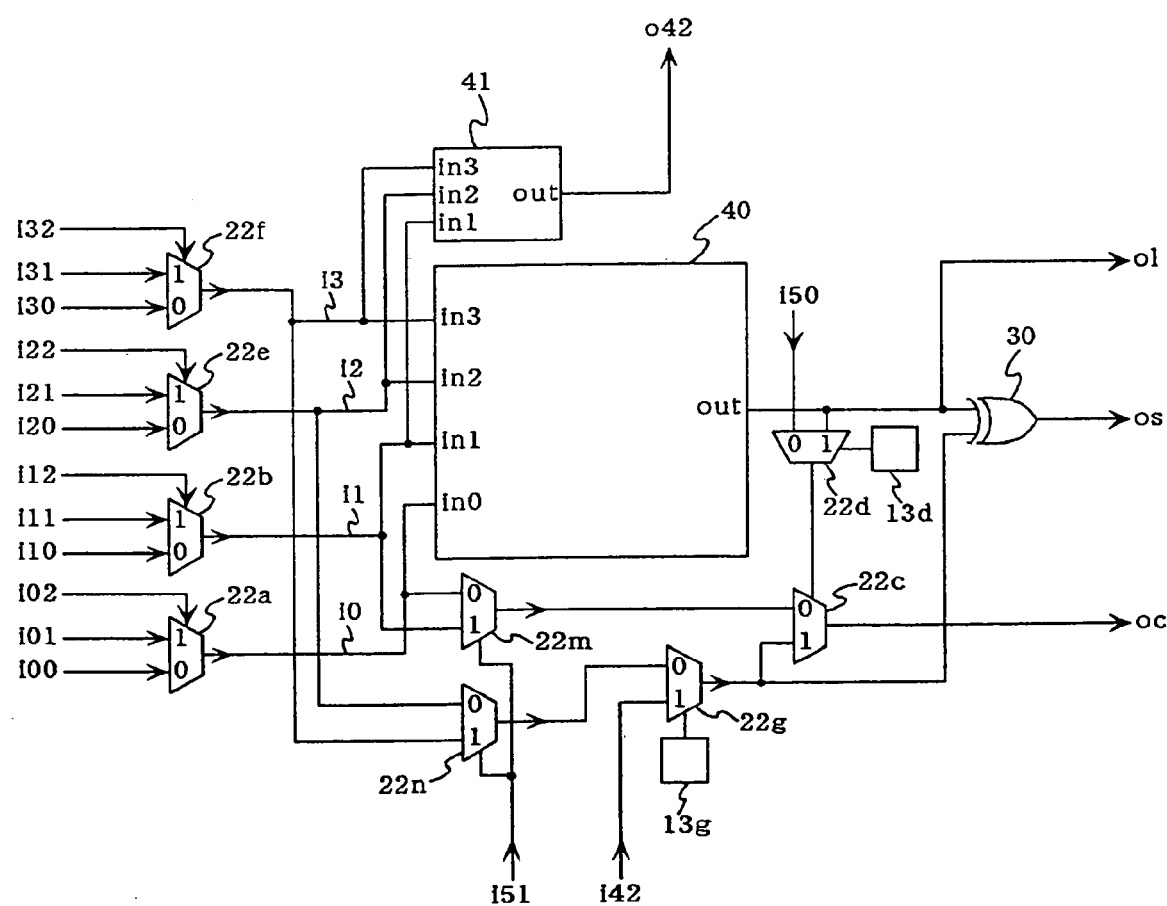
FIG. 45 is a circuit diagram showing a fourth embodiment of the function block according to the present invention.

FIG. 45 is a circuit diagram showing a function block according to a fourth embodiment of the present invention. In the embodiment, in function block 4 of FIG. 40, there are provided MUX 22b, MUX 22e, MUX 22n and MUX 22m. The inputs i1 and i2 of the logic function generator 40 are connected with outputs of the MUX 22b and 22e, respectively. Outputs of the MUX 22e and 22f are connected to input-0 and input-1 of the MUX 22n, respectively. Outputs of the MUX 22a and 22b are connected to input-0 and input-1 of the MUX 22m, respectively. Furthermore, the MUX 22m and 22n are controlled by a control input i51 and outputs of the MUX 22m and 22n are connected to input-0 of the MUX 22c and 22g, respectively.

Thus, one function block according to the present embodiment can realize 8-input MUX. In order to use as the 8-input MUX, 0 is stored in both of configuration memories 13d and 13g. Here, an 8-input MUX is formed using the four MUXs 22a, 22b, 22e and 22f as an input stage, the two MUXs 22m and 22n as the second stage, and the MUX 22c as the output stage.

Moreover, the function block 4 according to the present embodiment can also realize the 4AND4-2 adder 25 shown in FIG. 29 by using the four MUXs 22a, 22b, 22e and 22f as AND.

Furthermore, in the same way as is the case with FIG. 41, the function block 4 according to the present embodiment can constitute a full adder. For this, logical values 1 and 0 are stored in the configuration memories 13d and 13g respectively, and the control input i51 is set to a fixed logical value, e.g., 0. And an XOR for inputting in1 (or in3) and in0 is implemented in the logic function generator 40. Here, the function block 4 according to the present embodiment functions as a 1-bit full adder using in1 (or in3) and in0 as argument inputs, an output of the MUX 22e (i.e., i20 or i21) as a ripple carry input, and the carry output oc as a ripple carry output.

4.2) Modified Example of the Fourth Embodiment

Figure 46:
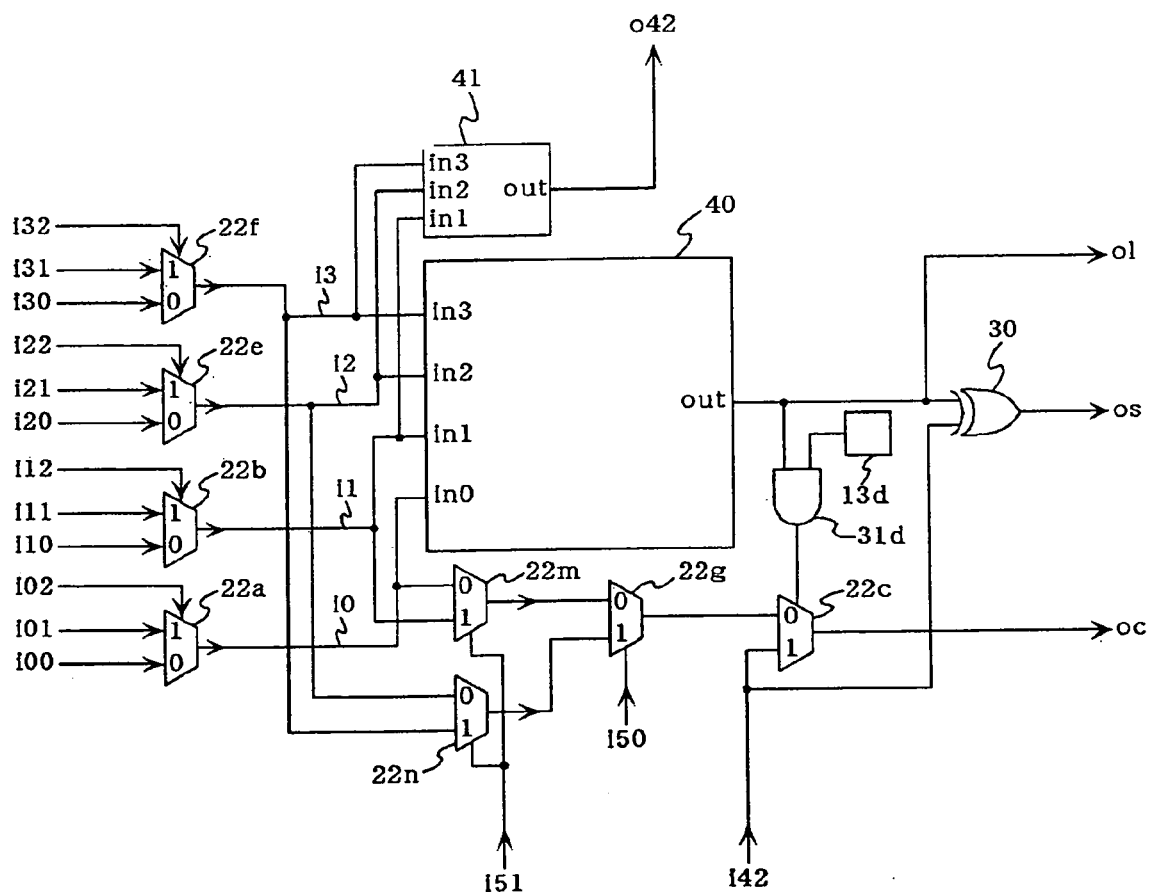
FIG. 46 is a circuit diagram showing a modified example of the fourth embodiment of the function block according to the present invention.

FIG. 46 is a circuit diagram showing a modified example of the function block according to the fourth embodiment of the present invention. This embodiment differs from the function block 4 of FIG. 42 in that MUX 22b, MUX 22e, MUX 22n, MUX 22m and MUX 22g are provided. The inputs i1 and i2 of the logic function generator 40 are connected with outputs of the MUX 22b and 22e, respectively. The outputs of the MUX 22e and 22f are connected to input-0 and input-1 of the MUX 22n, respectively. The outputs of MUX 22a and 22b (instead of the MUX 22m of FIG. 42) are connected to input-0 and input-1 of the MUX 22m, respectively. The outputs of the MUX 22m and 22n are connected to input-0 and input-1 of the MUX 22g, respectively. Moreover, the control input i51 controls the MUX 22m and 22n, the control input i50 controls the MUX 22g, and the output of the MUX 22g is connected to input-0 of the MUX 22c.

Thus, one function block 4 according to the present embodiment can realize an 8-input MUX. To use it as the 8-input MUX, a logical value of 0 is stored in the configuration memory 13d. Thus, an 8-input MUX is formed using the four MUX 22a, 22b, 22e and 22f of the preposition logic circuit as an input stage, the two MUX 22m and 22n as a second stage, and the MUX 22g as an output stage. The output of the output stage is taken out to oc via the MUX 22c.

Moreover, the function block 4 of FIG. 46 can also realize the 4AND4-2 adder 25 shown in FIG. 29 by using the four MUX 22a, 22b, 22e and 22f as AND.

5. Fifth Embodiment

And now, in the full adder composed of the function block of the aforementioned FIG. 45 (or FIG. 41), the ripple carry signal is transferred from the carry output oc via the output block 5 (FIG. 1) and the interconnection wire group to the adjacent programmable function cell, and in the cell, input to the function block via the input selection unit. Thus, going through some switching circuits and the interconnection wire group which a plenty of circuits are connected to and thereby is burdened with relatively heavy load makes a signal propagation delay fairly large. Next, explanation will be given on a function block for realizing high-speed ripple carry propagation.

5.1) Function Block

Figure 47:
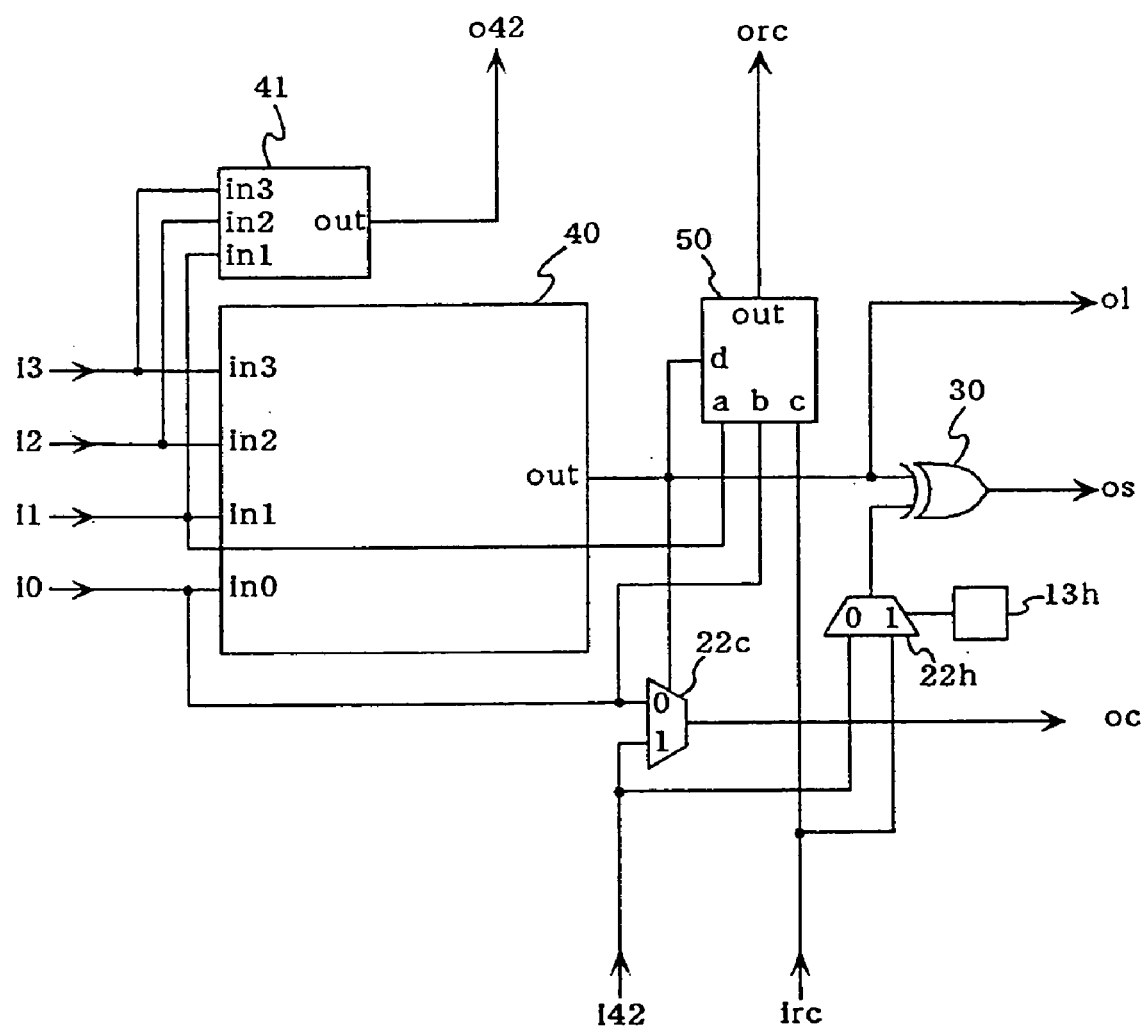
FIG. 47 is a circuit diagram showing a fifth embodiment of the function block according to the present invention.

FIG. 47 is a circuit diagram showing a function block according to a fifth embodiment of the present invention. This differs from the function block of FIG. 6 in that the function block is connected with a ripple carry block 50. An input c and output out of the ripple carry block 50 are connected to a ripple carry input irc and a ripple carry output orc, respectively. The inputs a, b and d are not necessarily used all. Moreover, the inputs a and b may be connected to any of i0, i1, i2 and i3 and FIG. 47 shows only one example of how to be connected.

The ripple carry block 50 can be realized using the same method as the 4-2 carry block 41. Accordingly, one of the circuits FIG. 8(1) to FIG. 8(7) can be used. Here, the inputs in1, in2 and in3 in FIG. 8(1), FIG. 8(2), FIG. 8(3). FIG. 8(6) and FIG. 8(7) correspond to the inputs c, b and a of the ripple carry block 50, respectively, and the input d is not used. The inputs in1, in2 and in3 and the output of the XOR 30 in FIG. 8(4) correspond to the inputs c, b, a and d of the ripple carry block 50, respectively. The inputs in1 and in2 and the output of the XOR 30 in FIG. 8(5) correspond to the inputs c, b and d of the ripple carry block 50 and input a is not used. The output out in each of the circuits of FIG. 8 corresponds to the output out of the ripple carry block 50.

When using the function block 4 of FIG. 47 as a 1-bit full adder, an XOR having inputs in0 and in1 and an output out is implemented in the logic function generator 40. Here, the inputs i0 and i1 and the addition output os of the function block 4 correspond to the two argument inputs and the addition output of the 1-bit full adder, respectively. Since the XOR 30 in the circuits FIG. 8(4) and FIG. 8(5) is carried by the XOR implemented in the logic function generator 40 of the function block 4 of FIG. 47, when using the circuit of FIG. 8(4) and FIG. 8(5) as a ripple carry, the circuit except the XOR is used as the ripple carry block 50. The other circuits of FIG. 8 can be used directly as the ripple carry block.

The configuration memory 13h in FIG. 47 stores a logical value of 1 when using the function block 4 as a 1-bit full adder and a logical value of 0 when using other function (the same function as the function block 4 of FIG. 6).

5.2) First Modified Example of the Fifth Embodiment

Figure 48:
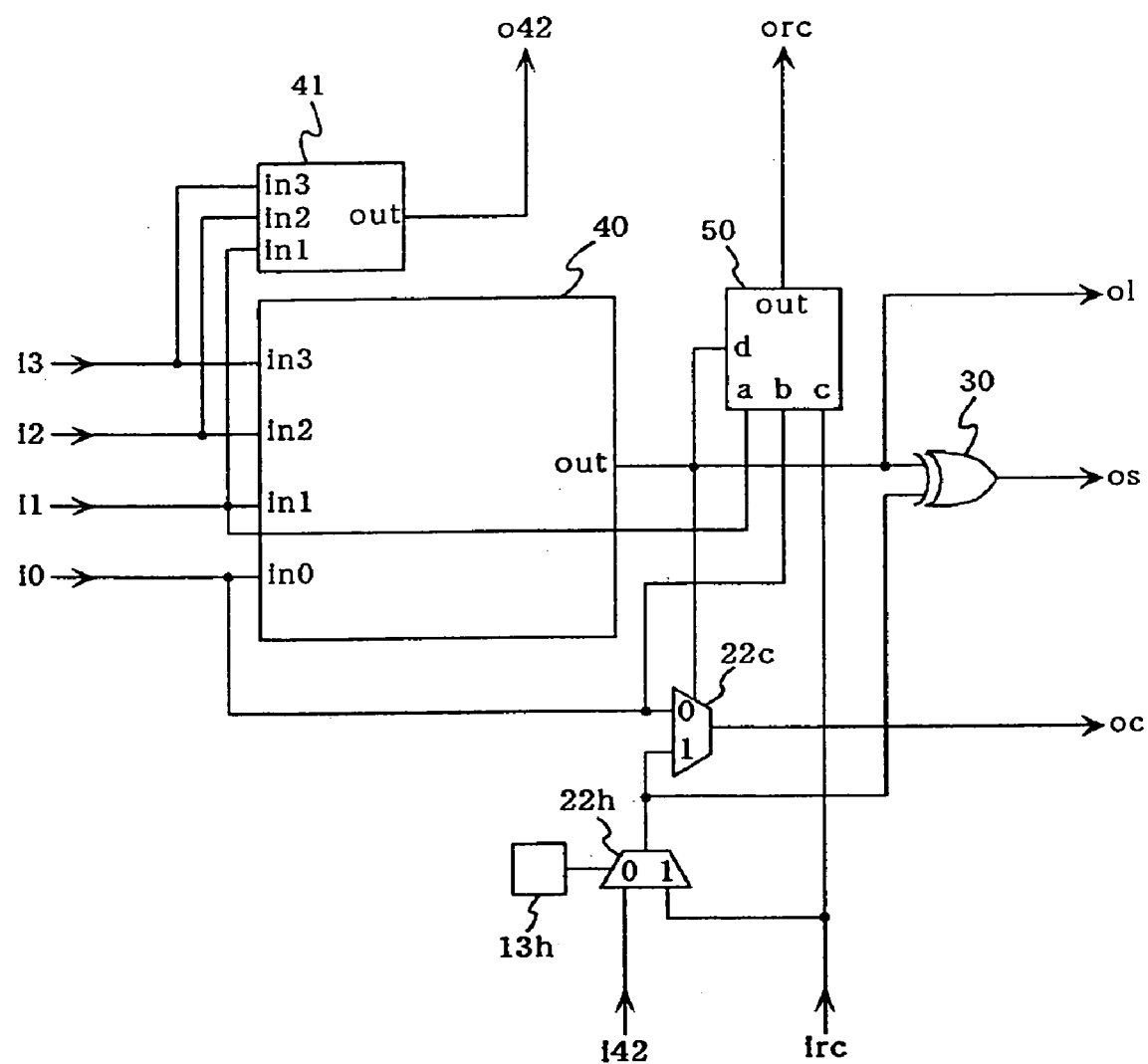
FIG. 48 is a circuit diagram showing a first modified example of the fifth embodiment of the function block according to the present invention.

FIG. 48 is a circuit diagram showing a first modified example of the fifth embodiment. Here, the MUX 22h in the function block 4 of FIG. 47 is connected to a different position but the function is almost identical to that of the function block 4 of FIG. 47. However, in case of FIG. 48, the ripple carry input irc can be output via the MUX 22c to the carry output oc unlike the case of FIG. 47.

5.3) Second Modified Example of the Fifth Embodiment

Figure 49:
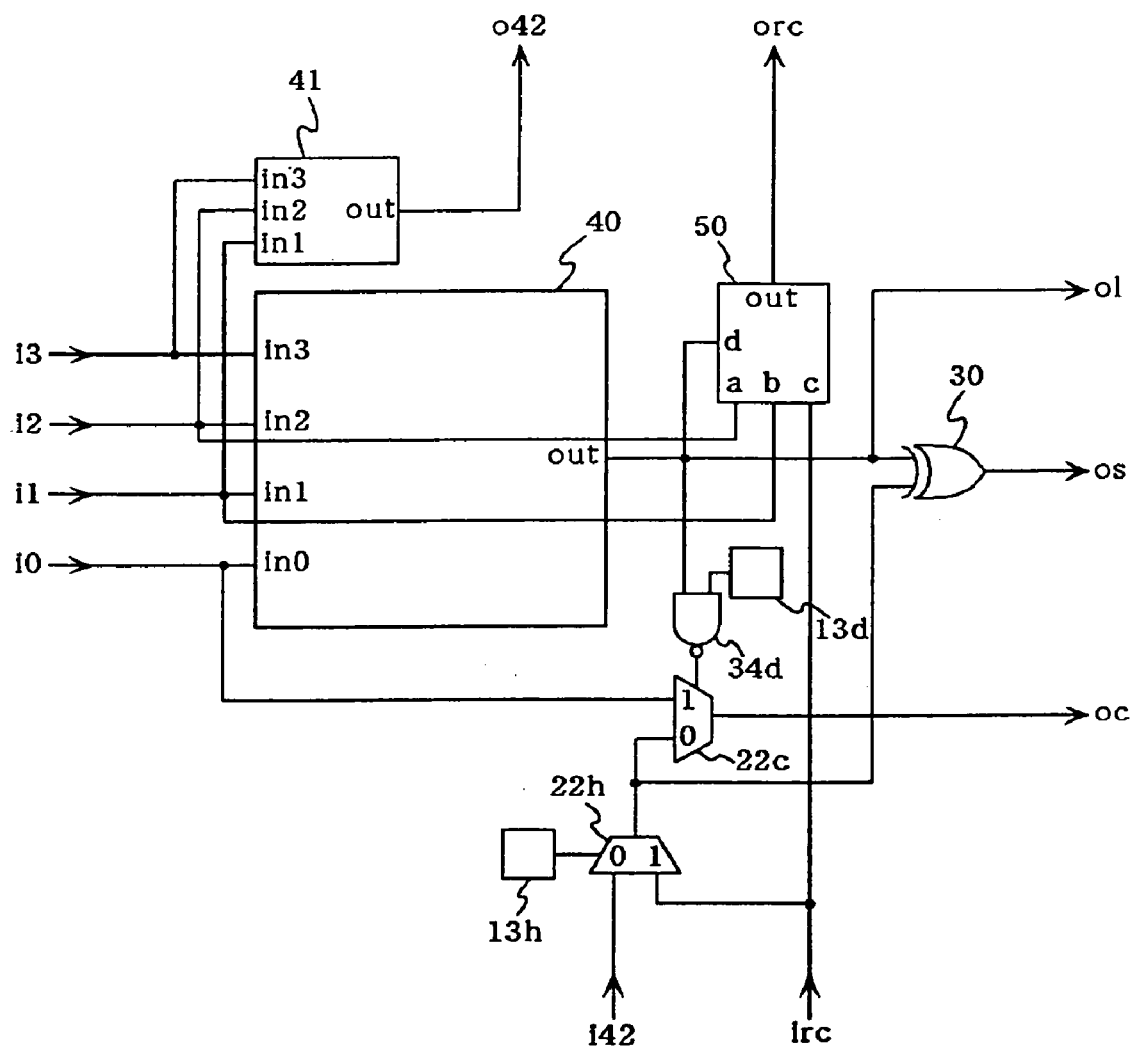
FIG. 49 is a circuit diagram showing a second modified example of the fifth embodiment of the function block according to the present invention.

FIG. 49 is a circuit diagram showing a second modified example of the fifth embodiment according to the present invention. Here, in the function block 4 of FIG. 48, the input-0 and the input-1 of the MUX 22c are replaced by one another, an NAND 34d is inserted for controlling the MUX 22c, and the inputs a and b of the ripple carry block 50 are reconnected to the inputs i2 and i1.

When the configuration memory 13d stores a logical value of 1, the function block 4 of FIG. 49 has a function substantially identical to that of FIG. 48. The difference is only the connection destination of the inputs a and b of the ripple carry block 50. Only the argument input, when using the function block as a 1-bit full adder, is changed to i1 and i2 in FIG. 49 (here, in the logic function generator 40, an XOR having inputs in1 and in2 and an output out is implemented).

When the configuration memory 13d stores a logical value of 0, it is possible to simultaneously implement a 3-input logic circuit using in1, in2 and in3 as inputs and o1 as an output, and a bypass route for outputting the input i0 directly to oc. The bypass route is useful when increasing the routability and outputting an input signal as it is via D-FF (in the output block 5 of FIG. 1). Furthermore, with this configuration, it is also possible to simultaneously implement a 1-bit full adder using i1 and i2 as argument inputs and os as an addition output, and a bypass route outputting the input i0 directly to oc.

When using the function block 4 of FIG. 49 as a 1-bit full adder, the ripple carry signal is transferred from irc to orc and accordingly, the carry output oc is not used. Thus, the bypass route can be used for other purpose and helps to avoid waste. As has been described above, since at least two D-FF's are present in one programmable function cell (in the output block), it is desirable to use these as effectively as possible.

The aforementioned configuration enabling simultaneous use of the 3-input logic circuit or the 1-bit full adder and the bypass route serves the purpose. In the function block 4 of FIG. 49, the NAND 34d is used for controlling the MUX 22c, but the AND can also be used as in FIG. 42. In this case, the input-0 and the input-1 of the MUX 22c in FIG. 49 are replaced by one another.

6. Sixth Embodiment

Figure 50:
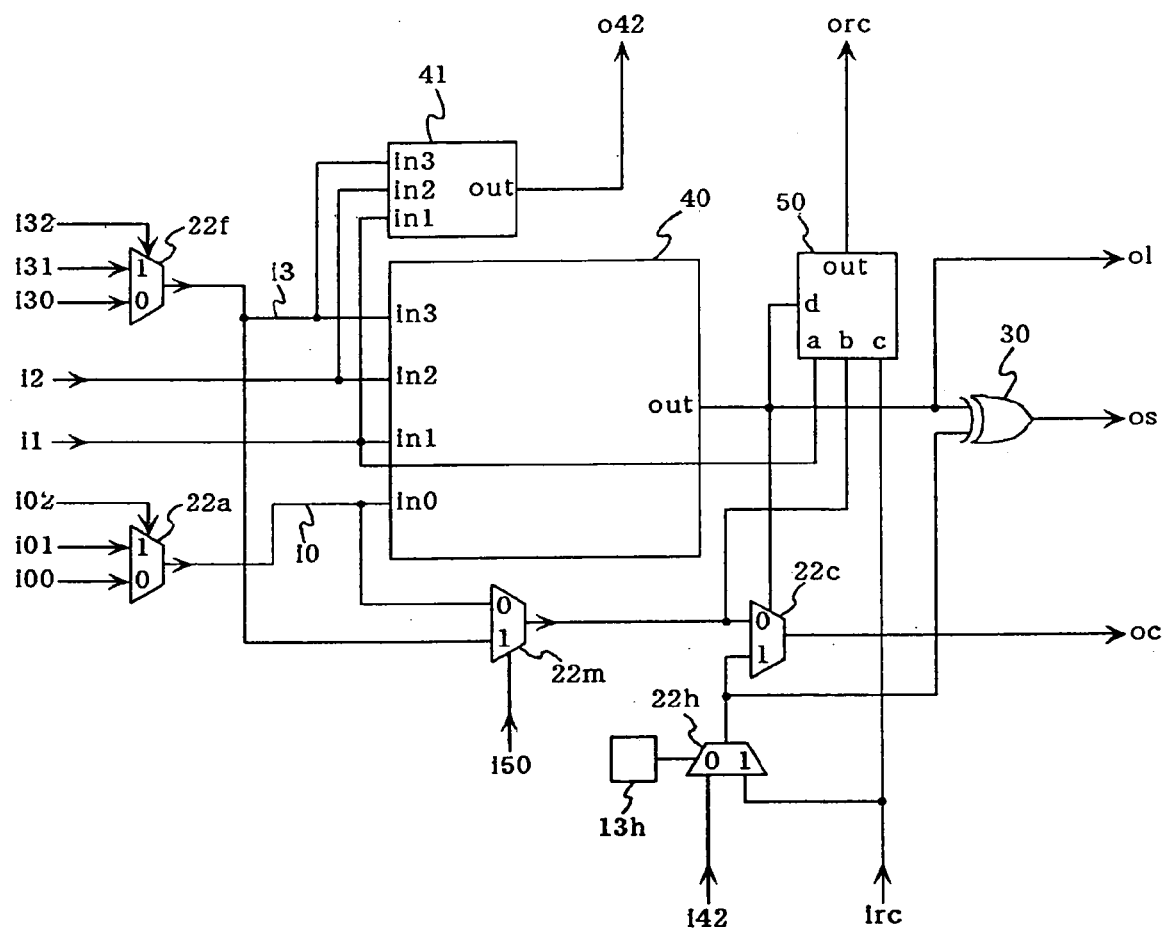
FIG. 50 is a circuit diagram showing a sixth embodiment of the function block according to the present invention.

FIG. 50 is a circuit diagram showing a function block according to a sixth embodiment of the present invention. This is an example of the function block 4 of FIG. 42 in which the ripple carry block 50 is attached in the same way as in FIG. 48. FIG. 50 shows an example in which the control AND 31d of FIG. 42 is removed but it can also be contained.

In the function block 4 of the present embodiment, when the logic function generator 40 is set so as to output a fixed logical value of 0, it is possible to constitute a 4-input MUX by the MUX 22a, 22f and 22m using the oc as an output. In FIG. 50, an input b of the ripple carry block 50 is connected to an output of the MUX 22m. This causes a flexibility that when using the function block 4 as a 1-bit full adder, either of i3 and i0 can be used as an argument input of the adder in accordance with the logical value given to the control input i50.

Although this flexibility is lost, this function block 4 can be also used as a 1-bit full adder by connecting the input b of the ripple carry block 50 directly to the input (for example, i0) of the logic function generator 40.

7. Seventh Embodiment 7.1) Function Block

Figure 51:
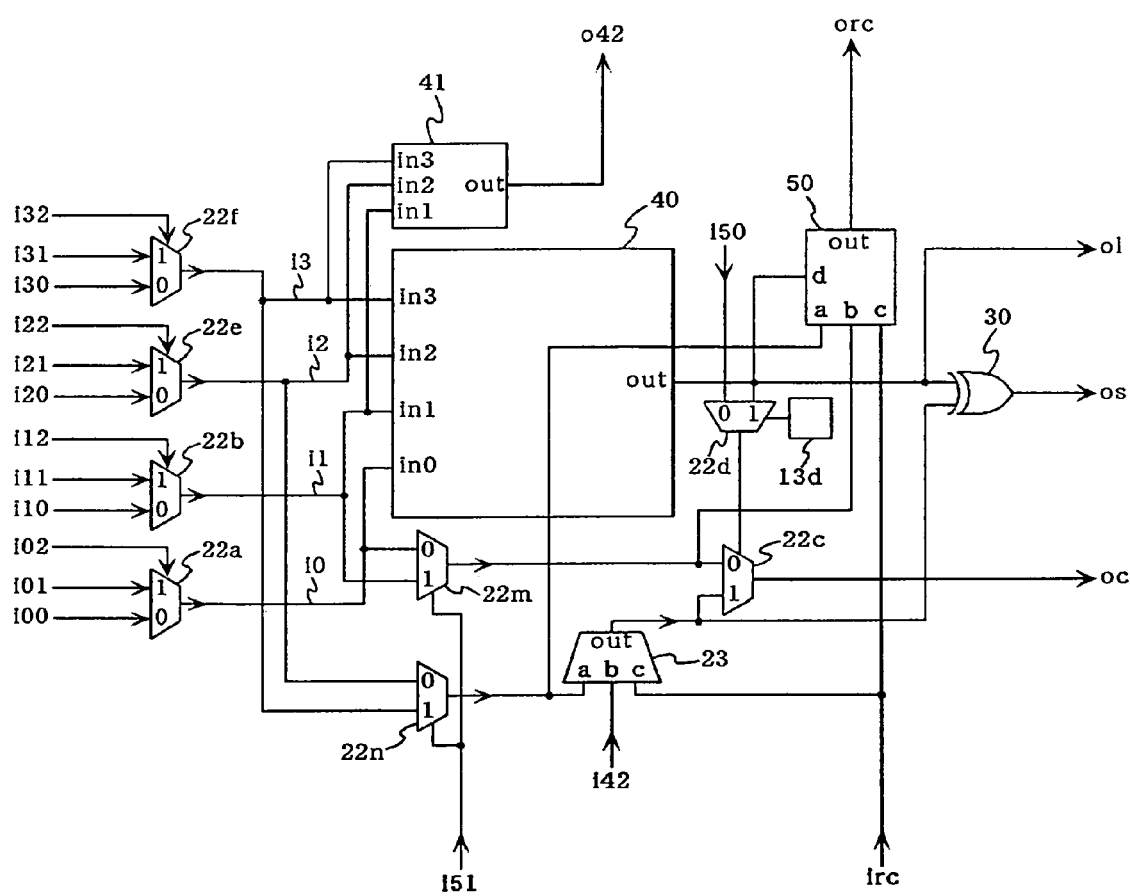
FIG. 51 is a circuit diagram showing a seventh embodiment of the function block according to the present invention.

FIG. 51 is a circuit diagram showing a function block according to a seventh embodiment of the present invention. This is an example of the function block 4 of FIG. 45 in which the ripple carry block 50 is attached in the same way as in FIG. 48. Inputs a and b of the ripple carry block 50 has been connected to the outputs of the MUX 22n and 22m, respectively. This causes a flexibility that when using the function block 4 as a 1-bit full adder, a pair of i0 and i2 or a pair of i1 and i3 can be used as argument inputs of the adder in accordance with a logical value given to a control input i51. Although this flexibility is lost, this function block 4 can also be used as the 1-bit full adder by connecting the inputs a and b of the ripple carry block 50 directly to any of the inputs i0, i1, i2 and i3 of the logic function generator 40.

In FIG. 51, the memory-equipped 3-input MUX 23 is a circuit that has a built-in configuration memory, selects one of the input signals a, b and c in accordance with the content of the configuration memory, and outputs the selected signal to the output out. When the input c is selected in the memory-equipped 3-input MUX 23, the function block 4 of FIG. 51 functions as a 1-bit full adder having a dedicated ripple carry circuit 50.

When the input a or b is selected in the memory-equipped 3-input MUX 23, the function block 4 of the present embodiment has the same function as in the case where a logical value of 0 or 1 is stored in the configuration memory 13g in FIG. 45.

Memory-equipped 3-Input MUX

Figure 52:
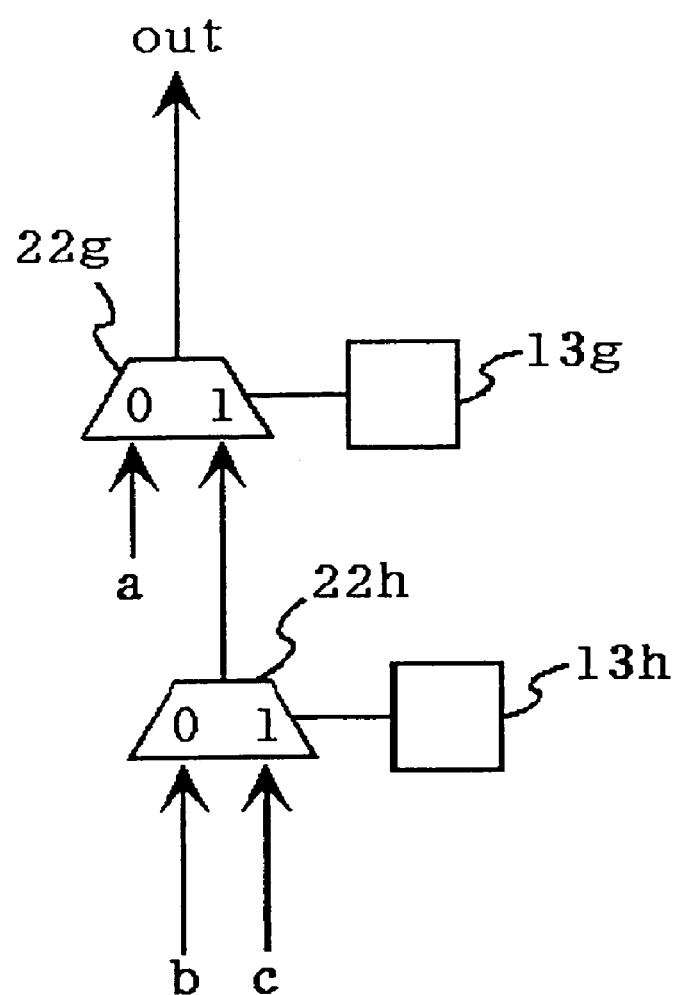
FIG. 52 is a circuit diagram showing a first example of a memory-equipped 3-input MUX 23.

FIG. 52 is a circuit diagram showing a first example of the memory-equipped 3-input MUX 23 in which one of the data inputs of the MUX 22g is connected with an output of an MUX 22h.

Figure 53:
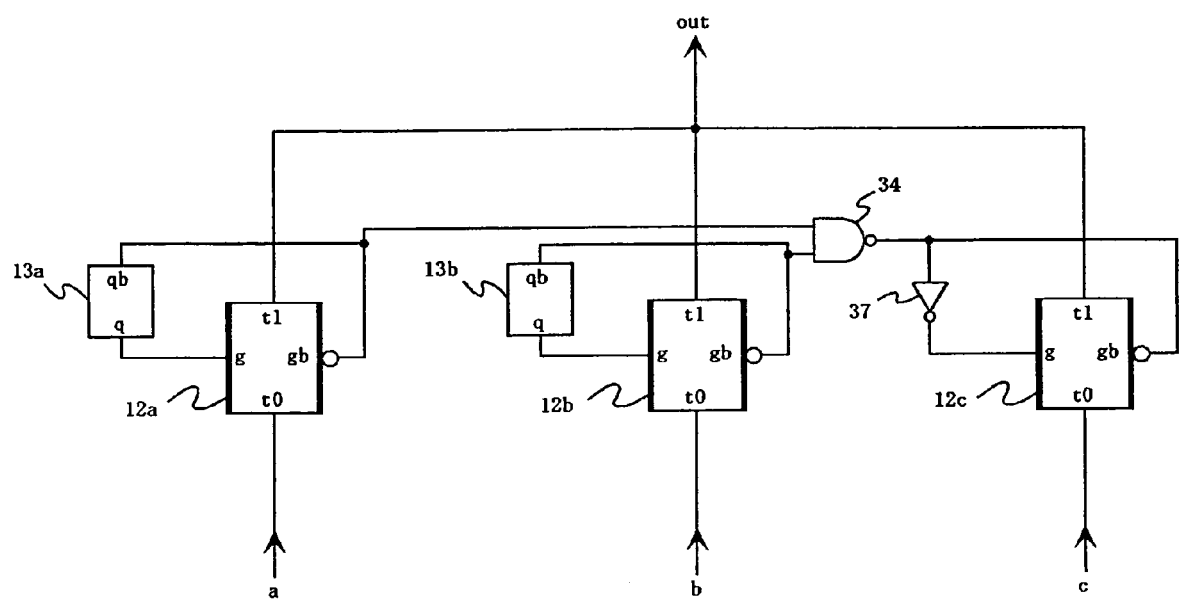
FIG. 53 is a circuit diagram showing a second example of a memory-equipped 3-input MUX 23.

FIG. 53 is a circuit diagram showing a second example of the memory-equipped 3-input MUX 23. This 3-input MUX is composed of three transmission gates 12a, 12b and 12c. When the configuration memory 13a (or 13b) stores a logical value of 1, the transmission gate 12a (or 12b) is forced into conduction to output the input a (or b) to the out. In this case, the transmission gate 12c controlled by the NAND 34 and the inverter 37 is in a non-conduction state.

When both of the configuration memories 13a and 13b store logical value of 0, only the transmission gate 12c is forced into conduction to output the input c to the out. The memory-equipped 3-input MUX 23 of FIG. 53 has a smaller delay from data input (inputs b and c) to the output out as compared to the first example of FIG. 52.

7.2) Modified Example of Seventh Embodiment

Figure 54:
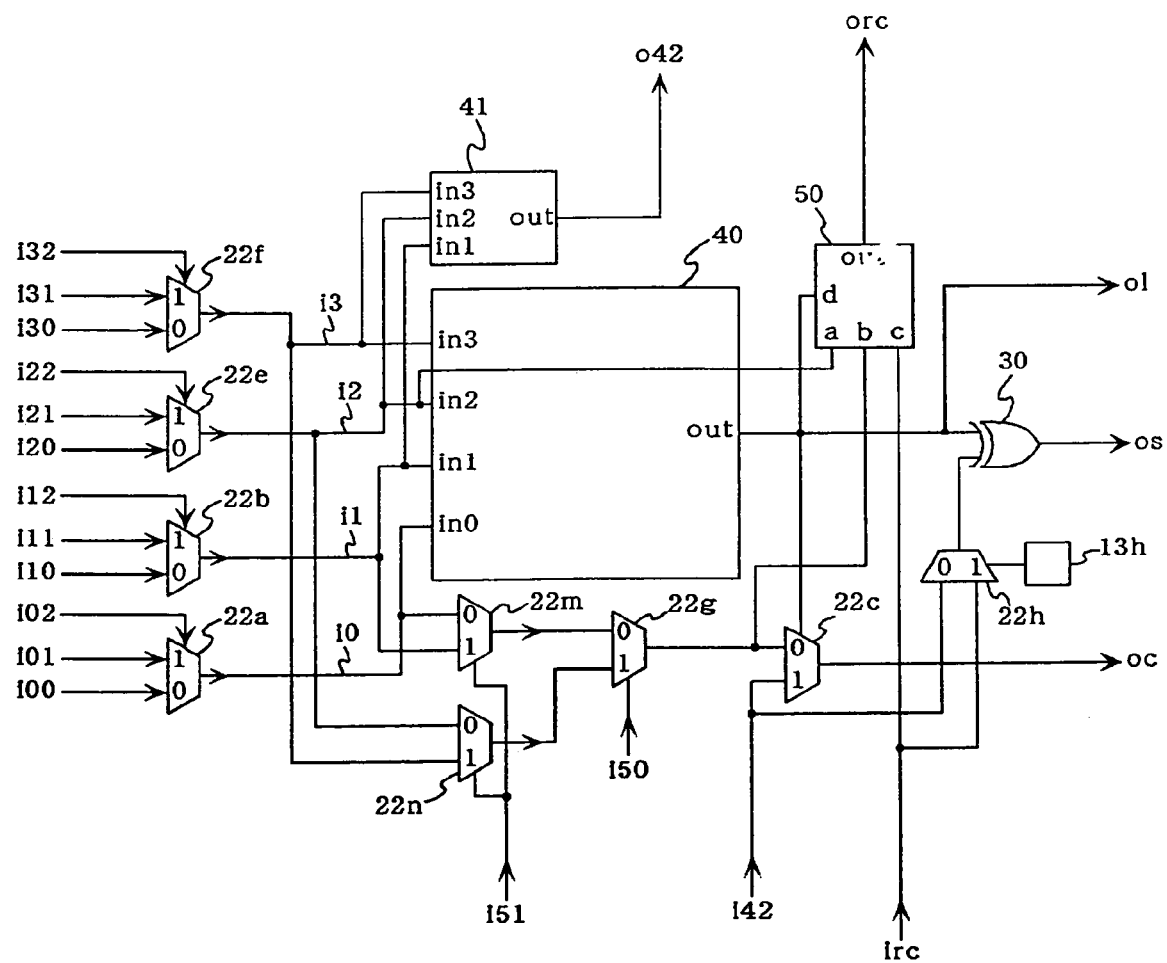
FIG. 54 is a circuit diagram showing a modified example of the seventh embodiment of the function block according to the present invention.

FIG. 54 is a circuit diagram showing a modified example of the function block according to the seventh embodiment of the present invention. This is an example where function block 4 of FIG. 46 to which the ripple carry block 50 is attached in the same way as FIG. 47 (FIG. 54 shows an example where the control AND 31d of FIG. 46 is removed but it can also be contained). When using this function block as an 8-input MUX, the logic function generator 40 is set so as to output a fixed logical value of 0.

In FIG. 54, inputs a and b of the ripple carry block 50 has been connected to the input i2 and an output of the MUX 22g, respectively. By the connection to the output of the MUX 22g, the function block 4 has a following flexibility when used as a 1-bit full adder. That is, it is possible to use any of i0, i1 and i3 as an adder argument input in accordance with a logical value given to the control inputs i51 and i50.

The inputs a and b of the ripple carry block 50 need be supplied with an input signal i0, i1, i2 or i3 of the logic function generator 40. For example, it is possible to connect them directly to these inputs or to the outputs of the MUX 22m and MUX 22n.

8. Eighth Embodiment

Next, explanation will be given on a function block according to an eighth embodiment of the present invention. This is an example of function block having a 2-bit carry look ahead circuit having a higher speed than the aforementioned ordinary ripple carry circuit.

8.1) Function Block

Figure 55:
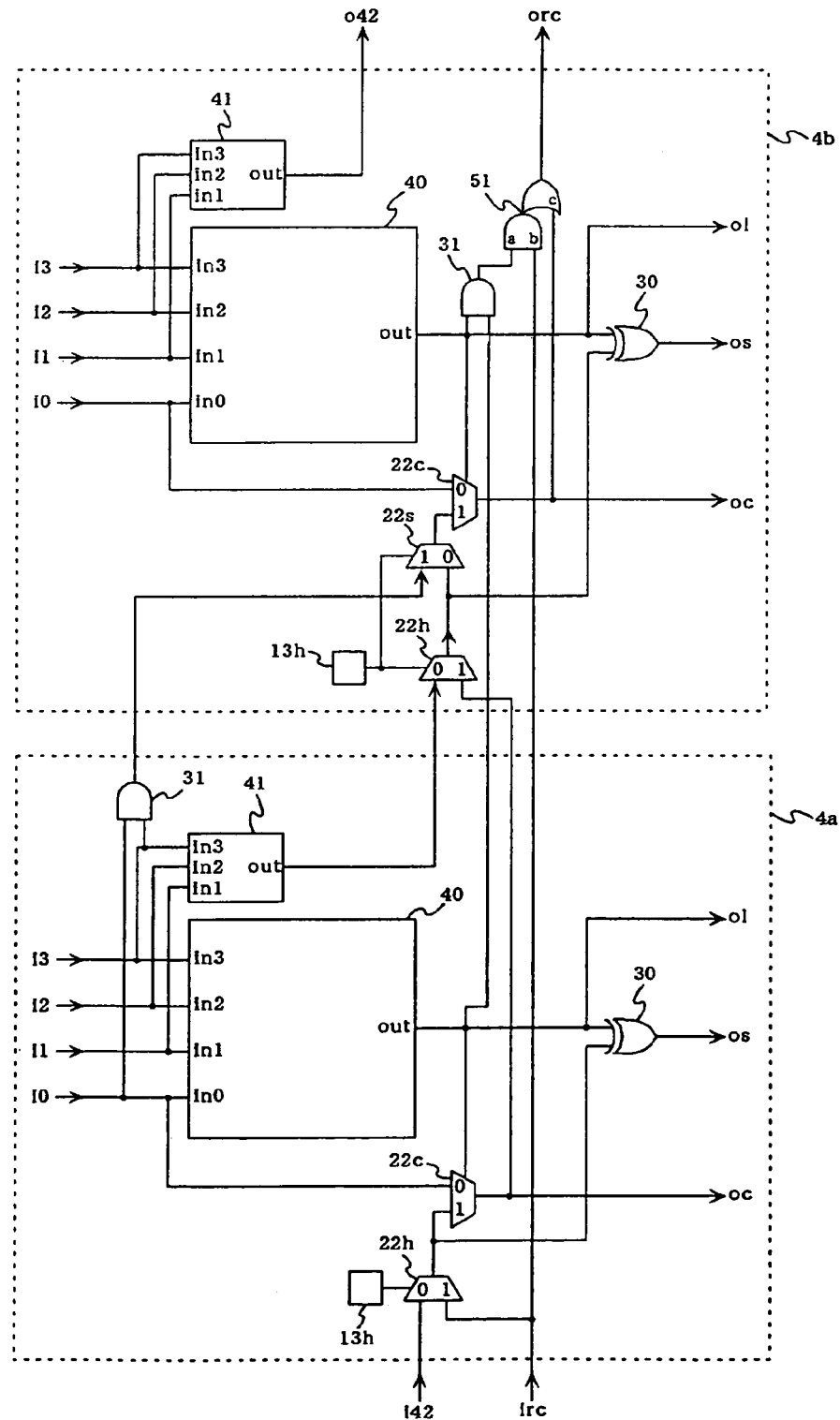
FIG. 55 is a circuit diagram showing an eighth embodiment of the function block according to the present invention.

FIG. 55 is a circuit diagram showing a function block according to the eighth embodiment of the present invention. This embodiment is a composite or combined function block and is composed of a function block 4a and a function block 4b.

The function block 4a is the function block 4 of FIG. 6 to which an MUX 22h, a configuration memory 13h for controlling it, and an AND 31 are added as a circuit for 2-bit carry look ahead. The function block 4b is the function block 4 of FIG. 6 to which MUX 22h and 22s, a configuration memory 13h for controlling them, and AO (AND-OR) 51 and AND 31 are added as a circuit for 2-bit carry look ahead.

Figure 61:
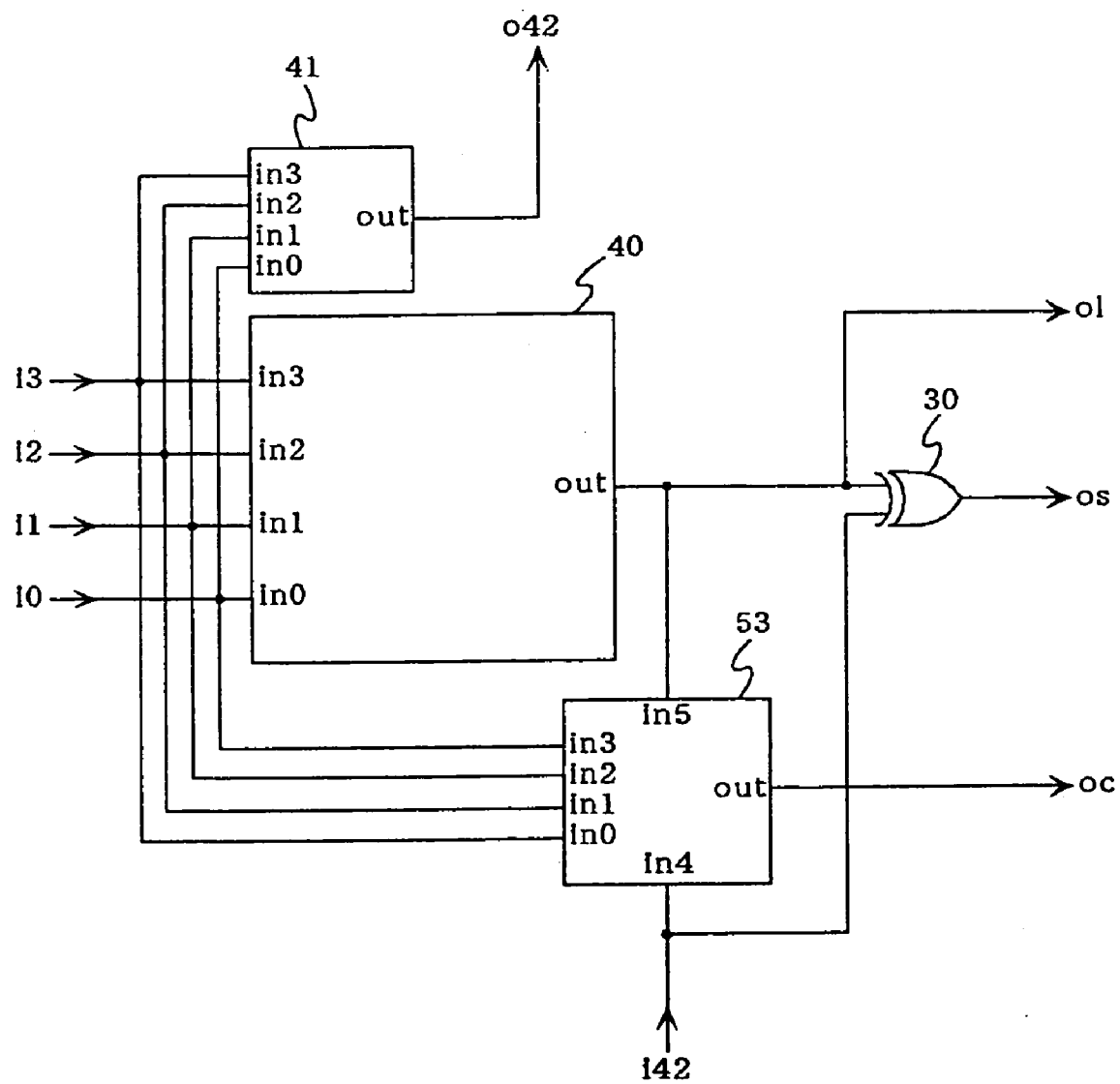
FIG. 61 is a circuit diagram showing a tenth embodiment of the function block according to the present invention.

When the configuration memories 13h of the function blocks 4a and 4b store a logical value of 0, these function blocks have a function identical to that of the function block of FIG. 61, respectively. In this case, the 4-2 carry output of the function block 4a is connected to the 4-2 carry input of the function block 4b.

When the configuration memories 13h of the function blocks 4a and 4b store a logical value of 1, these function blocks can be used as a 2-bit full adder using carry look ahead. For this, however, it is necessary to implement an XOR having inputs in0 and in3 in the logic function generators 40 of the function blocks 4a and 4b (in2 or in1 may be used instead of in3. In this case, the input connected to i3 of the AND 31 of the function block 4a is also reconnected to i2 or i1). Here, the inputs of the XOR implemented in the logic function generator 40 serve as argument inputs of the full adder of each bit; os serves as an addition output of the full adder of each bit; and irc and orc become the ripple carry input and the ripple carry output of the full adder, respectively.

The AO 51 in FIG. 55 has a logic function identical to a circuit in which one of the OR inputs are connected with an output of AND. Actually, however, because of the CMOS circuit characteristic, it is general to configure from the AOI in which AO output is inverted and an inverter. Here, the AOI may be configured by connecting an output of the AND to one of the NOR inputs. However, it is possible to increase the speed and reduce the area when it is made as one indivisible logic gate.

Figure 56:
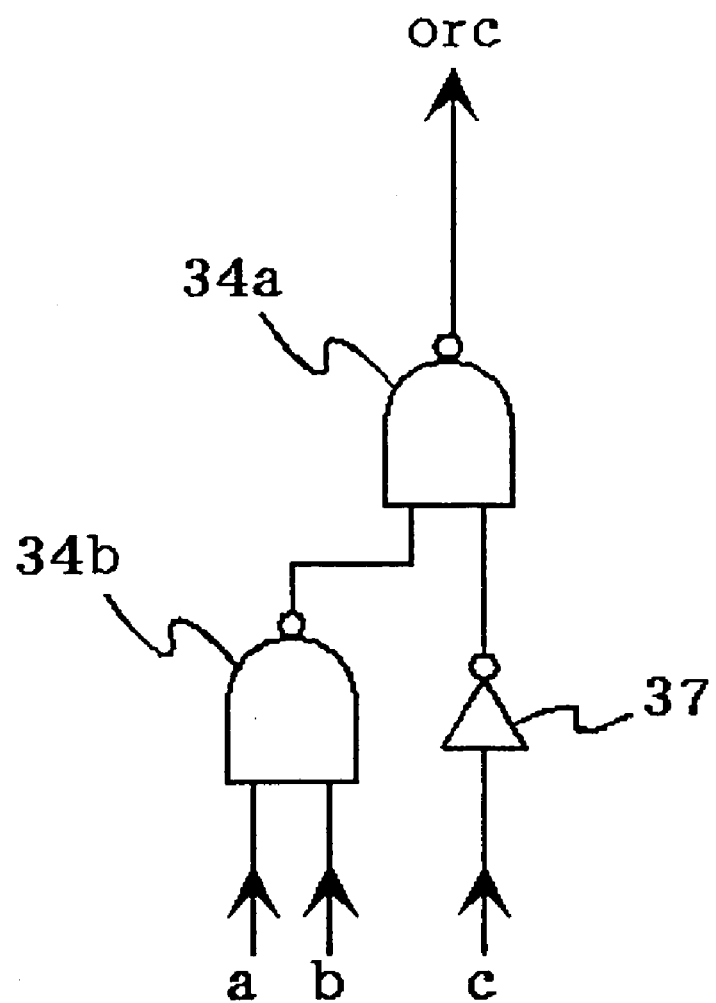
FIG. 56 is a circuit diagram showing a configuration example of AO by NAND.

FIG. 56 is a circuit diagram showing a configuration example of the AO using an NAND. Thus, the AO 51 can also be configured by using the NAND. Since the NAND is a very simple high-speed logic gate, when the AO 51 thus configured is used, a carry transfer from irc to orc in FIG. 55 can be performed at a very high speed.

8.2) Modified Example of Eighth Embodiment

Figure 57:
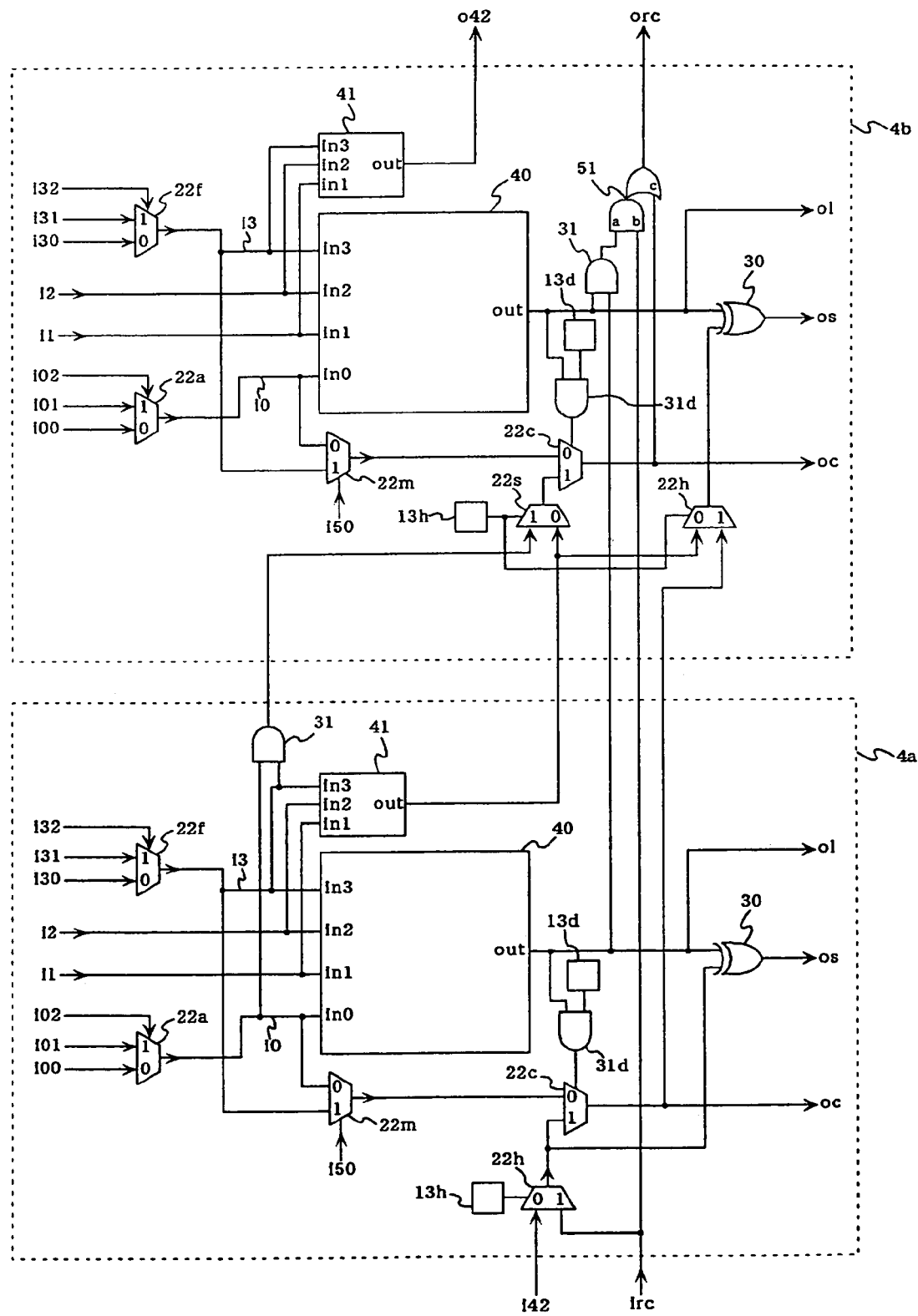
FIG. 57 is a circuit diagram showing a modified example of the eighth embodiment of the function block according to the present invention.

FIG. 57 is a circuit diagram showing a modified example of the function block according to the eighth embodiment of the present invention. This is an example of a composite function block 2 composed of two function blocks of FIG. 42 to which a 2-bit carry look ahead circuit is added.

The function block 4a is the function block 4 of FIG. 42 to which MUX 22h, a configuration memory 13h for controlling it and AND 31 are added as a circuit for 2-bit carry look ahead. The function block 4b is the function block 4 of FIG. 42 to which MUX 22h and 22s, a configuration memory 13h for controlling them, and AO 51 and AND 31 are added as a circuit for 2-bit carry look ahead. It should be noted that the MUX 22h and 22s in the function block 4b of FIG. 57 is attached in a different way from that of the function block 4b of FIG. 55. However, this is only an example of different ways for realizing the same function and is not a substantial difference.

In the composite function block of FIG. 57, when the configuration memories 13h of the function blocks 4a and 4b store a logical value of 0, these function blocks have a function identical to that of the function block 4 of FIG. 42. In this case, the 4-2 carry output of the function block 4a is connected with the 4-2 carry input of the function block 4b.

When the configuration memories 13h of the function blocks 4a and 4b store a logical value of 1, these function blocks can be used as a 2-bit full adder using carry look ahead. For this, however, it is necessary to implement an XOR having inputs in0 and in3 in the logic function generator 40 of the function blocks 4a and 4b. (The in3 may be replaced by in2 or in1. In this case, the input connected to the i3 of the AND 31 of the function block 4a is also reconnected to the i2 or i1.) In this case, the inputs of the XOR implemented in the logic function generator 40 serve as argument inputs of the full adder of each bit; os becomes an addition output of the full adder of each bit; and irc and orc become the ripple carry input and the ripple carry output of the 2-bit full adder, respectively.

The modified example shown in FIG. 57 is only one of the plenty of modified examples. The 2-bit carry look ahead circuit can also be added similarly to the other function blocks of the present invention. It is easy, for those skilled in the art, to configure them from the information disclosed in this specification.

Figure 58:
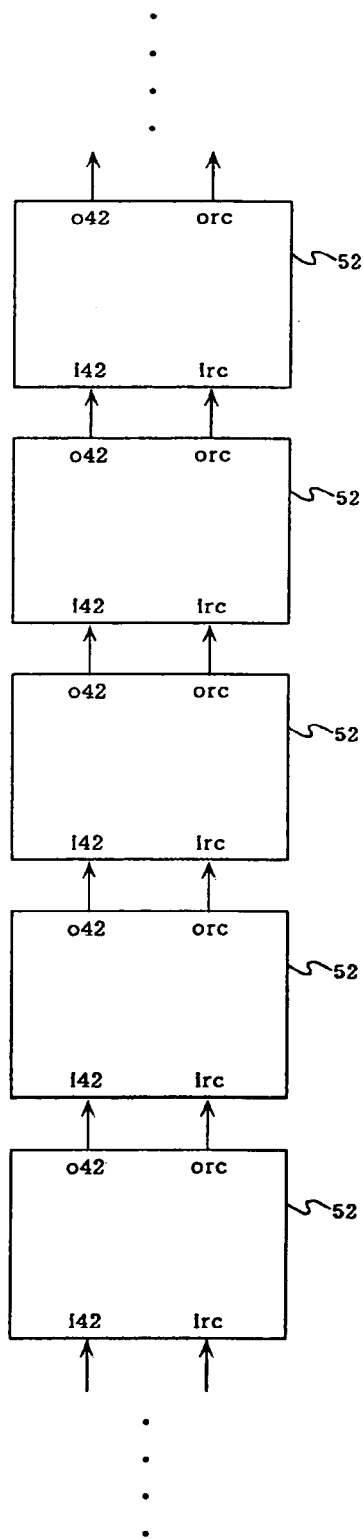
FIG. 58 is a block diagram showing a connection method of the aforementioned function block having a ripple carry circuit.

FIG. 58 is a block diagram showing a connection method of the function blocks having the aforementioned ripple carry circuit. Here, when using a function block having an ordinary ripple carry circuit as in the fifth to seventh embodiments of the invention and their modifications, the cell 52 corresponds to a programmable function cell containing one. Moreover, when using a composite function block having a 2-bit carry look ahead circuit as in the function block of the eighth embodiment and its modifications, the cell 52 of FIG. 58 corresponds to two programmable function cells containing one function block.

9. Ninth Embodiment

Figure 59:
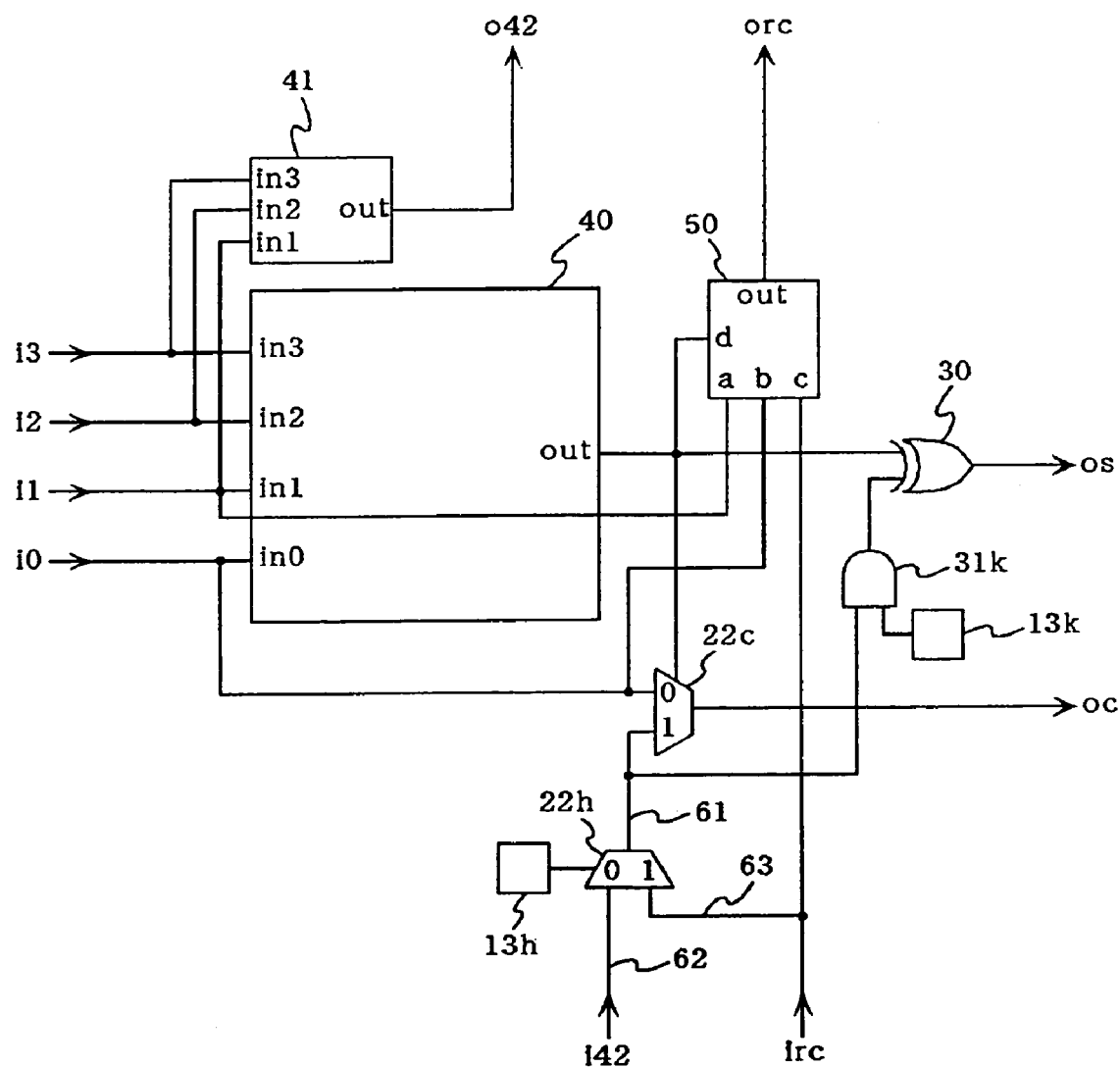
FIG. 59 is a circuit diagram showing a ninth embodiment of the function block according to the present invention.

FIG. 59 is a circuit diagram showing a function block according to a ninth embodiment of the present invention. This is the function block 4 of FIG. 48 into which AND 31k controlling the XOR 30 and a configuration memory 13k controlling the AND 31k are inserted, and from which the logic output ol is removed.

When the configuration memory 13k stores a logical value of 1, the function block of FIG. 59 has a function identical to that of FIG. 48 (except that the ol is absent). On the other hand, when the configuration memory 13k stores a logical value of 0, the output out of the logic function generator 40 of FIG. 59 is output from os. Thus, even without the logic output ol as in FIG. 48, it becomes possible to utilize various logic functions implemented in the logic function generator 40. In this case, only two outputs os and oc of the function block 4 are present, and there is no need of the output selection unit 5_2, the register block 42a and the input block 3a in the output block (FIG. 9), thereby reducing the area.

And now, in FIG. 59 the output of the logic function generator 40 passes through the XOR 30 to be output to os; while in FIG. 48 the output is output from ol without passing through the XOR 30. However, the total delay is identical.

Figure 60:
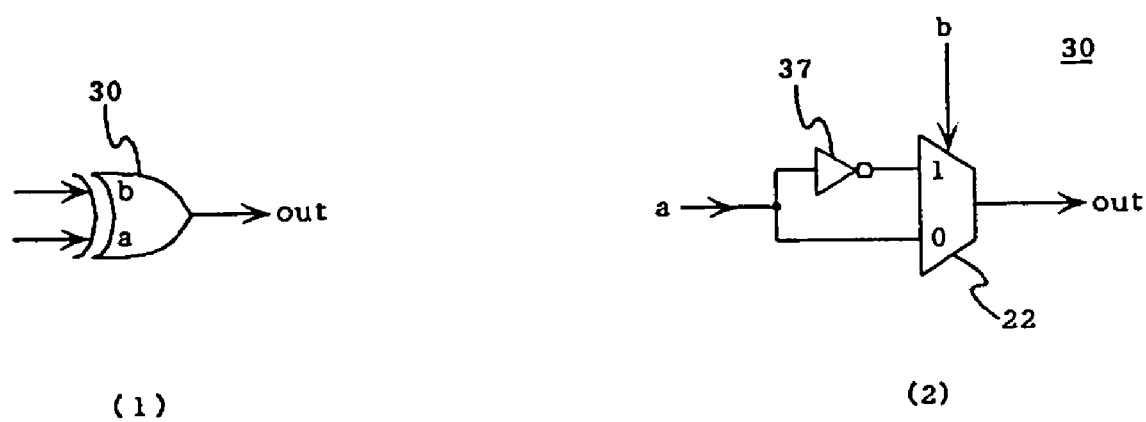
FIG. 60(1) shows symbols of an XOR.

FIG. 60 is a circuit diagram showing a configuration example of the XOR 30. The XOR shown in FIG. 60(1) can be composed of an MUX 22 and inverter 37 as shown in FIG. 60(2). When this configuration is applied to the XOR 30 of FIG. 59 and the input a is connected to the output out of the logic function generator 40, the signal on the output out is input to the output block, passing through one stage of the MUX.

On the other hand, even when the logic output ol is present as in FIG. 48, by using the output block of FIG. 12, only two output selection units, two register blocks, and two input selection units are required. However, the logic output ol should pass through the MUX 22a of FIG. 12 (nothing corresponding to this in FIG. 9). Thus, considering up to the output block, there is no difference in delay between circuits of FIG. 59 and FIG. 48.

The insertion position of the AND 31k may be other than the position shown in FIG. 59 such as wires 61, 62 and 63. The AND 31k may be at any position if only it can feed a fixed logical value to one of the inputs of the XOR 30. Moreover, the AND 31k may be replaced by other logic circuit only if has that function. Moreover, here, explanation has been given on means giving a fixed logical value in a programmable way to one of the inputs of the XOR 30 through an example of the function block 4 of FIG. 48, but this means can also be applied to the other function blocks of the present invention.

Explanation has been given on various function blocks according to the embodiments of the present invention. These are based on the function block of FIG. 6 in which signal supply means to inputs i0 to i3, to respective inputs of the MUX 22c and to one of the inputs of the XOR 30, and the carry circuit are modified in various ways. The present specification has shown only a part of examples of the function block using the various signal supply means and the carry circuits. Those skilled in the art can easily constitute the function block by using the various signal supply means and the carry circuits that have been described in other combinations than examples shown in this specification.

10. Tenth Embodiment

The function block of the present invention that has been explained has the 4-2 carry block 41 and the MUX 22c for realizing the 4-2 adder 44 (FIG. 14). And now, there are various types of 4-2 adder other than the one composed of two 1-bit full adders as in FIG. 14.

In general, the 4-2 adder is a circuit having five inputs i0, i1, i2, i3 and i42 and three outputs o42, oc and os, and (o42+oc)×2+os is equal to a sum of the five inputs. Its usage is identical to the case of FIG. 14 but I/O relations (truth table) differ from one to another circuit. Next, explanation will be given on a function block that can realize another type of 4-2 adder different from FIG. 14.

FIG. 61 is a circuit diagram showing a function block according to a tenth embodiment of the present invention. Inputs i0, i1, i2 and i3 of the function block 4 are respectively connected to the inputs in0, in1, in2 and in3 of the logic function generator 40, to the inputs in0, in1, in2 and in3 of the carry block 41, and to the inputs in0, in1, in2 and in3 of the carry block 52. The output out of the logic function generator 40 is connected to the input in5 of the carry block 53 and a first input of the XOR 30, and becomes logic output ol of the function block 4.

The 4-2 carry input i42 of the function block 4 is connected to the input in4 of the carry block 53 and to a second input of the XOR 30. The output of the 4-2 carry block 41, the output of the XOR 30 and the output of the carry block 53 respectively become the 4-2 carry output o42, the addition output os and the carry output oc of the function block 4. When using the function block 4 of FIG. 61 as the 4-2 adder, the 4-input XOR 24 as shown in FIG. 13 is implemented in the logic function generator 40.

Figure 62:
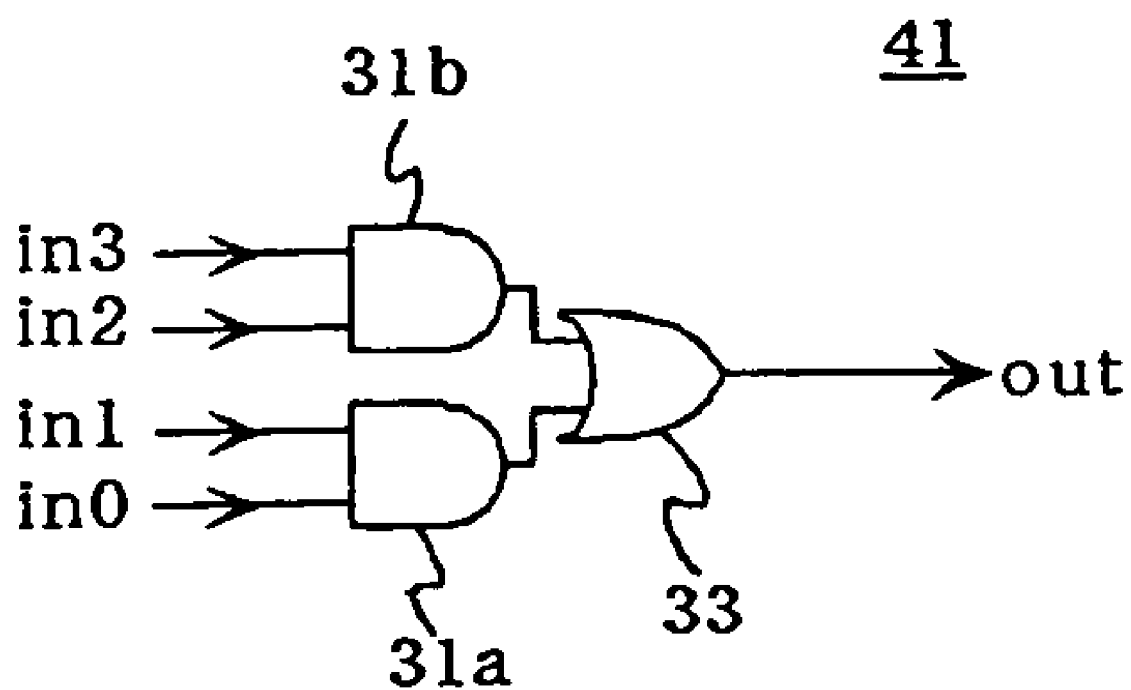
FIG. 62(1) is a circuit diagram showing a first example of a 4-2 carry block.

FIG. 62(1) and FIG. 62(2) are circuit diagrams showing a first example and a second example of the 4-2 carry block 41, respectively. FIG. 63(1) and FIG. 63(2) are circuit diagrams showing a first example and a second example of the carry block 53, respectively. The 4-2 carry block 41 and the carry block 53 may be any circuit as long as the sum of inputs i0, i1, i2, i3 and i42 is equal to (o42+oc)×2+os.

Needless to say, those skilled in the art can easily add the aforementioned preposition logic circuit to the inputs i0 to i3 of the function block of FIG. 61.

Explanation has been given on a function block containing one 4-input logic function generator. As has been described above, a typical example of the 4-input logic function generator is the 4-input LUT (FIG. 105).

As shown in FIG. 64(1), the 4-input LUT 40 is composed of two 3-input LUT'S 48 and an MUX 22 connecting them. Furthermore, as shown in FIG. 64(2), the 3-input LUT 48 is composed of two 2-input LUT's 49 and an MUX connecting them. Thus, in general, when the number of inputs is reduced by one, the LUT area is reduced by half or more and the delay from the input to the output is also shortened.

Next, explanation will be given on a function block using a logic function generator of 3-input or less and capable of constituting a 4-2 adder.

11. Eleventh Embodiment 11.1) Function Block

Figure 65:
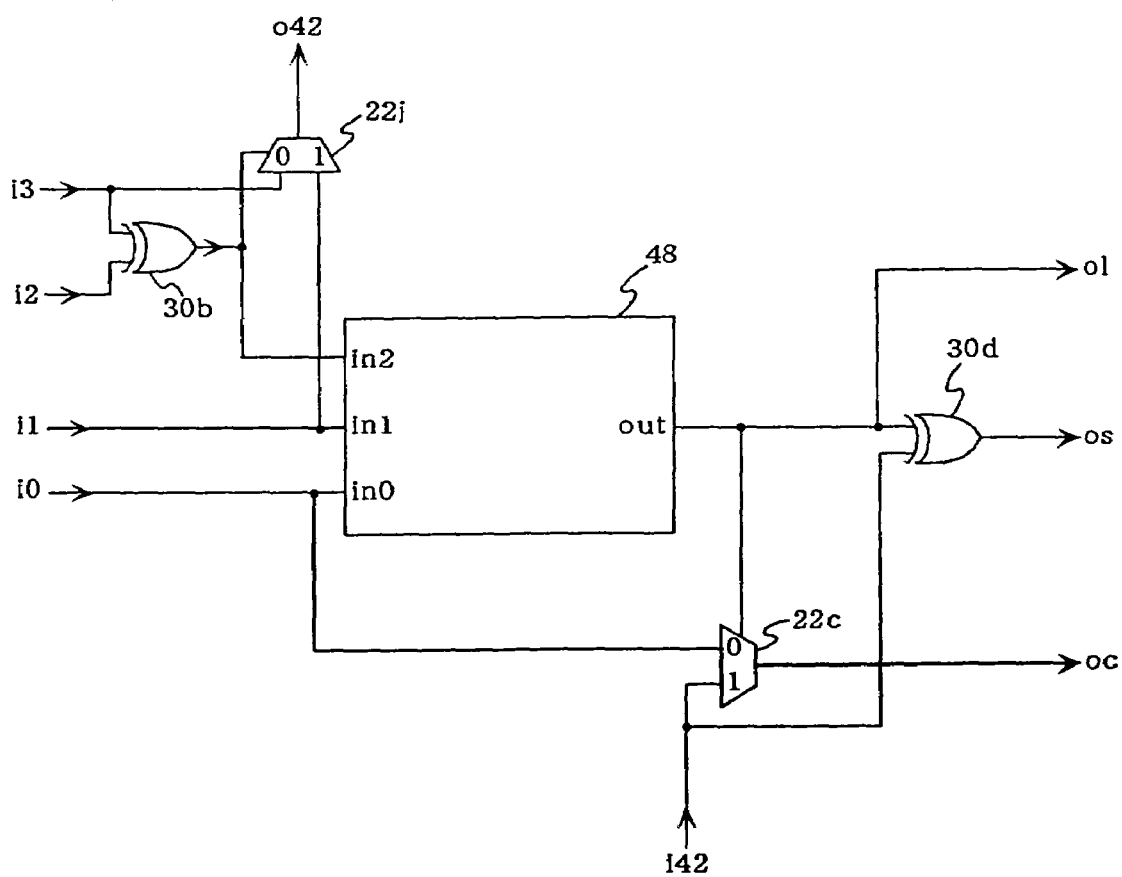
FIG. 65 is a circuit diagram showing an eleventh embodiment of the function block according to the present invention.

FIG. 65 is a circuit diagram showing a function block according to a eleventh embodiment of the present invention. Inputs i0, i1, i2 and i3 of the function block 4 are respectively connected to inputs in0 and in1 of a 3-input logic function generator 48 and to two inputs of an XOR 30b, and an output of the XOR 30b is connected to an input in2 of the 3-input logic function generator 48.

An output out of the 3-input logic function generator 48 is connected to a control input of an MUX 22c and to a first input of an XOR 30d and becomes a logic output ol of the function block 4. A 4-2 carry input i42 of the function block 4 is connected to an input-1 of the MUX 22c and to a second input of the XOR 30d. An input-0 of the MUX 22c The is connected with input i0 of the function block 4. Outputs of the XOR 30d and the MUX 22c respectively become an addition output os and a carry output oc of the function block 4.

An MUX 22j generates a 4-2 carry output o42 of the function block 4. The MUX 22j is controlled by the output of the XOR 30b, input-0 is connected to the input i3 (or i2), and input-1 is connected to the input i1. The circuit generating the 4-2 carry output o42 may be any circuit if it can generate carry signals (carry signals generated when adding three inputs) associated with the inputs i1, i2 and i3 and the MUX 22j is the most preferable example.

The function block shown in FIG. 65 has two operation modes: logic mode; and 4-2 adder mode. In the logic mode, a fixed logical value of 0 is fed to the input i3 of FIG. 65, and the function block 4 is used as a 3-input logic circuit using i0, i1 and i2 as inputs and o1 as an output. Here, the function block 4 can be used as an arbitrary logic circuit that can be realized by the 3-input logic function generator 48.

In the 4-2 adder mode, the function block of FIG. 65 is used as a 4-2 adder. For this, a 3-input XOR using in0, in1 and in2 as inputs is implemented in the 3-input logic function generator 48. In this case, the function block 4 functions as a 4-2 adder using i0, i1, i2 and i3 as argument inputs, i42 as a 4-2 carry input, o42 as a 4-2 carry output, os as an addition output, and oc as a carry output.

The function block shown in FIG. 65 includes one 3-input logic function generator 48. As has been described above, since the 3-input logic function generator occupies only half area as compared to the 4-input logic function generator, the function block of FIG. 65 has a feature that its area is small as compared to the aforementioned function block including the 4-input logic function generator.

As compared to the function block of FIG. 6 using the 4-input logic function generator 40, in the function block of FIG. 65, the XOR 30b is added to the input of the 3-input logic function generator 48 but the delay from the input to the output is almost identical in both cases. This is because the delay increase due to passing through the XOR 30b in the function block of FIG. 65 is cancelled by the delay reduction obtained by replacing the 4-input logic function generator with the 3-input logic function generator.

11.2) Modified Example of Eleventh Embodiment

Figure 66:
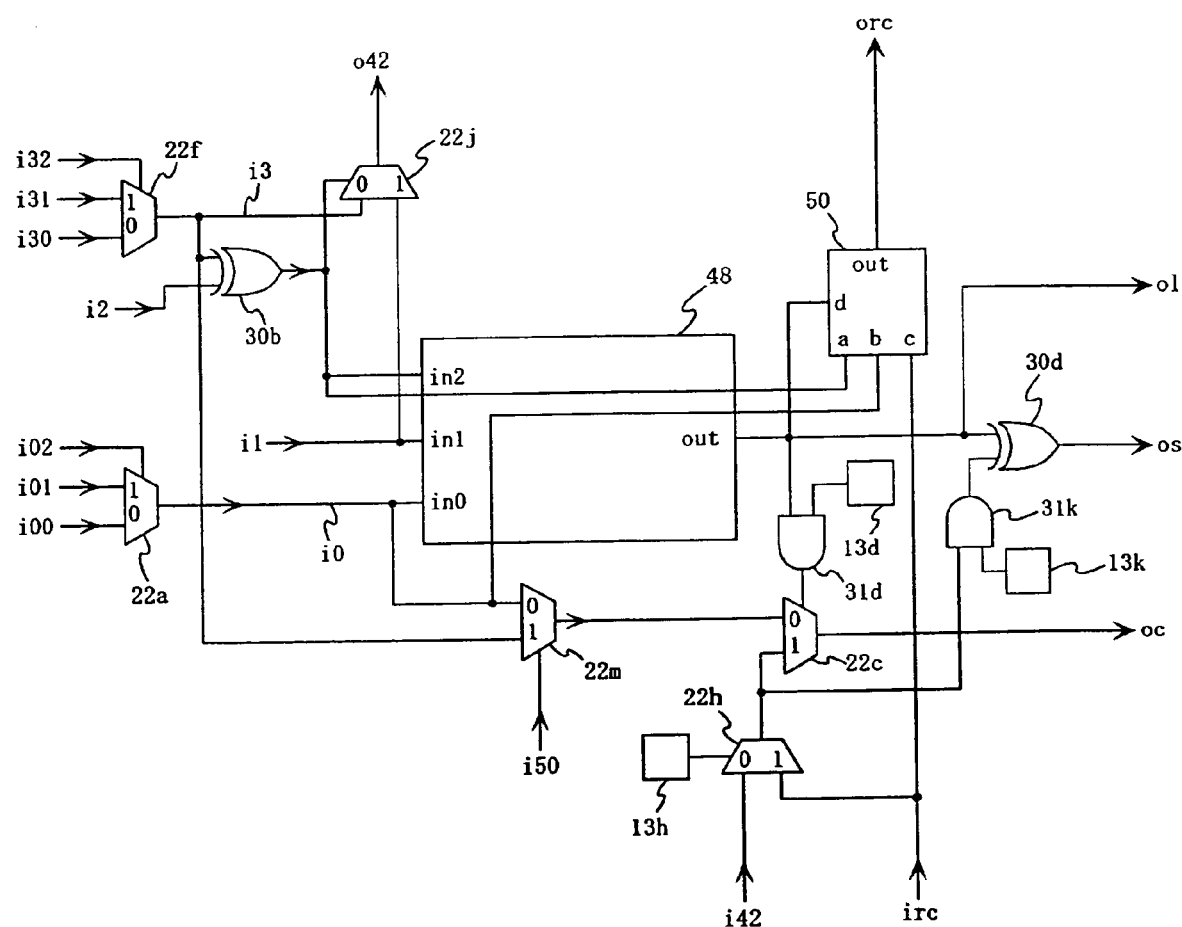
FIG. 66 is a circuit diagram showing a modified example of the eleventh embodiment of the function block according to the present invention.

FIG. 66 is a circuit diagram showing a modified example of the function block according to the eleventh embodiment of the present invention. This has the constitution shown in FIG. 65 to which modifications have been performed like the modified example of the third embodiment (FIG. 42), the first modified example of the fifth embodiment (FIG. 48) and the ninth embodiment (FIG. 59) of the present invention.

More specifically, the MUX 22a, 22f and 22m, the AND 31d, and the configuration memory 13d in FIG. 66 add their functions in the modified example of the third embodiment (FIG. 42) to the function block of FIG. 65. Moreover, the ripple carry block 50, the MUX 22h and the configuration memory 13h in FIG. 66 add their functions in the first modified example of the fifth embodiment (FIG. 48) to the function block of FIG. 65. Furthermore, the AND 31k and the configuration memory 13k in FIG. 66 add their functions in the ninth embodiment (FIG. 59) to the function block of FIG. 65.

Various variations of the function block including the 4-input logic function generator have been already detailed. They are based on the function block of FIG. 6 in which signal supply means to the inputs i0 to i3, to the inputs of the MUX 22c and to one of the inputs of the XOR 30, and the carry circuit are modified in various ways. The inputs i0 to i3 and respective inputs of the MUX 22c of FIG. 65 correspond to those of FIG. 6, and the XOR 30d of FIG. 65 corresponds to the XOR 30 of FIG. 6. Accordingly, various modifications that have been performed to the function block of FIG. 6 can also be performed to the function block of FIG. 65. FIG. 66 shows only one of the examples.

When adding a high-speed carry circuit to the function block of FIG. 65, it is preferable that the input a of the ripple carry block 50 or one of the inputs of the AND 31 in the function block 4a of FIG. 55 and FIG. 57 are connected to the output of the XOR 30b as shown in FIG. 66, but one of the signals i1 to i3 may be fed.

12. Twelfth Embodiment 12.1) Function Block

Figure 67:
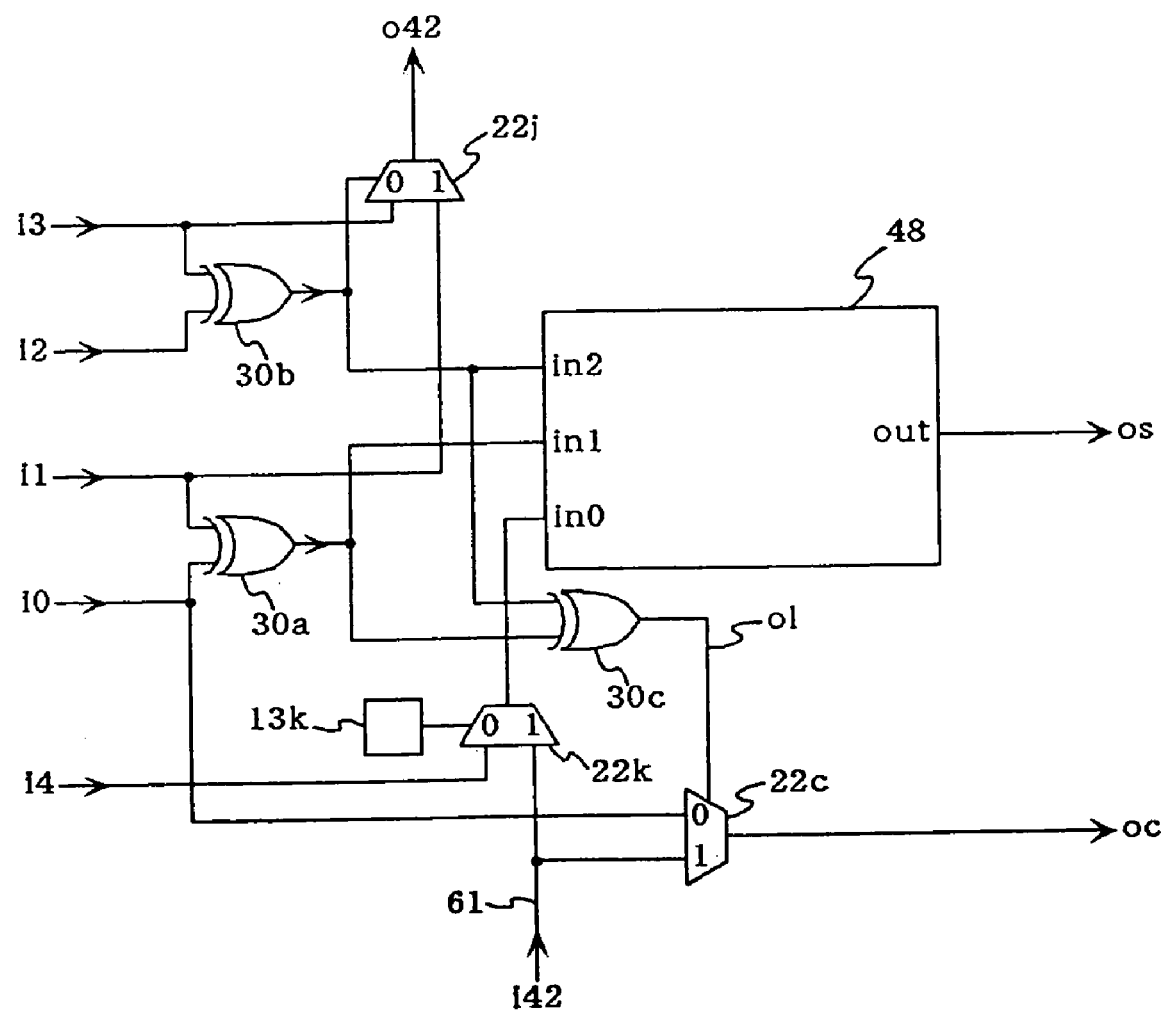
FIG. 67 is a circuit diagram showing a twelfth embodiment of the function block according to the present invention.

FIG. 67 is a circuit diagram showing a function block according to a twelfth embodiment of the present invention. The inputs i0, i1, i2 and i3 of the function block 4 are connected to the inputs of the XOR 30a and 30b, and outputs of the XOR 30a and 30b are connected to the inputs in1 and in2 of the 3-input logic function generator 48 and to the input of the XOR 30c. The output o1 of the XOR 30c is connected to a control input of the MUX 22c. The 4-2 carry input i42 of the function block 4 is connected to input-1 of the MUX 22c and MUX 22k; input-0 of the MUX 22c is connected with the input i0 of the function block 4; the input-0 of the MUX 22k is connected with the input i4 of the function block 4; and the output of the MUX 22k is connected to the input in0 of the 3-input logic function generator 48. The output of the 3-input logic function generator 48 and the output of the MUX 22c become the addition output oc and the carry output oc of the function block 4, respectively.

Here the MUX 22k may be inserted at the position 61 of FIG. 67 instead of the position shown in FIG. 67. The MUX 22j generates the 4-2 carry output o42 of the function block 4. The MUX 22j is controlled by the output of the XOR 30b. The input-0 is connected to the input i3 (or i2) and the input-1 is connected to the input i1. The circuit generating the 4-2 carry output o42 may be any circuit if it can generate a carry signal (carry signal generated when three inputs are added) associated with the inputs i1, i2 and i3, and the MUX 22j is the most preferable example.

The function block of FIG. 67 has two operation modes: logic mode and 4-2 adder mode. In the logic mode, a fixed logical value of 0 is fed to the inputs i1 and i3 of FIG. 67 and a logical value of 0 is stored in the configuration memory 13k. And the function block 4 is used as a 3-input logic circuit using i0, i2 and i4 as inputs and os as an output. In this case, the function block 4 can be used as an arbitrary logic circuit that can be realized by the 3-input logic function generator 48.

In the 4-2 adder mode, the function block of FIG. 67 is used as a 4-2 adder. For this, a 3-input XOR using in0, in1 and in2 as inputs is implemented in the 3-input logic function generator 48, and a logical value of 1 is stored in the configuration memory 13k. In this case, the function block 4 functions as a 4-2 adder using i0, i1, i2 and i3 as argument inputs, i42 as a 4-2 carry input, o42 as a 4-2 carry output, os as an addition output, and oc as a carry output.

The function block of FIG. 67 includes one 3-input logic function generator 48. As has been described above, since the 3-input logic function generator occupies half or less of the area as compared to the 4-input logic function generator, the function block of FIG. 67 has a feature to have a small area as compared to the function block containing 4-input logic function generator.

Moreover, in the function block 4 of FIG. 67, the delay from the inputs i0 to i3 to the output os is a sum of delays of the XOR and the 3-input logic function generator. On the other hand, the corresponding delay in the aforementioned function block is a sum of delays of the XOR and the 4-input logic function generator (except the function block according to the eleventh embodiment of the present invention) or a sum of delays of the two stages of XOR and the 3-input logic function generator (in case of the function block according to the eleventh embodiment of the present invention). Accordingly, the function block of FIG. 67 also has a feature that it has a higher speed than the function blocks mentioned above.

12.2) Modified Example of Twelfth Embodiment

Figure 68:
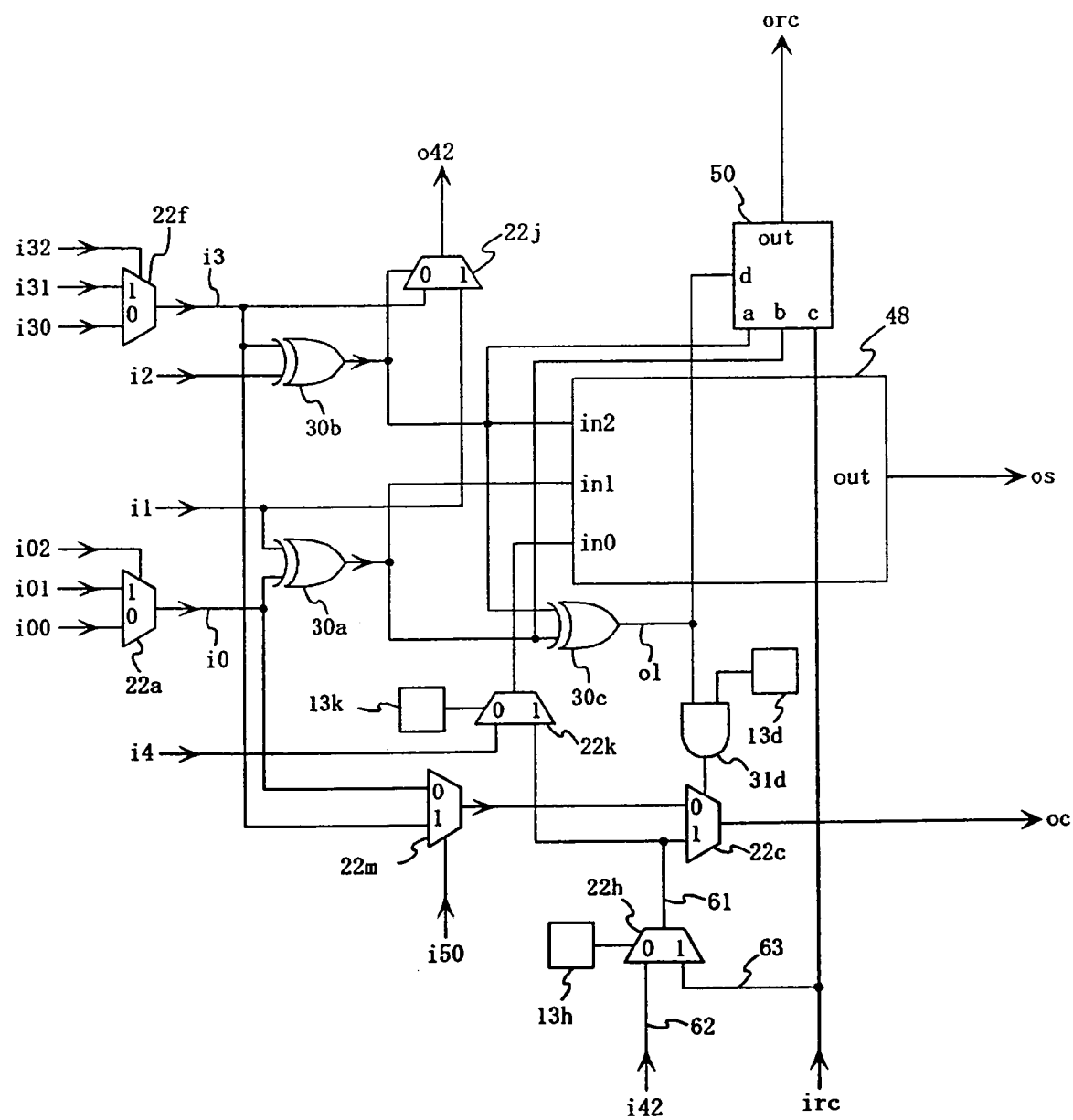
FIG. 68 is a circuit diagram showing a modified example of the twelfth embodiment of the function block according to the present invention.

FIG. 68 is a circuit diagram showing a modified example of the function block according to the twelfth embodiment of the present invention. This circuit is obtained by modifying the twelfth embodiment shown in FIG. 67 similarly to the modified example of the third embodiment (FIG. 42) and the first modified example of the fifth embodiment (FIG. 48) of the present invention.

More specifically, the MUX 22a, 22f, 22m, the AND 31d and the configuration memory 13d in FIG. 68 are configured to add the same functions as in the modified example of the third embodiment (FIG. 42) to the function block of FIG. 67. Moreover, the ripple carry block 50, the MUX 22h, and the configuration memory 13h in FIG. 68 are configured to add the same functions as in the first modified example of the fifth embodiment (FIG. 48) to the function block of FIG. 67. The MUX 22k may be inserted at the position 61, 62 or 63 instead of the position shown in FIG. 68.

Various variations of the function block including the 4-input logic function generator have been already detailed. They are based on the function block of FIG. 6 in which the inputs i0 to i3, the signal supply means to respective inputs of the MUX 22c and to one of the inputs of the XOR 30, and the carry circuit are modified in various ways.

The inputs i0 to i3 and the respective inputs of the MUX 22c in FIG. 67 correspond to those in FIG. 6; and the input in0 of the 3-input logic function generator 48 of FIG. 67 corresponds to one of the inputs of the XOR 30 in FIG. 6. Accordingly, various modifications performed to the function block of FIG. 6 can also be performed to the function block of FIG. 67. FIG. 68 shows only one of the modification examples. However, when such modifications are performed, attention should be paid on that os and ol in the function block of FIG. 6 correspond to the output of the 3-input logic function generator 48 and the output of the XOR 30c, respectively.

When adding a high-speed carry circuit to the function block of FIG. 67, the inputs a and b of the ripple carry block 50 or the input of the AND 31 in the function block 4a of FIG. 55 and FIG. 57 are preferably connected to the outputs of the XOR 30a and 30b as shown in FIG. 68 but may also be supplied with signals i0 to i3.

Moreover, FIG. 65 to FIG. 68 show examples of the function block including the 3-input logic function generator but in these function blocks, the 3-input logic function generator can easily be replaced by a 4-input logic function generator.

13. Thirteenth Embodiment 13.1) Function Block

Figure 69:
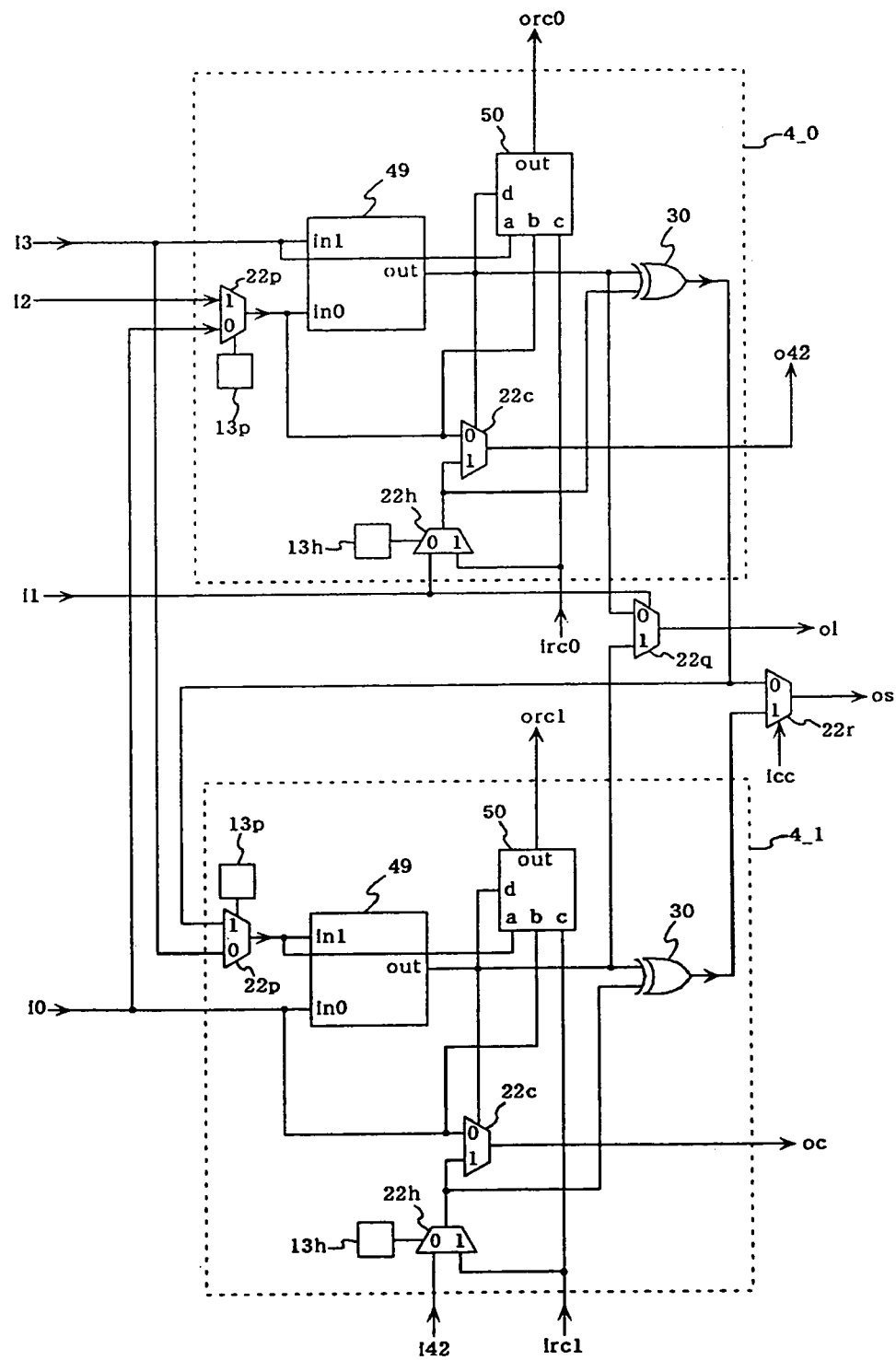
FIG. 69 is a circuit diagram showing a thirteenth embodiment of the function block according to the present invention.

FIG. 69 is a circuit diagram showing a function block according to a thirteenth embodiment of the present invention. The function block 4 consists of two half-function blocks 4_0 and 4_1 and MUX 22q and MUX 22r connecting them.

The half-function block 4_0 comprises: a first 2-input logic function generator 49 generating a first logic output; a first XOR 30 generating a first addition output; a first MUX 22c generating a 4-2 carry output o42; a first ripple carry block 50 generating a first ripple carry output orc0; a first MUX 22p for supplying a signal to an input in0 of the first 2-input logic function generator 49, an input-0 of the first MUX 22c and an input-b of the first ripple carry bock 50, and a first configuration memory 13p for controlling it; a first MUX 22h for supplying a signal to a first input of the first XOR 30 and an input-1 of the first MUX 22c, and a first configuration memory 13h for controlling it.

The first logic output is supplied to a control input of the first MUX 22c, a second input of the first XOR 30, and an input-d of the first ripple carry block 50. An input-a of the first ripple carry block 50 is connected to an input in1 of the first 2-input logic function generator 49. The first ripple carry input irc0 is supplied to an input-c of the first ripple carry block 50 and an input-1 of the first MUX 22h.

The half-function block 4_1 comprises: a second 2-input logic function generator 49 generating a second logic output; a second XOR 30 generating a second addition output; a second MUX 22c generating a carry output oc; a second ripple carry block 50 generating a second ripple carry output orc1; a second MUX 22p for supplying a signal to an input in1 of the second 2-input logic function generator 49 and an input-a of the second ripple carry bock 50, and a second configuration memory 13p for controlling it; a second MUX 22h for supplying a signal to a first input of the second XOR 30 and an input-1 of the second MUX 22c, and a second configuration memory 13h for controlling it.

The second logic output is supplied to a control input of the second MUX 22c, a second input of the second XOR 30, and an input-d of the second ripple carry block 50. An input-b of the second ripple carry block 50 and an input-0 of the second MUX 22c are connected to an input in0 of the second 2-input logic function generator 49. The second ripple carry input irc1 is supplied to an input-c of the second ripple carry block 50 and an input-1 of the second MUX 22h.

The 4-2 carry input i42 is supplied to the input-0 of the second MUX 22h; the input i0 is supplied to the input in0 of the second 2-input logic function generator 49 and to the input-0 of the first MUX 22p; the input i1 is supplied to the input-0 of the first MUX 22h and to the control input of the MUX 22q; the input i2 is supplied to the input-1 of the first MUX 22p; and the input i3 is supplied to the input in1 of the first 2-input logic function generator 49 and to the input-0 of the second MUX 22p.

The input-0 and the input-1 of the MUX 22q are supplied with the first and the second logic output, respectively; the input-0 and the input-1 of the MUX 22r are supplied with the first and the second addition output, respectively; and the input-1 of the MUX 22p is supplied with the first addition output. The addition output os and the logic output ol of the function block 4 are given by the output of the MUX 22r and the output of the MUX 22q, respectively.

13.2) Operation Mode

The function block shown in FIG. 69 has three operation modes: logic mode, 4-2 adder mode and conditional carry mode.

Logic Mode

In the logic mode, a logical value of 0 is stored in the first and the second configuration memory 13p of FIG. 69. Here, as can be seen from comparison with FIG. 64(2), the first and the second 2-input logic function generator 49 and the MUX 22q function as a 3-input logic function generator using i0, i1 and i3 as inputs and ol as an output. (Here, it is assumed that the 2-input logic function generator is an LUT.) Thus, in the logic mode, the function block of FIG. 69 can be used as an arbitrary 3-input logic circuit.

4-2 Adder Mode

In the 4-2 adder mode, a 2-input XOR is implemented in the first and the second 2-input logic function generator 49; a logical value of 1 is stored in the first and the second configuration memory 13$p$; a logical value of 0 is stored in the first and the second configuration memory 13$h$; and a fixed logical value of 1 is fed to a control input icc of the MUX 22$r$. In this case, the function block 4 functions as a 4-2 adder using i0, i1, i2 and i3 as argument inputs, i42 as a 4-2 carry input, o42 as a 4-2 carry output, os as an addition output, and oc as a carry output.

Conditional Carry Mode

In the conditional carry mode, a 2-input XOR is implemented in the first and the second 2-input logic function generator 49, a logical value of 0 is stored in the first and the second configuration memory 13$p$, and a logical value of 1 is stored in the first and the second configuration memory 13$h$. In this case, the half-function block 4_0 functions as a 1-bit full adder using i0 and i3 as argument inputs, irc0 as a ripple carry input, orc0 as a ripple carry output, and the first addition output as an addition output. Simultaneously with this, the half-function block 4_1 functions as a 1-bit full adder using i0 and i3 as argument inputs, irc1 as a ripple carry input, orc1 as a ripple carry output, and the second addition output as an addition output.

Thus, the two full adders having the common argument inputs and independent ripple carry routes can be used as a high-speed condition carry adder. For this, the programmable function cell 52 including the function block 4 of FIG. 69 is connected as shown in FIG. 70.

Figure 70:
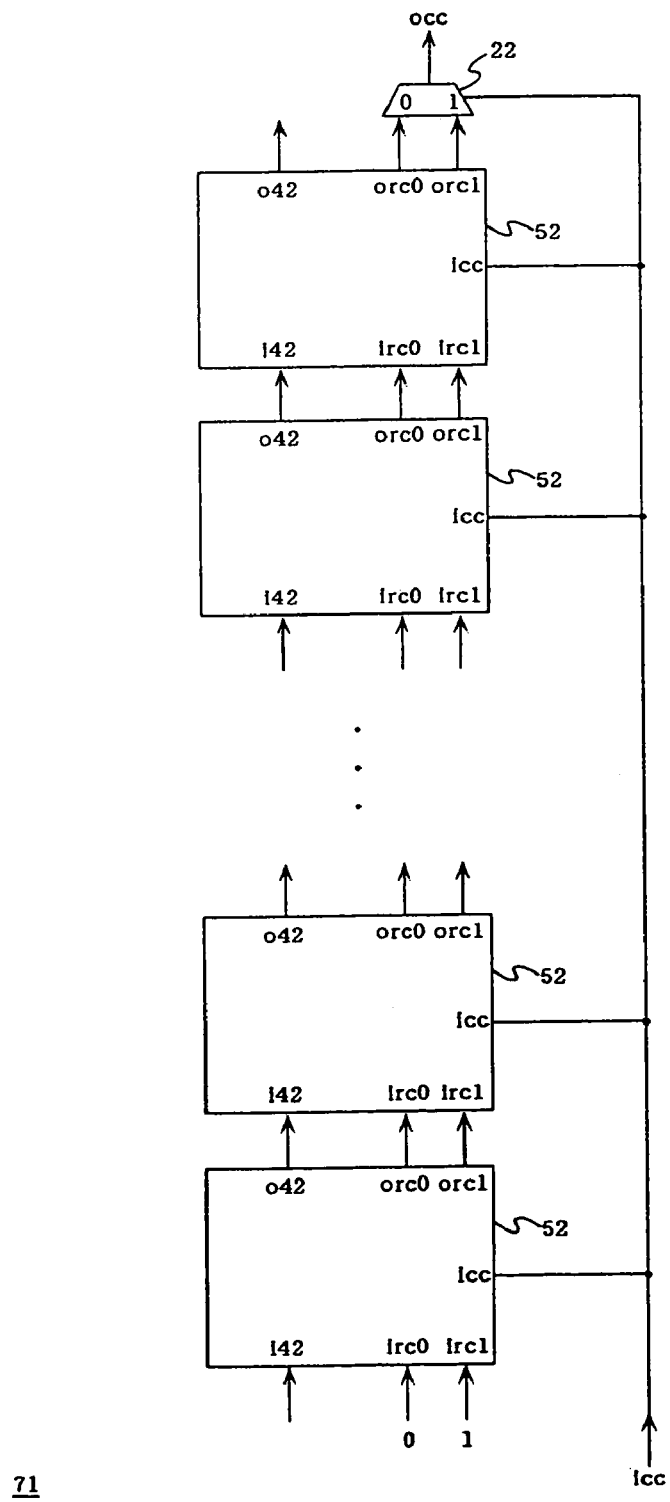
FIG. 70 is a block diagram showing a composite function cell for constituting a condition carry adder.

FIG. 70 is a block diagram showing a composite or combined function cell for constituting a condition carry adder. The composite function cell 71 includes a plurality (for example, eight) of programmable function cell 52. The 4-2 carry output o42, a first ripple carry output orc0, and a second ripple carry output orc1 of each of the programmable function cells 52 are connected to the 4-2 carry input i42, a first ripple carry input irc0, and a second ripple carry input irc1 of the programmable function cell 52 of an upper node, respectively; a first ripple carry output orc0 and a second ripple carry output orc1 of the programmable function cell 52 of the uppermost node are connected to the input-0 and input-1 of the MUX 22, respectively; and a common signal icc is fed to the control input of the MUX 22 and the input icc of the respective programmable function cell 52.

Figure 71:
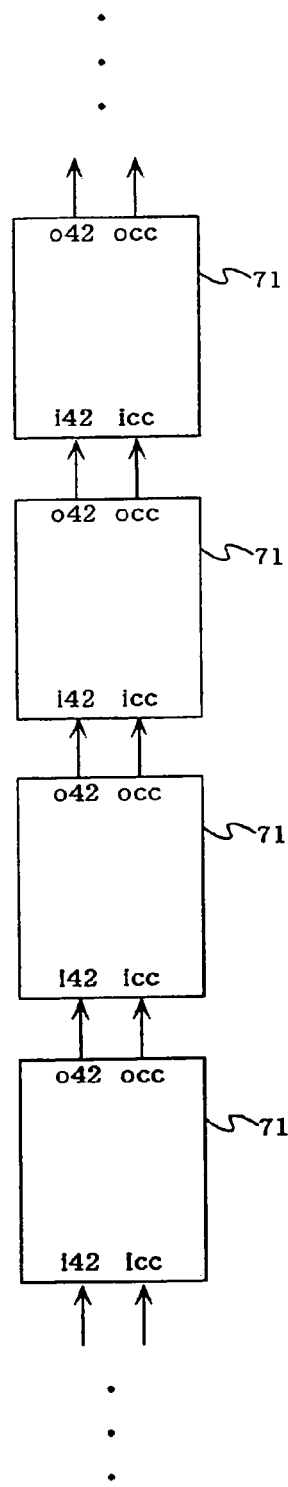
FIG. 71 is a block diagram showing a cascade connection of the composite function cells 71.

FIG. 71 is a block diagram showing a cascade connection of the composite function cells 71. With this configuration, it is possible to realize a multi-bit full adder having a high-speed condition carry as compared to an ordinary ripple carry. In each of the composite function cells of FIG. 71, when i0 and i3 of the function block are supplied with bits of the first and the second multi-bit argument inputs respectively, and icc of the lowermost composite function cell 71 is supplied with a carry input, respective bits of the addition result are output to the addition output os of the respective function blocks.

The function block 4 of FIG. 69 comprises two 2-input logic function generators 49 and one MUX 22$q$, which is equivalent to one 3-input logic function generator in the functional and area aspects. Since the 3-input logic function generator occupies half or less of that of the 4-input logic function generator, the function block of FIG. 69 has a feature that the area is small as compared to a function block including a 4-input logic function generator.

13.3) Modified Example of Thirteenth Embodiment

Figure 72:
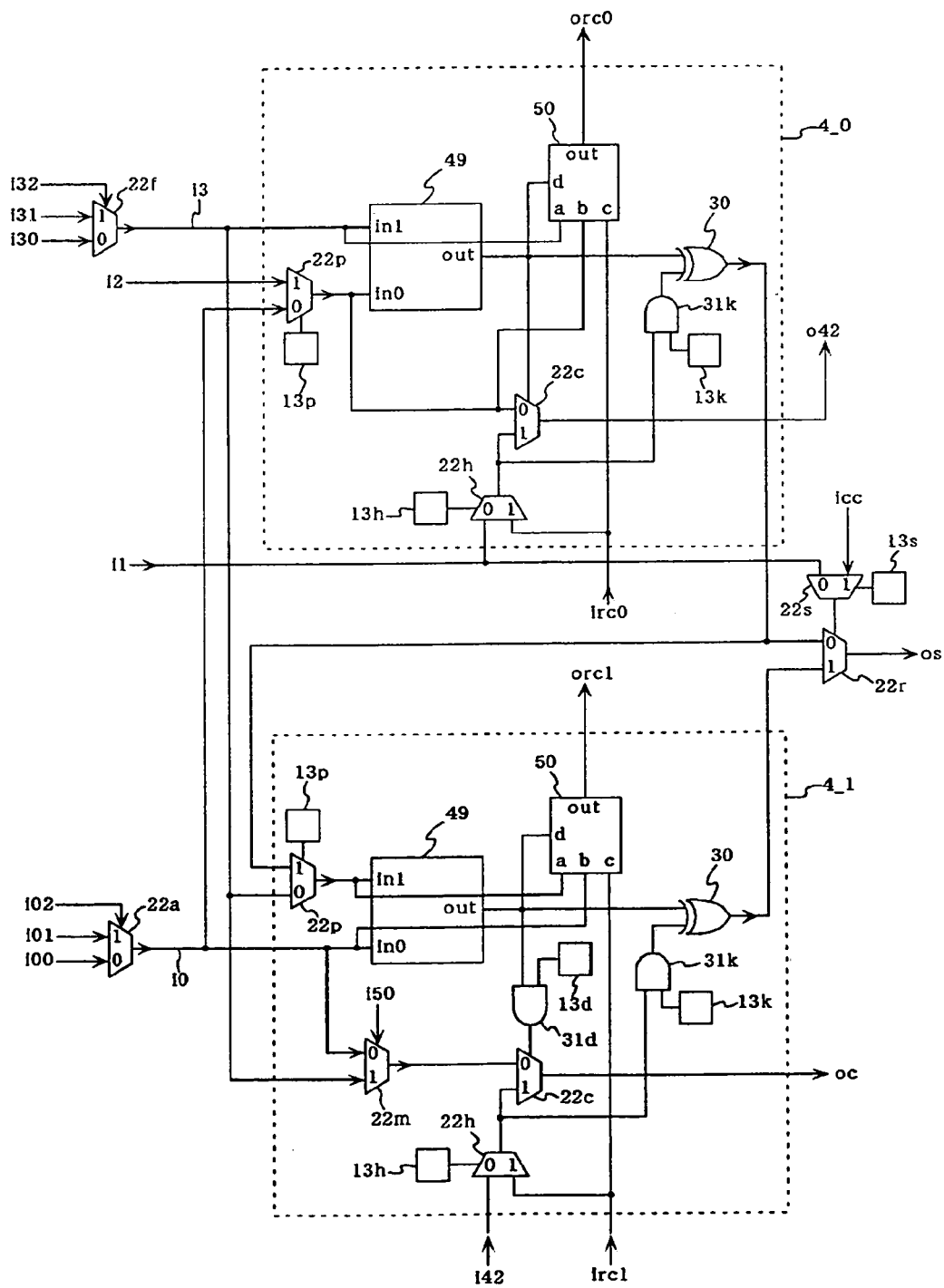
FIG. 72 is a circuit diagram showing a modified example of the thirteenth embodiment of the function block according to the present invention.

FIG. 72 is a circuit diagram showing modified example of the function block according to the thirteenth embodiment of the present invention. This is the aforementioned thirteenth embodiment (FIG. 69) to which modification like the modified example of the third embodiment (FIG. 42) has been performed, and such modification is performed that the MUX 22$q$ of FIG. 69 is removed and its function is performed by the MUX 22$r$.

More specifically, the MUX 22$a$, 22$f$ and 22$m$ in FIG. 72, the AND 31 and the configuration memory 13$d$ in the half-function block 4_1 add their functions in the modified example of the third embodiment (FIG. 42) to the function block of FIG. 69. That is, the MUX 22$a$, 22$f$ and 22$m$ in the function block 4 of FIG. 72 can constitute a 4-input MUX outputting to oc via the second MUX 22$c$.

Moreover, by using the MUX 22$a$ and 22$f$ as AND in the 4-2 adder mode, the function block 4 of FIG. 72 can be used as 2AND4-2 adder (FIG. 33).

In FIG. 72, in the 4-2 adder mode and the conditional carry mode, a logical value of 1 is stored in the configuration memory 13$k$ and the configuration memory 13$s$ in the half-function blocks 4_0 and 4_1. On the other hand, in the logic mode, a logical value of 0 is stored in them. Here, a first logic output is output directly to the first addition output and a second logic output is output directly to the second addition output respectively, and the MUX 22$r$ is controlled by i1. Accordingly, the MUX 22$r$ of FIG. 72 functions in the same way as the MUX 22$q$ of FIG. 69 and the addition output os becomes a logic output.

FIG. 72 shows only one of the modifications that can be performed to the function block of FIG. 69. Those skilled in the art can easily apply modification examples performed to the other function blocks disclosed in this specification to the function block of FIG. 69. Moreover, FIG. 69 and FIG. 72 show examples of the function block including the 2-input logic function generator but in these function blocks the 2-input logic function generator can also easily be replaced by a 3-input logic function generator.

Explanation has thus far been given on the function block including a logic function generator. Hereinafter, explanation will be given on a function block not including a logic function generator.

14. Fourteenth Embodiment 14.1) Function Block

Figure 73:
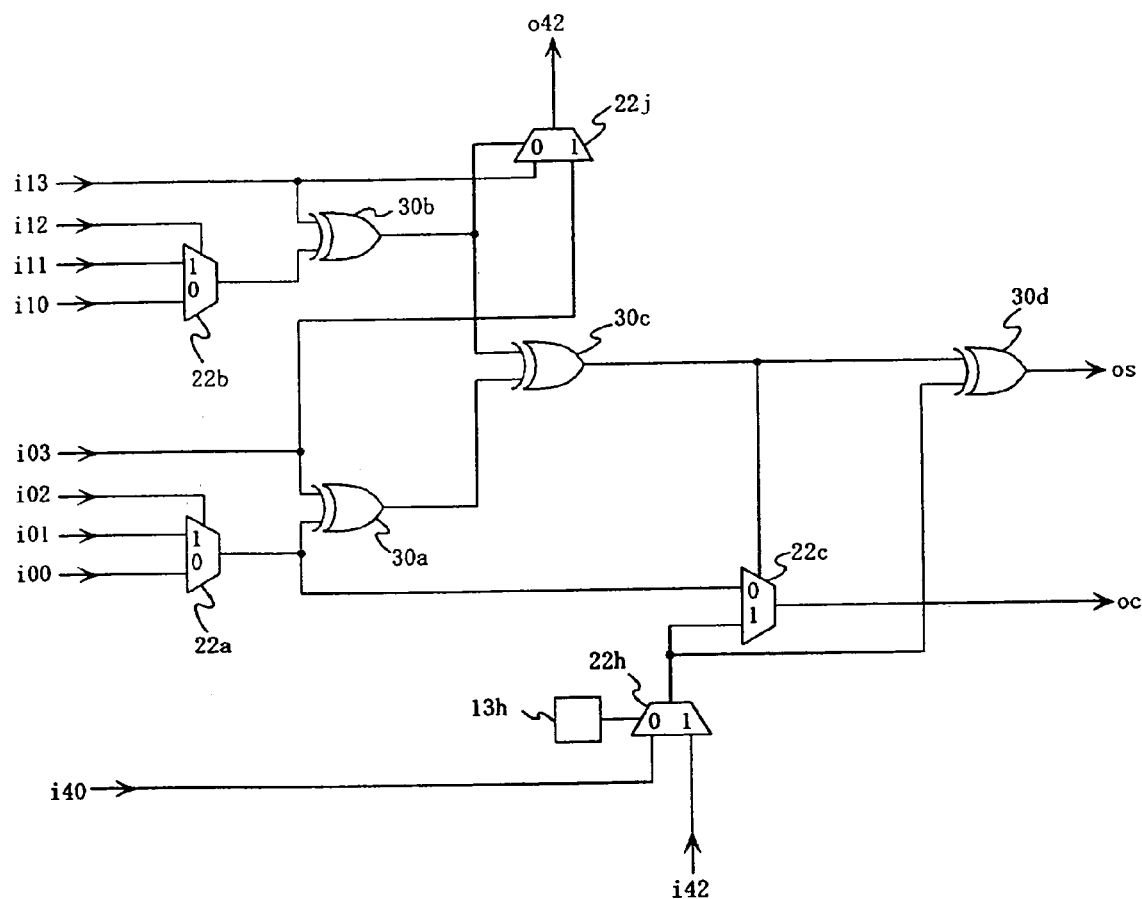
FIG. 73 is a circuit diagram showing a fourteenth embodiment of the function block according to the present invention.

FIG. 73 is a circuit diagram showing a function block according to a fourteenth embodiment of the present invention. In the function block 4, the inputs i00, i01 and i02 are connected to the input-0, the input-1 and the control input of the MUX 22$a$, respectively; the output of the MUX 22$a$ is connected to a first input of the XOR 30$a$; and the input 03 is connected to a second input of the XOR 30$a$. The inputs i10, i11 and i12 are connected to the input-0, the input-1 and control input of the MUX 22$b$, respectively; the output of the MUX 22$b$ is connected to a first input of the XOR 30$b$; and the input i13 is connected to a second input of the XOR 30$a$.

The input-0, the input-1 and the control input of the MUX 22$j$ outputting the 4-2 carry o42 are connected with the input i13, the input i03 and the output of the XOR 30$b$, respectively; and a first and a second input of the XOR 30$c$ are connected with the outputs of the XOR 30$a$ and 30$b$, respectively. The input-0, the input-1 and control input of the MUX 22$h$ are connected with the input i40, the 4-2 carry input i42 and the output of the configuration memory 13$h$, respectively; the input-0, the input-1 and the control input of the MUX 22$c$ outputting the carry output oc are connected with the outputs of the MUX 22$a$, the MUX 22$h$ and the XOR 30$c$, respectively; and a first and a second input of the XOR 30d outputting the addition output os are connected with the outputs of the XOR 30c and the MUX 22h, respectively.

The function block 4 of FIG. 73 is used in one programmable function cell 1 as shown in FIG. 1. However, there are provided nine input selection units 3_k (k is an integer) and their inputs are connected to the inputs i00, i01, i02, i03, i10, i11, i12, i13 and i40, respectively. Moreover, the input selection units 3_k here are all input selection units with fixed values. Since the function block 4 of FIG. 73 does not have the logic output ol, the circuits 5_2, 3a and 42a corresponding to ol are removed from the output block 5 (FIG. 9).

14.2) Operation Mode

Next, explanation will be given on the operation and effect of the present embodiment. The present embodiment has two operation modes: full adder mode and 4-2 adder mode.

Full Adder Mode

For using the present embodiment in the full adder mode, a logical value of 0 is stored in the configuration memory 13h and a fixed logical value of 0 is fed to the input i03.

FIG. 74(1) shows an equivalent circuit of the function block of FIG. 73 in the full adder mode. In this circuit, the argument inputs a and b of the 1-bit full adder 42 are connected with outputs of the MUX 22a and an MUX-XOR 54, respectively, as a preposition logic circuit. As has been shown in FIG. 28, the MUX can realize various logic circuits in accordance with the input setting. FIG. 75 is a table showing various logic functions of the MUX-XOR 54. As shown in FIG. 75, the MUX-XOR 54 in which an output of the MUX is connected with one of the inputs of the XOR can realize various logic circuits in accordance with the input setting. Especially FIG. 75 includes all the 2-input 1-output logic circuits. Thus, the circuit of FIG. 74(1) can realize a circuit in which various logic circuits are added to the input of the 1-bit full adder, and is useful for various arithmetic computations.

Figure 76:
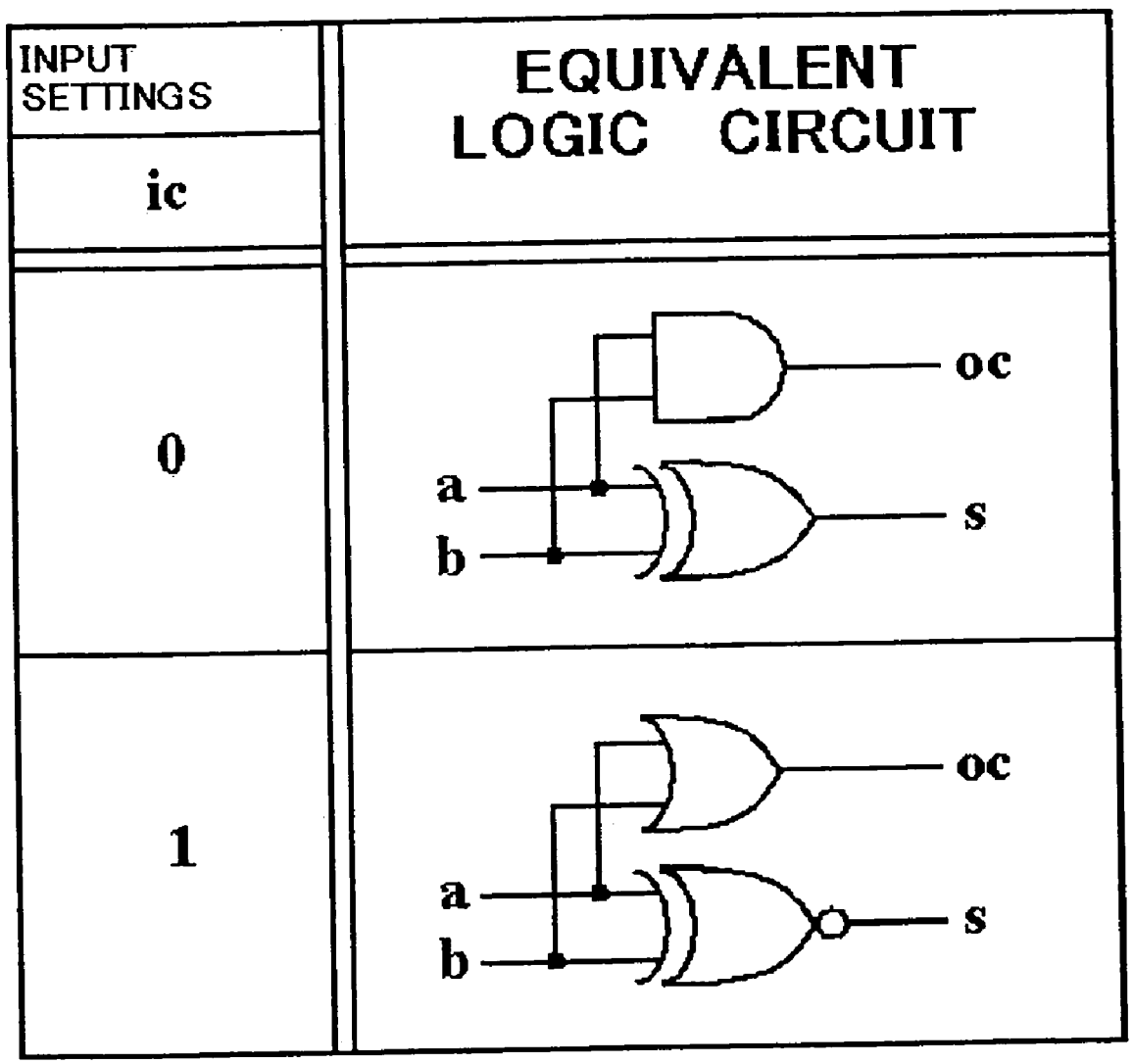
FIG. 76 is a table showing logic functions of a 1-bit full adder.

Moreover, as shown in FIG. 76, by using both of the carry output oc and the addition output s, the 1-bit full adder can also provide various logic circuits in accordance with the input setting. (Here, I/O symbols a, b, ic, oc and s in FIG. 76 follow the ones described in the 1-bit full adder 43 of FIG. 74(1).) By using such a 1-bit full adder in combination with the logic varieties of the preposition logic circuit, the circuit of FIG. 74(1) can realize a large variety of logic circuits. That is, the full adder mode of the function block 4 of FIG. 73 is excellent not only in the arithmetic computation but also in logic calculation. This feature enables the function block 4 of FIG. 7 to be used as a logic function constituting unit of a reconfigurable device.

4-2 Adder Mode

On the other hand, the function block 4 of FIG. 73 enters the 4-2 adder mode when a logical value of 1 is stored in the configuration memory 13h.

FIG. 74(2) shows an equivalent circuit of the function block of FIG. 73 in the 4-2 adder mode. This circuit is the 4-2 adder 44 whose inputs i0 and i3 are connected with outputs of the MUX 22a and 22b. As shown in FIG. 28, the MUX as a preposition logic circuit can realize various logic functions. For example, when it is used as an AND, FIG. 74(2) becomes equivalent to the 2AND4-2 adder 27 of FIG. 33 and can be used to constitute a high-performance multiplier (FIG. 34).

The function block 4 of FIG. 73 has a function similar to that of the function block of FIG. 32 in which the AND 31 is replaced by an MUX. The former has less logic variety but has merits of a small area and a small delay because the logic function generator 40 is not provided.

15. Fifteenth Embodiment

Figure 77:
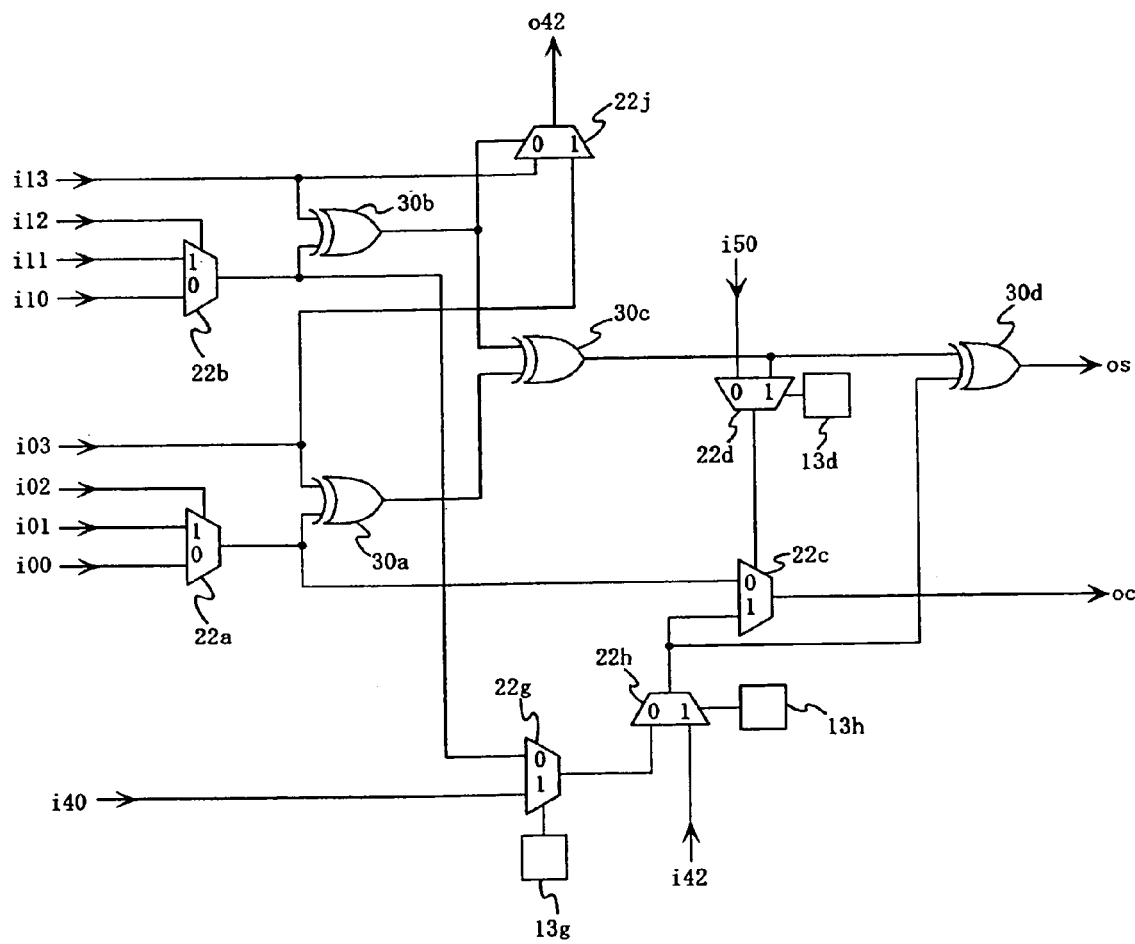
FIG. 77 is a circuit diagram showing a fifteenth embodiment of the function block according to the present invention.

FIG. 77 is a circuit diagram showing a function block according to a fifteenth embodiment of the present invention. This is the function block 4 of FIG. 73 to which the MUX 22d and the configuration memory 13d controlling it, and the MUX 22g and the configuration memory 13g controlling it are added. The input-0 and the input-1 of the MUX 22g are connected with the output of the MUX 22b and i40; and the output of the MUX 22g is connected to the input-0 of the MUX 22h. The MUX 22d selects either of the output of the XOR 30c and the control signal i50 and supplies it to the control input of the MUX 22c.

The function block 4 of FIG. 77 becomes equivalent to the function block 4 of FIG. 73 when a logical value of 1 is stored in the configuration memories 13d and 13g. On the other hand, when a logical value of 0 is stored in the configuration memories 13d, 13g and 13h, the MUX 22a, 22b and 22c constitute a 4-input MUX using the oc as an output.

The function block 4 of FIG. 77 has a function similar to the function of FIG. 41. The former has a less logic variety but has merits of a small area and a small delay because the logic function generator 40 is not provided.

Figure 78:
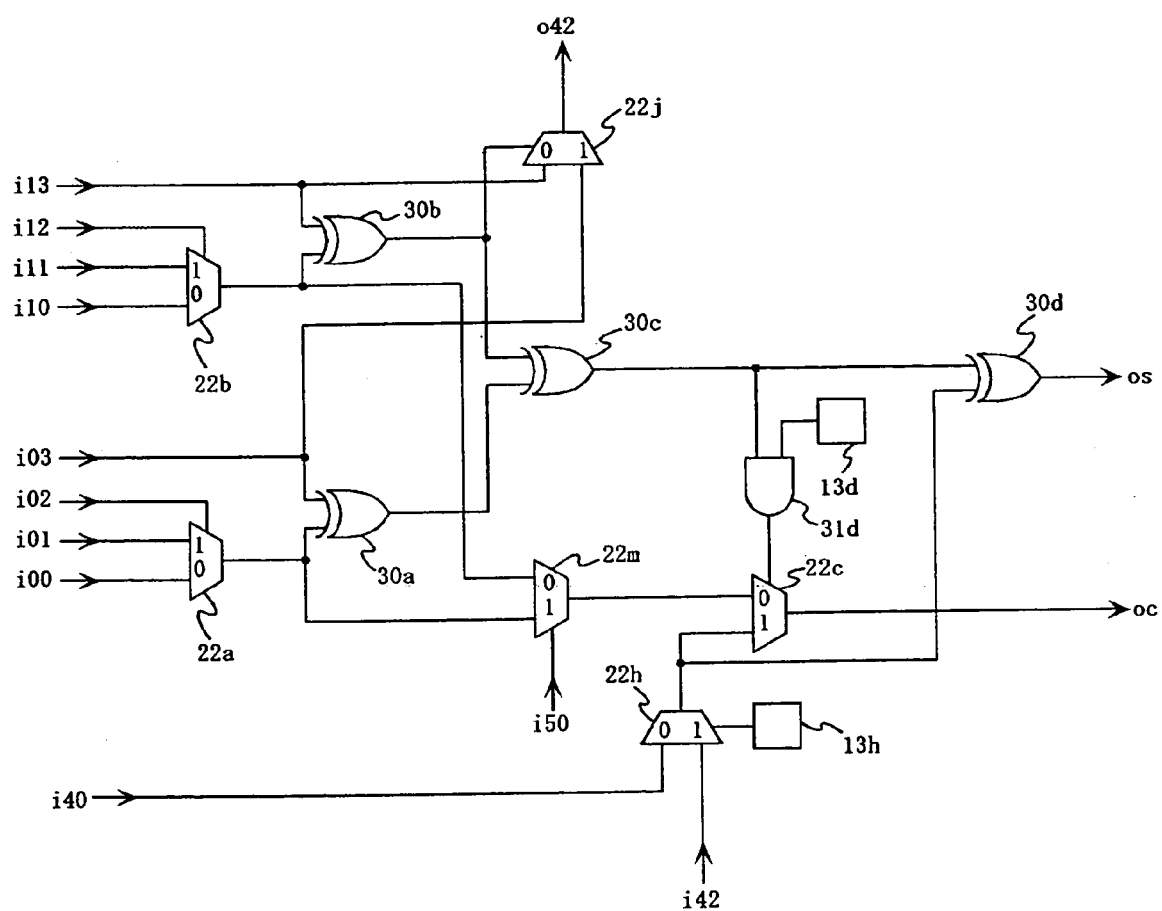
FIG. 78 is a circuit diagram showing a modified example of the fifteenth embodiment of the function block according to the present invention.

FIG. 78 is a circuit diagram showing a modified example of the function block according to the fifteenth embodiment of the present invention. This is the function block 4 of FIG. 73 to which the MUX 22m, the AND 31d and the configuration memory 13d are added. The input-1 and the input-0 of the MUX 22m are connected with outputs of the MUX 22a and 22b, respectively; the output of the MUX 22m is connected to the input-0 of the MUX 22c; and the MUX 22m is controlled by the control input i50. The AND 31d is supplied with outputs of the XOR 30c and the configuration memory 13d as inputs and the output of the AND 31d controls the MUX 22c.

The function block 4 of FIG. 78 becomes equivalent to the function block 4 of FIG. 73 when a logical value of 1 is given as i50 and a logical value of 1 is stored in the configuration memory 13d. On the other hand, when a logical value of 0 is stored in the configuration memory 13d, the MUX 22a, 22b and 22m constitute a 4-input MUX using the oc as an output. The function block 4 of FIG. 78 has a function similar to the function of FIG. 42. The former has less logic variety but has merits of a small area and a small delay because the logic function generator 40 is not provided.

16. Sixteenth Embodiment

Figure 79:
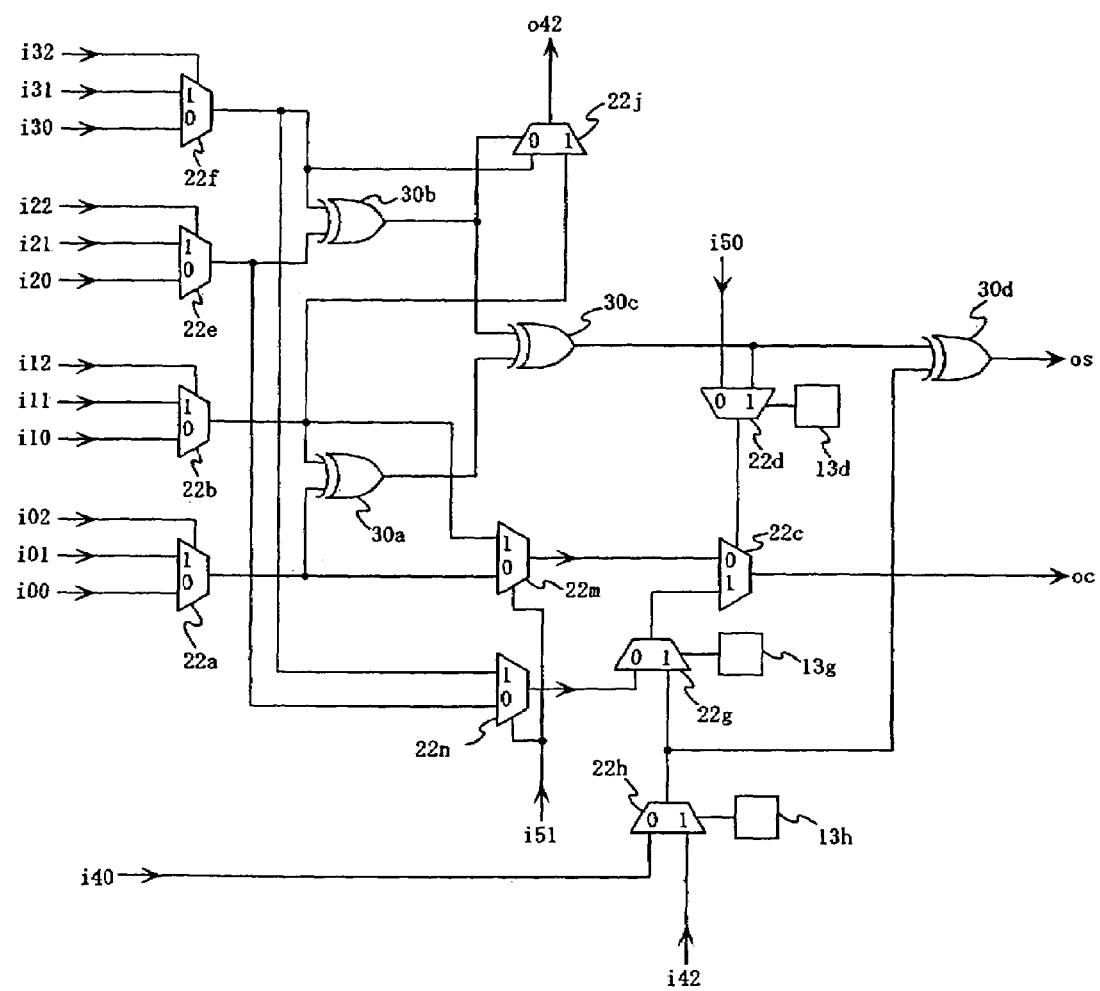
FIG. 79 is a circuit diagram showing a sixteenth embodiment of the function block according to the present invention.

FIG. 79 is a circuit diagram showing a function block according to a sixteenth embodiment of the present invention. This is the function block 4 of FIG. 73 that has been modified to realize an 8-input MUX in the same way as FIG. 45. The function block 4 of FIG. 79 becomes equivalent to the circuit of FIG. 73 in which an MUX is added to i03 and i13 when a logical value of 0 is fed as i51 and a logical value of 1 is stored in both of the configuration memories 13d and 13g.

On the other hand, when a logical value of 0 is stored in both of the configuration memories 13d and 13g, the MUXs 22a, 22b, 22e, 22f, 22m, 22n and 22c constitute an 8-input MUX using the oc as an output. The function block 4 of FIG. 79 has the function similar to the function of FIG. 45. The former has a less logic variety but has merits of a small area and a small delay because the logic function generator 40 is not provided.

Figure 80:
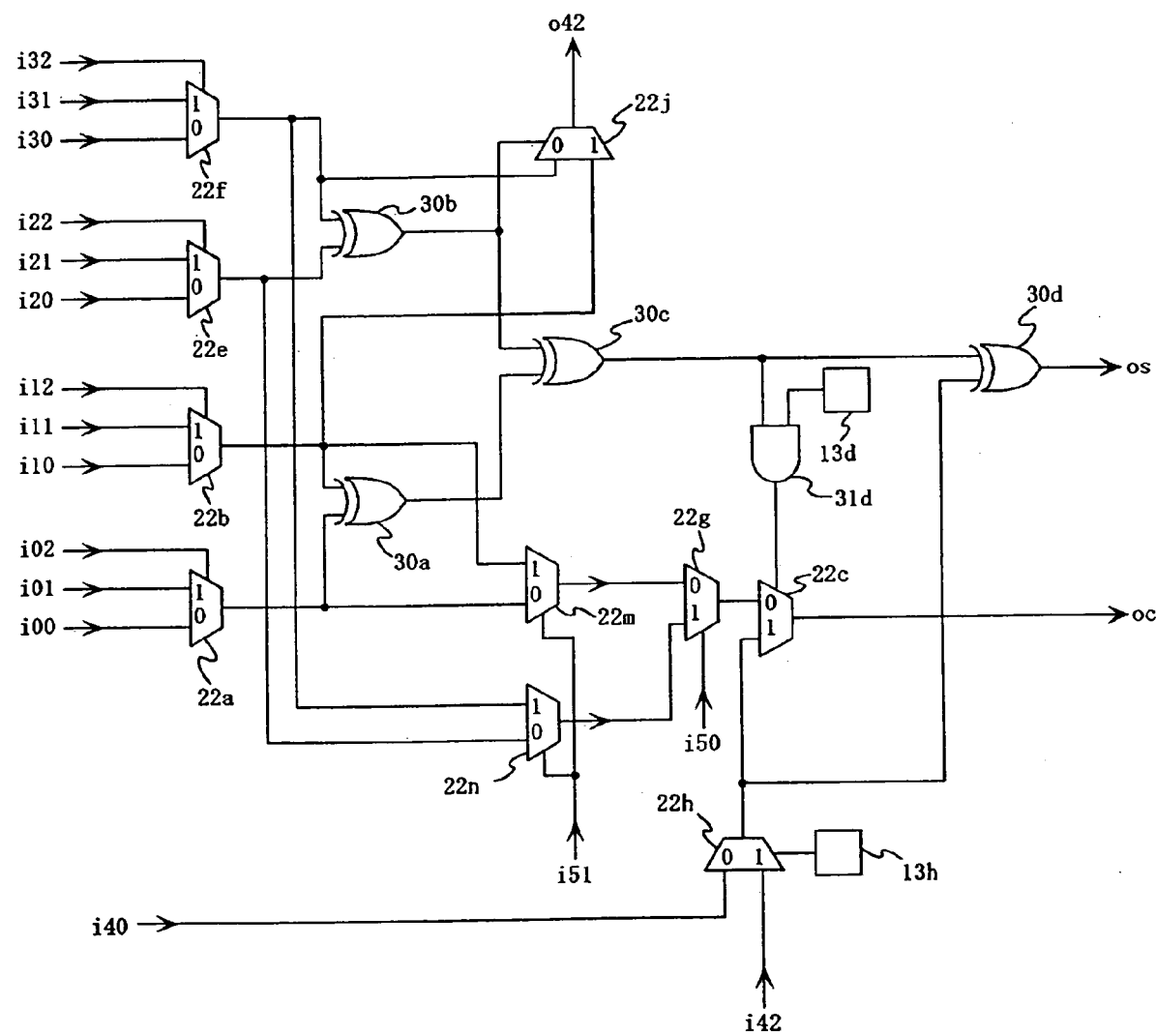
FIG. 80 is a circuit diagram showing a modified example of the sixteenth embodiment of the function block according to the present invention.

FIG. 80 is a circuit diagram showing a modified example of the function block according to the sixteenth embodiment of the present invention. This is the function block 4 of FIG. 73 that has been modified to realize an 8-input MUX in the same way as FIG. 46. The function block of FIG. 80 becomes equivalent to the circuit of FIG. 73 in which an MUX is added to i03 and i13 when a logical value of 0 is fed to i50 and i51 and a logical value of 1 is stored in the configuration memory 13d.

On the other hand, when a logical value of 0 is stored in the configuration memory 13d, the MUX 22a, 22b, 22e, 22f, 22m, 22n and 22g constitute an 8-input MUX using the oc as an output. The function block 4 of FIG. 80 has a function similar to the function of FIG. 46. The former has a less logic variety but has merits of a small area and a small delay because the logic function generator 40 is not provided.

17. Seventeenth Embodiment

Figure 81:
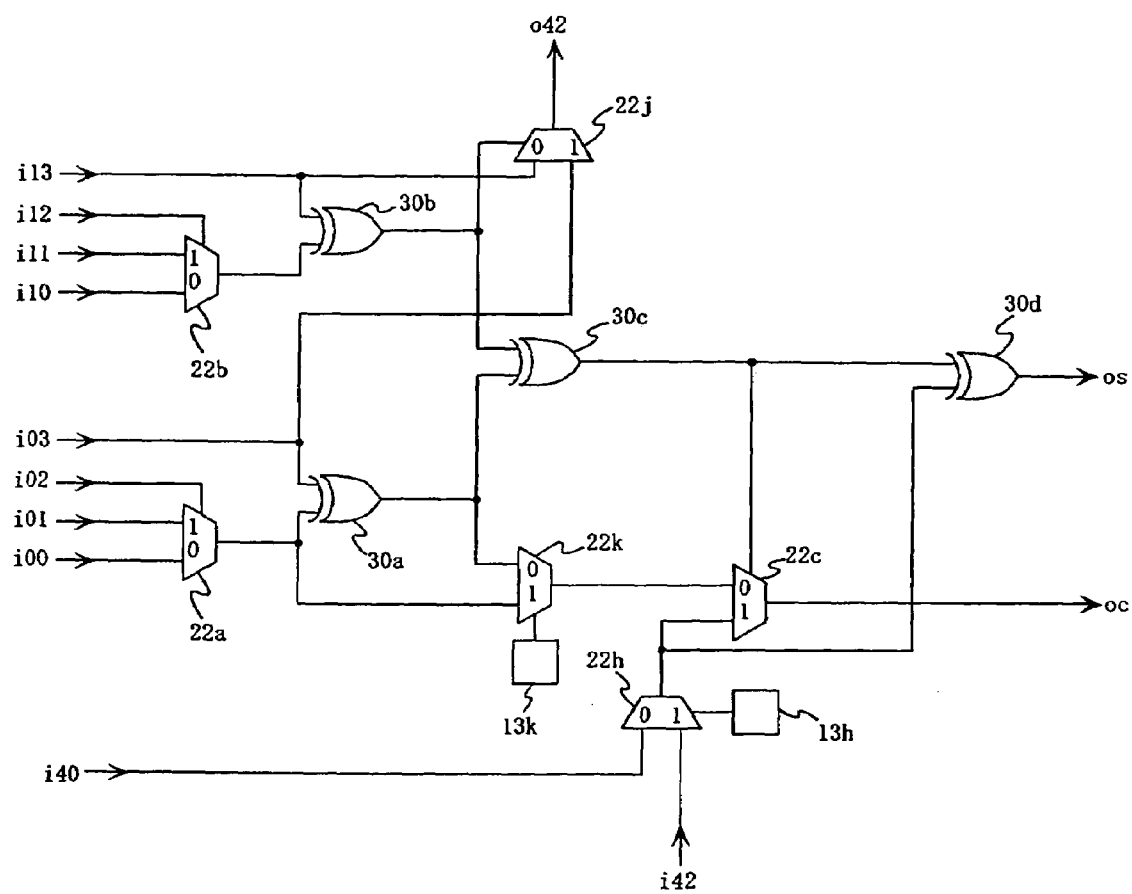
FIG. 81 is a circuit diagram showing a seventeenth embodiment of the function block according to the present invention.

FIG. 81 is a circuit diagram showing a function block according to the seventeenth embodiment of the present invention. This is the function block 4 of FIG. 73 to which the MUX 22k and the configuration memory 13k controlling it are added.

The function block of FIG. 81 becomes equivalent to the circuit of FIG. 73 when a logical value of 1 is stored in the configuration memory 13k.

Figure 82:
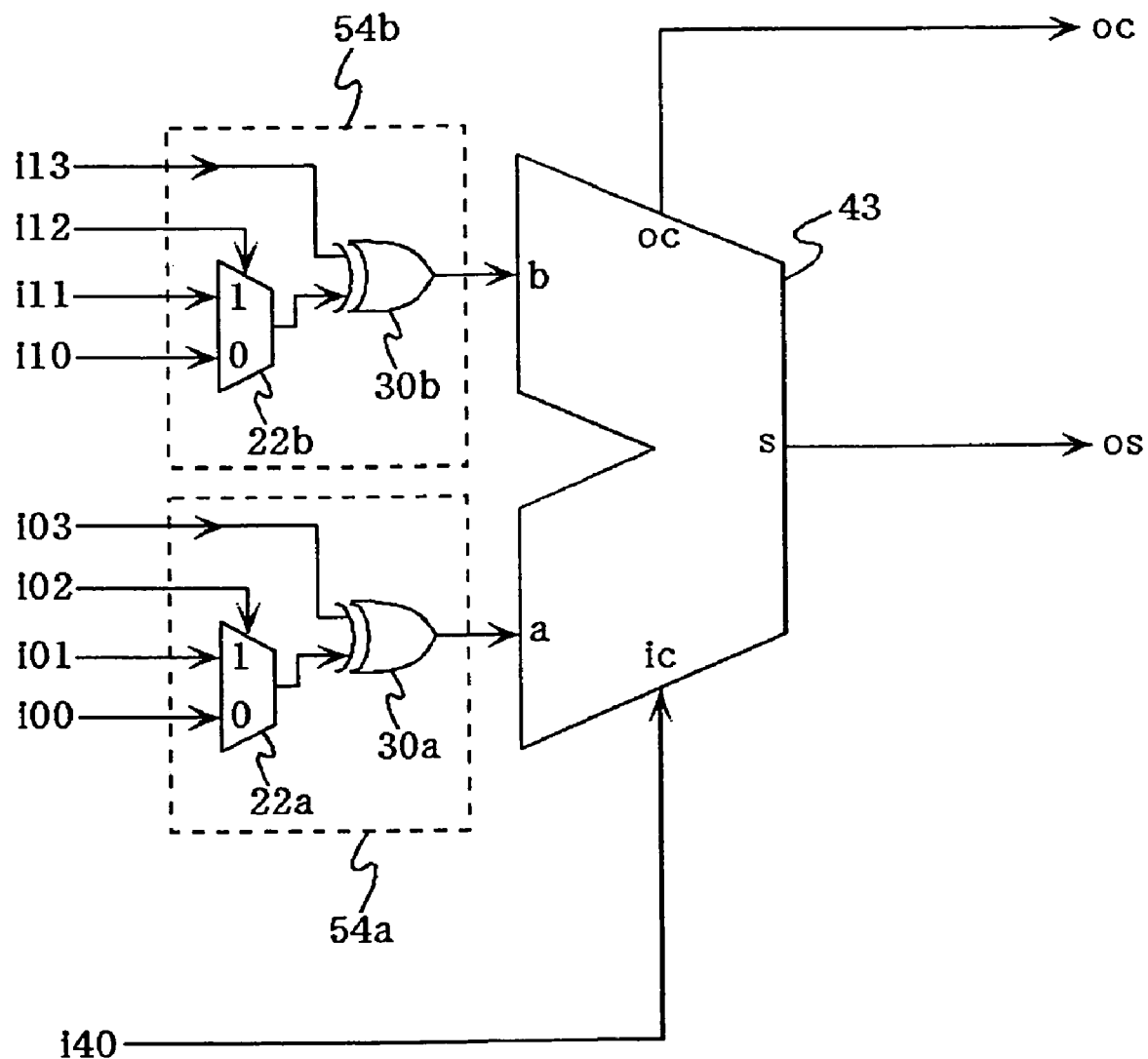
FIG. 82 shows one of equivalent circuits of the function block 4 in FIG. 81.

On the other hand, when a logical value of 0 is stored in both of the configuration memories 13k and 13h, the function block 4 of FIG. 81 becomes equivalent to a circuit of FIG. 82.

FIG. 82 shows one of the equivalent circuits of the function block 4 of FIG. 81 in which the argument inputs a and b of the 1-bit full adder 43 are respectively connected with the outputs of the MUX-XOR 54a and 54b as a preposition logic circuit.

As has been described above, since the MUX-XOR can realize a larger variety of logic circuits than the MUX, the circuit of FIG. 82 can implement a larger variety of logic circuits than FIG. 74(1).

Figure 83:
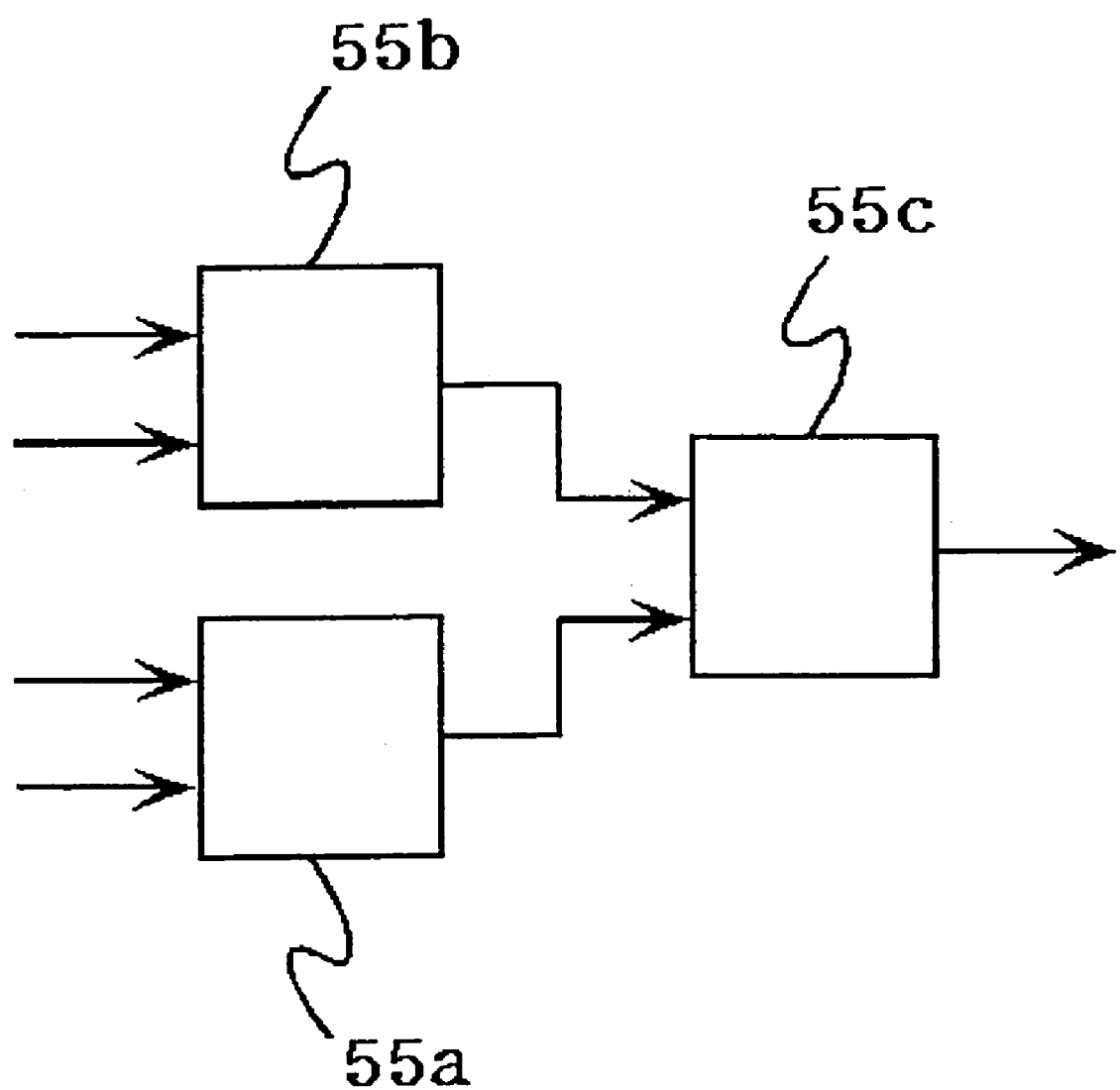
FIG. 83 shows a logic circuit of frequent use that can be realized by the circuit of FIG. 82.

FIG. 83 shows a logic circuit that can be realized by the circuit of FIG. 82 and is used with a high frequency. The circuit of FIG. 82 has a feature that it can implement all the logic circuits of the type shown in FIG. 83. Here, reference numerals 55a, 55b and 55c denote arbitrary 2-input 1-output logic circuits. This type of logic circuit is used by much more frequently than the other types. Accordingly, realization of it in a single function block is a very effective feature for a logic function constituting unit of a reconfigurable device.

18. Eighteenth Embodiment

Figure 84:
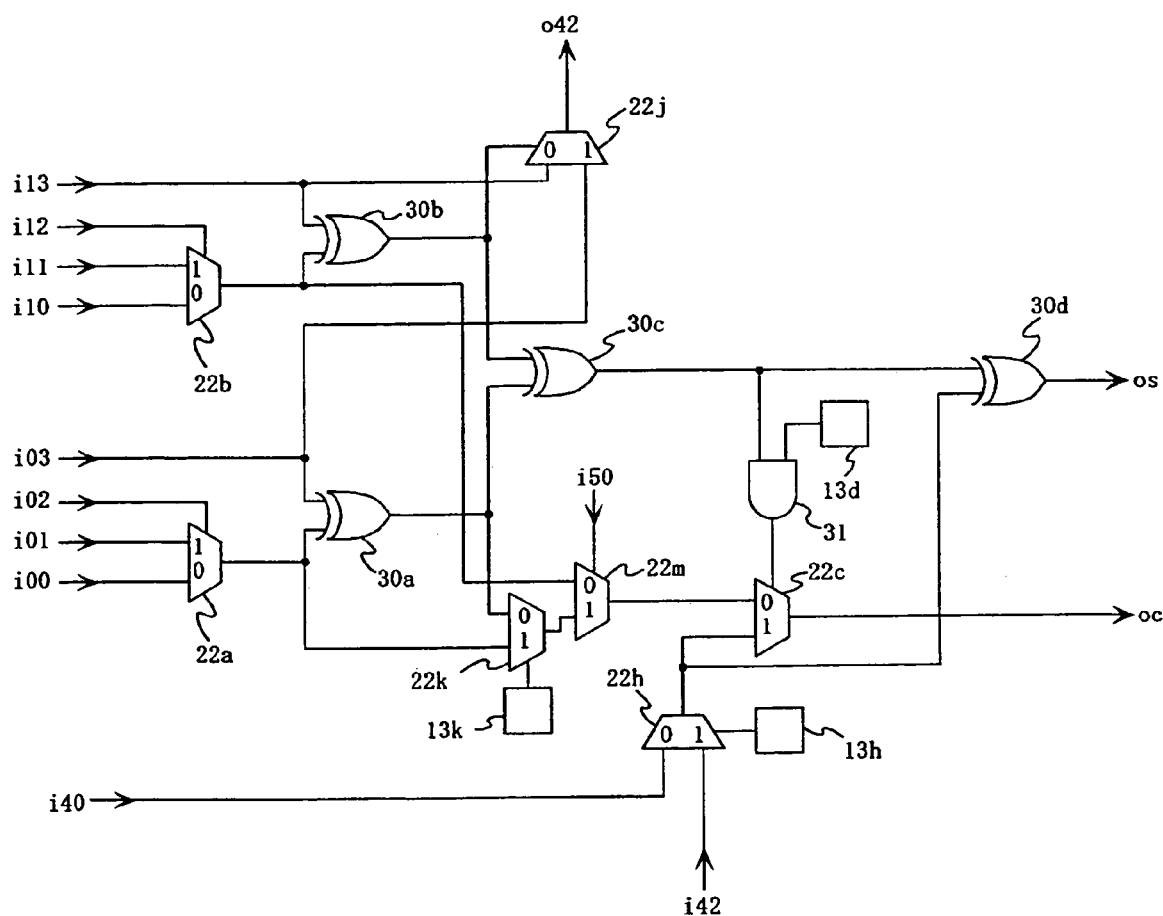
FIG. 84 is a circuit diagram showing an eighteenth embodiment of the function block according to the present invention.

FIG. 84 is a circuit diagram showing a function block according to an eighteenth embodiment of the present invention. This is the function block 4 of FIG. 78 to which the MUX 22k and the configuration memory 13k controlling it are added. The function block 4 of FIG. 84 is equivalent to FIG. 78 when a logical value of 1 is stored in the configuration memory 13k.

On the other hand, when logical values 0, 1 and 0 are stored in the configuration memories 13k, 13d and 13h, respectively, and a logical value of 1 is fed as the control input i50, the function block 4 of FIG. 84 becomes equivalent to the circuit of FIG. 82. With these modes, the function block 4 of FIG. 84 cab realize a 4-input MUX and has a large logic variety. In the same way, the function block 4 of FIG. 79 or FIG. 80 can also have a large logic variety by adding the MUX 22k and the configuration memory 13k controlling it.

19. Nineteenth Embodiment

Figure 85:
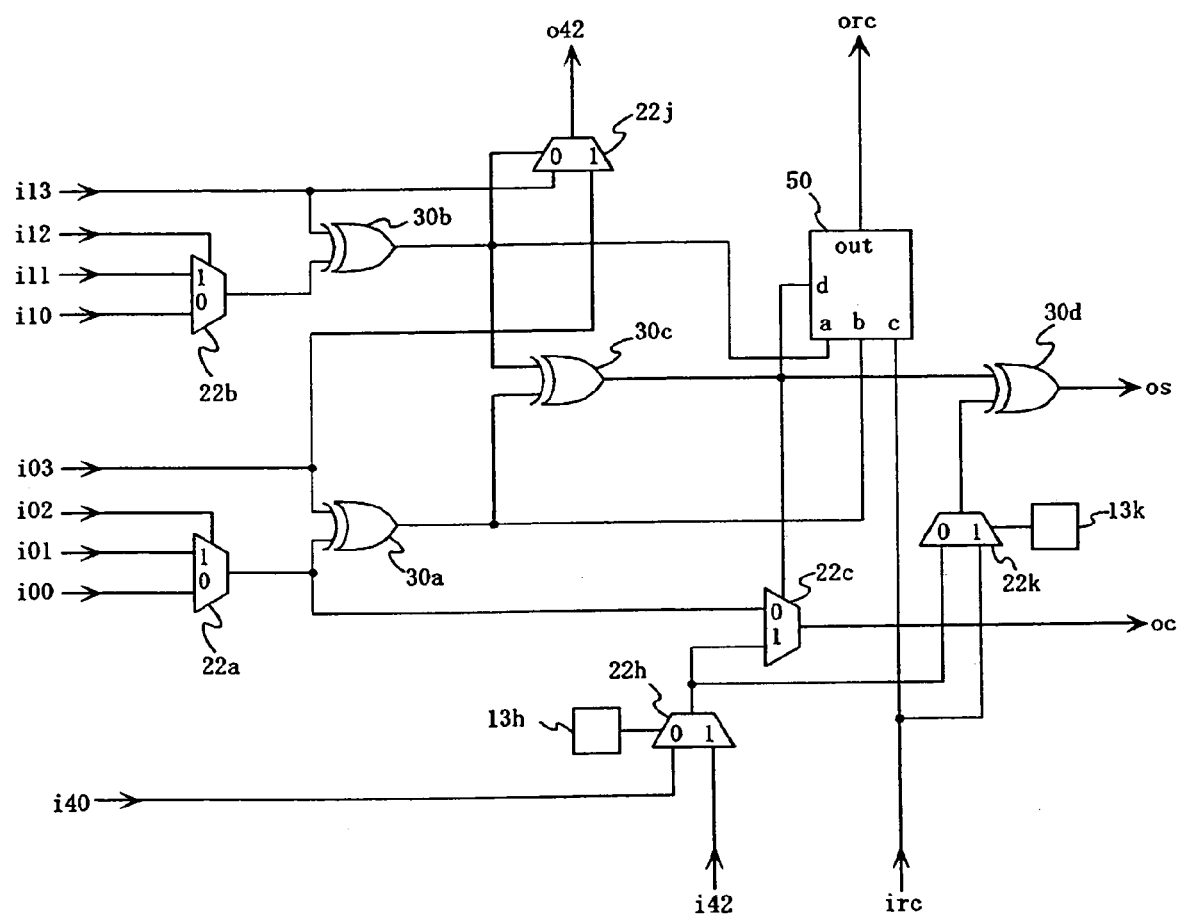
FIG. 85 is a circuit diagram showing a nineteenth embodiment of the function block according to the present invention.

FIG. 85 is a circuit diagram showing a function block according to a nineteenth embodiment of the present invention. This is the function block 4 of FIG. 73 to which the ripple carry block 50 is added in the same way as FIG. 47, thereby making a high-speed ripple carry transfer possible. When using this ripple carry function, a logical value of 1 is stored in the configuration memory 13k. In this case, the function block 4 of FIG. 85 is equivalent to the circuit of FIG. 82 in which i40 is replaced by the ripple carry input irc and oc is replaced by the ripple carry output orc, respectively.

Moreover, when a logical value of 0 is stored in the configuration memory 13k, the function block 4 of FIG. 85 becomes equivalent to the function block 4 of FIG. 73. For those skilled in the art, it is easy to provide the ripple carry block 50 in the other function blocks of the present invention (function blocks of the fifteenth to eighteenth embodiment of the present invention and their modified examples) in the same way as the present example using the information disclosed in this specification.

Figure 86:
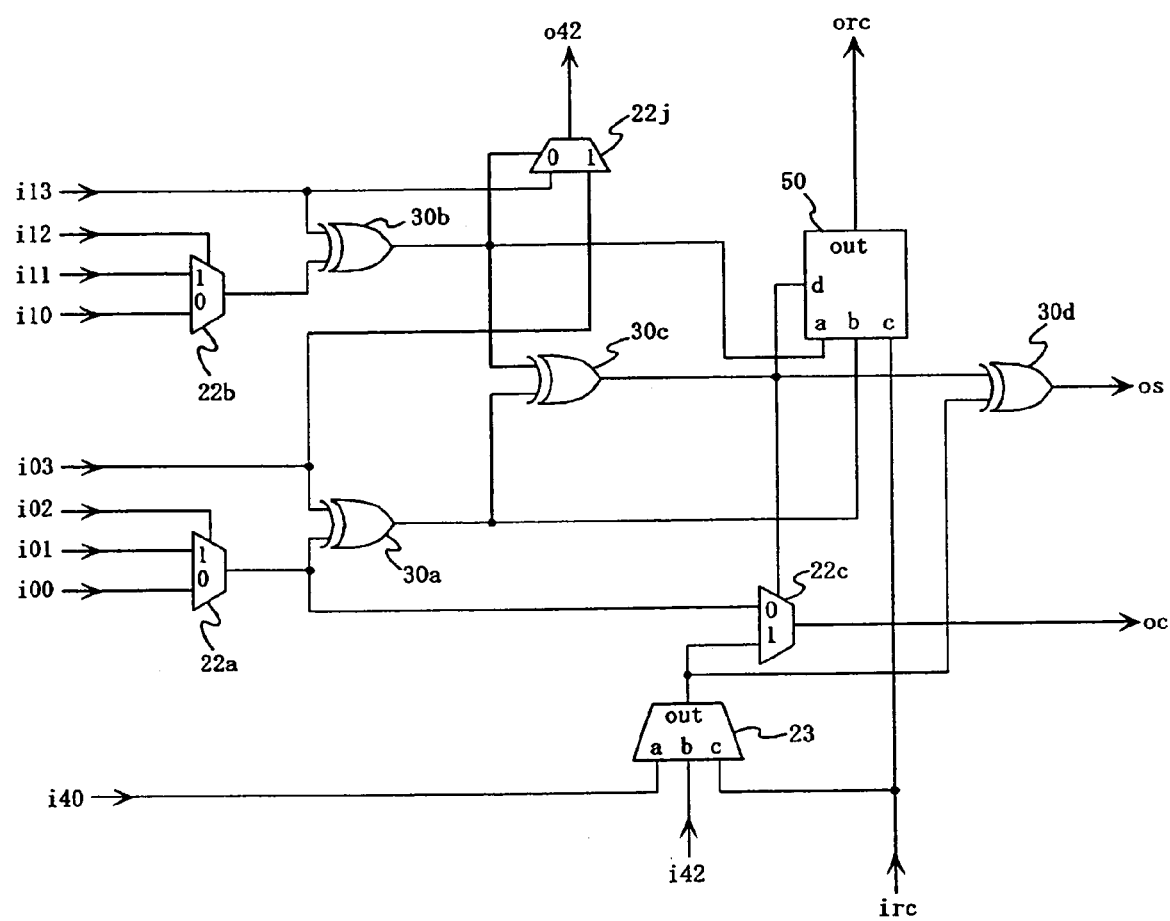
FIG. 86 is a circuit diagram showing a modified example of the nineteenth embodiment of the function block according to the present invention.

FIG. 86 is a circuit diagram showing a modified example of the function block according to the nineteenth embodiment of the present invention. This is the function block 4 of FIG. 73 to which the ripple carry block 50 is added in the same way as FIG. 48, thereby making a high-speed ripple carry transfer possible. When using this ripple carry function, the memory-equipped 3-input MUX 23 is configured so as to output the input c to out. In this case, the function block 4 of FIG. 86 is equivalent to the circuit of FIG. 82 in which i40 is replaced by the ripple carry input irc and the oc is replaced by the ripple carry output orc, respectively.

Moreover, when the input a or b is selected by the memory-equipped 3-input MUX 23, the function block 4 of FIG. 86 becomes equivalent to the circuit of FIG. 73 in which the input-0 or the input-1 is selected by the MUX 22h, respectively.

For those skilled in the art, it is easy to provide the ripple carry block 50 in the other function blocks of the present invention (the function blocks of the fifteenth to the eighteenth embodiment of the present invention and their modified examples) in the same way as in the present embodiment using the information disclosed in this Specification.

20. Twentieth Embodiment

Figure 87:
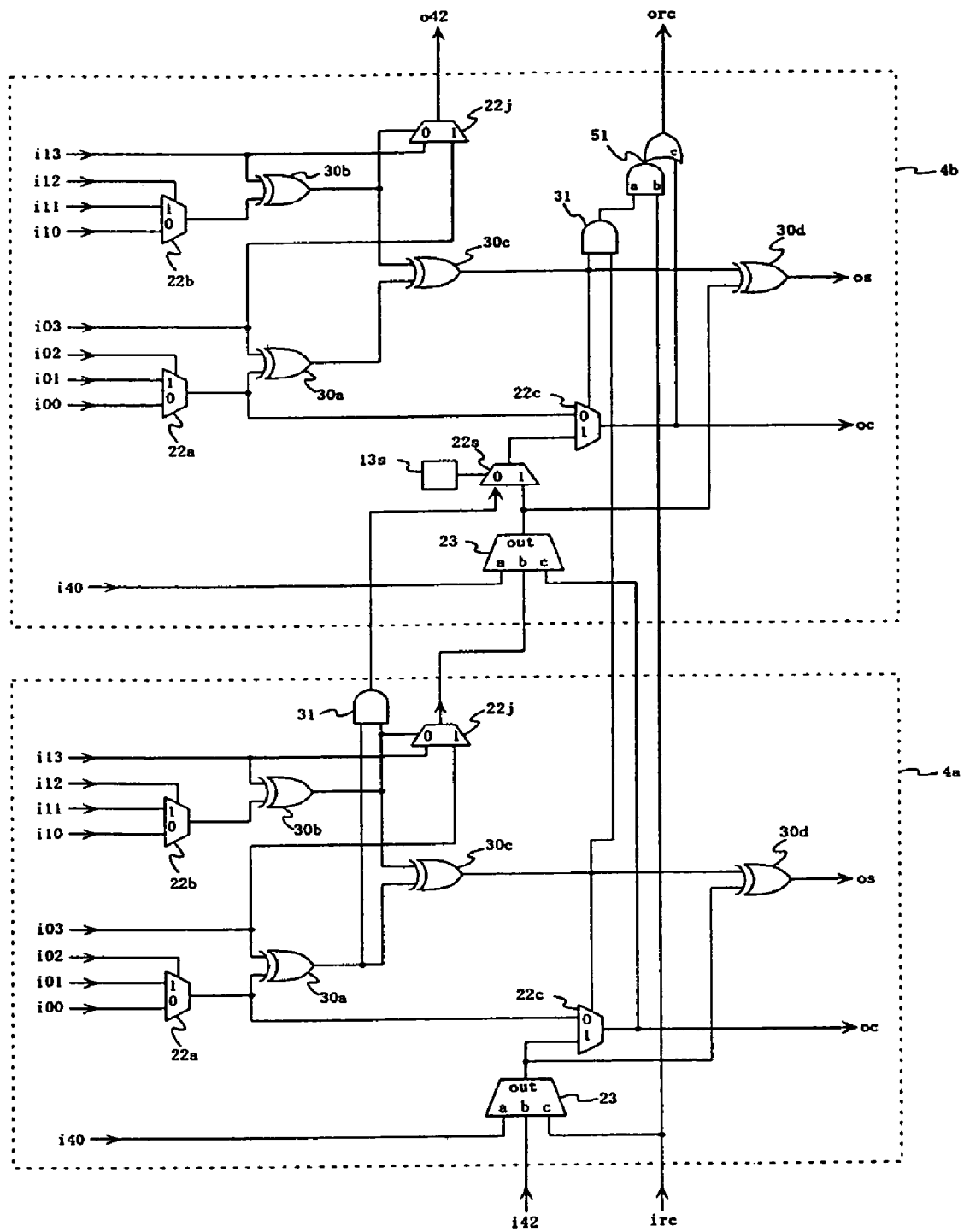
FIG. 87 is a circuit diagram showing a twentieth embodiment of the function block according to the present invention.

FIG. 87 is a circuit diagram showing a function block according to a twentieth embodiment of the present invention. This embodiment is a composite or combined function block composed of a function block 4a and a function block 4b. Each of the function blocks is the function block 4 of FIG. 73 to which the 2-bit carry look ahead function of FIG. 55 is added.

In order to use the 2-bit carry look ahead function, in the two function blocks 4a and 4b of FIG. 87, the memory-equipped 3-input MUX 23 is configured so as to output the input c to out and a fixed logical value of 0 is fed to the input i03. Here, the function blocks 4a and 4b of FIG. 87 becomes equivalent to FIG. 74(1) in which the carry circuit is modified to a 2-bit carry look ahead (this only increases the carry transfer speed and the function of the full adder does not change).

When a logical value of 1 is stored in the configuration memory 13s and the input a or b is selected by the memory-equipped 3-input MUX 23, the function blocks 4a and 4b of FIG. 87 become equivalent to the circuit of FIG. 73 in which the input-0 or the input-1 is selected by the MUX 22h, respectively. For those skilled in the art, it is easy to add the 2-bit carry look ahead function to the other function blocks (the function blocks of the fifteenth to the eighteenth embodiment of the present invention and their modified examples) in the same way as the present embodiment using the information disclosed in the present Specification.

21. Twenty-first Embodiment

Figure 88:
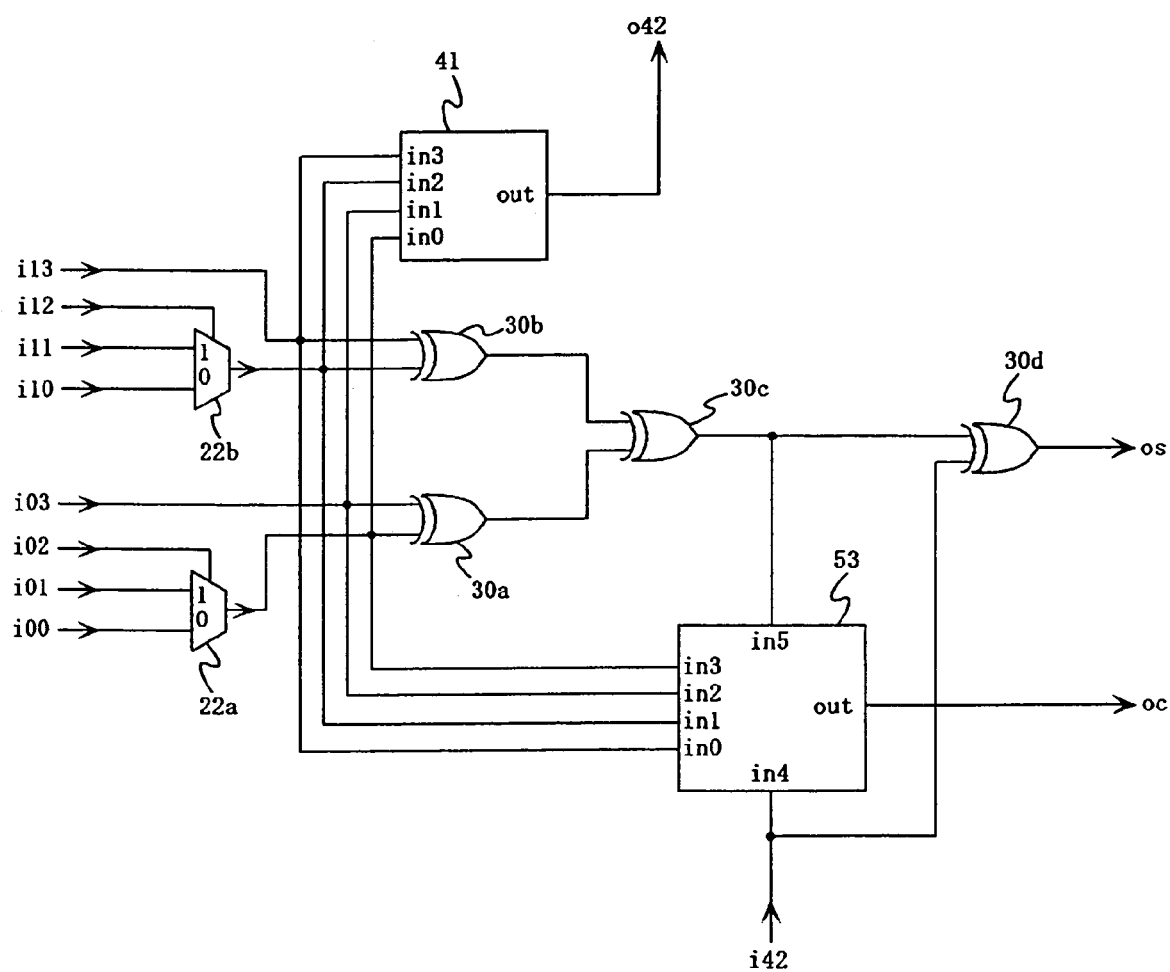
FIG. 88 is a circuit diagram showing a twenty-first embodiment of the function block according to the present invention.

FIG. 88 is a circuit diagram showing a function block according to a twenty-first embodiment of the present invention. This is the function block 4 of FIG. 61 in which the logic function generator 40 is replaced by a 4-input XOR composed of XOR 30*a*, 30*b* and 30*c*, and MUX 22*a* and 22*b* are added as a preposition logic circuit. The function block of FIG. 88 functions as a circuit equivalent to FIG. 74(2) and accordingly, it can be used, for example, as a 2AND4-2 adder. Moreover, the MUX 22*a* and XOR 30*a*, or the MUX 22*b* and XOR 30*b* in FIG. 88 constitute the aforementioned preposition logic circuit MUX-XOR, which can be used as various logic circuits as shown in FIG. 75.

22. Twenty-second Embodiment

22.1) Function Block

Figure 89:
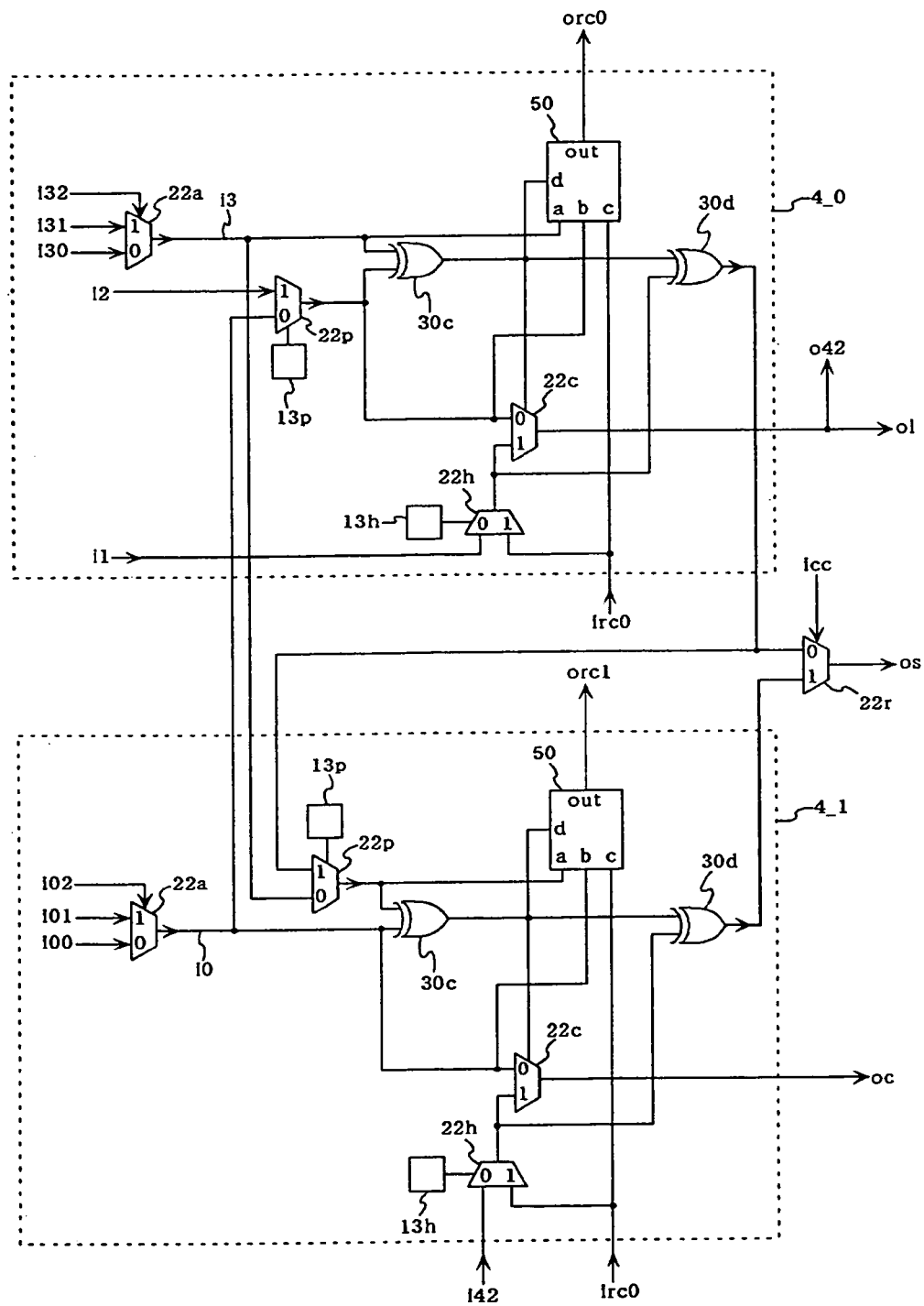
FIG. 89 is a circuit diagram showing a twenty-second embodiment of the function block according to the present invention.

FIG. 89 is a circuit diagram showing a function block according to a twenty-second embodiment of the present invention. The function block 4 consists of two half-function blocks 4_0 and 4_1 and an MUX 22*r* connecting them.

The half-function block 4_0 includes: a first XOR 30*d* generating a first addition output; a first MUX 22*c* generating a 4-2 carry output o42 and a logic output ol; a first ripple carry block 50 generating a first ripple carry output orc0; a first XOR 30*c* for supplying a signal to a first input of the first XOR 30*d*, to the input-d of the first ripple carry block 50 and to the control input of the first MUX 22*c*; a first MUX 22*p* for supplying a signal to the input-0 of the first MUX 22*c*, to a first input of the first XOR 30*c* and to the input-b of the first ripple carry block 50, and a first configuration memory 13*p* for controlling it; a first MUX 22*a* for supplying a signal to a second input of the first XOR 30*c* and to the input-a of the first ripple carry block 50; and a first MUX 22*h* for supplying a signal to a second input of the first XOR 30*d* and to the input-1 of the first MUX 22*c*, and a first configuration memory 13*h* for controlling it.

The first ripple carry input irc0 is supplied to the input-c of the first ripple carry block 50 and to the input-1 of the first MUX 22*h*. The input-0 of the first MUX 22*h* is supplied with an input i1 and the input-1 of the first MUX 22*p* is supplied with an input i2.

The half-function block 4_1 comprises: a second XOR 30*d* generating a second addition output; a second MUX 22*c* generating a carry output oc; a second ripple carry block 50 generating a second ripple carry output orc1; a second XOR 30*c* for supplying a signal to a first input of the second XOR 30*d*, to the input-d of the second ripple carry block 50 and to the control input of the second MUX 22*c*; a first MUX 22*a* for supplying a signal to the input-0 of the second MUX 22*c*, to a first input of the second XOR 30*c* and to the input-b of the second ripple carry block 50; a second MUX 22*p* for supplying a signal to a second input of the second XOR 30*c* and to the input-a of the second ripple carry block 50, and a second configuration memory 13*p* for controlling it; and a second MUX 22*h* for supplying a signal to a second input of the second XOR 30*d* and to the input-1 of the second MUX 22*h*, and a second configuration memory 13*h* for controlling it.

The second ripple carry input irc1 is supplied to the input-c of the second ripple carry block 50 and to the input-1 of the second MUX 22*h*. The input-0 of the second MUX 22*h* is supplied with a 4-2 carry input i42.

A first addition output is supplied to the input-0 of the MUX 22*r* and to the input-1 of the second MUX 22*p*. A second addition output is supplied to the input-1 of the MUX 22*r*. The input-0 of the first MUX 22*p* is supplied with an output of the second MUX 22*a* and the input-0 of the second MUX 22*p* is supplied with an output of the first MUX 22*a*.

22.2) Operation Mode

The function block 4 of FIG. 89 has three operation modes: logic mode; 4-2 adder mode; and conditional carry mode.

Figure 90:
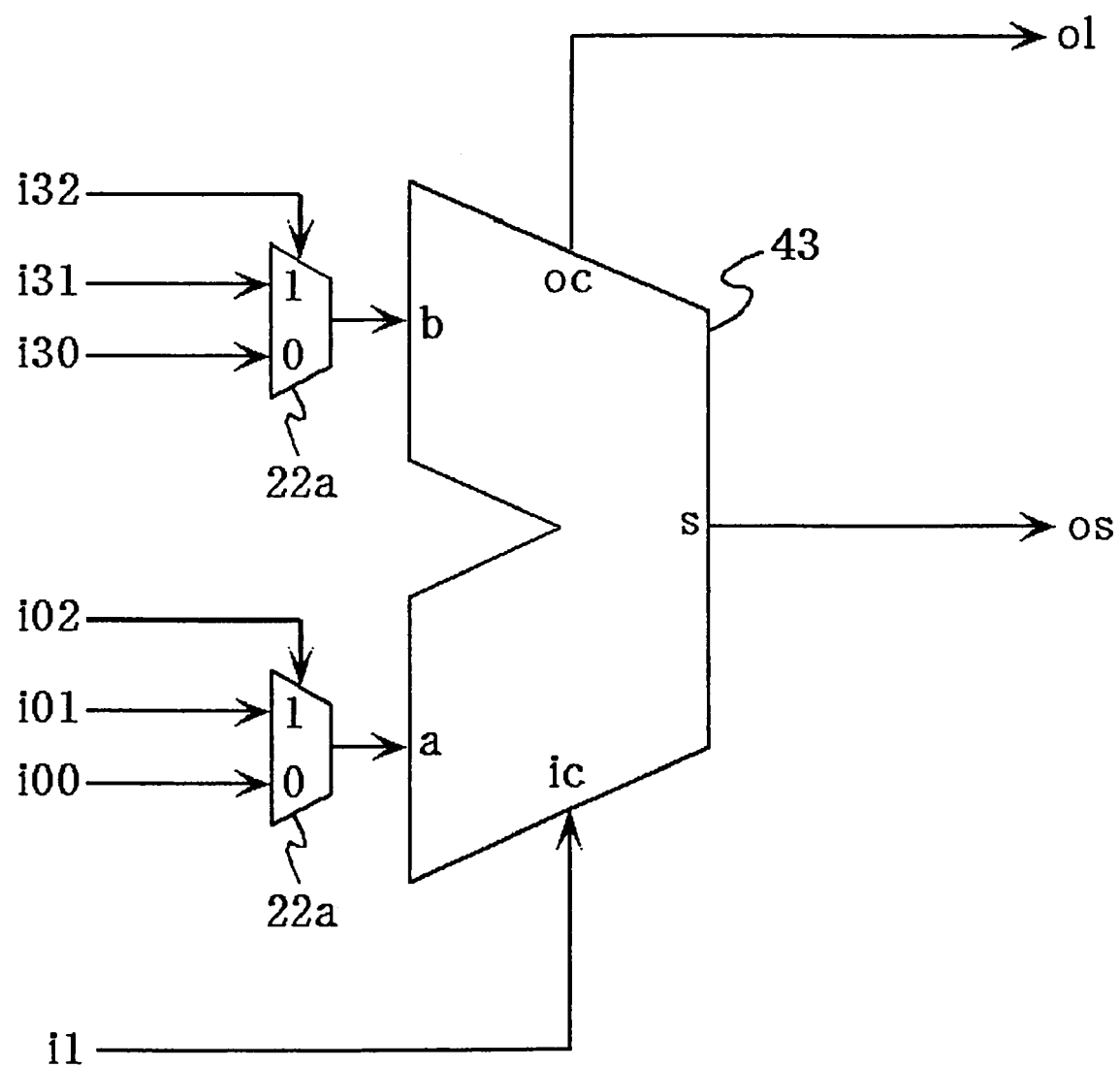
FIG. 90 shows an equivalent circuit of the function block of FIG. 89 in a logic mode.

In the logic mode, a logical value of 0 is stored in the first configuration memory 13*p* and the first configuration memory 13*h* of FIG. 89, and a logical value of 0 is fed to icc. Here, the function block 4 of FIG. 89 becomes a circuit equivalent to FIG. 90. As has been already described, since the full adder 43 and the preposition logic circuit MUX 22*a* function as various logic circuits, the circuit of FIG. 90 can be used as various logic circuits.

In the 4-2 adder mode, a logical value of 0 is stored in the first and the second configuration memory 13*h* of FIG. 89, a logical value of 1 is stored in the first and the second configuration memory 13*p*, and a logical value of 1 is fed to icc. Here, the function block 4 of FIG. 89 becomes a circuit equivalent to FIG. 74(2).

In the conditional carry mode, a logical value of 1 is stored in the first and the second configuration memory 13*h* of FIG. 89 and a logical value of 0 is stored in the first and the second configuration memory 13*p*.

Here, the half-function block 4_0 is supplied with argument inputs i0 and i3 by the output of the first and the second MUX 22*a* and functions as a 1-bit full adder having a preposition logic circuit using irc0 as a ripple carry input, orc0 as a ripple carry output, and the first addition output as an addition output.

Simultaneously with this, the half-function block 4_1 is supplied with argument inputs i0 and i3 by the output of the first and the second MUX 22*a* and functions as a 1-bit full adder having a preposition logic circuit using irc1 as a ripple carry input, orc1 as a ripple carry output, and the second addition output as an addition output.

Thus, the two full adders having common argument inputs and independent ripple carry routes, as has been already described above, can be used as a high-speed condition carry adder. For this, the programmable function cell 52 including the function block 4 of FIG. 89 is connected as shown in FIG. 70 so as to constitute a composite or combined function cell 71, which is further cascade-connected as shown in FIG. 71. With this configuration, it is possible to realize a multi-bit full adder having a higher speed condition carry than an ordinary ripple carry.

In the function blocks of the fourteenth to the twenty-second embodiments and their modified examples, an example has been given using an MUX as a preposition logic circuit. However, the preposition logic circuit of the function block of the present invention is not limited to this. For example, other circuits such as an LUT and an MUX-XOR can be used in which various programmable functions can be set. Moreover, for those skilled in the art, it is easy to change the number of preposition logic circuits and to modify the inputs to which the preposition logic circuit is added to other than those exemplified in this specification.

23. Programmable Function Cell

Figure 91:
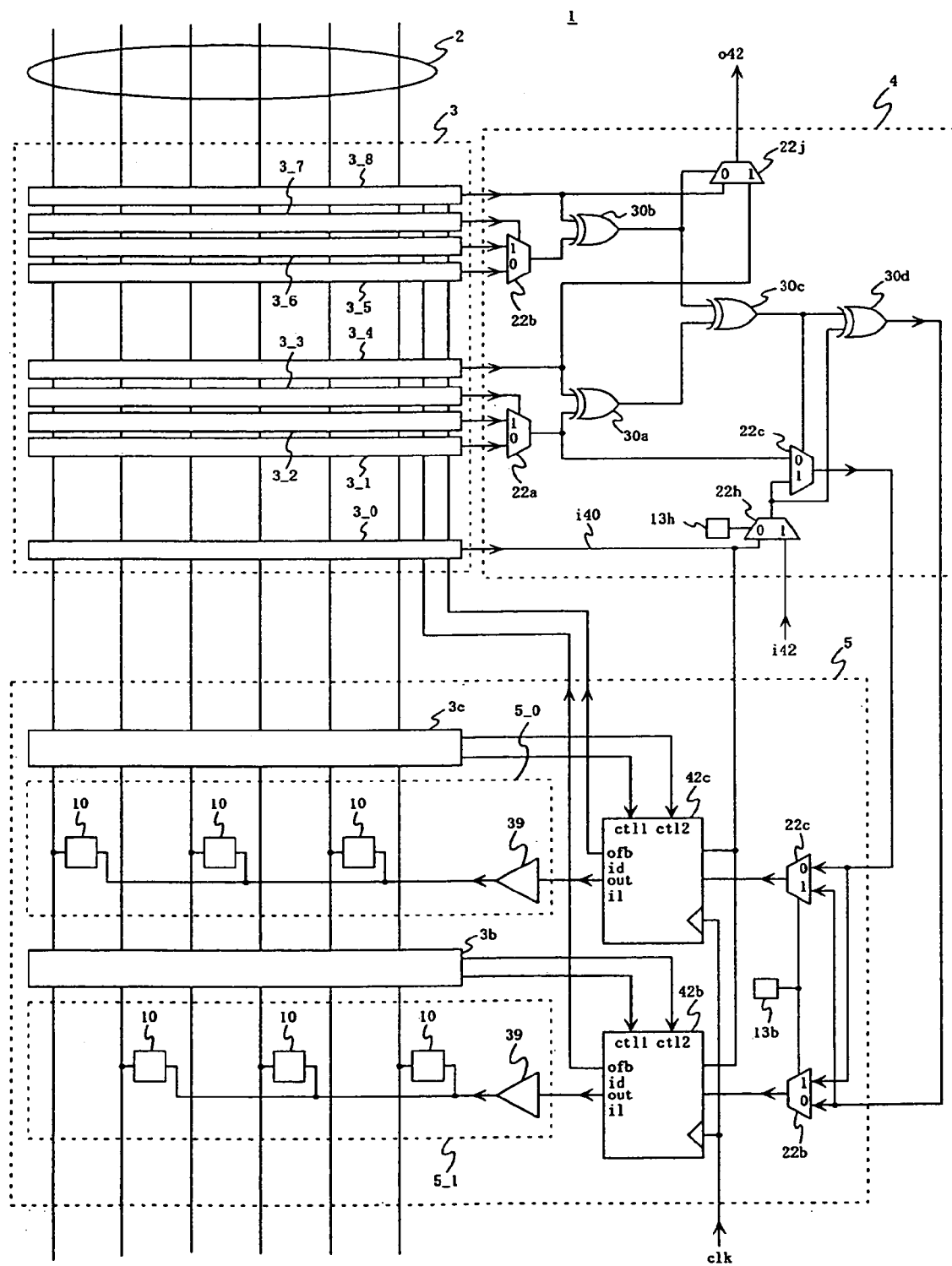
FIG. 91 is a block diagram showing another example of the programmable function cell using the function block according to the present invention.

FIG. 91 is a block diagram showing another example of the programmable function cell using the function block according to the present invention. FIG. 91 shows an example using the function block of FIG. 73 but it is also possible to use other function blocks of the present invention. Moreover, in the example, the interconnection wire group 2 consists of 6 wires but the number of wires is not limited to this.

In FIG. 91, the two outputs oc and os of the function block 4 firstly pass through the MUX 22c and 22b of the output block 5. These MUX'es are controlled by the configuration memory 13b and output the oc and os directly or after exchanging with each other in accordance with the value stored. This performs the same function as the MUX 22c and 22b of FIG. 12. In case of FIG. 91, this is attached to the input side of the register block.

The output block 5 has register blocks 42b and 42c that are identical to the aforementioned register block (FIG. 19), which has been slightly modified.

Figure 92:
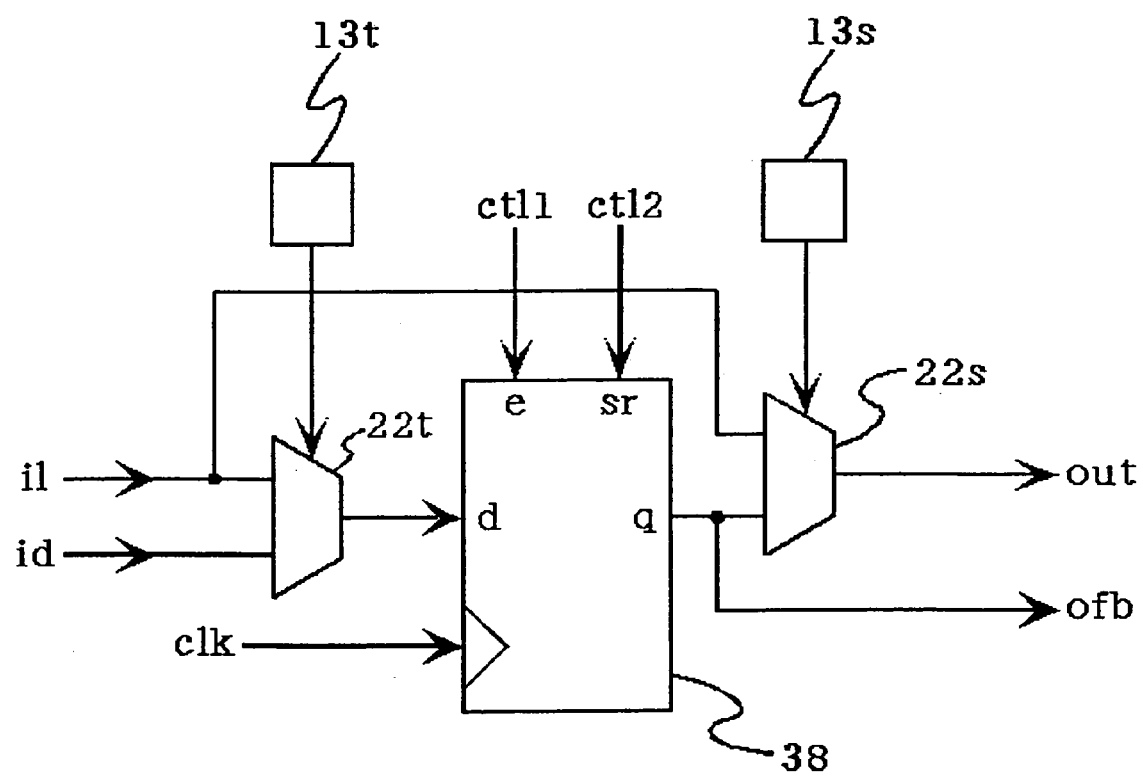
FIG. 92 is a circuit diagram showing a register block 42 that has been modified.

FIG. 92 is a circuit diagram showing the register block 42 modified. This register block 42 has two data inputs i1 and id, and also two data outputs out and ofb. The i1 and id are connected to a data input of the MUX 22t whose output is connected to a data input d of the D-FF 38.

The MUX 22t is controlled in accordance with a value stored in the configuration memory 13t and one of the i1 and id is selected to be input to the D-FF 38. The MUX 22s is supplied with a data output q and i1 of the D-FF 38 as data input and selects one of the data inputs in accordance with a value stored in the configuration memory 13s so as to be output as out. Moreover, the data output q of the D-FF 38 is output directly as ofb.

In this register block 42, the id is passed through the D-FF before being output from ofb and simultaneously with this, the i1 can bypass the D-FF to be output from the out. This feature is effective when constituting a pipelined multiplier as will be detailed later.

As shown in FIG. 91, the data inputs i1 of the register blocks 42c and 42b are connected with outputs of the MUX 22c and 22b respectively, and the data inputs id of the both register blocks are connected with i40 of the function block 4. In case of the function block using the logic function generator as shown in FIG. 6, nothing corresponds to i40 and a separate input selection unit is provided and its output is input to id. The output out of the register blocks 42c and 42b are input to the output selector units 5_0 and 5_1, respectively. On the other hand, the output ofb of the register blocks 42c and 42b is input to the input selection units 3_1 to 3_8 not connected to the i40.

Next, explanation will be given on the effect of the programmable function cell of FIG. 91. One function block of the present invention can realize a 4-2 adder and by using it, it is possible to constitute a compact multiplier, which is a significant feature of it. In general, a multiplier is composed by connecting computation blocks in multi-stages and accordingly, a signal transfer delay from the first input to the last output is fairly large. For this, a pipeline register is often inserted between some computation blocks so as to operate even with a high clock frequency.

Figure 93:
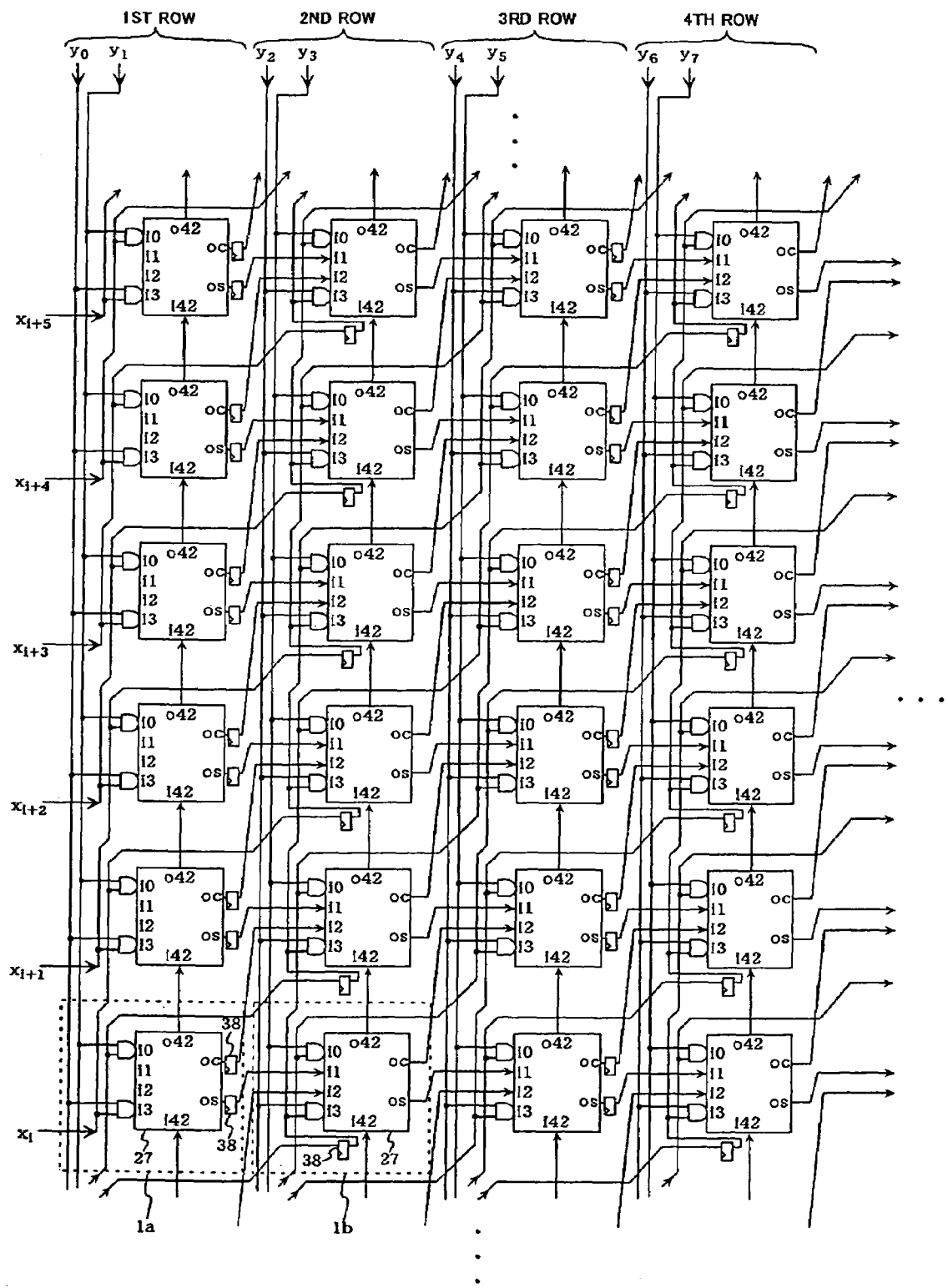
FIG. 93 is a circuit diagram showing a configuration example of a pipelined multiplier.

And now, as is seen from FIG. 34, in order to insert a pipeline register between the computation blocks (i.e., between rows in FIG. 34), in addition to the outputs os and oc, a register should also be inserted with respect to multiplicand data xk per one 4-2 adder. However, when only two register blocks are present per one programmable function cell as in FIG. 91 (or FIG. 12), the number of registers is insufficient. This problem can be solved by inserting a pipeline register between every other computation blocks. FIG. 93 shows the example.

Pipelined Multiplier

FIG. 93 is a circuit diagram showing a configuration example of a pipelined multiplier. In the figure, i in $x_i$, $x_{i+1}, \ldots, x_{i+5}$ is an integer.

A pipeline registers is inserted between an odd-numbered row (for example, the first row) and the following even-numbered row (for example, the second row) and no pipeline register is inserted between an even-numbered rows (for example, the second row) and the following odd-numbered row (for example, the third row). The 2AND4-2 adder 27 is implemented in each of the programmable function cells (for example, 1a and 1b). The outputs oc and os of 2AND4-2 adder 27 of the odd-numbered row (for example, the one implemented in the programmable function cell 1a) respectively pass through the register 38. Each bit $x_k$ (k is an integer) of the multiplicand data passes through the register 38 of the programmable function cell (for example 1b) of the even-numbered row before being supplied to the programmable function cell of a corresponding row. The outputs oc and os of the 2AND4-2 adder 27 implemented in a programmable function cell of the even-numbered row (for example, 1b) are transferred to the subsequent stage without passing through the register. Thus, the pipeline register is inserted between every other computation blocks.

Here, in the programmable function cell of the even-numbered row (for example, 1b) has two outputs oc and os not passing through the register and an output $x_k$ being output simply through the register without any logic processing on input. The former uses a route from i1 of the register block 42 (FIG. 92) to out bypassing the D-FF 38 and the latter uses a route from id through the D-FF to ofb. By using the register block 42 in this way, it is possible to realize the even-numbered rows of FIG. 93. More specifically, the flow of $x_k$ is as follows: in the programmable function cell 1 of FIG. 91, x passes from the input selection unit 3_0 through i40 and from id of the register block (42c or 4b) to ofb so as to be fed to the input selection unit (3_1 to 3_8).

As has been described above, by using the programmable function cell of FIG. 91, it is possible to constitute a pipelined multiplier. With a progress in the process technique and the like, currently, it is possible to make a reconfigurable device of a very high speed and accordingly, it is possible to obtain a sufficiently high speed operation by inserting a pipeline register only in every other stage (instead of inserting in every stage).

In computing and signal processing, multi-bit data is used in most cases. In general, a calculator processing such multi-bit data is composed of a computation block in which a 1-bit calculation unit is arranged in one row in the bit arrangement direction. In this specification also, examples of such computation blocks have been described: the multi-bit 4-2 adder circuit 45_k (k is an integer) constituting multi-bit multi-argument addition (FIG. 18), the multi-bit 4AND4-2 adder 26 (FIG. 30) constituting a certain multiplier, the multi-bit 2AND4-2 adder (rows of FIG. 30 except the fifth row) constituting other type of multiplier, rows constituting a barrel shifter (FIG. 44), rows constituting the pipelined multiplier (FIG. 93), and the like. Moreover, besides these examples, as exemplified below, a computation block having one row of calculation units, each having a certain logic gate attached to the input of the 1-bit full adder, is used very often.

Multi-bit Adder/Subtractor

Figure 94:
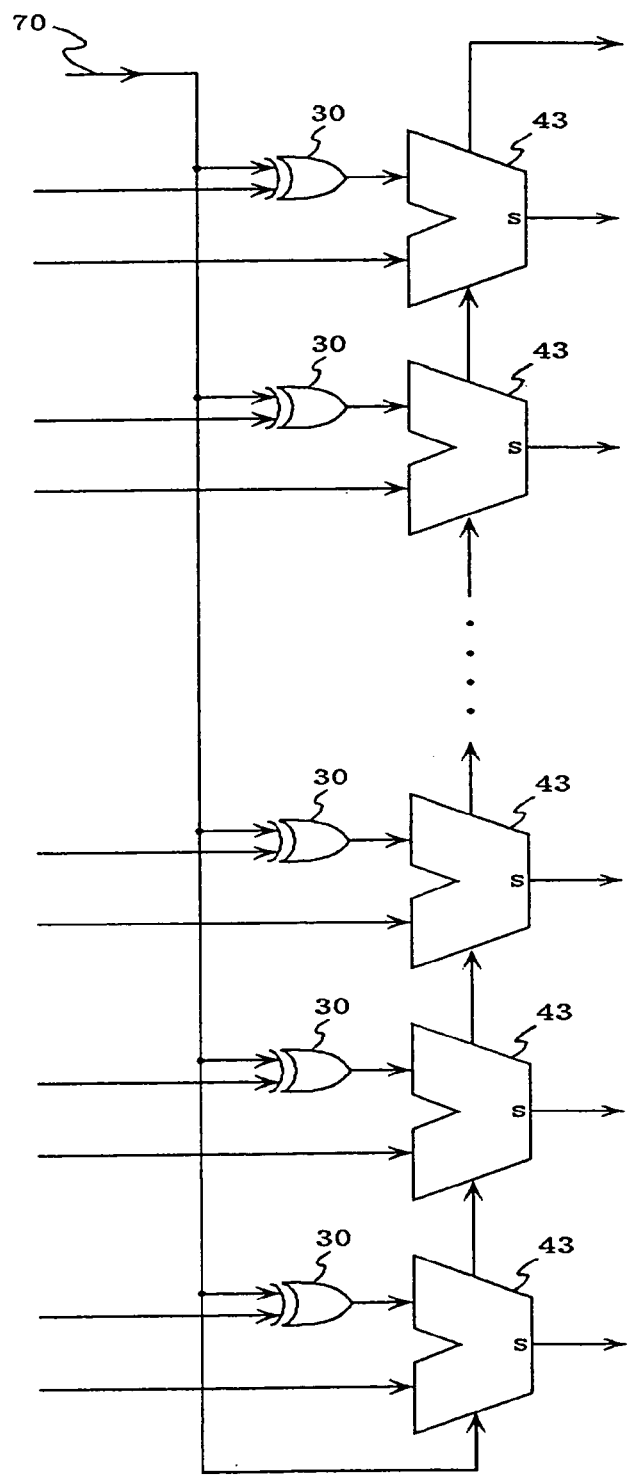
FIG. 94 is a circuit diagram showing a configuration example of a multi-bit adder/subtractor.

FIG. 94 is a circuit diagram showing a configuration example of a multi-bit adder/subtractor. This uses a 1-bit full adder 43 having one argument input b connected with the output of the XOR 30 as a calculation unit, which is connected in one row as shown in the figure. The circuit of FIG. 90 serves as a multi-bit adder when the common input 70 connected to one of the inputs of the XOR 30 of all the calculation units is a logical value of 0; and as a multi-bit subtractor when the common input 70 is a logical value of 1. This multi-bit adder/subtractor is one of the computation blocks that are used most often.

MUX-equipped Multi-bit Adder

Figure 95:
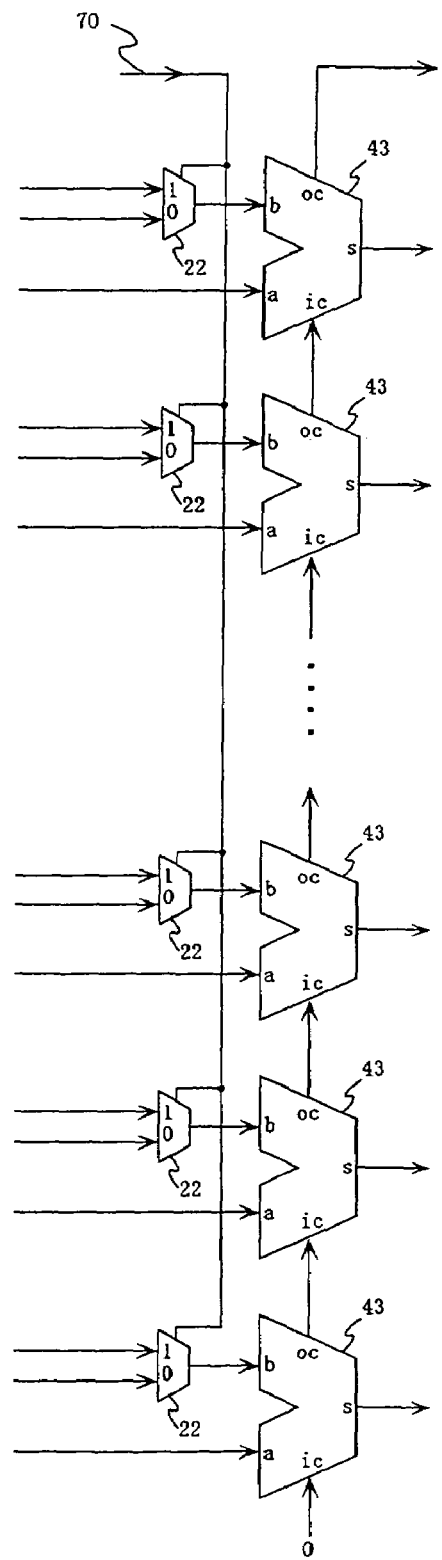
FIG. 95 is circuit diagram showing a configuration example of a multi-bit adder having an MUX.

FIG. 95 is a circuit diagram showing a configuration example of a MUX-equipped multi-bit adder. This uses the 1-bit full adder 43 having one argument input b connected with the output of the MUX 22 as a calculation unit, which is connected in one row as shown in the figure. The circuit of FIG. 95 is a computation block in which the argument input fed to the full adder is changed in accordance with the logical value of the common input 70 connected to the control input of the MUX 22 of all the calculation units. This is used for a conditioned calculation.

Overflow Processing

Figure 96:
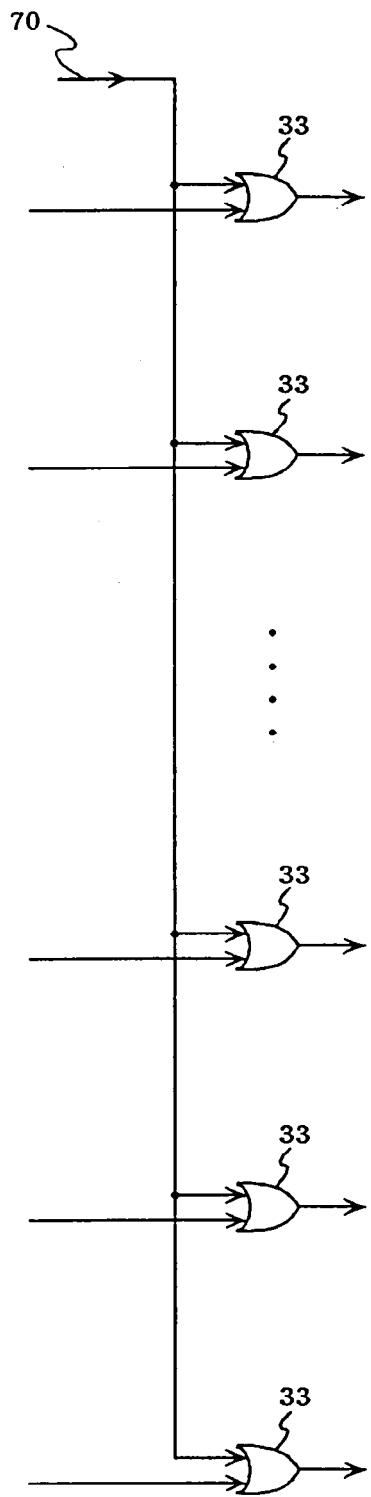
FIG. 96 is a circuit diagram showing a configuration example of an overflow processor composed of OR's arranged in one row.

FIG. 96 is a circuit diagram showing a configuration example of an overflow processor composed of OR's arranged in one row. The circuit of FIG. 96 is a computation block in which when the common input 70 connected to one of the inputs of all the OR 33 is a logical value of 0, the other input of the OR 33 is directly output, and when the common input 70 is a logical value of 1, a logical value of 1 is output. This is used for overflow processing.

As has been described above, in the multi-bit data processing, a computation block often used is such that certain calculation units are arranged in one row and further a common input to all the calculation units is provided. If such a computation block is implemented in the conventional FPGA, a great waste is caused. Because in the conventional FPGA, all the programmable function cells have their own configuration memories and can be configured separately but in the case of the aforementioned computation block, the calculation units have an identical function and need not be configured separately. Furthermore, the conventional programmable function cells have separate input selection units but in the case of the aforementioned common input, an input can be supplied from one input selection unit to all the calculation units in the computation block.

24. Programmable Function Cell Row

Next, explanation will be given on a programmable function cell row for effectively realizing a computation block for the aforementioned multi-bit data processing.

Figure 97:
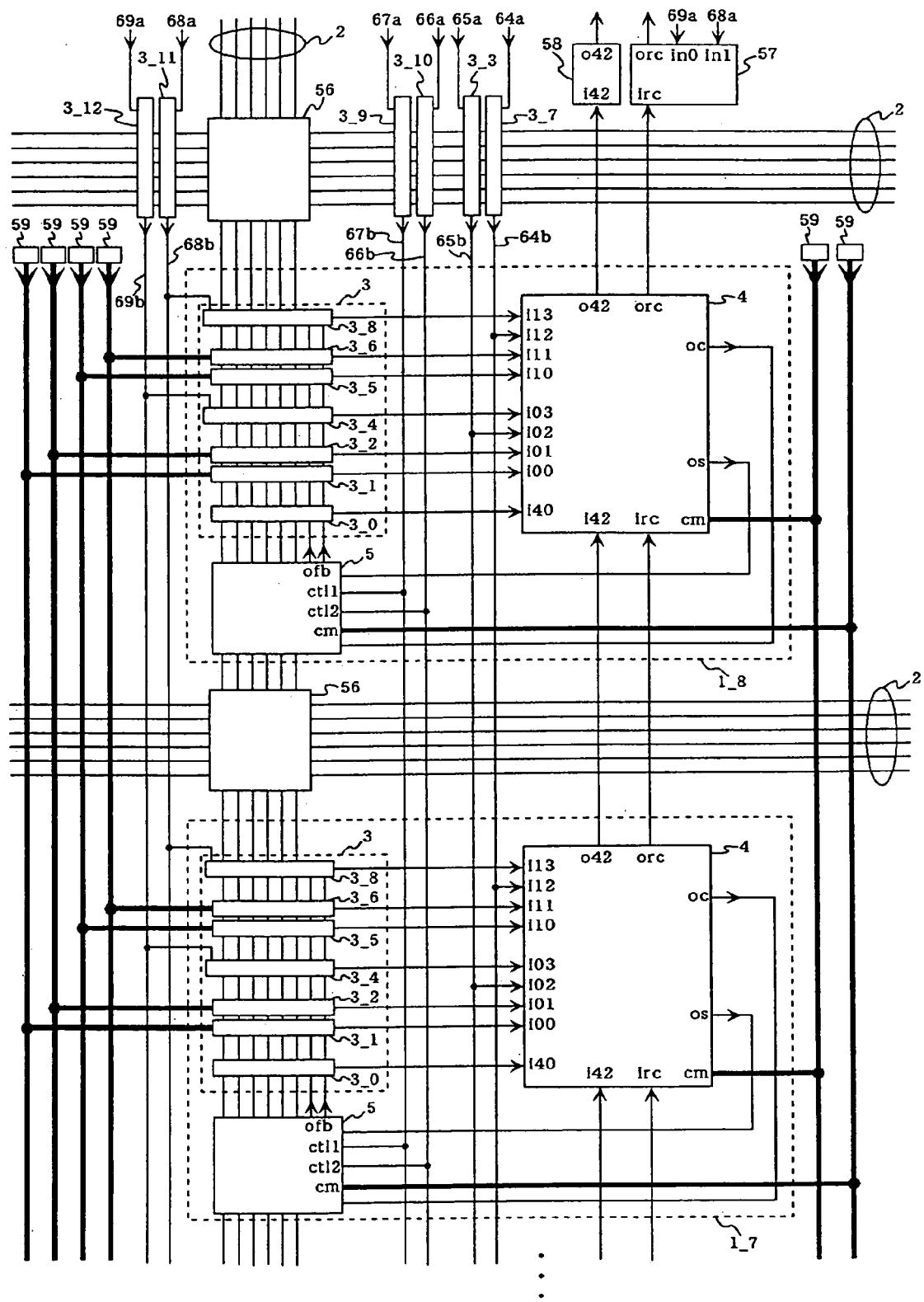
FIG. 97 is a block diagram showing a part of a programmable function cell array according to the present invention.

FIG. 97 is a block diagram showing a part of a programmable cell row according to the present invention. The programmable function cell row is composed of a plurality of programmable function cells arranged in one row. FIG. 97 shows, as an example, the most significant part (including programmable function cells 1_8 and 1_7 corresponding to significant two bits) of a programmable function cell row consisting of eight programmable function cells 1_1 to 1_8.

In general, as shown in FIG. 97, a reconfigurable device consists of an interconnection wire group 2 running vertically and horizontally and programmable function cells arranged in a two-dimensional array state. An intersection 56 of the interconnection wire group running vertically and the interconnection wire group running horizontally is in general connected by a programmable switch 10 as shown in FIG. 98.

Figure 98:
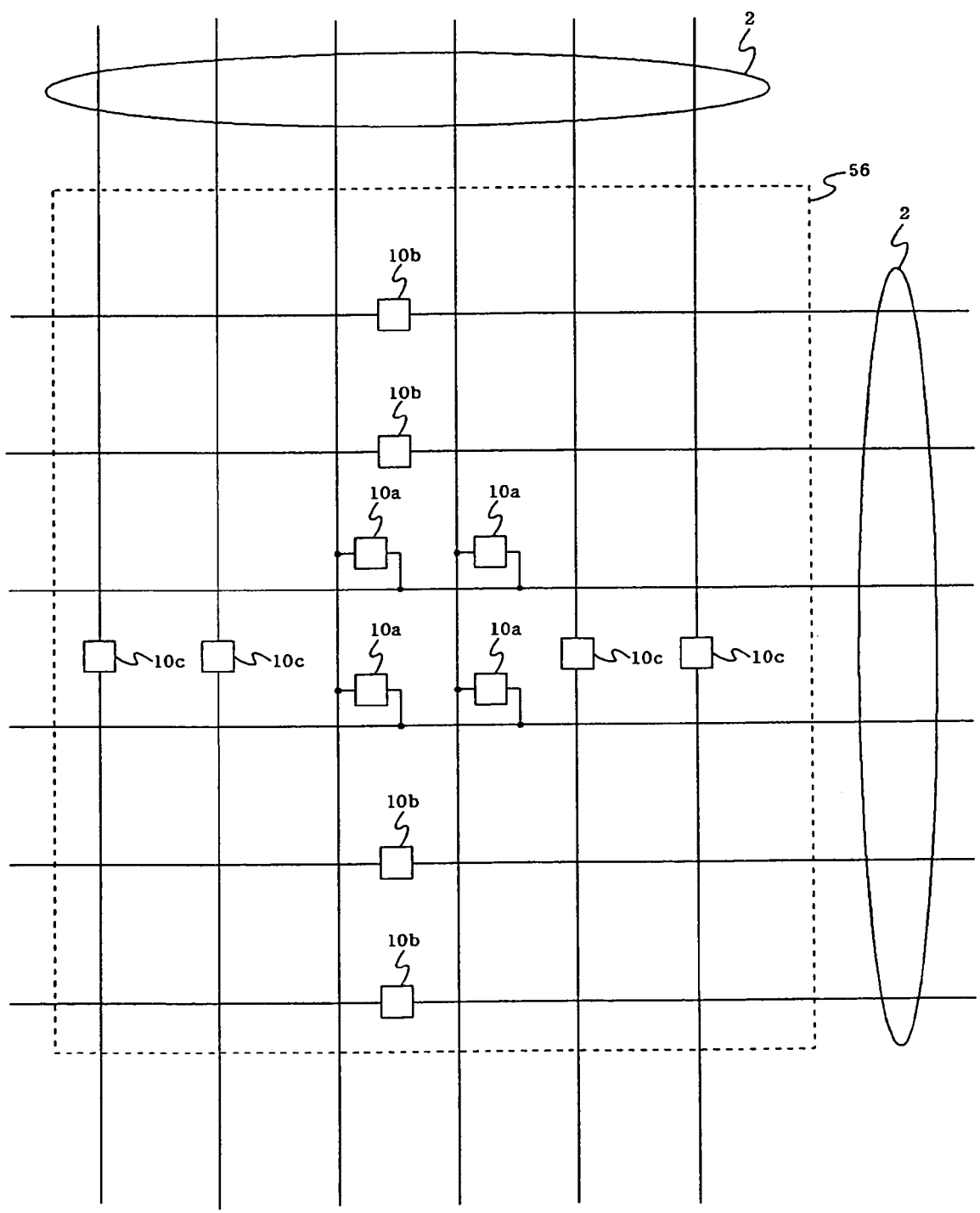
FIG. 98 is a circuit diagram showing an example of an intersection portion of an interconnection wire group running in vertical direction and an interconnection wire group running in a horizontal direction.

FIG. 98 is a circuit diagram showing an example of the intersection of the interconnection wire group running vertically and the interconnection wire group running horizontally. In the intersection 56, there are provided a programmable switch 10c for connecting wires running vertically, a programmable switch 10b for connecting wires running horizontally, and a programmable switch 10a for connecting a wire running horizontally and a wire running vertically. FIG. 98 shows only one example of connections by the programmable switch and the invention is not limited to this connection.

In FIG. 97, inputs i12 and i02 of all the function blocks 4 of the programmable function cells 1_1 to 1_8 arranged in one row are connected to common lines 64b and 65b, respectively. And the common lines 64b and 65b are connected to outputs of the input selection units 3_7 and 3_3, respectively.

The input selection unit 3_7 selects an output signal in accordance with configuration from the interconnection wire group 2, the common line 64a, and, if exists, a fixed logical value (not indispensable) in the input selection unit. The input selection unit 3_3 selects an output signal in accordance with configuration from the interconnection wire group 2, the common line 65a, and, if exists, a fixed logical value (not indispensable) in the input selection unit if any. Thus, by supplying some inputs of the function block 4 from the common input selection units 3_7 and 3_3, it is possible to reduce the number of input selection units occupying a large area.

In case of FIG. 97, the number of selection units in each programmable function cell is smaller by 2 as compared to the case when no common input is used (FIG. 91). Any inputs of the function block 4 can be made common. However, when an MUX is included as the preposition logic circuit as in the examples of FIG. 86 and FIG. 50, it is most preferable to make its control input common. This is because a common control input is used often as shown in FIG. 95 and FIG. 44.

Moreover, as is seen from FIG. 28, when using the MUX as a 2-input logic circuit such as AND and OR, the control input becomes an input common to all the 2-input logic circuit. Accordingly, when the MUX control input is made common, it is possible to form a circuit in which one of the OR inputs is made common as in FIG. 96 and a circuit in which one of the AND inputs is made common as in FIG. 34 and FIG. 30. Thus, it is the most useful example to make the control input of the MUX of the preposition logic circuit common among the inputs in the function block 4.

FIG. 97 shows an example in which the function block 4 of FIG. 86 is used and its i02 and i12 are made common but the function block 4 is not limited to this and may be another one (the number of input selection units used varies depending on the function block used).

Moreover, although not depicted in FIG. 97, like i51 and i51 of FIG. 77 and FIG. 79, the control input of the MUX other than the preposition logic circuit (the one supplied with not a fixed logical value by the configuration memory but a dynamic signal) should also be supplied by a common input in the same way as has been described above.

In FIG. 97, reference numerals 64a and 65a denote common lines of the programmable function cell row arranged at a node upper by one. For example, when the common line 64a is selected by the input selection unit 3_7, the same signal as to the common line 64a is transmitted to the common line 64b. Accordingly, it is possible to control two programmable function cell rows arranged vertically with the common input, so as to use them as one longer programmable function cell row (having twice the bit width).

In FIG. 97, in all the output blocks 5 of the programmable function cells 1_1 to 1_8 arranged in one row, the inputs ctl1 and ctl2 are connected to the common lines 67b and 66b, respectively, and the common lines 67b and 66b are connected to outputs of the input selection units 3_9 and 3_10, respectively.

The input selection unit 3_9 selects an output signal in accordance with the configuration from the interconnection wire group 2, the common line 67a, and, if exists, a fixed logical value (not indispensable) in the input selection unit. The input selection unit 3_10 selects an output signal in accordance with the configuration from the interconnection wire group 2, the common line 66a, and, if exists, a fixed logical value (not indispensable) in the input selection unit. Here, the inputs ctl1 and ctl2 of the output block 5 are the control inputs ctl1 and ctl2 of the register block in the output block 5 (FIG. 91).

FIG. 97 shows that no input block is provided in the output block 5 and ctl1 and ctl2 of the register block are supplied with inputs from outside the output block. IN FIG. 91, two register blocks 42c and 42b are provided in the output block 5 and various methods can be obtained: only one of the control inputs is supplied from outside (the remaining is controlled by the inner input block); both are supplied with the same control input; or total of four control inputs are all supplied from outside independently. FIG. 97 shows an example that two control inputs are supplied from outside. Here, the number of control inputs of the register block (i.e., control input of the D-FF) is not necessarily limited to two.

As in FIG. 97, by supplying a control signal of the register block from the common input selection units 3_9 and 3_10, it is possible to reduce the number of input blocks in the register block occupying a large area. In FIG. 97, reference numerals 67a and 66a denote common lines of the programmable function cell row arranged at one-node upper position. For example, when the common line 67a is selected by the input selection unit 3_9, the same signal as to the 67a is transmitted to the common line 67b. Accordingly, it is possible to control the programmable function cell rows arranged vertically with the common input so as to use them as one longer programmable function cell row (twice the bit width).

In FIG. 97, the input selection units 3_4 and 3_8 of the programmable function cells 1_1 to 1_8 arranged in one row have the common lines 69b and 68b, respectively, as one of inputs, and the common lines 69b and 68b are connected to output of the input selection units 3_12 and 3_11, respectively. The input selection unit 3_12 selects an output signal in accordance with the configuration from the interconnection wire group 2, the common line 69a, and, if exists, a fixed logical value (not indispensable) in the input selection unit. The input selection unit 3_11 selects an output signal in accordance with the configuration from the interconnection wire group 2, the common line 68a, and, if exists, a fixed logical value (not indispensable) in the input selection unit.

In FIG. 97, the input selection unit 3_8 having the common input is connected to the input i13 of the function block 4. When the function block 4 (FIG. 86) is used in the full adder mode, as can be seen from its equivalent circuit (FIG. 74(1)), the input i13 corresponds to one of the inputs of the XOR attached to the input of the full adder. Accordingly, when the programmable function cell row is used as an adder/subtractor as in FIG. 94, the common line 68b of FIG. 97 serves as the common input 70 of FIG. 94.

On the other hand, as in FIG. 93, when the 2AND4-2 adder 27 is implemented in each of the programmable function cells (for example, 1a and 1b), the input i13 of the function block 4 (FIG. 86) corresponds to input i2 of the 2AND4-2 adder 27 and is not connected to the common input. In this case, an input is selected from the interconnection wire group 2 by the input selection unit 3_8.

Moreover, when using the function block 4 of FIG. 77, it is possible to exchange the roles of the inputs i13 and i03 in accordance with a logical value fed to i50. In this case, by providing the input selection method of i31 for the input i30, these inputs have a preferably symmetry and an application circuit can easily be implemented. The aforementioned i12 and i02 are examples of inputs connected only to the common input while i113 and i03 are input examples using both of the common input and the interconnection wire group.

In FIG. 97, 69a and 68a are common lines of the programmable function cell row arranged at a one-node upper position. For example, when the common line 68a is selected by the input selection unit 3_11, the same signal as to the common line 68a is transmitted to the common line 68b. Accordingly, it is possible to supply the same common input to the input selection unit 3_8 of the programmable function cell rows arranged vertically, so as to use them as one longer programmable function cell row (having twice the bit width).

In FIG. 97, the input selection units 3_1, 3_2, 3_5 and 3_6 of the programmable function cells 1_1 to 1_8 arranged in one row are respectively connected to the common configuration memory group 59.

Figure 99:
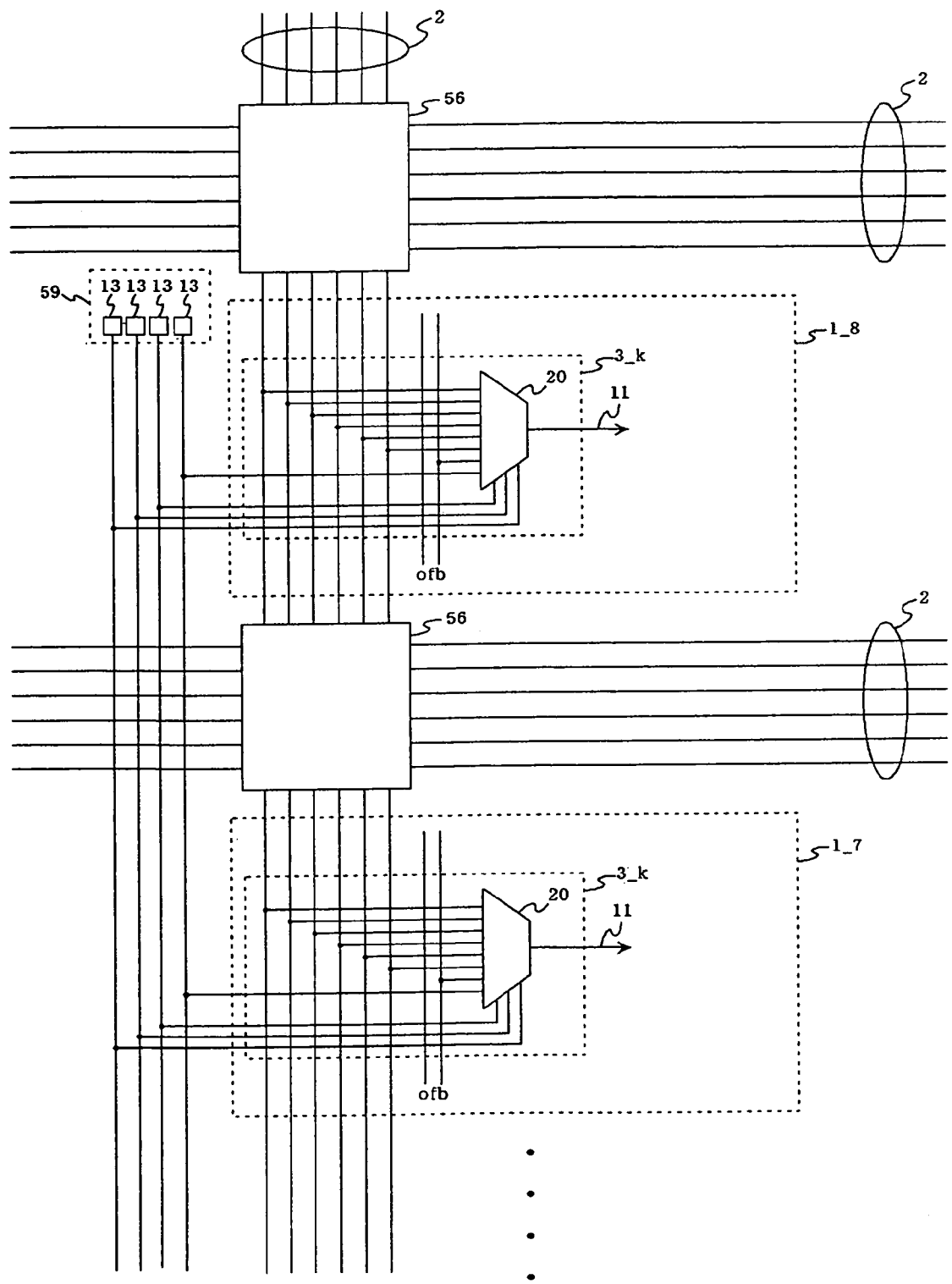
FIG. 99 is a circuit diagram for explaining a common configuration memory group.

FIG. 99 is a circuit diagram for explaining the common configuration memory group. FIG. 99 shows only those portions that are necessary for explaining the common configuration memory group 59. For example, in the programmable function cells 1_7 and 1_8, only the input selection unit 3_k related to one common configuration memory group 59 is depicted. Here, as the input selection unit 3_k, the example of FIG. 26 is used but the input selection unit is not limited to this.

In FIG. 99, each of a control input of the input selection unit 3_k having a certain fixed value (21 of FIG. 26) and a fixed logical value (supplied by the memory 13a of FIG. 26) is made common over all the programmable function cells in the programmable function cell row and supplied from the respective memories 13 of the common configuration memory group 59.

As has been described above, in the multi-bit data processing, most of the computation blocks are made from a calculation unit of an identical function. Accordingly, as shown in FIG. 99, there is no problem if a fixed logical value determining the function of the function block is made common in the programmable function cell row. This eliminates an unnecessary memory. Moreover, identical calculation units are arranged within a computation block and a connection with the other computation block is also regular, i.e., wires of identical connection are arranged (for example, FIG. 93). Accordingly, as is shown in FIG. 99, there is no problem if the control unit of the input selection unit 3_k is made common in the programmable function cell row. This can eliminate an unnecessary configuration memory.

Moreover, in general, a configuration memory is present in the function block 4 like the configuration memory in the logic function generator 40 of FIGS. 6 and 13d and 13h of FIG. 77. This is also preferably made common to obtain a high efficiency like the configuration input cm of the function block 4 of FIG. 97 in the multi-bit data processing using all the function blocks in the programmable function cell row as having an identical function.

The same can be said for the output block 5. Like 13*t* and 13*s* of FIG. 92, in general, several configuration memories are also present in the output block 5. These are also preferably made common to obtain a high efficiency like the configuration input cm of the output block 5 of FIG. 97 for the multi-bit data processing.

There is no need of making common all the configuration memories in the programmable function cell row. For example, like FIG. 97, (most of) the configuration memories of the input selection unit are made common but a separate configuration memory is provided in the output selector unit in the output block 5, thereby allowing a slight variety of the programmable function cell, which is useful when implementing various circuits.

A ripple carry terminal block 57 of FIG. 97 is to feed a ripple carry input of the least significant bit of the programmable function cell row. An input irc of the ripple carry terminal block 57 is connected with a ripple carry output from the lower-node programmable function cell row, inputs in0 and in1 is respectively connected with common lines 69*a* and 68*a* of the upper-node programmable function cell row, and an output orc is connected to a ripple carry input of the upper-node programmable function cell row.

Figure 100:
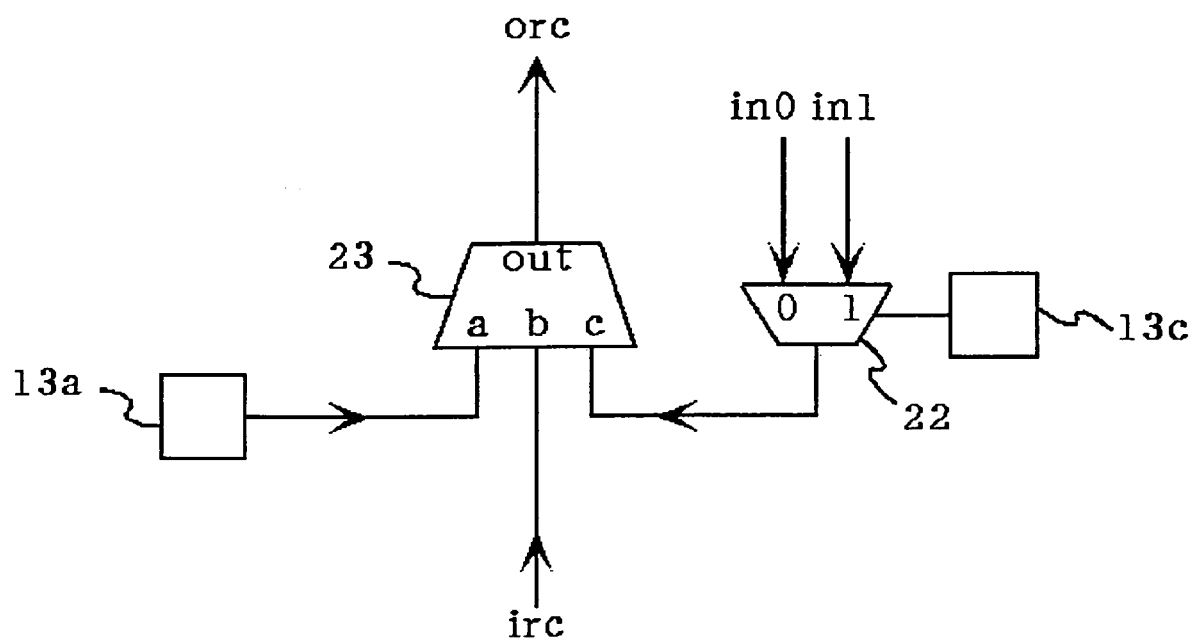
FIG. 100 is a circuit diagram showing a configuration example of a ripple carry terminal block 57.

FIG. 100 is a circuit diagram showing a configuration example of the ripple carry terminal block 57. In accordance with configuration of the memory-equipped 3-input MUX 23, a fixed logical value memory 13*a*, a ripple carry signal that has risen from a lower node, or an output of the MUX 22 is selected and output to orc.

When the upper-node programmable function cell row is used as a full adder, a logical value of 1 is supplied from the fixed logical value memory 13*a* to orc. When the upper-node programmable function cell row is used as a subtractor, a logical value of 0 is supplied from the fixed logical value memory 13*a* to orc. When the lower-node and the upper-node programmable function cell rows are connected so as to be used as one computation block, irc of the ripple carry terminal block 57 is output to orc. When the upper-node programmable function cell row is used as an adder/subtractor like FIG. 94, in0 or in1 of the ripple carry terminal block 57 is selected by the MUX 22 and is output to orc. This is because, as has been described above, the common line 68 or 69 of FIG. 97 is equivalent to the common line 70 of FIG. 94.

A 4-2 carry terminal block 58 of FIG. 97 is to feed a 4-2 carry input of the least significant bit of the programmable function cell row. An input i42 of the 4-2 carry terminal block 58 is connected with a 4-2 carry output from the lower-node programmable function cell row, and an output o42 is connected to a 4-2 carry input of the upper-node programmable function cell row.

Figure 101:
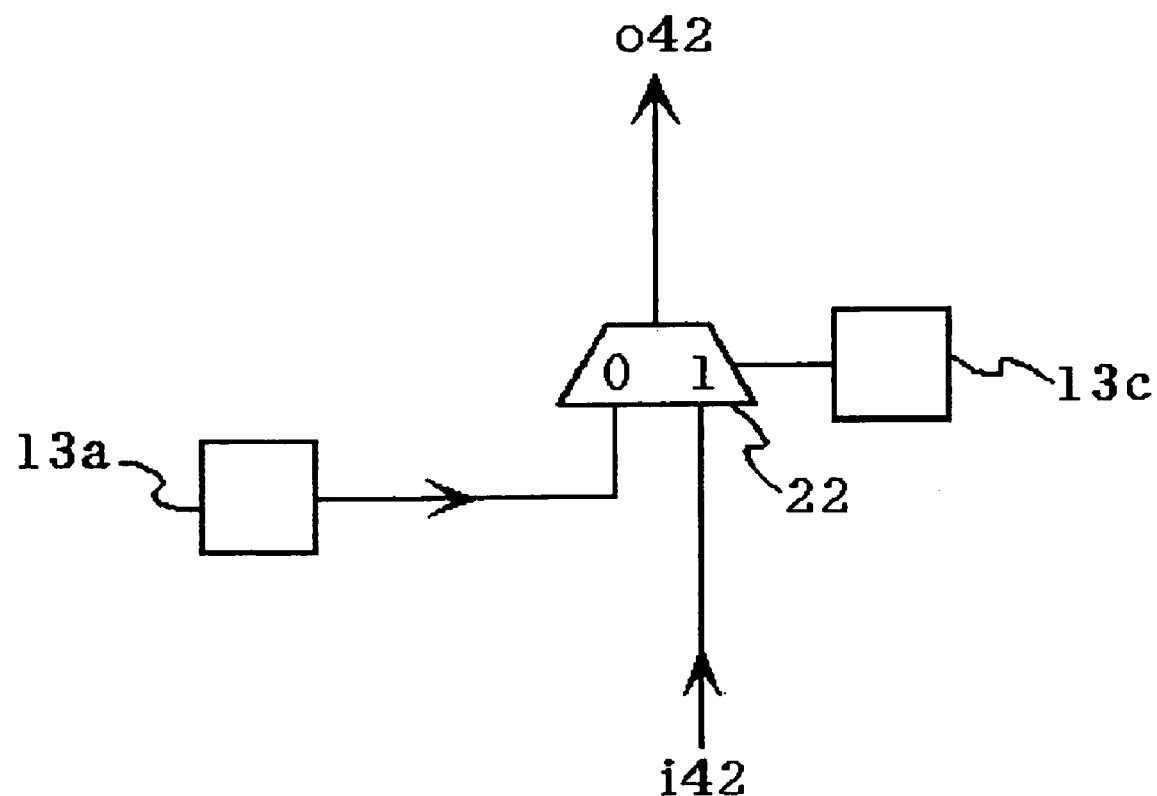
FIG. 101 is a circuit diagram showing a configuration example of a 4-2 carry block 58.

FIG. 101 is a circuit diagram showing a configuration example of the 4-2 carry block 58. In accordance with a content of the configuration memory 13*c* controlling the MUX 22, a fixed logical value memory 13*a* or a 4-2 carry signal that has risen from a lower node is selected and is output to o42.

When the upper-node programmable function cell row is used as a 4-2 adder for adding all the four argument inputs, a logical value of 0 is supplied from the fixed logical value memory 13*a* to o42. When the upper-node programmable function cell row is used as a subtractor for subtracting one argument input, a logical value of 1 is supplied from the fixed logical value memory 13*a* to o42. When the lower-node and the upper-node programmable function cell rows are connected so as to be used as one computation block, i42 of the 4-2 carry terminal block 58 is output to o42.

As has been described above, by using the programmable function cell row according to the embodiment of the present invention, it is possible to effectively implement a computation block used for multi-bit data processing. Furthermore, a plurality of programmable function cell rows can be connected so as to create a programmable function cell row of more bits.

Figure 102:
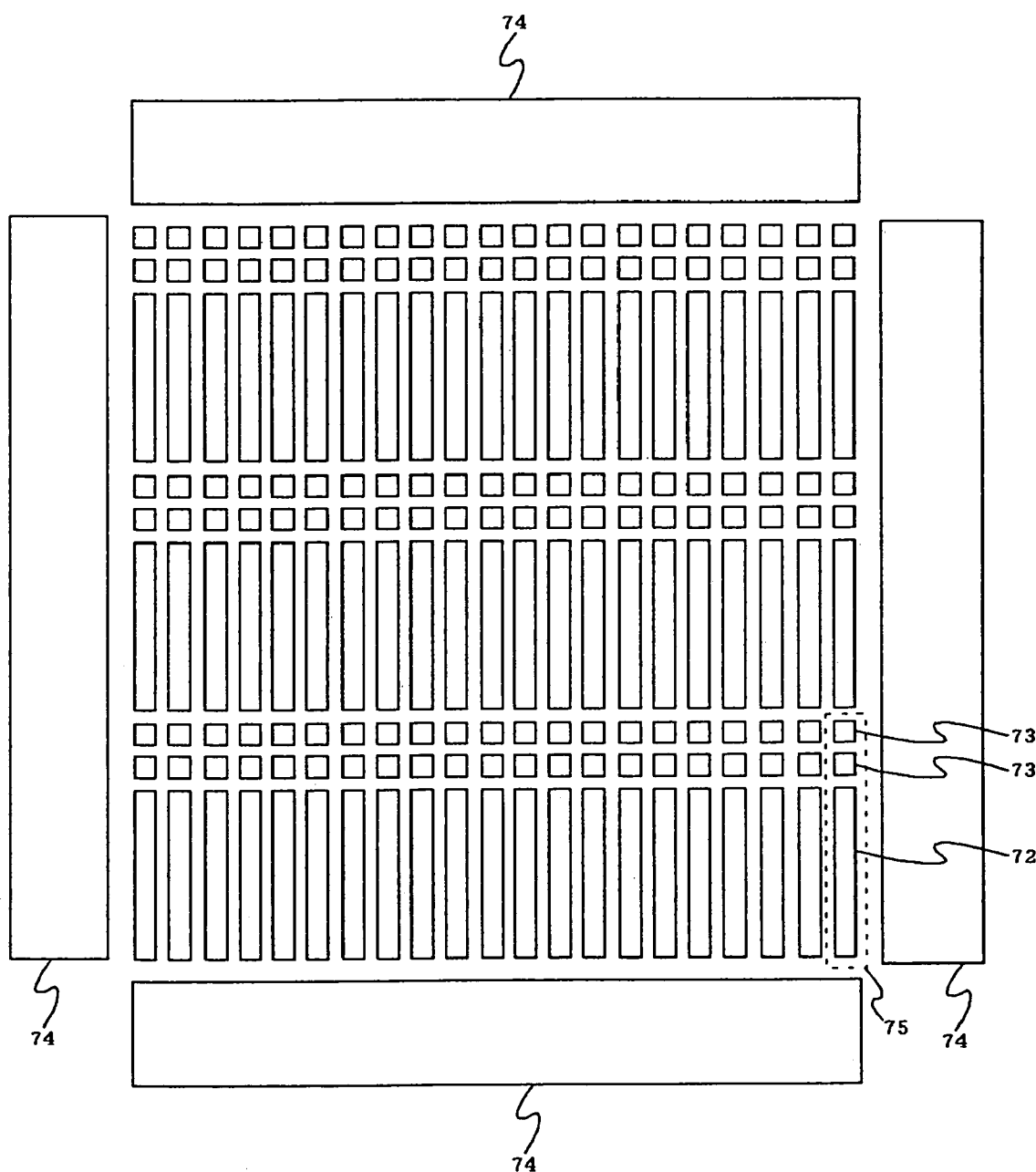
FIG. 102 is a layout diagram of an example of a reconfigurable device in which the programmable function cells are arranged.

FIG. 102 is a layout showing an example of reconfigurable device in which the programmable function cells are arranged. This includes an arithmetic logic unit (ALU) 75 composed of an n-bit programmable function cell row 72 and m-bit programmable function cell rows 73 and arranged in a two-dimensional array; and a peripheral block 74 arranged around the array. Here, in general m<<n and the usability is especially high when m=1. The n may be 4, 8, 16, 32 and the like for a high usability.

In the ALU 75, one or a small number of (two in the example of FIG. 102) m-bit programmable function cell rows 73 is arranged at the uppermost-node position. In general, even in the case of a regular computation block for multi-bit data processing, the end portion often breaks the regularity. The m-bit programmable function cell row 73 is useful for implementing such a portion. Moreover, this is also used when creating various flags and performing various processing. The two-dimensional array of ALU is a portion suitable for implementing a multi-bit data path and occupies the most area of the reconfigurable device.

On the other hand, in the peripheral block 74, a programmable function cell which can be configured independently by one bit is arranged. This is where a random logic is mainly implemented and suitable for creating a data path control system. Such a reconfigurable device can effectively implement a large-scale circuit including multi-bit data processing as compared to the conventional FPGA in which programmable function cells independently configurable are arranged over the entire surface.

The present invention has a first advantage to provide a function block capable of constituting a compact high-speed multiplier. This is because it is possible to realize an AND-equipped 4-2 adder as a multiplier constituting unit by one function block. Thus, it is possible to constitute a multiplier by using half the number of programmable function cells used conventionally.

The present invention has a second advantage to provide a function block capable of constituting a compact multi-input MUX. This is because by utilizing the MUX used as a preposition logic circuit, it is possible to create a 4-input or more-input MUX by one function block. Thus, it is possible to constitute a 4-input MUX by using one-half the number of programmable function cells used conventionally.

What is claimed is:

1. A function block comprising:
   first to fourth multiplexers;
   a first exclusive OR circuit for performing an exclusive OR function on output signals of the first and second multiplexers;
   a second exclusive OR circuit for performing an exclusive OR function on output signals of the third and fourth multiplexers;
   a third exclusive OR circuit for performing an exclusive OR function on output signals of the first and second exclusive OR circuits;
   a 4-2 carry block for generating a 4-2 carry output signal from at least, an output signal of one of the first and second multiplexers and an output signal of one of the third and fourth multiplexers;

a fifth multiplexer for selecting one of output signals of the first and second multiplexers depending on a first control signal;

a sixth multiplexer for selecting one of output signals of the third and fourth multiplexers depending on a second control signal;

a seventh multiplexer for selecting a signal from a first multiple-signal group including a logical input signal and a 4-2 carry input signal;

an eighth multiplexer for selecting a signal from a second multiple-signal group including output signals of the sixth and seventh multiplexers;

a ninth multiplexer for selecting a signal from a third multiple-signal group including a third control signal and an output signal of the third exclusive OR circuit;

a tenth multiplexer which is controlled by an output signal of the ninth multiplexer and selects a signal from a fourth multiple-signal group including output signals of the fifth and eighth multiplexers to output it as a carry output signal; and a fourth exclusive OR circuit for performing an exclusive OR function on output signals of the third exclusive OR circuit and the seventh multiplexer to produce an addition output.

2. The function block according to claim 1, wherein the first control signal and the second control signal are one and the same.

3. The function block according to claim 1, wherein the 4-2 carry block comprises:

a 4-2 carry multiplexer which is controlled by an output signal of the second exclusive OR circuit and selects either one of the output signals of the first and second multiplexers or one of the output signals of the third and fourth multiplexers to produce the 4-2 carry output signal.

4. A function block comprising:

first to fourth multiplexers;

a first exclusive OR circuit for performing an exclusive OR function on output signals of the first and second multiplexers;

a second exclusive OR circuit for performing an exclusive OR function on output signals of the third and fourth multiplexers;

a third exclusive OR circuit for performing an exclusive OR function on output signals of the first and second exclusive OR circuits;

a 4-2 carry block for generating a 4-2 carry output signal from at least, an output signal of one of the first and second multiplexers and an output signal of one of the third and fourth multiplexers;

a fifth multiplexer for selecting one of output signals of the first and second multiplexers depending on a first control signal;

a sixth multiplexer for selecting one of output signals of the third and fourth multiplexers depending on a second control signal;

a seventh multiplexer for selecting a signal from a first multiple-signal group including at least one logical input signal and a 4-2 carry input signal;

an eight multiplexer for selecting a signal from a second multiple-signal group including the logical input signal and the 4-2 carry input signal;

a ninth multiplexer for selecting a signal from a third multiple-signal group including output signals of the fifth and sixth multiplexers depending on a third control signal;

a selector for selecting a signal from a fourth multiple-signal group including a fourth control signal and an output of the third exclusive OR circuit;

a tenth multiplexer which is controlled by an output signal of the selector and selects a signal from a fifth multiple-signal group including output signals of the eighth and ninth multiplexers to output it as a carry output signal; and a fourth exclusive OR circuit for performing an exclusive OR function on output signals of the third exclusive OR circuit and the seventh multiplexer to produce an addition output.

5. The function block according to claim 4, wherein the tenth multiplexer selects the output signal of the ninth multiplexer when the selector selects the fourth control signal.

6. The function block according to claim 4, wherein the first control signal and the second control signal are one and the same.

7. The function block according to claim 4, wherein the 4-2 carry block comprises:

a 4-2 carry multiplexer which is controlled by an output signal of the second exclusive OR circuit and selects either one of the output signals of the first and second multiplexers or one of the output signals of the third and fourth multiplexers to produce the 4-2 carry output signal.

8. The function block according to claim 4, wherein the eighth multiplexer includes the seventh multiplexer, and the second multiple-signal group includes the first multiple-signal group, wherein the eighth multiplexer comprises a multiplexer for selecting a signal from a multiple-signal group including an output signal of the seventh multiplexer.

9. The function on block according to claim 4, wherein the seventh multiplexer and the eighth multiplexer are one and same circuit, wherein the first multiple-signal group is identical to the second multiple-signal group.

10. The function block according to claim 4, wherein the first multiple-signal group includes a ripple carry input signal.

11. The function block according to claim 4, wherein the first multiple-signal group and the second multiple-signal group include a ripple carry input signal.

12. The function block according to claim 10, further comprising:

a ripple carry block for generating a ripple carry output signal from the two input signals of the third exclusive OR circuit and the ripple carry input signal.

13. The function block according to claim 10, further comprising:

a ripple carry multiplexer for selecting a signal from the ripple carry input signal and one of input signals of the third exclusive OR circuit depending on an output signal of the third exclusive OR circuit to output it as a ripple carry output signal.

14. The function block according to claim 11, further comprising:

a ripple carry block for generating a ripple carry output signal from the ripple carry input signal, two input signals and an output signal of the third exclusive OR circuit.

15. A function cell allowing programmable connection to an interconnection wire group including a plurality of interconnection wires, comprising:

a programmable input selector for selecting a plurality of input signals from the interconnection wire group;

a function block for generating a plurality of output signals including at least an addition output signal and a carry output signal from the plurality of input signals; and a programmable output selector for selecting a plurality of interconnection wires from the interconnection wire group to output the plurality of output signals to respective ones of the selected interconnection wires, wherein the function block comprises:

a first exclusive OR circuit for performing an exclusive OR function on a first input signal and a second input signal;

a second exclusive OR circuit for performing an exclusive OR function on a third input signal and a fourth input signal;

a 4-2 carry block for generating a 4-2 carry output signal from at least, one of the first and second input signals and one of the third and fourth input signals;

a third exclusive OR circuit for performing an exclusive OR function on output signals of the first exclusive OR circuit and the second exclusive OR circuit;

a first signal generator for generating a first signal from at least an output signal of the third exclusive OR circuit;

a second signal generator for generating a second signal from at least one of the first and second input signals;

a third signal generator for generating a third signal from a first multiple-signal group including a 4-2 carry input signal and at least one logical input signal;

a fourth signal generator for generating a fourth signal from a second multiple-signal group including the 4-2 carry input signal and at least one logical input signal;

a selector for selecting one of the second and third signals to produce the carry output signal depending on the first signal; and a fourth exclusive OR circuit for performing an exclusive OR function on the fourth signal and the output signal of the third exclusive OR circuit to produce the addition output signal.

16. The function cell according to claim 15, wherein the programmable output selector comprises:

a programmable signal switch for routing at least the addition output signal and the carry output signal from input terminals to output terminals according to a state changeable between a straight connection state and a cross connection state;

a first output selection block for selectively outputting a first output signal of the programmable signal switch to a first wire group of the interconnection wire group; and a second output selection block for selectively outputting a second output signal of the programmable signal switch to a second wire group of the interconnection wire group, wherein the second wire group is different from the first wire group.

17. The function cell according to claim 15, wherein the programmable output selector comprises:

a first programmable register block changeable between a direct transfer state and a temporal latch state of the addition output signal;

a second programmable register block changeable between a direct transfer state and a temporal latch state of the carry output signal; and a signal transfer section connecting each of the first and second programmable register blocks to the function block without intervention of the interconnection wire group, wherein, when each of the first and second programmable register blocks is set to the temporal latch state, an output signal of a corresponding one of the first and second programmable register blocks is transferred to the function block through the signal transfer section.

18. The function cell according to claim 15, wherein the programmable output selector comprises:

a programmable signal switch for routing at least the addition output signal and the carry output signal from input terminals to output terminals according to a state changeable between a straight connection state and a cross connection state;

a first programmable register block changeable between a direct transfer state and a temporal latch state of one of two outputs of the programmable signal switch;

a second programmable register block changeable between a direct transfer state and a temporal latch state of the other one of the two outputs of the programmable signal switch;

a first output selection block for selectively outputting a direct-transfer output of the first programmable register block to a first wire group of the interconnection wire group;

a second output selection block for selectively outputting a direct-transfer output of the second programmable register block to a second wire group of the interconnection wire group, wherein the second wire group is different from the first wire group; and a signal transfer section connecting each of the first and second programmable register blocks to the function block without intervention of the interconnection wire group, wherein, a temporal-latch output signal of each of the first and second programmable register blocks is transferred to the function block through the signal transfer section.

19. A combined function block comprising a first function block and a second function block, wherein the first function block comprises:

a first exclusive OR circuit A for performing an exclusive OR function on a first input signal and a second input signal;

a second exclusive OR circuit A for performing an exclusive OR function on a third input signal and a fourth input signal;

a 4-2 carry block A for generating a 4-2 carry output signal from at least, one of the first and second input signals and one of the third and fourth input signals;

a third exclusive OR circuit A for performing an exclusive OR function on output signals of the first exclusive OR circuit A and the second exclusive OR circuit A;

a first signal generator A for generating a first signal A from at least an output signal of the third exclusive OR circuit;

a second signal generator A for generating a second signal A from at least one of the first and second input signals;

a third signal generator A for generating a third signal A from a first multiple-signal group including a 4-2 carry input signal, a ripple carry input signal, and at least one logical input signal;

a fourth signal generator A for generating a fourth signal A from a second multiple-signal group including the 4-2 carry input signal, the ripple carry input signal, and at least one logical input signal;

a selector A for selecting one of the second signal A and the third signal A to produce a carry output signal A depending on the first signal A;

a fourth exclusive OR circuit A for performing an exclusive OR function on the fourth signal A and the output signal of the third exclusive OR circuit A; and
a first AND circuit for performing AND function on the output signals of the first exclusive OR circuit A and the second exclusive OR circuit A, and
the second function block comprises:
a first exclusive OR circuit B for performing an exclusive OR function on a fifth input signal and a sixth input signal;
a second exclusive OR circuit B for performing an exclusive OR function on a seventh input signal and an eighth input signal;
a 4-2 carry block B for generating a 4-2 carry output signal from at least, one of the fifth and sixth input signals and one of the seventh and eighth input signals;
a third exclusive OR circuit B for performing an exclusive OR function on output signals of the first exclusive OR circuit B and the second exclusive OR circuit B;
a first signal generator B for generating a first signal B from at least an output signal of the third exclusive OR circuit B;
a second signal generator B for generating a second signal B from at least one of the fifth and sixth input signals;
a third signal generator B for generating a third signal B from a third multiple-signal group including the 4-2 carry output signal A, the carry output signal A, an output of the first AND circuit and at least one logical input signal;
a fourth signal generator B for generating a fourth signal B from a fourth multiple-signal group including the 4-2 carry output signal A, the carry output signal A and at least one logical input signal;
a selector B for selecting one of the second signal B and the third signal B to produce a carry output signal B depending on the first signal B;
a fourth exclusive OR circuit B for performing an exclusive OR function on the fourth signal B and the output signal of the third exclusive OR circuit B;
a second AND circuit for performing an AND function on an output signal of the third exclusive OR circuit A and an output signal of the third exclusive OR circuit B; and
an AND-OR circuit for performing a logical OR function on the carry output signal B and an AND of an output signal of the second AND circuit and the ripple carry input signal, to produce a ripple carry output signal.

20. The combined function block according to claim 19, wherein the AND-OR circuit comprises:
a first NAND circuit for inputting the output signal of the second AND circuit and the ripple carry input signal; and
a second NAND circuit for inputting an output signal of the first NAND circuit and NOT of the carry output signal B to produce the ripple output signal.

21. A function block having at least first, second, third, and fourth logical input terminals at which first, second, third, and fourth logical input signals are inputted, respectively, comprising:
a first half-function block; and
a second half-function block,
wherein
the first half-function block comprises:
a first logical function generator having at least first and second input terminals and one output terminal, for generating a first logical output signal from first and second input signals according to a logical function selected from a plurality of 2-input/1-output logical functions depending on configuration data, wherein the first logical function generator has up to three input terminals,
wherein the first half-function block is allowed to configure a full adder for producing a first addition output signal and a 4-2 carry output signal by adding the first, second, and fourth logical input signals, and
the second half-function block comprises:
a second logical function generator having at least third and fourth input terminals and one output terminal, for generating a second logical output signal from third and fourth input signals according to a logical function selected from a plurality of 2-input/1-output logical functions depending on configuration data, wherein the second logical function generator has up to three input terminals,
wherein the second half-function block is allowed to configure a full adder for producing a second addition output signal and a carry output signal by adding the first addition output signal, the third logical input signal, and the 4-2 carry input signal.

22. The function block according to claim 21, wherein the first half-function block further comprises:
a first signal generator for generating a first signal from at least the logical output signal;
a second signal generator for generating a second signal from at least the fourth logical input signal;
a third signal generator for generating a third signal from at least the fourth logical input signal;
a 4-2 carry generator for generating a 4-2 carry output signal from the second signal and the first input signal of the first logical function generator; and
a first exclusive OR circuit for performing an exclusive OR function on the logical output signal and the third signal to produce the first addition output signal,
wherein the first input signal and the second input signal of the first logical function generator are the first signal and the second logical input signal, respectively,
the second half-function block further comprises:
a fourth signal generator for generating a fourth signal from at least the first addition output signal;
a fifth signal generator for generating a fifth signal from at least the 4-2 carry input signal;
a sixth signal generator for generating a sixth signal from at least the 4-2 carry input signal;
a seventh signal generator for generating a seventh signal from the second logical output signal;
an eighth signal generator for generating an eighth signal from one input signal of the second logical function generator;
a carry generator for generating the carry output signal based on at least the fifth signal and the eighth signal; and
a second exclusive OR circuit for performing an exclusive OR function on the second logical output signal and the sixth signal to produce the second addition output signal,
wherein the third input signal and the fourth input signal of the second logical function generator are the third logical input signal and the fourth signal, respectively.

23. The function block according to claim 22, wherein the 4-2 carry generator comprises a first multiplexer which is controlled by the first logical output signal and selects a signal from the second signal and the first input signal of the first logical function generator to output it as the 4-2 carry output signal, and the carry generator comprises a second multiplexer which is controlled by the seventh signal and selects s a signal from the fifth signal and the eighth signal to output it as the carry output signal.

24. The function block according to claim 22, wherein the 4-2 carry generator comprises a first carry block which outputs a carry signal obtained from the second signal and the first input signal of the first logical function generator as the 4-2 carry output signal, and a carry generator comprises a second carry block which outputs a carry signal obtained from the fifth signal and the third input signal of the second logical function generator as the carry output signal.

25. The function block according to claim 22, wherein the third signal generator is a selector for selecting a signal from a multiple-signal group including the fourth logical input signal.

26. The function block according to claim 22, wherein the sixth signal generator is a selector for selecting a signal from a multiple-signal group including the 4-2 carry input signal.

27. The function block according to claim 22, wherein the second signal generator and the third signal generator are one and the same circuit.

28. The function block according to claim 22, wherein the fifth signal generator and the sixth signal generator are one and the same circuit.

29. The function block according to claim 22, wherein the first signal generator selects a signal as the first signal from a multiple-signal group including the first and third logical input signals.

30. The function block according to claim 22, wherein the fourth signal generator selects a signal as the fourth signal from a multiple-signal group including the first addition output signal and the second logical input signal.

31. The function block according to claim 21, further comprising:
a supplying section for selectively supplying the third logical input signal and the second logical input signal to respective ones of the first input terminal of the first logical function generator and the fourth input terminal of the second logical function generator.

32. The function block according to claim 21, wherein the first addition output signal is transferred to the second half-function block via a dedicated wire that is provided separately from an interconnection wire providing programmable connections between a plurality of function blocks.

33. The function block according to claim 31, wherein the second logical input signal is transferred to the second half-function block via a dedicated wire that is provided separately from an interconnection wire providing programmable connections between a plurality of function blocks.

34. The function block according to claim 21, wherein the third logical input signal is transferred to the first half-function block via a dedicated wire that is provided separately from an interconnection wire providing programmable connections between a plurality of function blocks.

35. The function block according to claim 21, further comprising:
an addition output multiplexer for selecting a signal from the first addition output signal and the second addition output signal.

36. The function block according to claim 35 wherein the addition output multiplexer is controlled by a signal that is selected in programmable fashion from a multiple-signal group including the fourth logical input signal.

37. The function block according to claim 21, further comprising:
a logical output multiplexer for selecting a signal from the first logical output signal and the second logical output signal.

38. The function block according to claim 37, wherein the logical output multiplexer is controlled by the fourth logical input signal.

39. The function block according to claim 21, further comprising:
a preposition circuit connected to at least one of the second and third logical input terminals, wherein the preposition circuit is a programmable circuit that is allowed to be set to an arbitrary one of a plurality of logical functions.

40. The function block according to claim 39, wherein the preposition circuit is programmable with configuration data.

41. The function block according to claim 39, wherein a logical function of the preposition circuit is determined based on a signal selected in programmable fashion from a fixed logical value and a signal on an interconnection network that allows programmable connections of a plurality of function blocks.

42. The function block according to claim 39, wherein the preposition circuit is a look-up table programmable with configuration data.

43. The function block according to claim 39, wherein the preposition circuit is a multiplexer that is allowed to be controlled by a dynamic signal.

44. The function block according to claim 39, wherein the plurality of logical functions include an AND function.

45. The function block according to claim 39, wherein the preposition circuit is connected to each of the second and third input terminals.

46. The function block according to claim 45, wherein
one of preposition circuits connected to the second and third input terminals is a look-up table programmable with configuration data; and
the other of the preposition circuits is set to a logical function determined based on a signal selected in programmable fashion from a fixed logical value and a dynamic signal on an interconnection network that allows programmable connections of a plurality of function blocks.

47. The function block according to claim 45, wherein the preposition circuits are each multiplexers that are allowed to be controlled by dynamic signals.

48. The function block according to claim 45, wherein each of the preposition circuits is allowed to be set to an AND function.

49. The function block according to claim 21, wherein the first half-function block further comprises:
a first ripple carry block for generating a first ripple carry output signal from a multiple-signal group including a first ripple carry input signal,
wherein the first half-function block is allowed to configure a full adder for producing the first addition output signal and the first ripple carry output signal by adding the first logical input signal, the second logical input signal, and the first ripple carry input signal, and
the second half-function block further comprises:
a second ripple carry block for generating a second ripple carry output signal from a multiple-signal group including a second ripple carry input signal,
wherein the second half-function block is allowed to configure a full adder for producing the second addition output signal and the second carry output signal by adding the first addition output signal, the third logical input signal, and the second ripple carry input signal.

50. A function block having at least first, second, third, and fourth logical input terminals at which at least first, second, third, and fourth logical input signals are inputted, respectively, comprising:
a first half-function block; and
a second half-function block,
wherein
the first half-function block comprises:
at least two exclusive OR circuits for generating a first logical output signal,
wherein the first half-function block is allowed to configure a full adder for producing the first addition output signal and a 4-2 carry output signal by adding the first, second, and third logical input signals, and
the second half-function block comprises:
at least two exclusive OR circuits for generating a second logical output signal,
wherein the second half-function block is allowed to configure a full adder for producing the second addition output signal and a carry output signal by adding the first addition output signal, the fourth logical input signal, and a 4-2 carry input signal.

51. The function block according to claim 50, wherein the first half-function block further comprises:
a first preposition circuit connected to the third logical input terminal, wherein the first preposition circuit is a programmable circuit that is allowed to be set to an arbitrary one of a plurality of logical functions, and
the second half-function block further comprises:
a second preposition circuit connected to the fourth logical input terminal, wherein the second preposition circuit is a programmable circuit that is allowed to be set to an arbitrary one of a plurality of logical functions.

52. The function block according to claim 51, wherein the first half-function block further comprises:
a first signal generator for generating a first signal from at least the logical output signal;
a first exclusive OR circuit for performing an exclusive OR function on an output signal of the first preposition circuit and the first signal;
a second signal generator for generating a second signal from at least the second logical input signal;
a first selector for selecting a signal from the second signal and one of the output signal of the first preposition circuit and the first signal to output it as the 4-2 carry output signal, depending on an output signal of the first exclusive OR circuit; and
a second exclusive OR circuit for performing an exclusive OR function on the output signal of the first preposition circuit and the second signal, and
the second half-function block further comprises:
a third signal generator for generating a third signal from at least the first addition output signal;
a third exclusive OR circuit for performing an exclusive OR function on an output signal of the second preposition circuit and the third signal;
a fourth signal generator for generating a fourth signal from at least the 4-2 carry input signal;
a fifth signal generator for generating a fifth signal from at least either the output signal of the second preposition circuit or the third signal;
a second selector for selecting a signal from the fourth signal and the fifth signal to output it as the carry output signal, depending on an output signal of the third exclusive OR circuit; and a fourth exclusive OR circuit for performing an exclusive OR function on the output signal of the third exclusive OR circuit and the fourth signal to produce the second addition output signal.

53. The function block according to claim 51, wherein
the first half-function block further comprises a 4-2 carry block for generating the 4-2 carry output signal, and
the second half-function block further comprises a carry block for generating the carry output signal.

54. The function block according to claim 51, further comprising:
a supplying section for supplying an output signal of the first preposition circuit to the second half-function block,
wherein the second half-function block is allowed to configure a full adder for producing the second addition output signal and the carry output signal by adding the output signal of the first preposition circuit, an output signal of the second preposition circuit, and the 4-2 carry input signal.

55. The function block according to claim 54, wherein the output signal of the first preposition circuit is transferred to the second half-function block via a dedicated wire that is provided separately from an interconnection wire providing programmable connections between a plurality of function blocks.

56. The function block according to claim 51, further comprising:
a supplying section for supplying an output signal of the second preposition circuit to the first half-function block,
wherein the first half-function block is allowed to configure a full adder for producing the first addition output signal and the 4-2 carry output signal by adding the output signal of the first preposition circuit, an output signal of the second preposition circuit, and the second logical input signal.

57. The function block according to claim 56, wherein the output signal of the second preposition circuit is transferred to the first half-function block via a dedicated wire that is provided separately from an interconnection wire providing programmable connections between a plurality of function blocks.

58. The function block according to claim 50, wherein the first addition output signal is transferred to the second half-function block via a dedicated wire that is provided separately from an interconnection wire providing programmable connections between a plurality of function blocks.

59. The function block according to claim 50, further comprising:
an addition output multiplexer for selecting one of the first addition output signal and the second addition output signal.

60. The function block according to claim 51, wherein each of the first and second preposition circuits is a multiplexer that is controlled by a dynamic signal.

61. The function block according to claim 51, wherein each of the first and second preposition circuits is allowed to be set to an AND function.

62. The function block according to claim 51, wherein the input signals of the first preposition circuit and the second preposition circuit are signals selected in programmable fashion from fixed logical values and signals on an interconnection network that allows programmable connections of a plurality of function blocks.

63. The function block according to claim 51, wherein the second logical input signal is a signal selected in programmable fashion from a fixed logical value and signals on an interconnection network that allows programmable connections of a plurality of function blocks.

64. The function block according to claim 50, wherein the first half-function block further comprises:
a first ripple carry block for generating a first ripple carry output signal from a multiple-signal group including a first ripple carry input signal,
wherein the first half-function block is allowed to configure a full adder for producing the first addition output signal and the first ripple carry output signal by adding the first logical input signal, the third logical input signal, and the first ripple carry input signal, and
the second half-function block further comprises:
a second ripple carry block for generating a second ripple carry output signal from a multiple-signal group including a second ripple carry input signal,
wherein the second half-function block is allowed to configure a full adder for producing the second addition output signal and the second carry output signal by adding the first addition output signal, the fourth logical input signal, and the second ripple carry input signal.

65. A combined function block comprising N blocks B1–BN (N is a natural number greater than 0), each of which includes at least one of 4-2 carry function and a ripple carry function,
wherein the N blocks B1–BN are connected such that a carry output signal of a block Bi is a carry input signal of a block Bi+1, where i is an arbitrary natural number greater than 0 and not greater than N−1, wherein the carry output signal is produced by one of 4-2 carry function and a ripple carry function and the carry input signal is used by the one of 4-2 carry function and a ripple carry function.

66. The combined function block according to claim 65, wherein each of the N blocks B1–BN comprises:
a logical function generator having at least four logical input terminals and one logical output terminal, for generating an logical output signal from first, second, third, and fourth logical input signals thereof according to a logical function selected from a plurality of 4-input/1-output logical functions depending on configuration data;
a 4-2 carry block for generating a 4-2 carry output signal from the second, third, and fourth logical input signals;
a first signal generator for generating a first signal from at least the logical output signal;
a second signal generator for generating a second signal from at least the first logical input signal;
a third signal generator for generating a third signal from at least a 4-2 carry input signal;
a fourth signal generator for generating a fourth signal from at least the 4-2 carry input signal;
a selector for selecting one of the second and third signals depending on the first signal to produce a carry output signal; and
an exclusive OR circuit for performing an exclusive OR function on the logical output signal and the fourth signal.

67. The combined function block according to claim 66, wherein each of the N blocks B1–BN further comprises:
a ripple carry generator for generating a ripple carry output signal based on at least, one of the first to fourth logical input signals and the ripple carry input signal.

68. The combined function block according to claim 67, wherein each of the N blocks B1–BN comprises a first function block and a second function block, wherein the first function block comprises:
a logical function generator A having at least four logical input terminals and one logical output terminal, for generating an logical output signal A from first, second, third, and fourth logical input signals thereof according to a logical function selected from a plurality of 4-input/1-output logical functions depending on configuration data;
a 4-2 carry block A for generating a 4-2 carry output signal A from the second, third, and fourth logical input signals;
a first signal generator A for generating a first signal A from at least the logical output signal A;
a second signal generator A for generating a second signal A from at least the first logical input signal;
a third signal generator A for generating a third signal A by selecting a signal as the third signal from a first multiple-signal group including at least a 4-2 carry input signal;
a fourth signal generator A for generating a fourth signal A by selecting a signal as the fourth signal from the second multiple-signal group including at least the 4-2 carry input signal;
a selector A for selecting one of the second signal A and the third signal A depending on the first signal A to produce a carry output signal A;
an exclusive OR circuit A for performing an exclusive OR function on the logical output signal A and the fourth signal A to produce an exclusive OR result A; and
a first AND circuit for performing an AND function on the first logical input signal and one of the second to fourth logical input signals, and
the second function block comprises:
a logical function generator B having at least four logical input terminals and one logical output terminal, for generating an logical output signal B from fifth, sixth, seventh, and eighth logical input signals thereof according to a logical function selected from a plurality of 4-input/1-output logical functions depending on configuration data;
a 4-2 carry block B for generating a 4-2 carry output signal B from the sixth, seventh, and eighth logical input signals;
a first signal generator B for generating a first signal B from at least the logical output signal B;
a second signal generator B for generating a second signal B from at least the fifth logical input signal;
a third signal generator B for generating a third signal B by selecting a signal as the third signal B from a third multiple-signal group including at least the 4-2 carry output signal A and an output of the first AND circuit;
a fourth signal generator B for generating a fourth signal B by selecting a signal as the fourth signal B from a fourth multiple-signal group including at least the 4-2 carry output signal A and the carry output signal A;
a selector B for selecting one of the second signal B and the third signal B depending on the first signal B to produce a carry output signal B;
an exclusive OR circuit B for performing an exclusive OR function on the logical output signal B and the fourth signal B to produce an exclusive OR result B;
a second AND circuit for performing an AND function on the logical output signal A and the logical output signal B; and
an AND-OR circuit for performing a logical OR function on the carry output signal B and an AND of an output signal of the second AND circuit and a ripple carry input signal, to produce a ripple carry output signal.

69. The combined function block according to claim 65, wherein each of the N blocks B1–BN is connected to a common signal line for supplying a common signal thereto.

70. The combined function block according to claim 69, wherein the common signal line is dedicated for signal inputting of each of the N blocks B1–BN.

71. A complex function block comprising:
a plurality of combined function blocks, each of which comprises N blocks B1–N (N is a natural number greater than 0), each of which includes at least one of 4-2 carry function and a ripple carry function, wherein the N blocks B1–BN are connected such that a carry output signal of a block Bi is a carry input signal of a block Bi+1, where i is an arbitrary natural number greater than 0 and not greater than N−1, wherein the carry output signal is produced by one of 4-2 carry function and a ripple carry function and the carry input signal is used by the one of 4-2 carry function and a ripple carry function, wherein each of the N blocks B1–BN is connected to a common signal line for supplying a common signal thereto; and
a common signal connection circuit for selecting a signal in programmable fashion from a multiple-signal group including a common signal for one of the combined function blocks to supply the selected signal as a common signal to another one of the combined function blocks.

72. A combined function block comprising:
a first block having at least a function of generating a 4-2 carry output signal;
a second block providing at least a predetermined function based on a 4-2 carry input signal; and
a 4-2 carry connection circuit connected between the first and second blocks, for selecting a signal from a multiple-signal group including the 4-2 carry output signal of the first block and another signal to supply the selected signal as the 4-2 carry input signal to the second block.

73. The combined function block according to claim 72, wherein
the first block is a combined function block according to claim 66.

74. The combined function block according to claim 73, wherein
the second block is a combined function block according to claim 66.

75. The combined function block according to claim 72, wherein
the first block is a combined function block according to claim 68.

76. The combined function block according to claim 72, wherein
the second block is a combined function block according to claim 68.

77. The combined function block according to claim 72, wherein the other signal is a fixed logical value.

78. A combined function block comprising:
a first block having at least a function of generating a ripple carry output signal;
a second block providing at least a predetermined function based on a ripple carry input signal; and
a ripple carry connection circuit connected between the first and second blocks, for selecting a signal from a multiple-signal group including the ripple carry output signal of the first block and another signal to supply the selected signal as the ripple carry input signal to the second block.

79. The combined function block according to claim 78, wherein
the first block is a combined function block according to claim 67.

80. The combined function block according to claim 78, wherein the second block is a combined function block according to claim 67.

81. The combined function block according to claim 78, wherein
the first block is a combined function block according to claim 68.

82. The combined function block according to claim 78, wherein
the second block is a combined function block according to claim 68.

83. The combined function block according to claim 78, wherein the other signal is a fixed logical value.

84. An integrated circuit comprising an area in which a plurality of function blocks are arranged in a two-dimensional array, wherein each of the function blocks is a combined function block according to claim 65.

85. An integrated circuit comprising an area in which a plurality of function blocks are arranged in a two-dimensional array, wherein each of the function blocks is a complex function block according to claim 71.

86. An integrated circuit comprising an area in which a plurality of function blocks are arranged in a two-dimensional array, wherein each of function blocks is a combined function block according to claim 72.

87. An integrated circuit comprising an area in which a plurality of function blocks are arranged in a two-dimensional array, wherein each of the function blocks is a combined function block according to claim 78.

88. An integrated circuit comprising:
a first area in which a plurality of first function blocks are arranged in a two-dimensional array, wherein each of the first function blocks is a combined function block according to claim 65; and
a second area around the first area, wherein a plurality of second function blocks are placed in the second area and are allowed to be individually set to arbitrary logical function.

89. An integrated circuit comprising:
a first area in which a plurality of first function blocks are arranged in a two-dimensional array, wherein each of the first function blocks is a complex function block according to claim 71; and
a second area around the first area, wherein a plurality of second function blocks are placed in the second area and are allowed to be individually set to arbitrary logical function.

90. An integrated circuit comprising:
a first area in which a plurality of first function blocks are arranged in a two-dimensional array, wherein each of the first function blocks is a combined function block according to claim 72; and
a second area around the first area, wherein a plurality of second function blocks are placed in the second area and are allowed to be individually set to arbitrary logical function.

91. An integrated circuit comprising:
a first area in which a plurality of first function blocks are arranged in a two-dimensional array, wherein each of the first function blocks is a combined function block according to claim 78; and a second area around the first area, wherein a plurality of second function blocks are placed in the second area and are allowed to be individually set to arbitrary logical function.

92. The combined function block according to claim 65, wherein each of the N blocks B1–BN comprises:

a first exclusive OR circuit for performing an exclusive OR function on a first input signal and a second input signal;

a second exclusive OR circuit for performing an exclusive OR function on a third input signal and a fourth input signal;

a 4-2 carry block for generating a 4-2 carry output signal from at least, one of the first and second input signals and one of the third and fourth input signals;

a third exclusive OR circuit for performing an exclusive OR function on output signals of the first exclusive OR circuit and the second exclusive OR circuit;

a first signal generator for generating a first signal from at least an output signal of to third exclusive OR circuit;

a second signal generator for generating a second signal from at least one of the first and second input signals;

a third signal generator for generating a third signal from a first multiple-signal group including a 4-2 carry input signal and at least one logical input signal;

a fourth signal generator for generating a fourth signal from a second multiple-signal group including the 4-2 carry input signal and at least one logical input signal;

a selector for selecting one of to second and third signals to produce a carry output signal depending on the first signal; and a fourth exclusive OR circuit for performing an exclusive OR function on the fourth signal and the output signal of the third exclusive OR circuit.

93. The combined function block according to claim 92, wherein each of the N blocks B1–BN further comprises:

a ripple carry block for generating a ripple carry output signal from two input signals of the third exclusive OR circuit and the ripple carry input signal.

94. The combined function block according to claim 65, wherein each of the N blocks B1–BN comprises a first function block and a second function block, wherein the first function block comprises:

a first exclusive OR circuit A for performing an exclusive OR function on a first input signal and a second input signal;

a second exclusive OR circuit A for performing an exclusive OR function on a third input signal and a fourth input signal;

a 4-2 carry block A for generating a 4-2 carry output signal from at least one of the first and second input signals and one of the third and fourth input signals;

a third exclusive OR circuit A for performing an exclusive OR function on output signals of the first exclusive OR circuit A and the second exclusive OR circuit A;

a first signal generator A for generating a first signal A from at least an output signal of the third exclusive OR circuit;

a second signal generator A for generating a second signal A from at least one of the first and second input signals;

a third signal generator A for generating a third signal A from a first multiple-signal group including a 4-2 carry input signal, a ripple carry input signal, and at least one logical input signal;

a fourth signal generator A for generating a fourth signal A from a second multiple-signal group including the 4-2 carry input signal, the ripple carry input signal, and at least one logical input signal;

a selector A for selecting one of the second signal A and the third signal A to produce a carry output signal A depending on the first signal A;

a fourth exclusive OR circuit A for performing an exclusive OR function on the fourth signal A and the output signal of the third exclusive OR circuit A; and a first AND circuit for performing AND function on the output signals of the first exclusive OR circuit A and the second exclusive OR circuit A, and the second function block comprises:

a first exclusive OR circuit B for performing an exclusive OR function on a fifth input signal and a sixth input signal;

a second exclusive OR circuit B for performing an exclusive OR function on a seventh input signal and an eighth input signal;

a 4-2 carry block B for generating a 4-2 carry output signal from at least, one of the fifth and sixth input signals and one of the seventh and eighth input signals;

a third exclusive OR circuit B for performing an exclusive OR function on output signals of the first exclusive OR circuit B and the second exclusive OR circuit B;

a first signal generator B for generating a first signal B from at least an output signal of the third exclusive OR circuit B;

a second signal generator B for generating a second signal B from at least one of the fifth and sixth input signals;

a third signal generator B for generating a third signal B from a third multiple-signal group including the 4-2 carry output signal A, the carry output signal A, an output of the first AND circuit and at least one logical input signal;

a fourth signal generator B for generating a fourth signal B from a fourth multiple-signal group including the 4-2 carry output signal A, the carry output signal A and at least one logical input signal;

a selector B for selecting one of the second signal B and the third signal B to produce a carry output signal B depending on the first signal B;

a fourth exclusive OR circuit B for performing an exclusive OR function on the fourth signal B and the output signal of the third exclusive OR circuit B;

a second AND circuit for performing an AND function on an output signal of the third exclusive OR circuit A and an output signal of the third exclusive OR circuit B; and an AND-OR circuit for performing a logical OR function on the carry output signal B and an AND of an output signal of the second AND circuit and the ripple carry input signal, to produce a ripple carry output signal, wherein the N blocks B1–BN are connected such that a 4-2 carry output signal of a second function block of a block Bi is a carry input signal of a first function block of a block Bi+1, where i is an arbitrary natural number greater than 0 and not greater than N−1.

95. The combined function block according to claim 72, wherein the first block is a combined function block according to claim 66 and the second block is a function block according to claim 65.

96. The combined function block according to claim 72, wherein the first block is a function block according to claim 65, and the second block is a combined function block according to claim 66.

97. The combined function block according to claim 72, wherein the first block is a combined function block according to claim 68, and the second block is a combined function block according to claim 19.

98. The combined function block according to claim 72, wherein the first block is a combined function block according to claim 19, and the second block is a combined function block according to claim 68.

99. The combined function block according to claim 12, wherein the other signal is a fixed logical value.

100. The combined function block according to claim 78, wherein the first block is a combined function block according to claim 61, and the second block is a function block according to claim 12.

101. The combined function block according to claim 78, wherein the first block is a function block according to claim 12, and the second block is a combined function block according to claim 67.

102. The combined function block according to claim 78, wherein the first block is a combined function block according to claim 68, and the second block is a combined function block according to claim 19.

103. The combined function block according to claim 78, wherein the first block is a combined function block according to claim 19, and the second block is a combined function block according to claim 68.

104. The combined function block according to claim 78, wherein the other signal is a fixed logical value.

105. A function block for generating 4-2 carry output O42, addition output OS, and carry output OC from at least first, second, third, and fourth logical inputs and a 4-2 carry input, wherein the function block is set to satisfying the following equation:

$$S=(O42+OC)\times 2+OS,$$

where S is a sum of the logical inputs and the 4-2 carry input, wherein only one logical function generator is provided, which configures a logical function arbitrarily selected from a plurality of possible 4-input/1-output logical functions depending on configuration data.

106. A function block for generating 4-2 carry output O42, addition output OS, and carry output OC from at least first, second, third, and fourth logical inputs and a 4-2 carry input, wherein the function block is set to satisfying the following equation:

$$S=(O42+OC)\times 2+OS,$$

where S is a sum of the logical inputs and the 4-2 carry input, wherein only one logical function generator is provided, which configures a logical function arbitrarily selected from a plurality of possible 3-input/1-output logical functions depending on configuration data.

107. A function block for generating 4-2 carry output O42, addition output OS, and carry output OC from at least first, second, third, and fourth logical inputs and a 4-2 carry input, wherein the function block is set to satisfying the following equation:

$$S=(O42+OC)\times 2+OS,$$

where S is a sum of the logical inputs and the 4-2 carry input, wherein two logical function generators are provided, each of which configures a logical function arbitrarily selected from a plurality of possible 3-input/1-output logical functions depending on configuration data.

108. A function block for generating 4-2 carry output O42, addition output OS, and carry output OC from at least first, second, third, and fourth logical inputs and a 4-2 carry input, wherein the function block is set to satisfying the following equation:

$$S=(O42+OC)\times 2+OS,$$

where S is a sum of the logical inputs and the 4-2 carry input, wherein n logical function generators are provided, each of which configures a logical function arbitrarily selected from a plurality of possible 2-input/1-output logical functions depending on configuration data, wherein n is a natural number greater than 1 and not greater than 4.

109. The function block according to claim 105, wherein the function block is allowed to implement any of all 4-input/1-output logical functions depending on configuration data.

110. The function block according to claim 107, wherein the function block concurrently configures both a first full adder having first ripple carry input and first ripple carry output and a second full adder having second ripple carry input and second ripple carry output.

111. The function block according to claim 108, wherein the function block concurrently configures both a first full adder having first ripple carry input and first ripple carry output and a second full adder having second ripple carry input and second ripple carry output.

112. A function block for generating 4-2 carry output O42, addition output OS, and carry output OC from at least first, second, third, and fourth logical inputs and a 4-2 carry input, wherein the function block is set to satisfying the following equation:

$$S=(O42+OC)\times 2+OS,$$

where S is a sum of the logical inputs and the 4-2 carry input, wherein at least one exclusive OR circuit is provided.

113. A function block for generating 4-2 carry output O42, addition output OS, and carry output OC from at least first, second, third, and fourth logical inputs and a 4-2 carry input, wherein the function block is set to satisfying the following equation:

$$S=(O42+OC)\times 2+OS,$$

where S is a sum of the logical inputs and the 4-2 carry input, wherein a single full adder having ripple carry input and ripple carry output is implemented.

114. A function block for generating 4-2 carry output O42, addition output OS, and carry output OC from at least first, second, third, and fourth logical inputs and a 4-2 carry input, wherein the function block is set to satisfying the following equation:

$$S=(O42+OC)\times 2+OS,$$

where S is a sum of the logical inputs and the 4-2 carry input, wherein the function block concurrently configures both a first full adder having first ripple carry input and first ripple carry output and a second full adder having second ripple carry input and second ripple carry output.

115. A function block for generating 4-2 carry output O42, addition output OS, and carry output OC from at least first, second, third, and fourth logical inputs and a 4-2 carry input, wherein the function block is set to satisfying the following equation:

$$S=(O42+OC)\times 2+OS,$$

where S is a sum of the logical inputs and the 4-2 carry input, and wherein the function block comprises:
  at least one preposition circuit provides at least one of the first, second, third, and fourth logical inputs, wherein said at least one preposition circuit is a programmable circuit that is allowed to be set to an arbitrary one of a plurality of logical functions without intervention of an interconnection wire providing programmable connections of a plurality of function blocks.

116. A function block for generating 4-2 carry output O42, addition output OS, and carry output OC from at least first, second, third, and fourth logical inputs and 4-2 carry input, the function block comprising:
  a logical function generator for generating a logical function selected from a plurality of logical functions including a 4-input/1-output exclusive OR function depending on configuration data;
  a 4-2 carry block for generating the 4-2 carry output from at least three ones of the first to fourth logical inputs;
  a carry block for generating the carry output from a multiple-signal group including the 4-2 carry input and at least one of the first to fourth logical inputs; and
  an exclusive OR circuit for performing an exclusive OR function on an output of the logical function generator and the 4-2 carry input to produce the addition output, wherein the function block is set to satisfying the following equation:

$$S=(O42+OC)\times 2+OS,$$

where S is a sum of the logical inputs and the 4-2 carry input.

117. The function block according to claim 116, wherein the 4-2 carry block outputs as the 4-2 carry output an OR of an AND of the first and second logical inputs and an AND of the third and fourth logical inputs, and
  the carry block outputs the carry output one selected from a signal group consisting of the 4-2 carry input and an AND of an OR of the first and second logical inputs and an OR of the third and fourth logical inputs, depending on the output of the logical function generator.

118. The function block according to claim 116, wherein the 4-2 carry block outputs as to 4-2 carry output an AND of an OR of the first and second logical inputs and an OR of the third and fourth logical inputs, and
  the carry block outputs the carry output one selected from a signal group consisting of the 4-2 carry input and an OR of an AND of the first and second logical inputs and an AND of the third and fourth logical inputs, depending on the output of the logical function generator.

119. The function block according to claim 116, further comprising:
  at least one preposition circuit provides at least one of the four logical inputs, wherein said at least one preposition circuit is a programmable circuit that is allowed to be set to an arbitrary one of a plurality of logical functions.

120. A function block comprising:
  a 4-2 adder block for generating 4-2 carry output O42, addition output OS, and carry output OC from at least first, second, third, and fourth logical inputs and a 4-2 carry input;
  at least one preposition circuit provides at least one of the first to fourth logical inputs, wherein said at least one preposition circuit is a programmable circuit that is allowed to be set to an arbitrary one of a plurality of logical functions,
  wherein the function block is allowed to be set to satisfying the following equation:

$$S=(O42+OC)\times 2+OS,$$

where S is a sum of the logical inputs and the 4-2 carry input,
  wherein the function block allows a plurality of 4-input/1-output logical functions.

121. The function block according to claim 120, wherein the 4-2 adder block comprises:
  a 5-input exclusive OR circuit for output the addition output from the first to fourth logical inputs and the 4-2 carry input;
  a 4-2 carry block for generating the 4-2 carry output from at least three ones of the first to fourth logical inputs;
  a carry block for generating the carry output from a first multiple-signal group including the 4-2 carry input and at least one of the first to fourth logical inputs.

122. The function block according to claim 121, wherein the 5-input exclusive OR circuit comprises a 4-input exclusive OR circuit performing an exclusive OR function on the first to fourth logical inputs,
  the carry block is controlled by an output of to 4-input exclusive OR circuit.

123. The function block according to claim 122, wherein the 4-2 carry block outputs as the 4-2 carry output an OR of an AND of the first and second logical inputs and an AND of the third and fourth logical inputs, and
  the carry block outputs the carry output one selected from a signal group consisting of the 4-2 carry input and an AND of an OR of the first and second logical inputs and an OR of the third and fourth logical inputs, depending on the output of the 4-input exclusive OR circuit.

124. The function block according to claim 122, wherein the 4-2 carry block outputs as the 4-2 carry output an AND of an OR of the first and second logical inputs and an OR of the third and fourth logical inputs, and
  the carry block outputs the carry output one selected from a signal group consisting of the 4-2 carry input and an OR of an AND of the first and second logical inputs and an AND of the third and fourth logical inputs, depending on the output of the 4-input exclusive OR circuit.

125. A function block for generating 4-2 carry output, addition output, carry output and ripple carry output from at least 4-2 carry input and ripple carry input, the function block implementing:
- a 4-input/1-output multiplexer controlled by at least a dynamic signal without intervention of an interconnection wire providing programmable connections between a plurality of function blocks;
- a plurality of 4-input/1-output logical functions;
- a 4-2 adder for generating the 4-2 carry output, the addition output, and the carry output from the 4-2 carry input; and
- a full adder for generating the addition output and the ripple carry output from the tipple carry input.

126. An N-bit 4-2 adder for generating multi-bit addition output and multi-bit carry output from first, second, third, and fourth N-bit argument inputs (N is a natural number greater than 1), comprising:
- N function blocks, each of which is set to an arbitrary logical function selected in programmable fashion from a plurality of logical functions, wherein each of the N function blocks has at least first to fourth argument inputs, a 4-2 carry input, a 4-2 carry output, an addition output, and a carry output;
- wherein
- the first N-bit argument input, second N-bit argument input third N-bit argument input and fourth N-bit argument input consist of the first argument inputs of the N function blocks, second argument inputs of the N function blocks, third argument inputs of the N function blocks and fourth argument inputs of the N function blocks, respectively,
- the multi-bit addition output includes addition outputs of the N function blocks, and
- the multi-bit carry output includes carry outputs of the N function blocks,
  - wherein the N function blocks B1–BN are connected such that a 4-2 carry output of a function block Bi is a 4-2 carry input of a function block Bi+1, where i is an arbitrary natural number greater than 1 and not greater than N−1,
  - wherein each of the N function blocks is set to satisfying the following equation:

$S=(O42+OC) \times 2+OS,$ where S is a sum of the first to fourth argument inputs and the 4-2 carry input, O42 is the 4-2 carry output, OC is the carry output, and OS is the addition output.

127. The N-bit 4-2 adder according to claim 126, wherein the N-bit 4-2 adder is implemented on an integrated circuit which has the N function blocks and an interconnection network formed thereon, the interconnection network providing programmable connections between the N function blocks.

128. The N-bit 4-2 adder according to claim 126, wherein each of the N function blocks comprises:
- a logical function generator having at least four logical input terminals and one logical output terminal, for generating a logical output from the first, second, third, and fourth argument inputs thereof according to a logical function selected from a plurality of 4-input/1-output logical functions depending on configuration data;
- a 4-2 carry block for generating a 4-2 carry output signal from the second, third, and fourth argument inputs;
- a first signal generator for generating a first signal from at least the logical output;
- a second signal generator for generating a second signal from at least the first argument input;
- a third signal generator for generating a third signal from at least the 4-2 carry input;
- a fourth signal generator for generating a fourth signal from at least the 4-2 carry input;
- a selector for selecting one of the second and third signals depending on the first signal to produce the carry output; and
- an exclusive OR circuit for performing an exclusive OR function on the logical output and the fourth signal to produce the addition output.

129. The N-bit 4-2 adder according to claim 126, wherein each of the N function blocks comprises:
- a first exclusive OR circuit for performing an exclusive OR function on the first and second argument inputs;
- a second exclusive OR circuit for performing an exclusive OR function on the third and fourth argument inputs;
- a 4-2 carry block for generating the 4-2 carry output from at least, one of the first and second argument inputs and one of the third and fourth argument inputs;
- a third exclusive OR circuit for performing an exclusive OR function on output signals of the first exclusive OR circuit and the second exclusive OR circuit;
- a first signal generator for generating a first signal from at least an output signal of the third exclusive OR circuit;
- a second signal generator for generating a second signal from at least one of the first and second argument inputs;
- a third signal generator for generating a third signal from a first multiple-signal group including the 4-2 carry input and at least one logical input signal;
- a fourth signal generator for generating a fourth signal from a second multiple-signal group including the 4-2 carry input and at least one logical input signal;
- a selector for selecting one of the second and third signals to produce the carry output depending on the first signal; and
- a fourth exclusive OR circuit for performing an exclusive OR function on the fourth signal and the output signal of the third exclusive OR circuit.

130. A multi-bit multi-argument 4-2 adder comprising a plurality of multi-bit 4-2 adders,
each of the multi-bit 4-2 adders comprising:
- at least first, second, third, and fourth multi-bit argument inputs, multi-bit addition output and multi-bit carry output;
- a plurality of function blocks, each of which is set to an arbitrary logical function selected in programmable fashion from a plurality of logical functions, wherein each of the N function blocks has at least first to fourth argument inputs, a 4-2 carry input, a 4-2 carry output, an addition output, and a carry output;
- wherein the first multi-bit argument input, second multi-bit argument input third multi-bit argument input and fourth multi-bit argument input consist of the first argument inputs of the function blocks, second argument inputs of the function blocks, third argument inputs of the function blocks, and fourth argument inputs of the function blocks, respectively,
- the multi-bit addition output includes addition outputs of the function blocks, and
- the multi-bit carry output includes carry outputs of the function blocks,
  - wherein the function blocks are connected such that a 4-2 carry output of a i-th function block is a 4-2 carry input of a (i+1)-th function block, where i is an arbitrary natural number greater than 0, wherein each of the N function blocks is set to satisfying the following equation:

$$S=(O42+OC)\times 2+OS,$$

where S is a sum of the first to fourth argument inputs and the 4-2 carry input, O42 is the 4-2 carry output, OC is the carry output, and OS is the addition output, wherein the multi-bit multi-argument 4-2 adder has at least one of six configurations as follows:

1) a first configuration in which a I-bit 4-2 adder (I is a natural number greater than 1), a J-bit 4-2 adder (J is a natural number greater than 1), and a K-bit 4-2 adder (K is a natural number greater than 1) are connected such that at least one portion of a multi-bit carry output and at least one portion of a multi-bit addition output of the I-bit 4-2 adder and at least one portion of a multi-bit carry output and at least one portion of a multi-bit addition output of the J-bit 4-2 adder are supplied to first, second, third and fourth K-bit argument inputs of the K-bit 4-2 adder;

2) a second configuration in which the I-bit 4-2 adder and the J-bit 4-2 adder are connected such that at least one portion of a multi-bit carry output and at least one portion of a multi-bit addition output of the I-bit 4-2 adder are supplied to any of first, second, third and fourth J-bit argument inputs of the J-bit 4-2 adder;

3) a third configuration in which
the I-bit 4-2 adder and the J-bit 4-2 adder are connected such that at least one portion of a multi-bit carry output and at least one portion of a multi-bit addition output of the I-bit 4-2 adder are supplied to any of first second, third and fourth J-bit argument inputs of the J-bit 4-2 adder, and
the J-bit 4-2 adder and the K-bit 4-2 adder are connected such that at least one portion of a multi-bit carry output and at least one portion of a multi-bit addition output of the J-bit 4-2 adder are supplied to any of first second, third and fourth K-bit argument inputs of the K-bit 4-2 adder;

4) a fourth configuration in which a multi-bit full adder having a multi-bit addition output and first and second multi-bit argument inputs and a N-bit 4-2 adder (N is a natural number greater than 1) are connected such that at least one portion of a multi-bit carry output and at least one portion of a multi-bit addition output of the N-bit 4-2 adder are supplied to respective ones of the first and second multi-bit argument inputs of the multi-bit full adder;

5) a fifth configuration in which
the I-bit 4-2 adder and the J-bit 4-2 adder are connected such that at least one portion of a multi-bit carry output and at least one portion of a multi-bit addition output of the I-bit 4-2 adder are supplied to any of first second, third and fourth J-bit argument inputs of the J-bit 4-2 adder,
the K-bit 4-2 adder and a L-bit 4-2 adder (L is a natural number greater than 1) are connected such that at least one portion of a multi-bit carry output and at least one portion of a multi-bit addition output of the K-bit 4-2 adder are supplied to any of first, second, third and fourth L-bit argument inputs of the L-bit 4-2 adder, and
the J-bit 4-2 adder, the L-bit 4-2 adder, and a M-bit 4-2 adder (M is a natural number greater than 1) are connected such that at least one portion of a multi-bit carry output and at least one portion of a multi-bit addition output of the J-bit 4-2 adder and at least one portion of a multi-bit carry output and at least one portion of a multi-bit addition output of the L-bit 4-2 adder are supplied to first, second, third and fourth M-bit argument inputs of the M-bit 4-2 adder; and 6) a sixth configuration in which
the I-bit 4-2 adder and the J-bit 4-2 adder are connected such that at least one portion of a multi-bit carry output and at least one portion of a multi-bit addition output of the I-bit 4-2 adder are supplied to any of first, second, third and fourth J-bit argument inputs of the J-bit 4-2 adder,
the J-bit 4-2 adder, the K-bit 4-2 adder, and the L-bit 4-2 adder are connected such that at least one portion of a multi-bit carry output and at least one portion of a multi-bit addition output of the J-bit 4-2 adder and at least one portion of a multi-bit carry output and at least one portion of a multi-bit addition output of the K-bit 4-2 adder are supplied to first, second, third and fourth L-bit argument inputs of the L-bit 4-2 adder, and
the M-bit 4-2 adder, the N-bit 4-2 adder, and the K-bit 4-2 adder are connected such that at least one portion of a multi-bit carry output and at least one portion of a multi-bit addition output of the M-bit 4-2 adder and at least one portion of a multi-bit carry output and at least one portion of a multi-bit addition output of the N-bit 4-2 adder are supplied to first, second, third and fourth K-bit argument inputs of the K-bit 4-2 adder.

131. An N-bit 4 AND 4-2 adder for generating multi-bit addition output and multi-bit carry output (N is a natural number greater than 1), comprising:

N function blocks, each of which is set to an arbitrary logical function selected in programmable fashion from a plurality of logical functions, wherein each of the N function blocks has at least first to fourth argument inputs, a 4-2 carry input, a 4-2 carry output, an addition output, and a carry output, wherein the first to fourth argument inputs are supplied from respective ones of AND circuits;

wherein the multi-bit addition output includes addition outputs of the N function blocks, and the multi-bit carry output includes carry outputs of the N function blocks, wherein the N function blocks are connected such that a 4-2 carry output of a i-th function block is a 4-2 carry input of a (i+1)-th function block, where i is an arbitrary natural number greater than 0, wherein each of the N function blocks is set to satisfying the following equation:

$$S=(O42+OC)\times 2+OS,$$

where S is a sum of the first to fourth argument inputs and the 4-2 carry input, O42 is the 4-2 carry output, OC is the carry output, and OS is the addition output.

132. The N-bit 4 AND 4-2 adder according to claim 131, wherein each of the N function blocks comprises:

a logical function generator having at least four logical input terminals and one logical output terminal, for generating a logical output from the first, second, third, and fourth argument inputs thereof according to a logical function selected from a plurality of 4-input/1-output logical functions depending on configuration data;

a 4-2 carry block for generating a 4-2 carry output signal from the second, third; and fourth argument inputs;

a first signal generator for generating a first signal from at least the logical output;

a second signal generator for generating a second signal from at least the first argument input;

a third signal generator for generating a third signal from at least the 4-2 carry input;

a fourth signal generator for generating a fourth signal from at least the 4-2 carry input;

a selector for selecting one of the second and third signals depending on the first signal to produce the carry output; and an exclusive OR circuit for performing an exclusive OR function on the logical output and the fourth signal to produce the addition output.

133. The N-bit 4AND4-2 adder according to claim 131, wherein each of the N function blocks comprises:

a first exclusive OR circuit for performing an exclusive OR function on the first and second argument inputs;

a second exclusive OR circuit for performing an exclusive OR function on the third and fourth argument inputs;

a 4-2 carry block for generating the 4-2 carry output from at least, one of the first and second argument inputs and one of the third and fourth argument inputs;

a third exclusive OR circuit for performing an exclusive OR function on output signals of the first exclusive OR circuit and the second exclusive OR circuit;

a first signal generator for generating a first signal from at least an output signal of the third exclusive OR circuit;

a second signal generator for generating a second signal from at least one of the first and second argument inputs;

a third signal generator for generating a third signal from a first multiple-signal group including the 4-2 carry input and at least one logical input signal;

a fourth signal generator for generating a fourth signal from a second multiple-signal group including the 4-2 carry input and at least one logical input signal;

a selector for selecting one of the second and third signals to produce the carry output depending on the first signal; and a fourth exclusive OR circuit for performing an exclusive OR function on the fourth signal and the output signal of the third exclusive OR circuit.

134. A multiplier comprising:

a plurality of N-bit 4AND4-2 adders, each of which has multi-bit addition output and multi-bit carry output (N is a natural number greater than 1); and a plurality of multi-bit multi-argument 4-2 adders, each of which includes a plurality of multi-bit 4-2 adders, each of the N-bit 4AND4-2 adders comprising:

N function blocks, each of which is set to an arbitrary logical function selected in programmable fashion from a plurality of logical functions, wherein each of the N function blocks has at least first to fourth inputs, a 4-2 carry input, a 4-2 carry output, an addition output, and a carry output, wherein the first to fourth inputs are supplied from respective ones of AND circuits;

wherein the multi-bit addition output includes addition outputs of the N function blocks, and the multi-bit carry output includes carry outputs of the N function blocks, wherein the N function blocks are connected such that a 4-2 carry output of a i-th function block is a 4-2 carry input of a (i+1)-th function block, where i is an arbitrary natural number greater than 0, wherein each of the N function blocks is set to satisfying the following equation:

$S=(O42+OC)\times 2+OS,$ where S is a sum of the first to fourth inputs and the 4-2 carry input, O42 is the 4-2 carry output, OC is the carry output, and OS is the addition output, and each of the multi-bit 4-2 adders comprises:

at least first, second, third, and fourth multi-bit argument inputs, multi-bit addition output and multi-bit carry output;

a plurality of function blocks which is set to an arbitrary logical function selected in programmable fashion from a plurality of logical functions, wherein each of the N function blocks has at least first to fourth argument inputs, a 4-2 carry input, a 4-2 carry output, an addition output, and a carry output;

wherein the first multi-bit argument input, second multi-bit argument input, third multi-bit argument input and fourth multi-bit argument input consist of the first argument inputs of the function blocks, second argument inputs of the function blocks, third argument inputs of the function blocks, and fourth argument inputs of the function blocks, respectively, the multi-bit addition output includes addition outputs of the function blocks, and the multi-bit carry output includes carry outputs of the function blocks, wherein the function blocks are connected such that a 4-2 carry output of a i-th function block is a 4-2 carry input of a (i+1)-th function block, where i is an arbitrary natural number greater than 0, wherein each of the N function blocks is set to satisfying the following equation:

$S=(O42+OC)\times 2+OS,$ where S is a sum of the first to fourth argument inputs and the 4-2 carry input, O42 is the 4-2 carry output, OC is the carry output, and OS is the addition output.

135. An N-bit 2AND4-2 adder for generating multi-bit addition output and multi-bit carry output from first and second N-bit argument inputs (N is a natural number greater than 1), comprising:

N function blocks, each of which is set to an arbitrary logical function selected in programmable fashion from a plurality of logical functions, wherein each of the N function blocks has at least first to fourth argument inputs, a 4-2 carry input, a 4-2 carry output, an addition output, and a carry output, wherein the first and second argument inputs are supplied from respective ones of AND circuits;

wherein the first N-bit argument input and the second N-bit argument input consist of the first argument inputs of the N function blocks and second argument inputs of the N function blocks, respectively, the multi-bit addition output includes addition outputs of the N function blocks, and the multi-bit carry output includes carry outputs of the N function blocks, wherein the N function blocks are connected such that a 4-2 carry output of a i-th function block is a 4-2 carry input of a (i+1)-th function block, where i is an arbitrary natural number greater than 0, wherein each of the N function blocks is set to satisfying the following equation:

$S=(O42+OC)\times 2+OS,$ where S is a sum of the first to fourth argument inputs and the 4-2 carry input, O42 is the 4-2 carry output, OC is the carry output, and OS is the addition output.

136. The N-bit 2AND4-2 adder according to claim 135, wherein each of the N function blocks comprises:
- a logical function generator having at least four logical input terminals and one logical output terminal, for generating a logical output from the first, second, third, and fourth argument inputs thereof according to a logical function selected from a plurality of 4-input/1-output logical functions depending on configuration data;
- a 4-2 carry block for generating a 4-2 carry output signal from the second, third, and fourth argument inputs;
- a first signal generator for generating a first signal from at least the logical output,
- a second signal generator for generating a second signal front at least the first argument input,
- a third signal generator for generating a third signal from at least the 4-2 carry input;
- a fourth signal generator for generating a fourth signal from at least the 4-2 carry input;
- a selector for selecting one of the second and third signals depending on the first signal to produce the carry output; and
- an exclusive OR circuit for performing an exclusive OR function on the logical output and the fourth signal to produce the addition output.

137. The N-bit 2AND4-2 adder according to claim 135, wherein each of the N function blocks comprises:
- a first exclusive OR circuit for performing an exclusive OR function on the first and second argument inputs;
- a second exclusive OR circuit for performing an exclusive OR function on the third and fourth argument inputs;
- a 4-2 carry block for generating the 4-2 carry output from at least, one of the first and second argument inputs and one of the third and fourth argument inputs;
- a third exclusive OR circuit for performing an exclusive OR function on output signals of the first exclusive OR circuit and the second exclusive OR circuit;
- a first signal generator for generating a first signal from at least an output signal of the third exclusive OR circuit;
- a second signal generator for generating a second signal from at least one of the first and second argument inputs;
- a third signal generator for generating a third signal from a first multiple-signal group including the 4-2 carry input and at least one logical input signal;
- a fourth signal generator for generating a fourth signal from a second multiple-signal group including the 4-2 carry input and at least one logical input signal;
- a selector for selecting one of the second and third signals to produce the carry output depending on the first signal; and
- a fourth exclusive OR circuit for performing an exclusive OR function on the fourth signal and the output signal of the third exclusive OR circuit.

138. A multiplier comprising:
M N-bit 2AND4-2 adders, each of which has multi-bit addition output multi-bit carry output, and first and second N-bit argument inputs (M, N is a natural number greater than 1) and comprises:
- N function blocks, each of which is set to an arbitrary logical function selected in programmable fashion from a plurality of logical functions, wherein each of the N function blocks has at least first to fourth argument inputs, a 4-2 carry input, a 4-2 carry output, an addition output, and a carry output, wherein the first and second argument inputs are supplied from respective ones of AND circuits;
- wherein the first N-bit argument input and the second N-bit argument input consist of the first argument inputs of the N function blocks and second argument inputs of the N function blocks, respectively, the multi-bit addition output includes addition outputs of the N function blocks, and the multi-bit carry output includes carry outputs of the N function blocks,
- wherein the N function blocks are connected such that a 4-2 carry output of a i-th function block is a 4-2 carry input of a (i+1)-th function block, where i is an arbitrary natural number greater than 0,
- wherein each of the N function blocks is set to satisfying the following equation:

$$S=(O42+OC)\times 2+OS,$$

where S is a sum of the first to fourth argument inputs and the 4-2 carry input, O42 is the 4-2 carry output, OC is the carry output, and OS is the addition output,
- wherein the M N-bit 2AND4-2 adders are connected such that at least one portion of a multi-bit carry output and at least one portion of a multi-bit addition output of an j-th N-bit 2AND4-2 adder are supplied to the first and second N-bit argument inputs of an (j+1)-th N-bit 2AND4-2 adder, wherein j is a natural number greater than 1 and not greater than M−1.

139. A multiplier comprising:
an N-bit 2AND4-2 adder having multi-bit addition output, multi-bit carry output, and at least first and second N-bit argument inputs (M, N is a natural number greater than 1), wherein the N-bit 2AND4-2 adder comprises:
- N function blocks, each of which is set to an arbitrary logical function selected in programmable fashion from a plurality of logical functions, wherein each of the N function blocks has at least first to fourth argument inputs, a 4-2 carry input, a 4-2 carry output, an addition output, and a carry output, wherein the first and second argument inputs are supplied from respective ones of AND circuits;
- wherein the first N-bit argument input and the second N-bit argument input consist of the first argument inputs of the N function blocks and second argument inputs of the N function blocks, respectively, the multi-bit addition output includes addition outputs of the N function blocks, and the multi-bit carry output includes carry outputs of the N function blocks,
- wherein the N function blocks are connected such that a 4-2 carry output of a i-th function block is a 4-2 carry input of a (i+1)-th function block, where i is an arbitrary natural number greater than 0,
- wherein each of the N function blocks is set to satisfying the following equation:

$$S=(O42+OC)\times 2+OS,$$

where S is a sum of the first to fourth argument inputs and the 4-2 carry input, O42 is the 4-2 carry output, OC is the carry output, and OS is the addition output.

140. A multiplier comprising:
at least two block circuits, each of which comprises:
M N-bit 2AND4-2 adders, each of which has multi-bit addition output, multi-bit carry output, and at least first and second N-bit argument inputs (M, N is a natural number greater than 1) and comprises:
- N function blocks, each of which is set to an arbitrary logical function selected in programmable fashion from a plurality of logical functions, wherein each of the N function blocks has at least first to fourth argument inputs, a 4-2 carry input, a 4-2 carry output, an addition output, and a carry output, wherein the first and second argument inputs are supplied from respective ones of AND circuits;

wherein the first N-bit argument input and the second N-bit argument input consist of the first argument inputs of the N function blocks and second argument inputs of the N function blocks, respectively, the multi-bit addition output includes addition outputs of the N function blocks, and the multi-bit carry output includes carry outputs of the N function blocks, wherein the N function blocks are connected such that a 4-2 carry output of a i-th function block is a 4-2 carry input of a (i+1)-th function block, where i is an arbitrary natural number greater than 0, wherein each of the N function blocks is set to satisfying the following equation:

$$S=(O42+OC)\times 2+OS,$$

where S is a sum of the first to fourth argument inputs and the 4-2 carry input, O42 is the 4-2 carry output, OC is the carry output, and OS is the addition output, wherein the M N-bit 2AND4-2 adders are connected such that at least one portion of a multi-bit carry output and at least one portion of a multi-bit addition output of an j-th N-bit 2AND4-2 adder are supplied to the first and second N-bit argument inputs of an (j+1)-th N-bit 2AND4-2 adder, wherein j is a natural number greater than 1 and not greater than M−1.

141. A barrel shifter comprising:

a plurality of function blocks, each of which is set to an arbitrary logical function selected from a plurality of logical functions, wherein the function blocks are arrayed in a plurality of stages and are connected in programmable fashion by an interconnection network, wherein a 4-input/1-output multiplexer controlled by a dynamic signal is configured in each of the function blocks, and wherein an i-th input of n-th 4-input/1-output multiplexer in arbitrary stage is supplied with a $(n-i\times 4^k)$-th bit of multi-bit data output from a previous stage, wherein i is one of 0, 1, 2, and 3, k is an integer equal to or greater than 0, n is an integer equal to or greater than $3\times 4^k$.

142. A barrel shifter comprising:

a plurality of function blocks, each of which is set to an arbitrary logical function selected from a plurality of logical functions, wherein the function blocks are arrayed in a plurality of stages and are connected in programmable fashion by an interconnection network, wherein a 4-input/1-output multiplexer controlled by a dynamic signal is configured in each of the function blocks, and wherein an i-th input of n-th 4-input/1-output multiplexer in arbitrary stage is supplied with a $(n+i\times 4^k)$-th bit of multi-bit data output from a previous stage, wherein i is one of 0, 1, 2, and 3, k and n is an integer equal to or greater than 0.

143. A barrel shifter comprising:

a plurality of function blocks, each of which is set to an arbitrary logical function selected from a plurality of logical functions, wherein the function blocks are arrayed in a plurality of stages and are connected in programmable fashion by an interconnection network, wherein a 4-input/1-output multiplexer controlled by a dynamic signal is configured in each of the function blocks, wherein the plurality of function blocks are divided into a first section and a second section, wherein in the first section, an i-th input of m-th 4-input/1-output multiplexer in arbitrary stage is supplied with a $(m-i\times 4^k)$-th bit of multi-bit data output from a previous stage, wherein i is one of 0, 1, 2, and 3, k is an integer equal to or greater than 0, and m is an integer equal to or greater than $3\times 4^k$, and wherein in the second section, an j-th input of n-th 4-input/1-output multiplexer in arbitrary stage is supplied with a $(n-j\times 4^{k+1})$-th bit of output data from the first section, wherein j is one of 0, 1, 2, and 3, and n is an integer equal to or greater than $3\times 4^{k+1}$.

144. A barrel shifter comprising:

a plurality of function blocks, each of which is set to an arbitrary logical function selected from a plurality of logical functions, wherein the function blocks are arrayed in a plurality of stages and are connected in programmable fashion by an interconnection network, wherein a 4-input/1-output multiplexer controlled by a dynamic signal is configured in each of the function blocks;

wherein the plurality of function blocks are divided into a first section and a second section, wherein in the first section, an i-th input of m-th 4-input/1-output multiplexer in arbitrary stage is supplied with a $(m+i\times 4^k)$-th bit of multi-bit data output from a previous stage, wherein i is one of 0, 1, 2, and 3, k and m is an integer equal to or greater than 0, and wherein in the second section, an j-th input of n-th 4-input/1-output multiplexer in arbitrary stage is supplied with a $(n+j\times 4^{k+1})$-th bit of output data from the first section, wherein j is one of 0, 1, 2, and 3, and n is an integer equal to or greater than $3\times 4^{k+1}$.

145. A barrel shifter comprising:

a plurality of function blocks, each of which is set to an arbitrary logical function selected from a plurality of logical functions, wherein the function blocks are arrayed in a plurality of stages and are connected in programmable fashion by an interconnection network, wherein a 4-input/1-output multiplexer controlled by a dynamic signal is configured in each of the function blocks, wherein each of the function blocks comprises:

a logical function generator having at least four logical input terminals and one logical output terminal, for generating a logical output from the first, second, third, and fourth argument inputs thereof according to a logical function selected from a plurality of 4-input/1-output logical functions depending on configuration data;

a 4-2 carry block for generating a 4-2 carry output signal from the second, third, and fourth argument inputs;

a first signal generator for generating a first signal from at least the logical output;

a second signal generator for generating a second signal from at least the first argument input;

a third signal generator for generating a third signal from at least the 4-2 carry input;

a fourth signal generator for generating a fourth signal from at least the 4-2 carry input;

a selector for selecting one of the second and third signals depending on the first signal to produce the carry output; and an exclusive OR circuit for performing an exclusive OR function on the logical output and the fourth signal to produce the addition output.

146. A barrel shifter comprising:

a plurality of function blocks, each of which is set to an arbitrary logical function selected from a plurality of logical functions, wherein the function blocks are arrayed in a plurality of stages and are connected in programmable fashion by an interconnection network, wherein a 4-input/1-output multiplexer controlled by a dynamic signal is configured in each of the function blocks, wherein each of the function blocks comprises:

a first exclusive OR circuit for performing an exclusive OR function on the first and second argument inputs;

a second exclusive OR circuit for performing an exclusive OR function on the third and fourth argument inputs;

a 4-2 carry block for generating the 4-2 carry output from at least, one of the first and second argument inputs and one of the third and fourth argument inputs;

a third exclusive OR circuit for performing an exclusive OR function on output signals of the first exclusive OR circuit and the second exclusive OR circuit;

a first signal generator for generating a first signal from at least an output signal of the third exclusive OR circuit;

a second signal generator for generating a second signal from at least one of the first and second argument inputs;

a third signal generator for generating a third signal from a first multiple-signal group including the 4-2 carry input and at least one logical input signal;

a fourth signal generator for generating a fourth signal from a second multiple-signal group including the 4-2 carry input and at least one logical input signal;

a selector for selecting one of the second and third signals to produce the carry output depending on the first signal; and a fourth exclusive OR circuit for performing an exclusive OR function on the fourth signal and the output signal of the third exclusive OR circuit.

147. A combined function block comprising:

two function blocks, each of which is programmed to provide an arbitrary logical function selected from a plurality of logical functions; and a 2-bit carry look-ahead circuit having a ripple carry input and a ripple carry output, wherein the 2-bit carry look-ahead circuit includes a first NAND circuit and a second NAND circuit, wherein the ripple carry output is supplied by the first NAND circuit, one input of the first NAND circuit is supplied by the second NAND circuit, and one input of the second NAND circuit is supplied by the ripple carry input.

148. A multiplier implemented on an integrated circuit comprising:

a plurality of function blocks, each of which is set to an arbitrary logical function selected in programmable fashion from a plurality of logical functions; and an interconnection wiring network allowing programmable connections among the plurality of function blocks, wherein the multiplier comprises:

at least one 4-2 adder, each of which is implemented in a different one of the plurality of function blocks, wherein the multiplier does not include any modified booth partial product generator.

149. A multiplier implemented on an integrated circuit comprising:

a plurality of function blocks, each of which is set to an arbitrary logical function selected in programmable fashion from a plurality of logical functions; and an interconnection wiring network allowing programmable connections among the plurality of function blocks, wherein the multiplier comprises:

at least one 4-2 adder, each of which is implemented in a different one of the plurality of function blocks, wherein at least one input of each 4-2 adder has an output of an AND circuit connected thereto, wherein the multiplier does not include any modified booth partial product generator.

* * * * *